United States Patent
Sakuma

(10) Patent No.: US 12,501,824 B2
(45) Date of Patent: Dec. 16, 2025

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventor: Takao Sakuma, Tsurumi-ku (JP)

(73) Assignee: Samsung Display Co., Ltd., Yongin-si (KR)

( * ) Notice: Subject to any disclaimer, the term of this patent is extended or adjusted under 35 U.S.C. 154(b) by 508 days.

(21) Appl. No.: 16/559,275

(22) Filed: Sep. 3, 2019

(65) Prior Publication Data

US 2020/0144518 A1    May 7, 2020

(30) Foreign Application Priority Data

Nov. 6, 2018    (KR) .................... 10-2018-0134840

(51) Int. Cl.
*H10K 85/60* (2023.01)
*C07D 311/78* (2006.01)
(Continued)

(52) U.S. Cl.
CPC ......... *H10K 85/631* (2023.02); *C07D 311/78* (2013.01); *C07D 311/82* (2013.01);
(Continued)

(58) Field of Classification Search
None
See application file for complete search history.

(56) References Cited

U.S. PATENT DOCUMENTS 9,809,601 B2   11/2017   Echigo et al.
9,966,543 B2    5/2018   Kim et al.
(Continued)

FOREIGN PATENT DOCUMENTS

JP    WO2014/123107 A1    8/2014
KR    10-2012-0070468 A    6/2012
(Continued)

OTHER PUBLICATIONS

Chen Muzi et al. "Synthesis and properties of spiro[dibenzo[ a,j ]xanthene-14,9'-fluorene]", Chem. J Chinese Univ. 2014, vol. 35, No. 1, p. 63-67 (Year: 2014).*
(Continued)

*Primary Examiner* — Seokmin Jeon
(74) *Attorney, Agent, or Firm* — Womble Bond Dickinson (US) LLP

(57) ABSTRACT

An organic electroluminescence device includes oppositely disposed first electrode and second electrode, and at least one organic layer disposed between the first electrode and the second electrode, wherein at least one organic layer includes a polycyclic compound represented by Formula 1, thereby showing improved device efficiency and life characteristics.

Formula 1

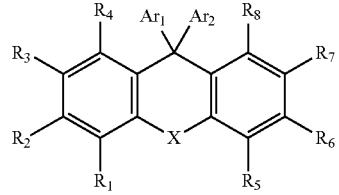

9 Claims, 2 Drawing Sheets

(51) Int. Cl.
  *C07D 311/82* (2006.01)
  *C07D 335/04* (2006.01)
  *C07D 335/12* (2006.01)
  *C07D 407/10* (2006.01)
  *C07D 409/10* (2006.01)
  *H10K 50/15* (2023.01)
  *H10K 50/18* (2023.01)
  *H10K 50/85* (2023.01)

(52) U.S. Cl.
  CPC ......... *C07D 335/04* (2013.01); *C07D 335/12* (2013.01); *C07D 407/10* (2013.01); *C07D 409/10* (2013.01); *H10K 85/615* (2023.02); *H10K 85/653* (2023.02); *H10K 85/655* (2023.02); *H10K 85/6574* (2023.02); *H10K 85/6576* (2023.02); *H10K 50/15* (2023.02); *H10K 50/18* (2023.02); *H10K 50/85* (2023.02)

(56) References Cited

U.S. PATENT DOCUMENTS

| | | | | |
|---|---|---|---|---|
| 2013/0181201 | A1* | 7/2013 | Lecloux | H01L 51/0058 257/40 |
| 2015/0295181 | A1* | 10/2015 | Mujica-Fernaud | H01L 51/0061 |
| 2017/0001972 | A1* | 1/2017 | Echigo | C07D 311/92 |
| 2017/0162800 | A1* | 6/2017 | Zoellner | H01L 51/0073 |
| 2018/0013074 | A1* | 1/2018 | Zeng | H01L 51/0073 |
| 2021/0070685 | A1* | 3/2021 | Echigo | C07C 43/295 |

FOREIGN PATENT DOCUMENTS

| | | | |
|---|---|---|---|
| KR | 10-2014-0034537 | A | 3/2014 |
| KR | 1020150106501 | A | 9/2015 |
| KR | 10-2016-0055557 | A | 5/2016 |
| KR | 10-2017-0016703 | A | 2/2017 |
| KR | 10-1790552 | B1 | 10/2017 |
| WO | WO 2018/016634 | A1 | 1/2018 |

OTHER PUBLICATIONS

Jefferson Martins et al. "New Class of Organic Hole-Transporting Materials Based on Xanthene Derivatives for Organic Electronic Applications" J. Phys. Chem. C, 2017, vol. 121, p. 12999-13007 (Year: 2017).*
English translation of KR 2015/0106501 and the original KR 2015/0106501, Young Kook Kim, Sep. 22, 2015 (Year: 2015).*
Daniel J. Rizzo, "Topological band engineering of graphene nanoribbons", Nature 2018, vol. 560, p. 204-208, published on Sep. 8, 2018 (Year: 2018).*
English translation of KR 2013/0007390 A, and the original KR 2013/0007390 A, Bokyoung Kim (Year: 2013).*
Amin Zarei et al. "The one-pot synthesis of 14-aryl or alkyl-14H-dibenzo[a,j]xanthenes catalyzed by P2O5/Al2O3 under microwave irradiation", Dyes and Pigments, 2010, vol. 85, p. 133-138 (Year: 2010).*
Arup Kumar Dutta et al. "Synthesis of dibenzoxanthene and acridine derivatives catalyzed by 1,3-disulfonic acid imidazolium carboxylate ionic liquids", RSC Adv. 2014, vol. 4, p. 41287-41291 (Year: 2014).*
Davinder Prasad et al. "PEG-SO3H catalyzed, environmentally benign synthesis of 14-aryl-14H-dibenzo[a,j]xanthenes under solvent-free conditions", Catal. Sci. Technol. 2012, vol. 2, p. 93-96 (Year: 2012).*
Ramakanth Pagadala et al. "BTADCI Promoted One-pot Synthesis of 14-aryl-14H-dibenzo [a, j] Xanthenes", J. Heterocyclic Chem. 2018, vol. 55, p. 1499-1503, Jun. 2018 (Year: 2018).*
English translation of CN107986975A and the original CN107986975A, Cai Hui, May 4, 2018 (Year: 2018).*
The original article and the English tranlsation of Jean-Pierre Poupelin et al. "Synthèse et propriétés anti-inflammatoires de dérivés du bis-(hydroxy-2 naphtyl-1) méthane", Eur. J. Med. Chem. 1978, vol. 13, p. 381-385 (Year: 1978).*
Examination report issued Jan. 31, 2024, from the Chinese Patent Office in corresponding Chinese Patent Application No. 201911069070.1 (295 pages).
RN 2235401-65-5 STN-REGISTRY 1-278 Aug. 6, 2018 (278 pages).
Korean Notice of Allowance dated Sep. 5, 2024, in corresponding Korean Patent Application No. 10-2018-0134840) (6 pages).

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2018-0134840, filed on Nov. 6, 2018, in the Korean Intellectual Property Office (KIPO), the entire content of which is hereby incorporated by reference.

BACKGROUND

1. Field

The present disclosure herein relates to a polycyclic compound and an organic electroluminescence device including the same, and more particularly, to a polycyclic compound utilized in a hole transport region and an organic electroluminescence device including the same.

2. Description of the Related Art

Recently, the development of an organic electroluminescence display device as an image display device is being actively pursued. Different from a liquid crystal display device, the organic electroluminescence display device is a so-called self-luminescent display device in which holes and electrons injected from a first electrode and a second electrode recombine in an emission layer, and a light emission material (including an organic compound) in the emission layer emits light to attain display (e.g., an image).

In the application of an organic electroluminescence device to a display device, the decrease of the driving voltage, and the increase of the emission efficiency and the life (e.g., lifespan) of the organic electroluminescence device are desired, and developments on materials for an organic electroluminescence device that can stably deliver the desired features are being continuously researched.

In addition, in order to accomplish an organic electroluminescence device with high efficiency, the development on materials for a hole transport region for restraining the diffusion of the exciton energy of the emission layer, and the like, are being conducted.

SUMMARY

An aspect according to embodiments of the present disclosure is directed toward a polycyclic compound, which is a material for an organic electroluminescence device and may improve emission efficiency and device life.

An aspect according to embodiments of the present disclosure is also directed toward an organic electroluminescence device including a polycyclic compound, which includes a xanthene derivative or a thioxanthene derivative, and having improved device efficiency and life (e.g., lifespan).

According to an embodiment of the present disclosure, an organic electroluminescence device includes a first electrode; a second electrode on the first electrode; and a plurality of organic layers between the first electrode and the second electrode, wherein at least one organic layer of the plurality of organic layers includes a polycyclic compound represented by the following Formula 1.

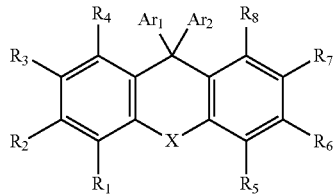

Formula 1

In Formula 1, X is O or S; $Ar_1$ and $Ar_2$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, when one of $Ar_1$ and $Ar_2$ is a hydrogen atom, the other one is not a hydrogen atom, a deuterium atom, an unsubstituted phenyl group, an unsubstituted biphenyl group, or a phenyl group substituted with a t-butyl group; $R_1$ to $R_8$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, and groups in at least one pair selected from pairs of $R_1$ and $R_2$, $R_3$ and $R_4$, $R_5$ and $R_6$, and $R_7$ and $R_8$ are combined with each other to form a hexagonal hydrocarbon ring.

In an embodiment, the plurality of organic layers may include an emission layer; and a hole transport region between the first electrode and the emission layer, wherein the hole transport region may include the polycyclic compound represented by Formula 1.

In an embodiment, the plurality of organic layers may include an emission layer; a hole injection layer between the first electrode and the emission layer; and a hole transport layer between the hole injection layer and the emission layer, wherein the hole transport layer may include the polycyclic compound represented by Formula 1.

In an embodiment, the hexagonal hydrocarbon ring may be represented by the following Formula 2:

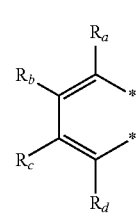

Formula 2

In Formula 2, $R_a$ to $R_d$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, and * represents a part which is combined with Formula 1.

In an embodiment, groups in at least two pairs selected from $R_1$ and $R_2$, $R_3$ and $R_4$, $R_5$ and $R_6$, and $R_7$ and $R_8$ may be combined with each other to form hexagonal hydrocarbon rings, respectively.

In an embodiment, the remainder of $R_1$ to $R_8$, which do not form the hexagonal hydrocarbon ring, may each be a hydrogen atom.

In an embodiment, the polycyclic compound represented by Formula 1 may be represented by the following Formula 1A:

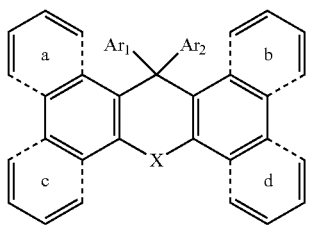

Formula 1A

In Formula 1A, a, b, c and d each represent a number of respective hexagonal hydrocarbon ring and are each independently 0 or 1, at least one selected from a, b, c and d is 1, and X, $Ar_1$ and $Ar_2$ are the same as defined respectively with respect to Formula 1.

In an embodiment, the polycyclic compound represented by Formula 1 may be represented by any one selected from the following Formula 1-1 to Formula 1-5:

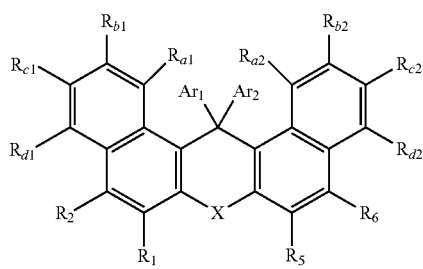

Formula 1-1

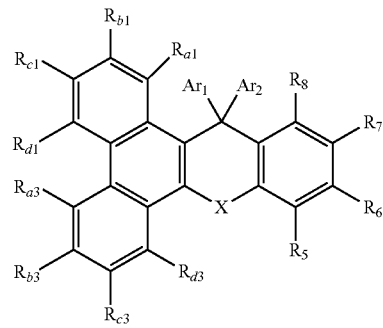

Formula 1-2

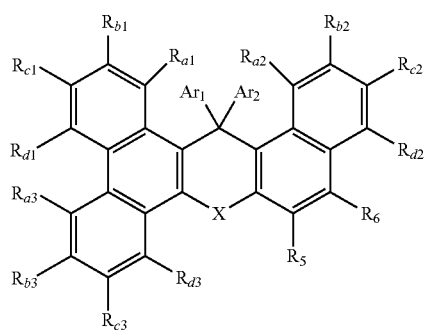

Formula 1-3

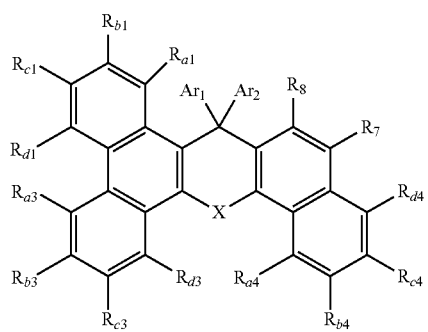

Formula 1-4

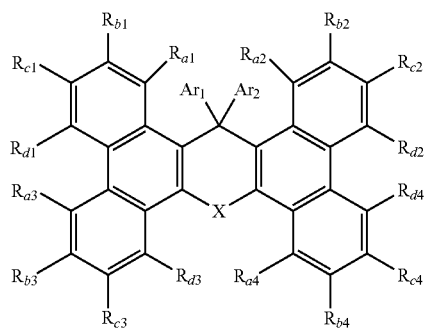

Formula 1-5

In Formula 1-1 to Formula 1-5, $R_{a1}$ to $R_{d1}$, $R_{a2}$ to $R_{d2}$, $R_{a3}$ to $R_{d3}$, and $R_{a4}$ to $R_{d4}$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, and X, $Ar_1$, $Ar_2$, $R_1$, $R_2$, and $R_5$ to $R_8$ are the same as defined respectively with respect to Formula 1.

In an embodiment, $Ar_1$ and $Ar_2$ may be each independently a hydrogen atom, a substituted or unsubstituted phenyl group, a substituted or unsubstituted biphenyl group, a substituted or unsubstituted naphthalene group, a substituted or unsubstituted phenanthrene group, a substituted or unsubstituted dibenzofuran group, a substituted or unsubstituted dibenzothiophene group, or a substituted or unsubstituted fluorene group.

In an embodiment, the emission layer may include an anthracene derivative represented by the following Formula 3:

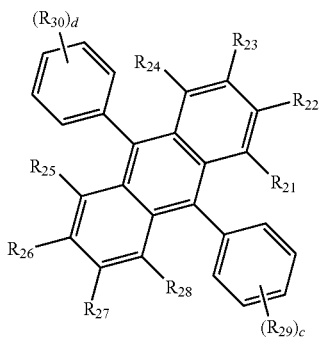

Formula 3

In Formula 3, $R_{21}$ to $R_{30}$ are each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, and c and d are each independently an integer of 0 to 5.

In an embodiment of the present disclosure, a polycyclic compound is represented by the following Formula 1.

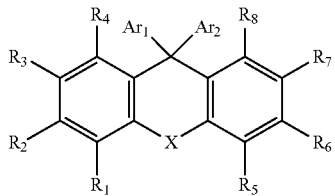

Formula 1

In Formula 1, X is O or S; $Ar_1$ and $Ar_2$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, when one of $Ar_1$ and $Ar_2$ is a hydrogen atom, the other one is not a hydrogen atom, a deuterium atom, an unsubstituted phenyl group, an unsubstituted biphenyl group or a phenyl group substituted with a t-butyl group; $R_1$ to $R_8$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, and groups in at least one pair selected from pairs of $R_1$ and $R_2$, $R_3$ and $R_4$, $R_5$ and $R_6$, and $R_7$ and $R_8$ are combined with each other to form a hexagonal hydrocarbon ring.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
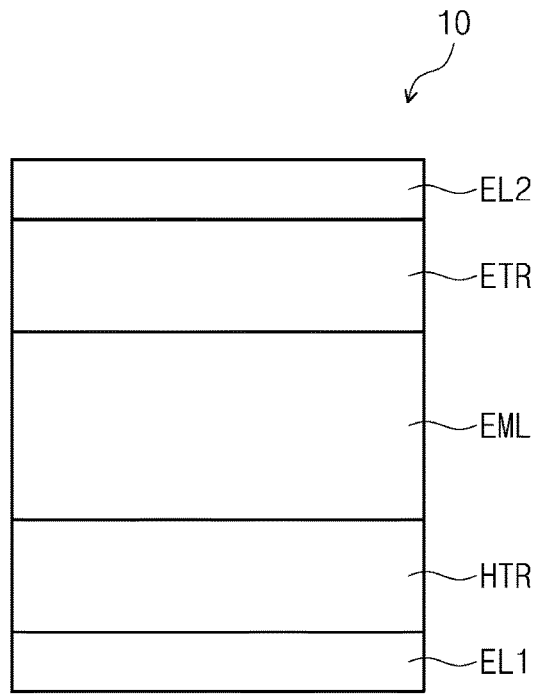
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompanying drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms first, second, etc., may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc., is referred to as being "on" another part, it can be "directly on" the other part, or one or more intervening layers may also be present.

Hereinafter, the organic electroluminescence device according to an embodiment of the present disclosure and the polycyclic compound included therein will be explained with reference to the accompanying drawings.

Figure 2:
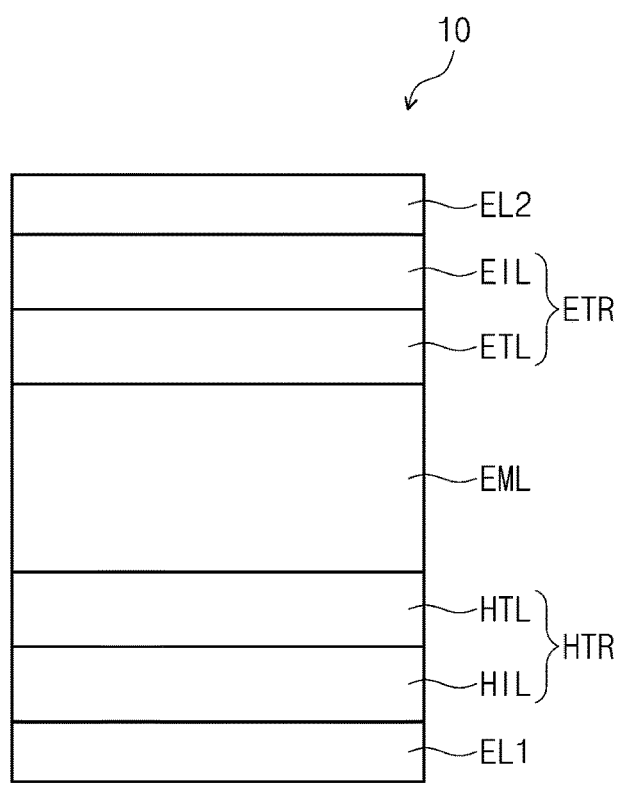
FIG. 2 is a cross-sectional view schematically illustrating an organic electroluminescence device according to an embodiment of the present disclosure.
Figure 3:
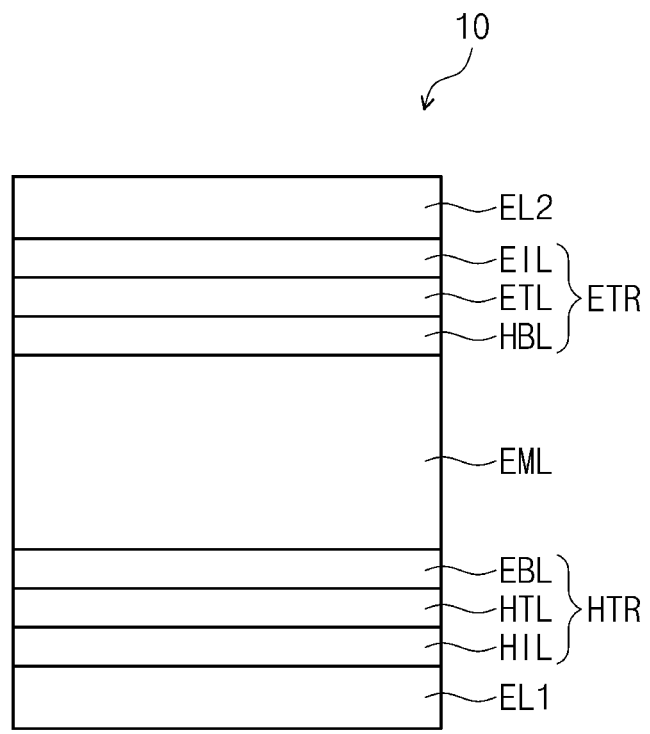
FIG. 3 is a cross-sectional view schematically illustrating an organic electroluminescence device according to an embodiment of the present disclosure.

FIGS. 1 to 3 are cross-sectional views schematically illustrating organic electroluminescence devices according to exemplary embodiments of the present disclosure. Referring to FIGS. 1 to 3, an organic electroluminescence device 10 of an embodiment may include a first electrode EL1, a hole transport region HTR, an emission layer EML, an electron transport region ETR and a second electrode EL2, laminated one by one (e.g., stacked in the stated order).

The first electrode EL1 and the second electrode EL2 are oppositely disposed to each other, and a plurality of organic layers may be disposed between the first electrode EL1 and the second electrode EL2. The plurality of organic layers may include a hole transport region HTR, an emission layer EML, and an electron transport region ETR.

The organic electroluminescence device 10 of an embodiment may include a polycyclic compound (which will be described in more detail later) in at least one organic layer of the plurality of organic layers disposed between the first electrode EL1 and the second electrode EL2. For example, the polycyclic compound of an embodiment may be included in the hole transport region HTR.

When compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Also, in the organic electroluminescence device 10 of an embodiment, the hole transport layer HTL may include a polycyclic compound of an embodiment, which will be explained in more detail later.

According to an embodiment, in the organic electroluminescence device 10, the hole transport layer HTL may include a plurality of sub hole transport layers, and a polycyclic compound of an embodiment (which will be explained in more detail later) may be included in a sub hole transport layer which is adjacent to the emission layer EML from among the sub hole transport layers.

The organic electroluminescence device 10 of an embodiment may include a polycyclic compound in at least one organic layer of the plurality of organic layers disposed between the first electrode EL1 and the second electrode EL2, and the polycyclic compound may include a xanthene skeleton or a thioxanthene skeleton. The polycyclic compound of an embodiment may include at least one hexagonal hydrocarbon ring with which the xanthene skeleton or the thioxanthene skeleton is condensed. The polycyclic compound of an embodiment, in which a hexagonal hydrocarbon ring is bonded and condensed, may be a compound in which (e.g., a total of) four or more hexagonal rings are condensed.

For example, the polycyclic compound of an embodiment may be a compound in which (e.g., a total of) four to seven hexagonal rings are condensed through the condensation of three hexagonal rings, which constitute the xanthene skeleton or the thioxanthene skeleton, with at least one additional hexagonal hydrocarbon ring.

The term "hydrocarbon ring" as used herein may refer to an optional functional group or substituent, which is derived from an aliphatic hydrocarbon ring, or an optional functional group or substituent, which is derived from an aromatic hydrocarbon ring. The hydrocarbon ring may be a ring of 6 to 50 carbon atoms for forming a ring and not including a heteroatom. For example, the carbon number for forming a ring of the hydrocarbon ring may be 6 to 20. The hydrocarbon ring may be a monocycle (e.g., a monocyclic group) or a polycycle (e.g., a polycyclic group). Also, the hydrocarbon ring may include an aryl group.

For example, in the polycyclic compound of an embodiment, the hexagonal hydrocarbon ring may be a substituted or unsubstituted benzene ring. The polycyclic compound of an embodiment may be represented by Formula 1, which will be described in more detail later.

In the description, the term "substituted or unsubstituted" refers to an unsubstituted group or a group substituted with at least one substituent selected from the group consisting of a deuterium atom, a halogen atom, a cyano group, a nitro group, an amino group, a hydroxyl group, a silyl group, a boron group, a phosphine oxide group, a phosphine sulfide group, an alkyl group, an alkenyl group, an alkoxy group, an aryloxy group, an alkylthio group, an arylthio group, a hydrocarbon ring group, an aryl group, and a heterocyclic group. In addition, each of the substituents may be substituted or unsubstituted. For example, a biphenyl group may be interpreted as an aryl or phenyl group substituted with a phenyl group.

In the description, the halogen atom may be a fluorine atom, a chlorine atom, a bromine atom and/or an iodine atom.

In the description, the alkyl (e.g., alkyl group) may be in a linear, branched or cyclic form. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without being limited thereto.

In the description, the heterocycle (e.g., heterocyclic group) may be a ring compound including at least one selected from O, N, P, Si and S as a heteroatom in addition to carbon atoms in forming the ring. The carbon number for forming a ring of the heterocycle may be 2 to 50 or 2 to 20. The heterocycle may be monocycle (e.g., a monocyclic group) or polycycle (e.g., a polycyclic group). In addition, the heterocycle may include a heteroaryl group.

In the description, the term "aryl group" refers to an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without being limited thereto.

In the description, the fluorenyl group may be substituted, and two substituents may be combined with each other to form a spiro structure. Examples of a substituted fluorenyl group are as follows. However, an embodiment of the present disclosure is not limited thereto.

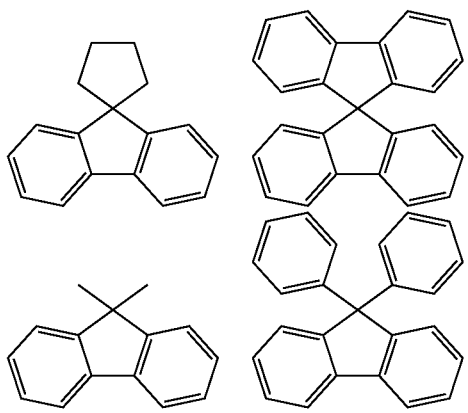

In the description, the term "heteroaryl" (e.g., heteroaryl group) refers to a group including one or more selected from O, N, P, Si and S as a heteroatom in addition to carbon atoms in forming the ring. The carbon number for forming a ring of the heteroaryl may be 2 to 30 or 2 to 20. The heteroaryl may be monocyclic heteroaryl or polycyclic heteroaryl. Examples of the polycyclic heteroaryl may have a dicyclic or tricyclic structure. Examples of the heteroaryl may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., without being limited thereto.

In the description, the silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present disclosure is not limited thereto.

In the description, the oxy group may include an alkoxy group and an aryloxy group. The alkoxy group may be a linear, branched or cyclic chain. The carbon number of the alkoxy group is not specifically limited, but may be, for example, 1 to 30, 1 to 20, or 1 to 10. The carbon number of the aryloxy group is not specifically limited, but may be, for example, 6 to 30, or 6 to 20. Examples of the oxy group may include methoxy, ethoxy, n-propoxy, isopropoxy, butoxy, pentyloxy, hexyloxy, octyloxy, nonyloxy, decyloxy, benzyloxy, etc. However, an embodiment of the present disclosure is not limited thereto.

In the description, the thio group may include an alkylthio group and an arylthio group. The carbon number of the alkylthio group is not specifically limited, but may be, for example, 1 to 30, 1 to 20, or 1 to 10. The carbon number of the arylthio group is not specifically limited, but may be, for example, 6 to 30, or 6 to 20.

Also, the same explanation of the alkyl group above may be applied to the alkyl group in the alkoxy group and the alkylthio group in the description. The same explanation of the aryl group above may be applied to the aryl group in the aryloxy group and the arylthio group in the description.

In the description, the expression "forming a ring via the combination with an adjacent group" may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with each other may be combined with another ring to form a spiro structure.

In the description, the term "adjacent group" may refer to a second substituent substituted on a second atom which is directly combined with a first atom substituted with a corresponding first substituent, a second substituent substituted on an atom which is substituted with a corresponding first substituent, or a second substituent sterically positioned at the nearest position to a corresponding first substituent. For example, in 1,2-dimethylbenzene, the two methyl groups may be interpreted as "adjacent groups" to each other, and in 1,1-diethylcyclopentane, the two ethyl groups may be interpreted as "adjacent groups" to each other.

Also, in the description, -* represents a connecting position (e.g., a binding site).

In the description, a dotted line (----) represents a selectively adopted or deleted bond. In the description, parts connected via the dotted line (----) may be connected via a single bond or may not be bonded to each other. The whole part shown as connected via the dotted line (----) may be selectively adopted or deleted.

In the organic electroluminescence devices 10 of exemplary embodiments shown in FIGS. 1 to 3, the first electrode EL1 has conductivity. The first electrode EL1 may be formed utilizing a metal alloy and/or a conductive compound. The first electrode EL1 may be an anode. In addition, the first electrode EL1 may be a pixel electrode. The first electrode EL1 may be a transmissive electrode, a transflective electrode, or a reflective electrode. If the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed utilizing the above materials, and a transmissive conductive layer formed utilizing ITO, IZO, ZnO, and/or ITZO. For example, the first electrode EL1 may include a three-layer structure of ITO/Ag/ITO. However, an embodiment of the present disclosure is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer EBL.

The hole transport region HTR may have a single layer formed utilizing a single material, a single layer formed utilizing a plurality of different materials, or a multilayer structure including a plurality of layers formed utilizing a plurality of different materials.

For example, the hole transport region HTR may have the structure of a single layer, such as a hole injection layer HIL or a hole transport layer HTL, and may have a structure of a single layer formed utilizing a hole injection material and/or a hole transport material. Alternatively, the hole transport region HTR may have a structure of a single layer formed utilizing a plurality of different materials, or a structure laminated (e.g., stacked) from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without being limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

In the organic electroluminescence device 10 of an embodiment, at least one organic layer of the organic layers between the first electrode EL1 and the second electrode EL2 may include a polycyclic compound represented by Formula 1 below. For example, in the organic electroluminescence device 10 of an embodiment, a hole transport region HTR may include a polycyclic compound represented by the following Formula 1:

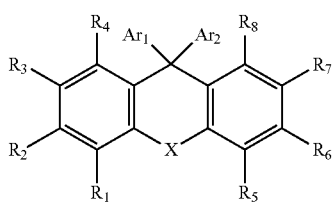

Formula 1

In Formula 1, X may be O or S. If X is O, the polycyclic compound of an embodiment may include a xanthene skeleton, and if X is S, the polycyclic compound of an embodiment may include a thioxanthene skeleton.

In Formula 1, $Ar_1$ and $Ar_2$ may be each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring.

In an embodiment, $Ar_1$ and $Ar_2$ may be each independently an aryl group of 6 to 50 carbon atoms for forming a ring, which is substituted with a triarylsilyl group.

In the polycyclic compound of an embodiment, represented by Formula 1, $Ar_1$ and $Ar_2$ may be the same or different. For example, $Ar_1$ and $Ar_2$ may be each independently a hydrogen atom, a substituted or unsubstituted phenyl group, a substituted or unsubstituted biphenyl group, a substituted or unsubstituted naphthalene group, a substituted or unsubstituted phenanthrene group, a substituted or unsubstituted dibenzofuran group, a substituted or unsubstituted dibenzothiophene group, or a substituted or unsubstituted fluorene group. Also, the substituted phenyl group, the substituted biphenyl group, the substituted naphthalene group, the substituted phenanthrene group, the substituted dibenzofuran group, the substituted dibenzothiophene group, and/or the substituted fluorene group may be each independently substituted with a deuterium atom, a halogen atom, a hydroxyl group, a cyano group, a nitro group, an amino group, a silyl group, an alkoxy group of 1 to 10 carbon atoms, an alkyl group of 1 to 10 carbon atoms, a substituted or unsubstituted aryl group of 6 to 20 carbon atoms for forming a ring, or a substituted or unsubstituted heteroaryl group of 2 to 20 carbon atoms for forming a ring.

In addition, if any one selected from $Ar_1$ and $Ar_2$ is a hydrogen atom, a case where the remainder one is a hydrogen atom, a deuterium atom, an unsubstituted phenyl group, an unsubstituted biphenyl group or a phenyl group substituted with a t-butyl group, is excluded. For example, when any one selected from $Ar_1$ and $Ar_2$ is a hydrogen atom, the remainder one may be an unsubstituted aryl group, and the carbon number of the unsubstituted aryl group may be 15 to 50.

If any one selected from $Ar_1$ and $Ar_2$ is a hydrogen atom, the remainder one may be a substituted phenyl group, a substituted biphenyl group, a substituted or unsubstituted naphthalene group, a substituted or unsubstituted phenanthrene group, a substituted or unsubstituted dibenzofuran group, a substituted or unsubstituted dibenzothiophene group, or a substituted or unsubstituted fluorene group.

In Formula 1, $R_1$ to $R_8$ may be each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring. The groups in at least one pair selected from $R_1$ and $R_2$, $R_3$ and $R_4$, $R_5$ and $R_6$, and $R_7$ and $R_8$ may be combined with each other to form a hexagonal hydrocarbon ring.

For example, the groups in at least two pairs selected from $R_1$ and $R_2$, $R_3$ and $R_4$, $R_5$ and $R_6$, and $R_7$ and $R_8$ may be combined with each other to form hexagonal hydrocarbon rings, respectively. Also, in Formula 1, the remainder of $R_1$ to $R_8$, which do not form the hexagonal hydrocarbon ring, may each be a hydrogen atom.

The hexagonal hydrocarbon ring may be represented by the following Formula 2:

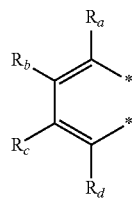

Formula 2

In Formula 2, * represents a part which is combined with Formula 1 (e.g., combined with the xanthene core or the thioxanthene core of Formula 1 at the sites corresponding to where the respective $R_1$ to $R_8$ are located), and the ring of Formula 1 may be combined with the * parts so that Formula 2 may form a hexagonal hydrocarbon ring. That is, Formula 2 may be combined with the ring (e.g., the corresponding phenyl ring) of Formula 1 via the * parts, to form a substituted or unsubstituted hexagonal aromatic ring.

In Formula 2, $R_a$ to $R_d$ may be each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring.

Also, in Formula 1, the groups in at least one pair selected from pairs of $R_1$ and $R_2$, $R_3$ and $R_4$, $R_5$ and $R_6$, and $R_7$ and $R_8$ may be combined with each other to form an unsubstituted benzene ring. That is, in Formula 2, $R_a$ to $R_d$ may be hydrogen atoms.

The polycyclic compound represented by Formula 1 may be represented by the following Formula 1A.

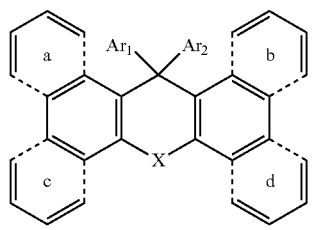

Formula 1A

In Formula 1A, a, b, c and d each represent a number of the respective hexagonal hydrocarbon ring and may be each independently 0 or 1, at least one selected from a, b, c and d may be 1. In Formula 1A, the same explanation on X, $Ar_1$ and $Ar_2$ as in Formula 1 above may be applied.

That is, in the polycyclic compound represented by Formula 1A, a, b, c and d may represent the presence or absence of a hexagonal hydrocarbon ring which is selectively bonded to a xanthene skeleton or a thioxanthene skeleton. In Formula 1A, any one selected from the hexagonal hydrocarbon rings associated with a to d, two selected from the hexagonal hydrocarbon rings associated with a to d, three selected from the hexagonal hydrocarbon rings associated with a to d, or all of the hexagonal hydrocarbon rings associated with a to d may be bonded to a xanthene skeleton or a thioxanthene skeleton to form a condensed ring.

The polycyclic compound represented by Formula 1 may be represented by any one selected from the following Formula 1-1 to Formula 1-5.

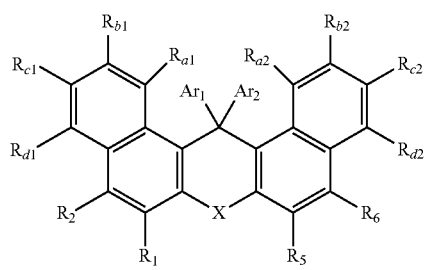

Formula 1-1

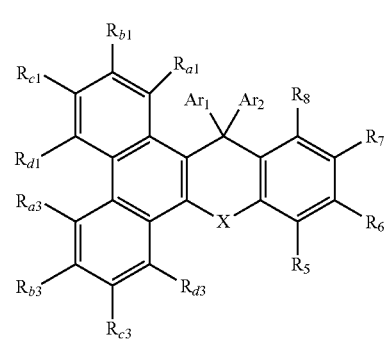

Formula 1-2

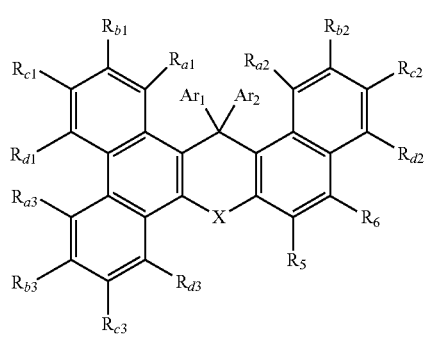

Formula 1-3

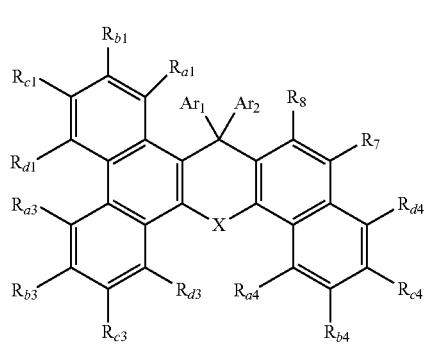

Formula 1-4

Formula 1-5

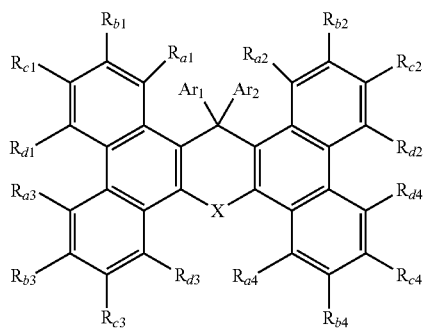

Formula 1-1 and Formula 1-2 represent cases where the groups in two pairs selected from $R_1$ and $R_2$, $R_3$ and $R_4$, $R_5$ and $R_6$, and $R_7$ and $R_8$ in Formula 1 are combined with each other to form hexagonal hydrocarbon rings, respectively, while being condensed. In addition, Formula 1-3 and Formula 1-4 represent cases where the groups in three pairs selected from $R_1$ and $R_2$, $R_3$ and $R_4$, $R_5$ and $R_6$, and $R_7$ and $R_8$ in formula 1 are combined with each other to form hexagonal hydrocarbon rings, respectively, while being condensed. Formula 1-5 represents a case where the groups in all four pairs selected from $R_1$ and $R_2$, $R_3$ and $R_4$, $R_5$ and $R_6$, and $R_7$ and $R_8$ in formula 1 are combined with each other to form hexagonal hydrocarbon rings, respectively, while being condensed.

In Formula 1-1 to Formula 1-5, $R_{a1}$ to $R_{d1}$, $R_{a2}$ to $R_{d2}$, $R_{a3}$ to $R_{d3}$, and $R_{a4}$ to $R_{d4}$ may be each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring.

For example, in Formula 1-1 to Formula 1-5, $R_{a1}$ to $R_{d1}$, $R_{a2}$ to $R_{d2}$, $R_{a3}$ to $R_{d3}$, and $R_{a4}$ to $R_{d4}$ may all be hydrogen atoms.

In addition, in Formula 1-1 to Formula 1-5, the same explanation on X, $Ar_1$, $Ar_2$, $R_1$, $R_2$, and $R_5$ to $R_8$ as in Formula 1 above may be applied.

The polycyclic compound of an embodiment, represented by Formula 1, may be represented by any one selected from the compounds represented in Compound Group 1 and Compound Group 2. That is, the organic electroluminescence device 10 of an embodiment may include at least one selected from the compounds represented in Compound Group 1 and Compound Group 2 in at least one organic layer. In addition, the organic electroluminescence device 10 of an embodiment may include at least one selected from the compounds represented in Compound Group 1 and Compound Group 2 in a hole transport region HTR.

Compound Group 1

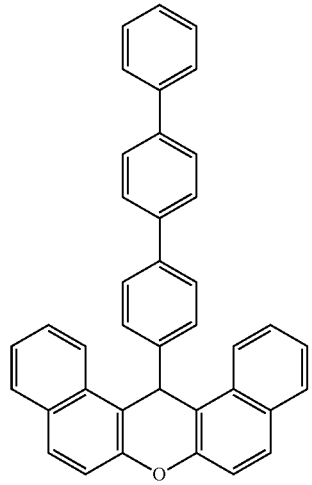

A1

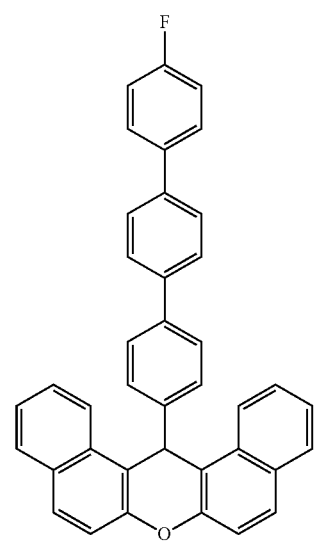

A2

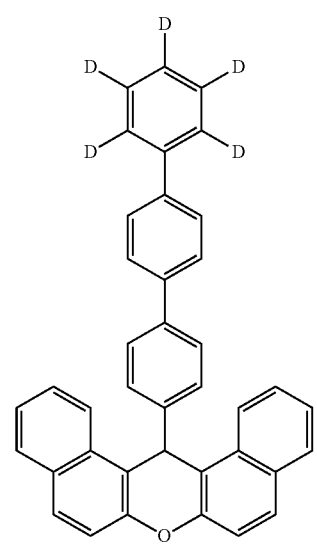

A3

-continued
A4
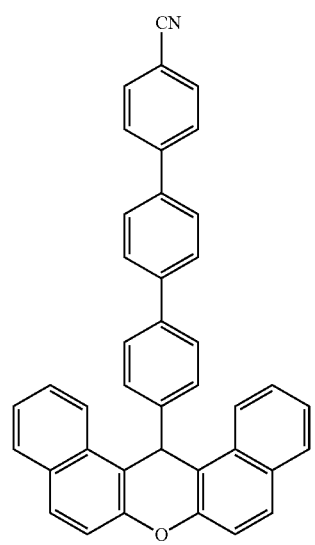
A5
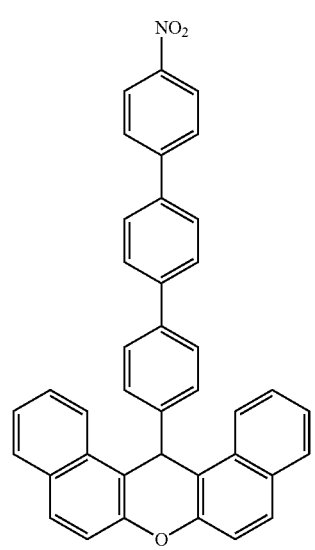
A6
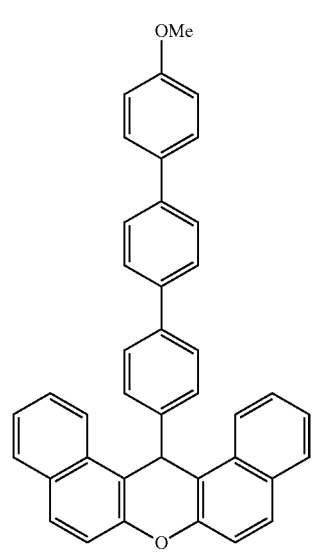
-continued
A7
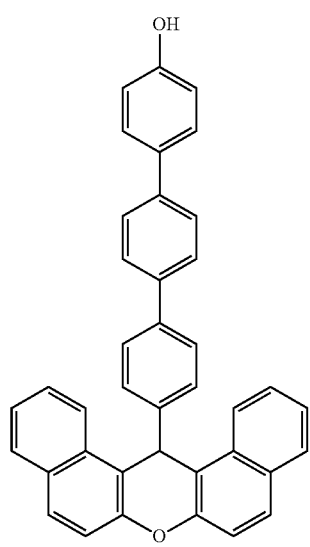
A8
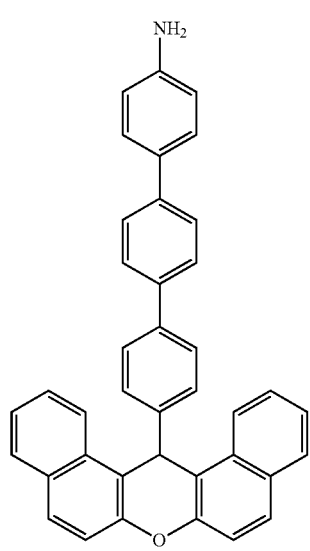
A9
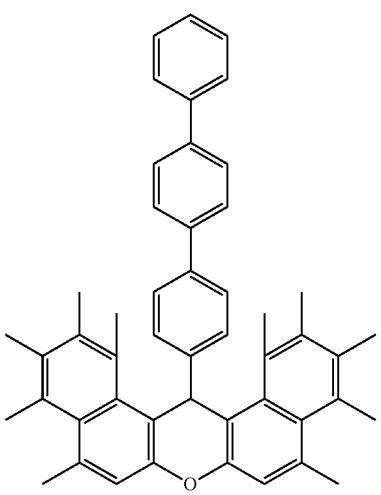

-continued
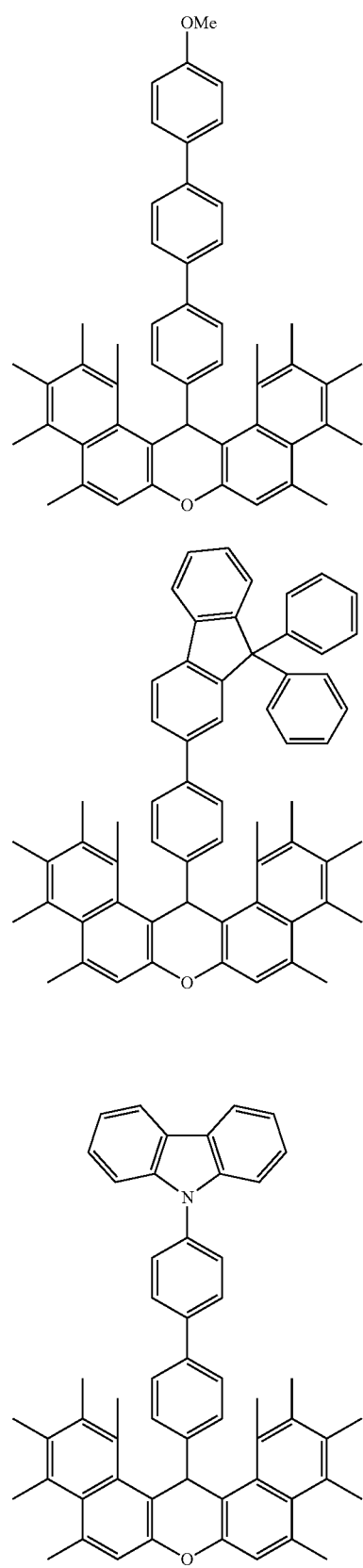
A10
A11
A12
-continued
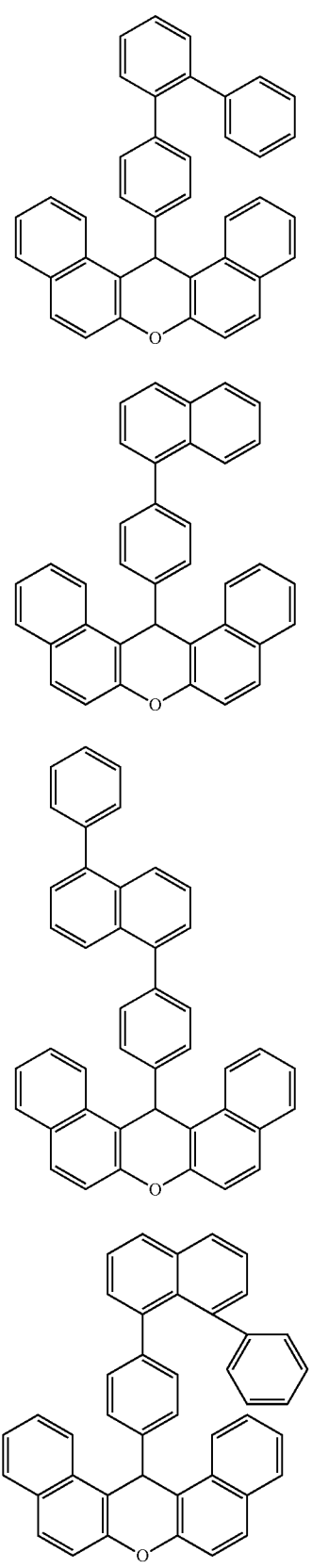
A13
A14
A15
A16

A17
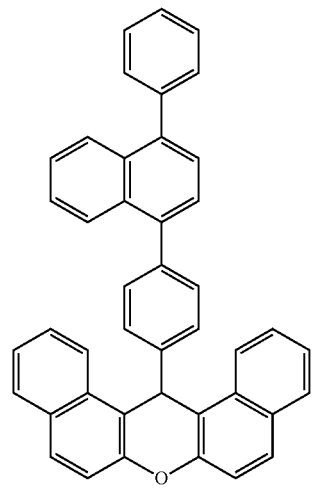
A18
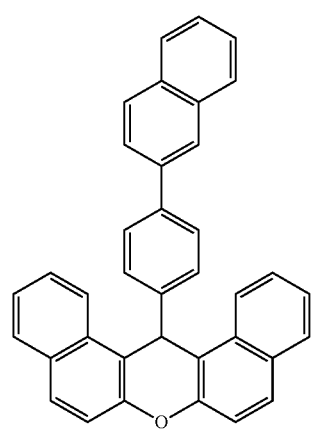
A19
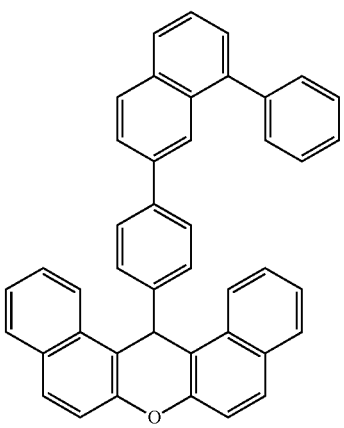
A20
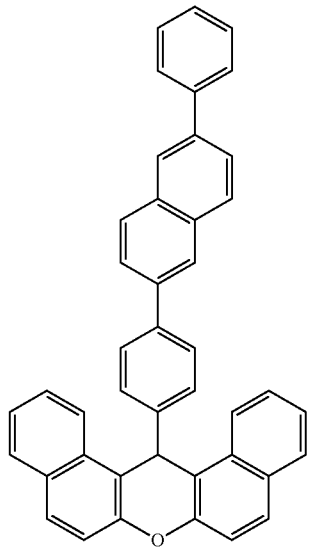
A21
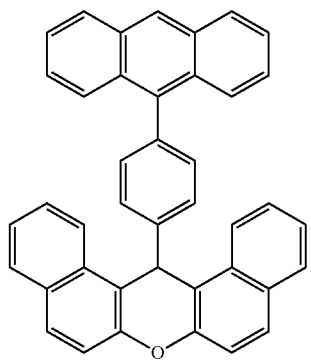
A22
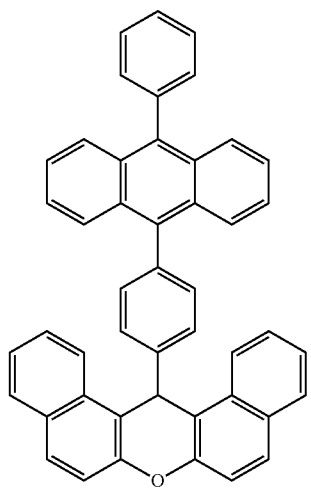

A23
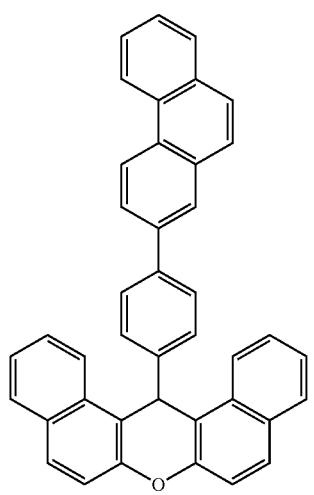
A24
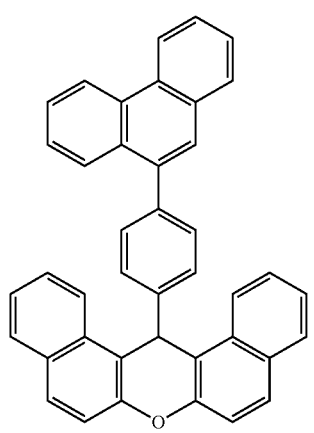
A26
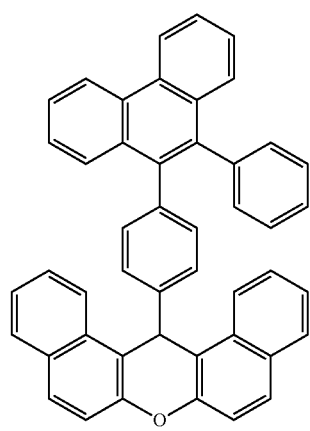
A27
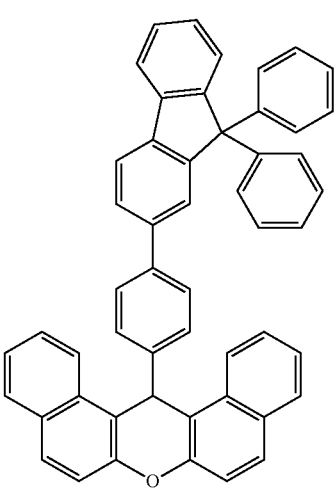
A25
A28

-continued
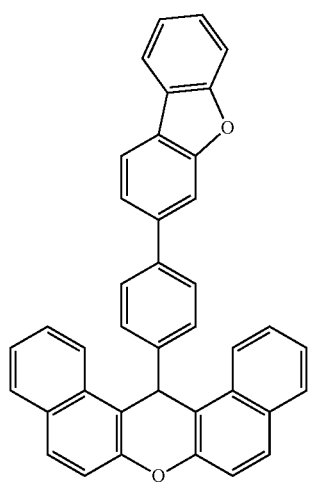
A29
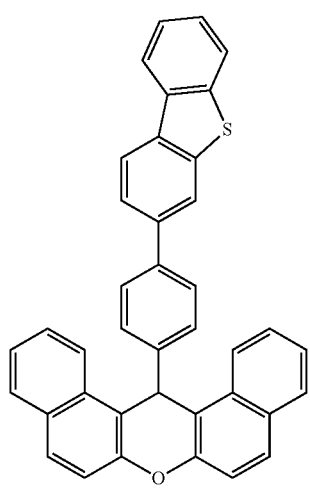
A30
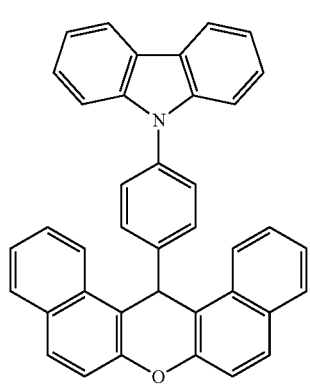
A31
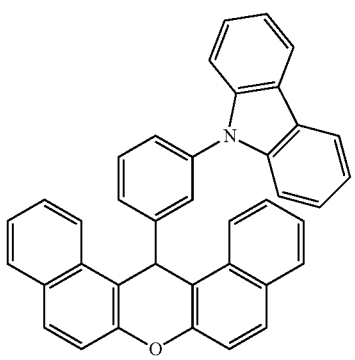
A32
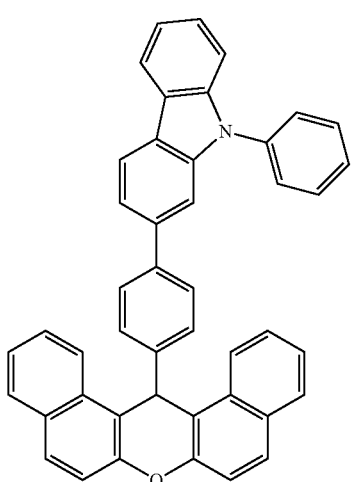
A33
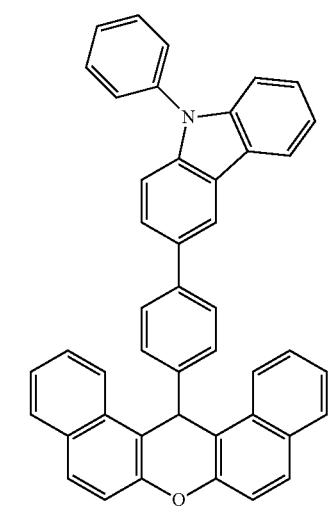
A34

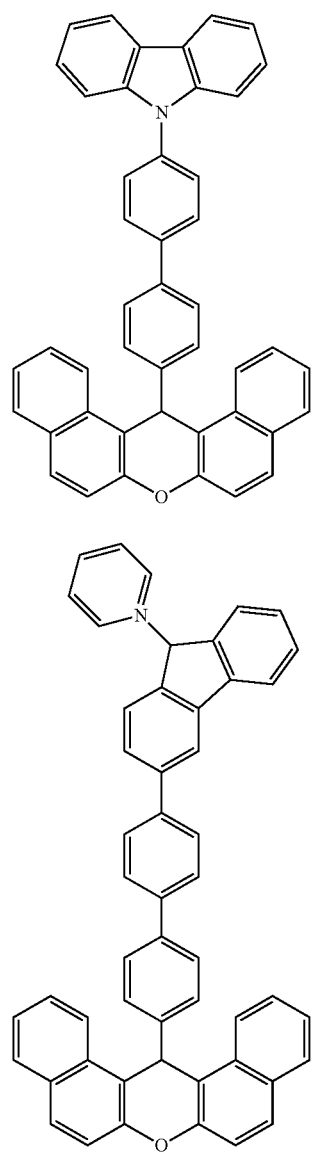
A35
A36
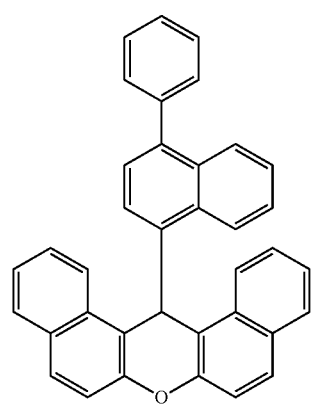
A37
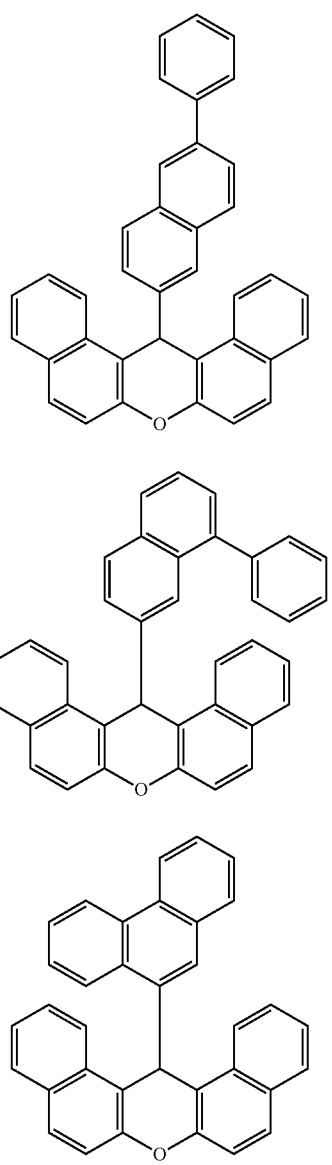
A38
A39
A40
A41

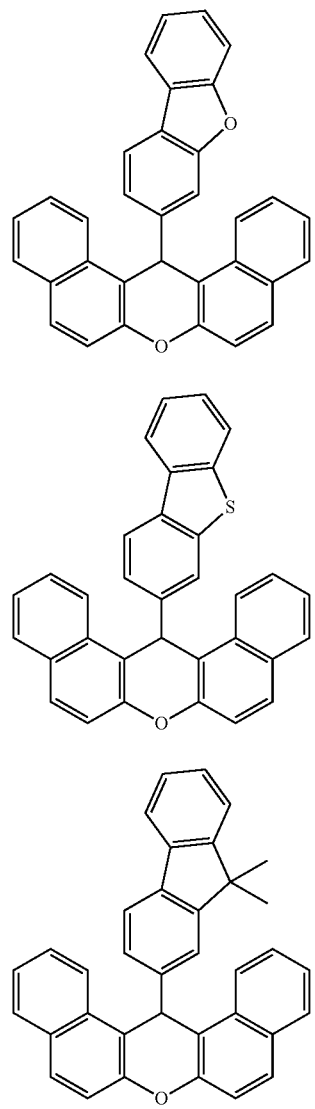
A42
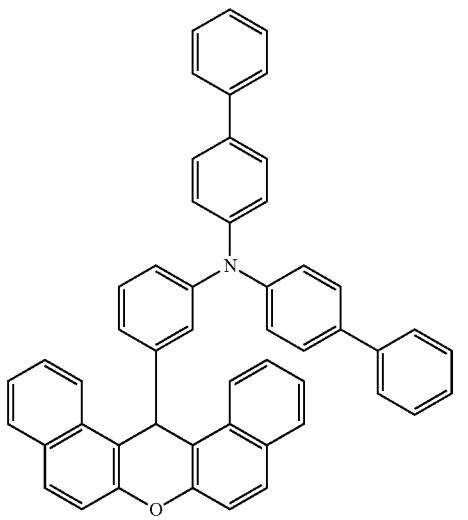
A46
A43
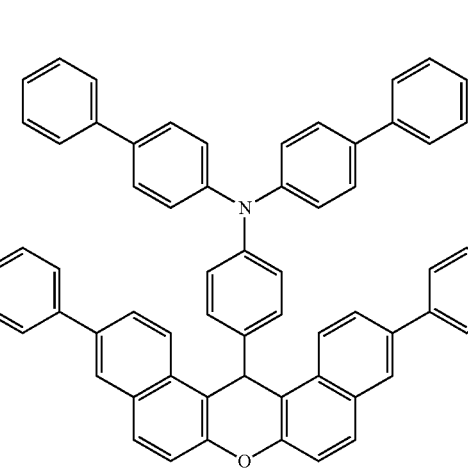
A47
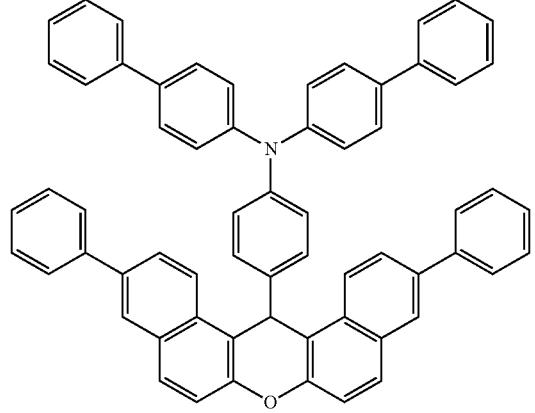
A44
A45
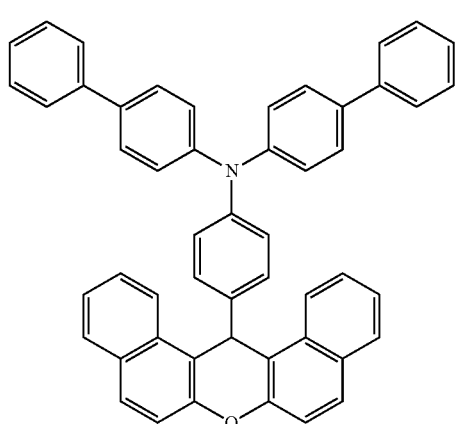
A48
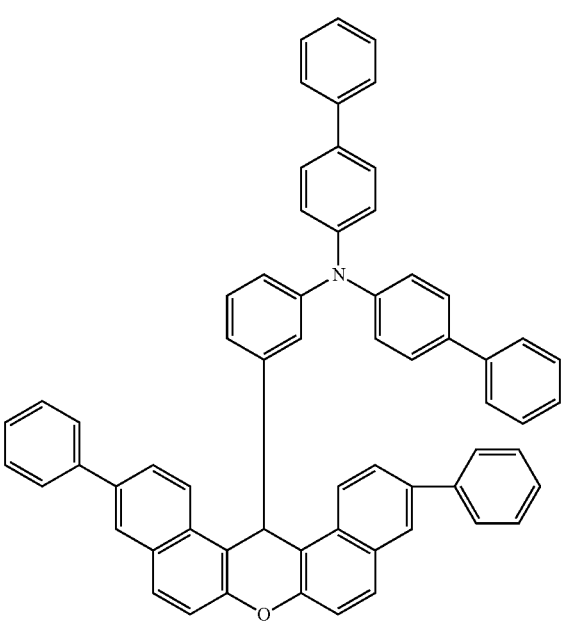

-continued
A49
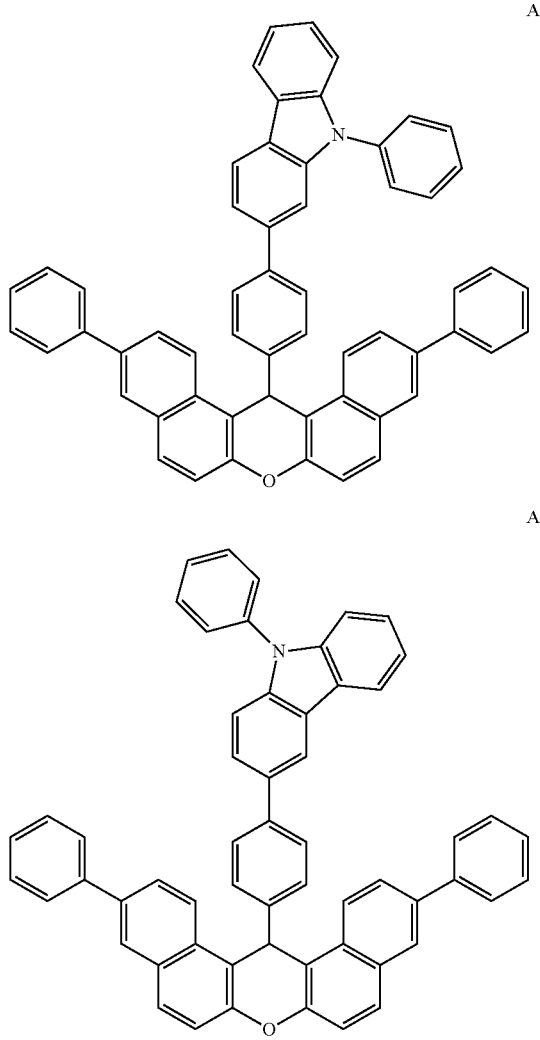
A50
A51
A52
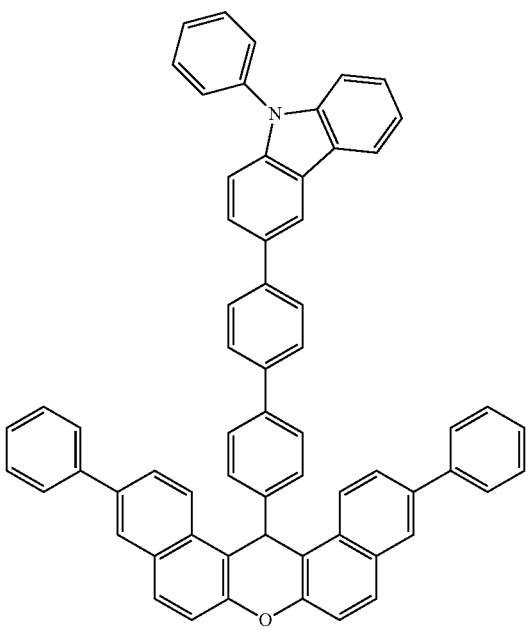
A53
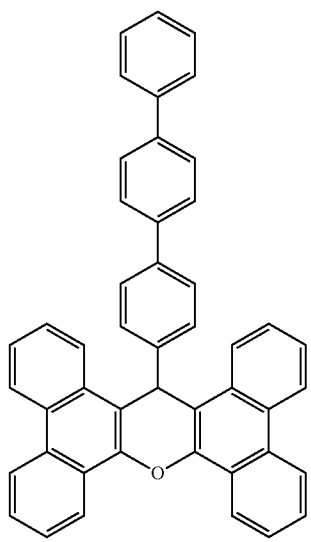

A54
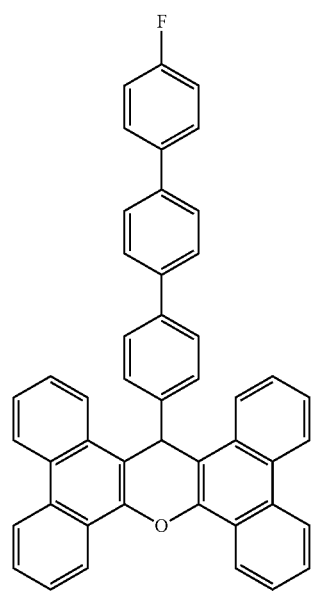
A56
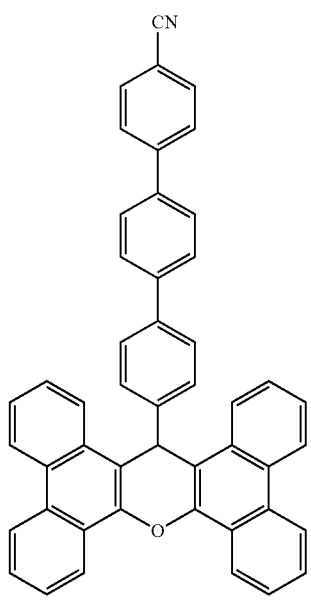
A55
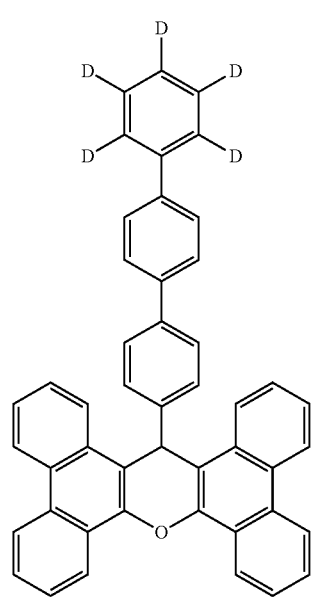
A57
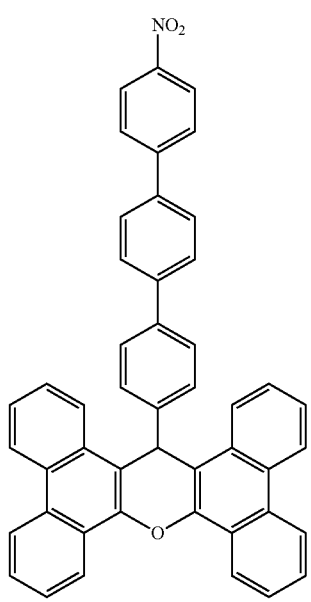

A58
A59
A60
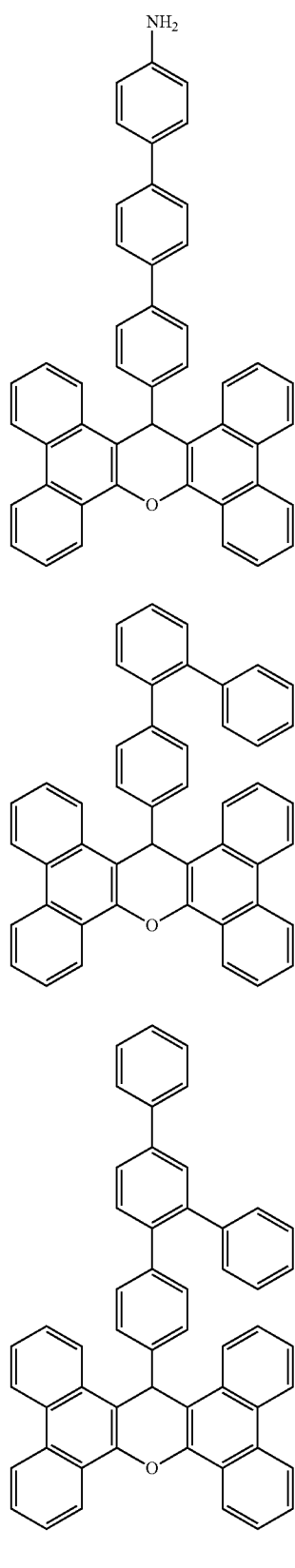
A61
A62

A63 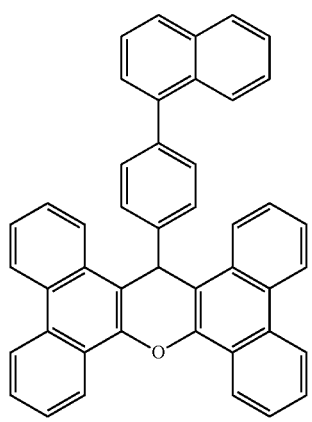
A64 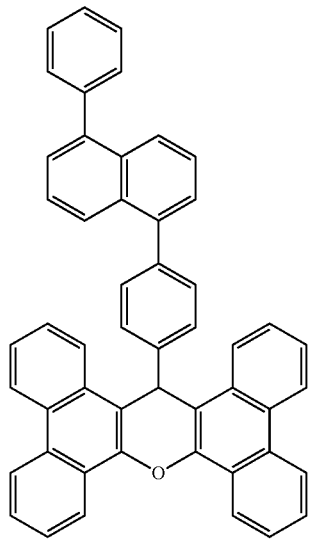
A65 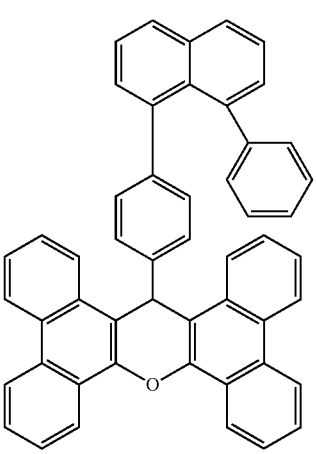
A66 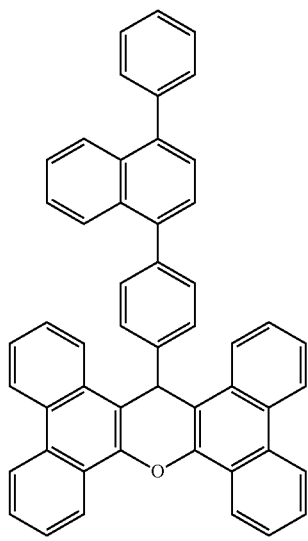
A67 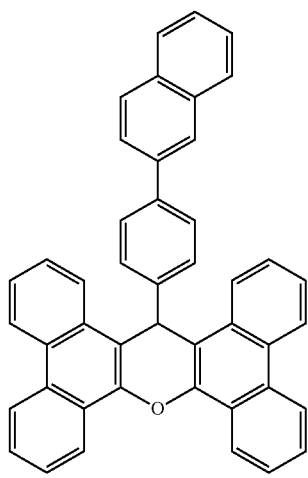
A68 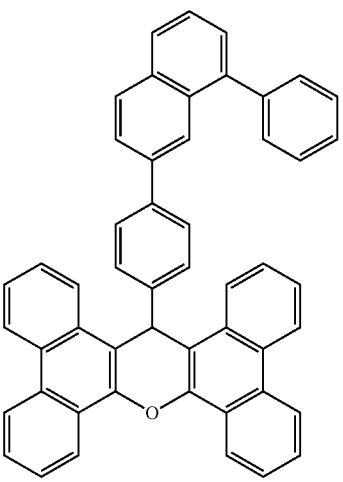

A69
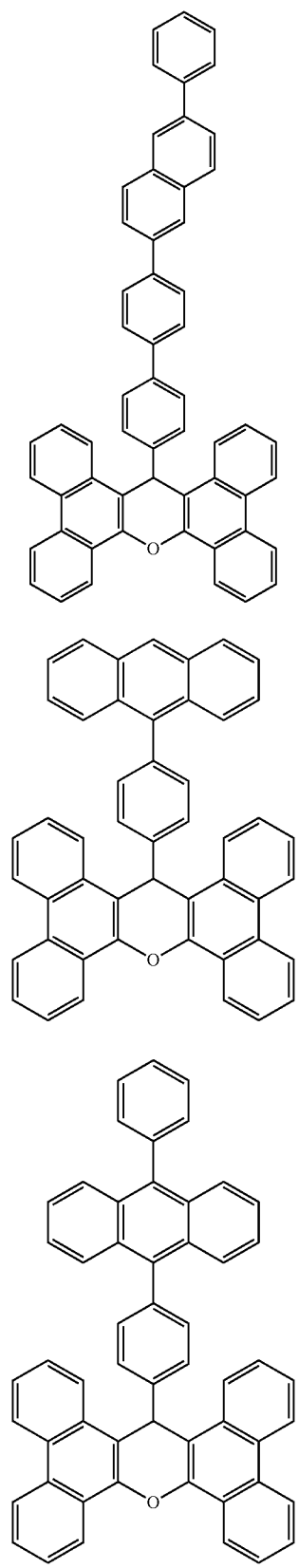
A70
A71
A72
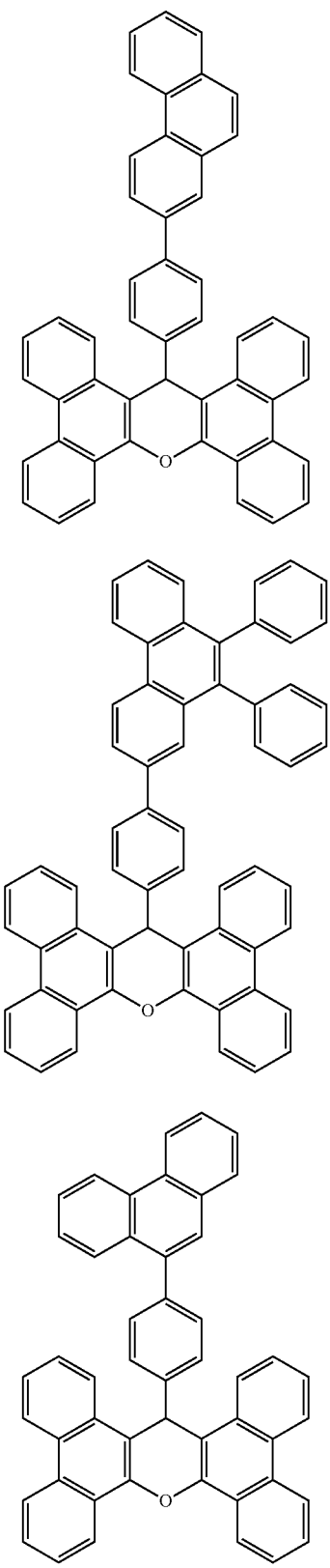
A73
A74

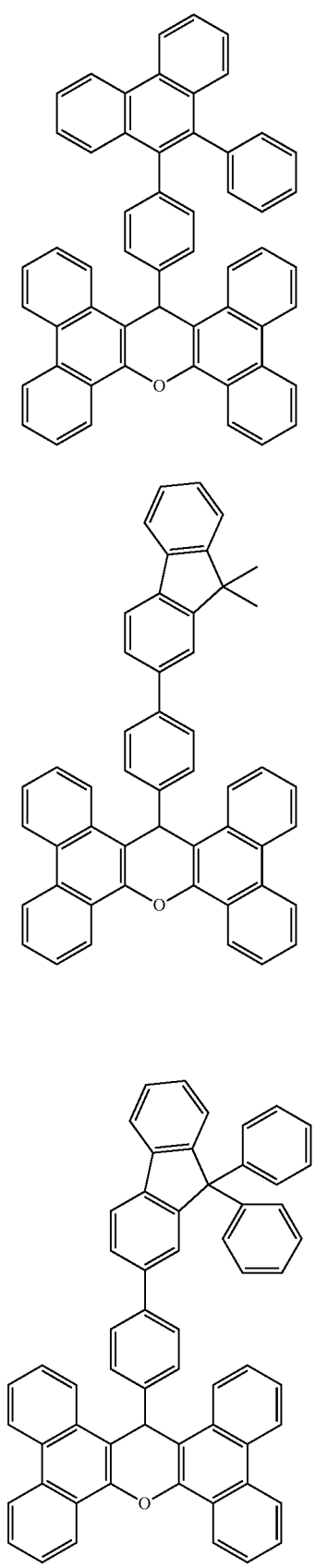
A75
A76
A77
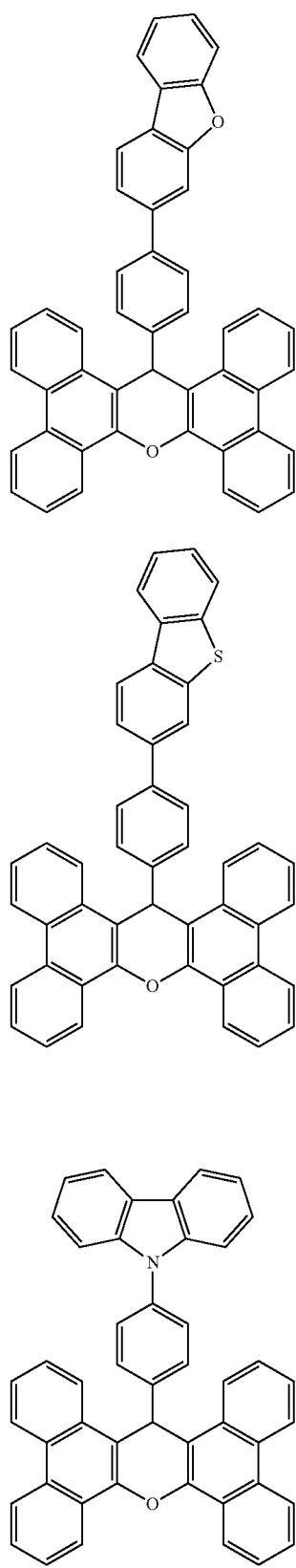
A78
A79
A80

A81
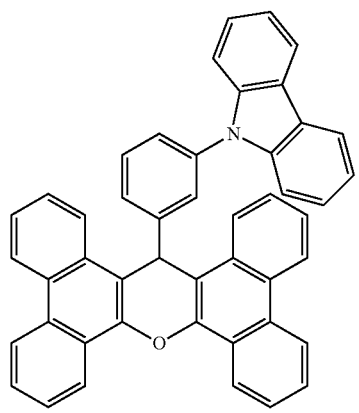
A82
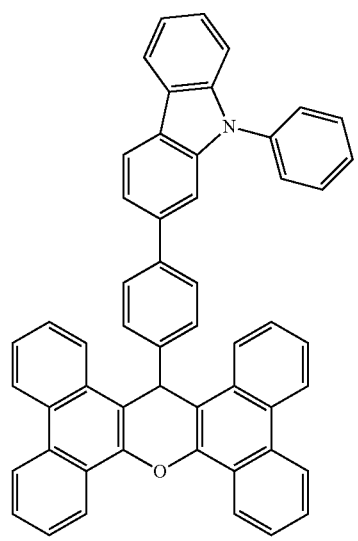
A83
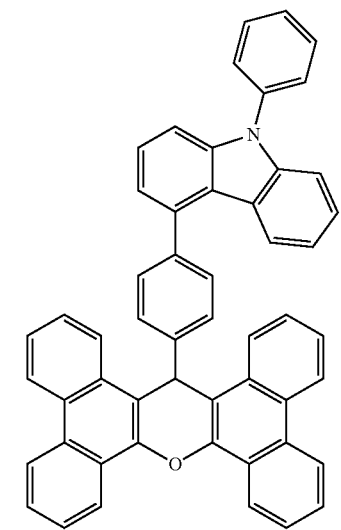
A84
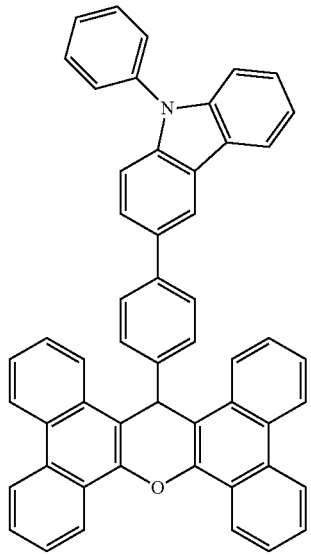
A85
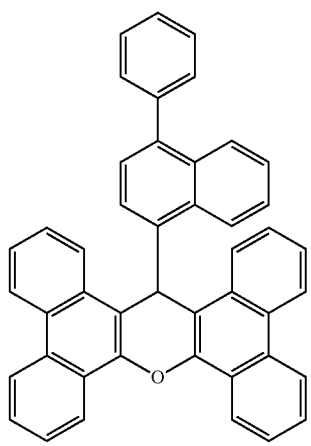
A86
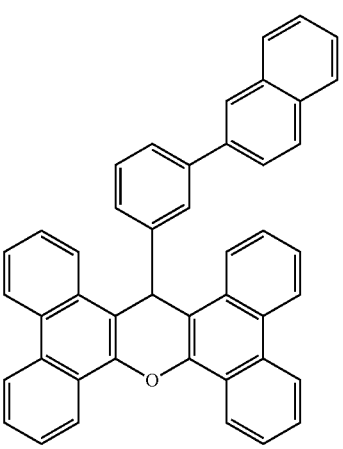

-continued
A87
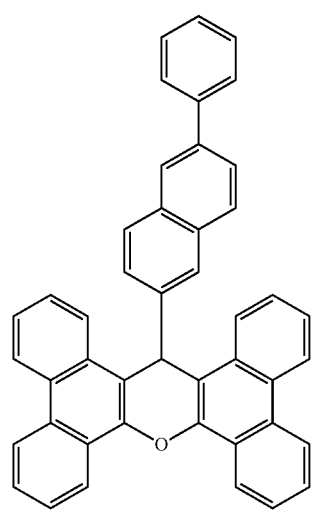
A88
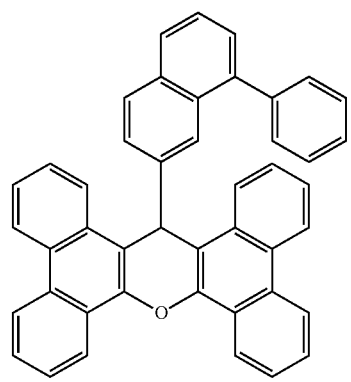
A89
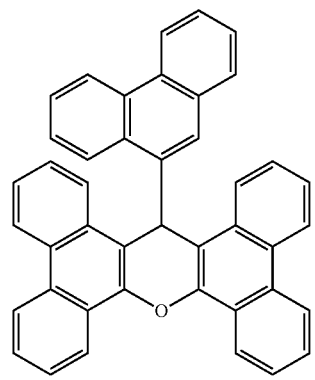
-continued
A90
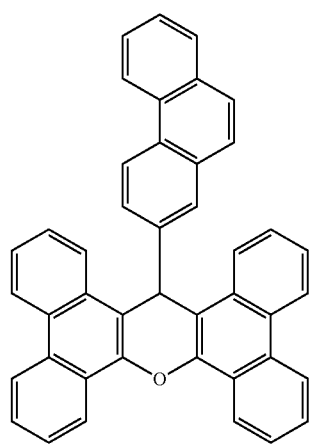
A91
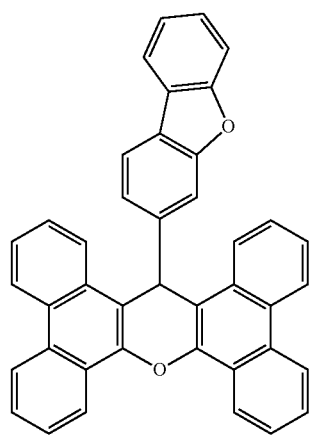
A92
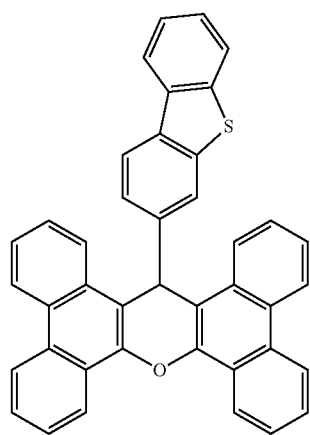

A93

A94

A95

A96

A97

A98

A99
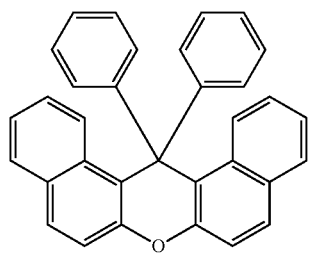
A100
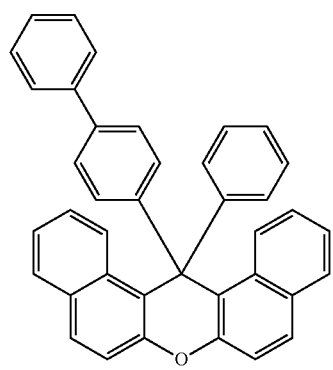
A101
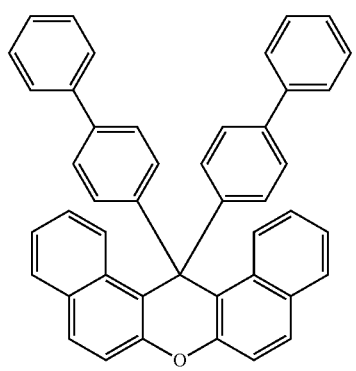
A102
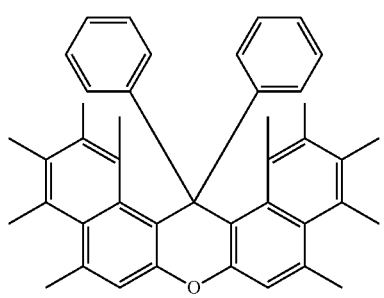
A103
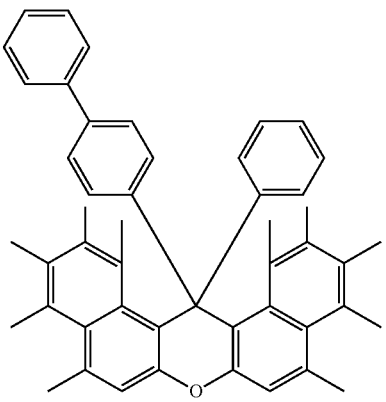
A104
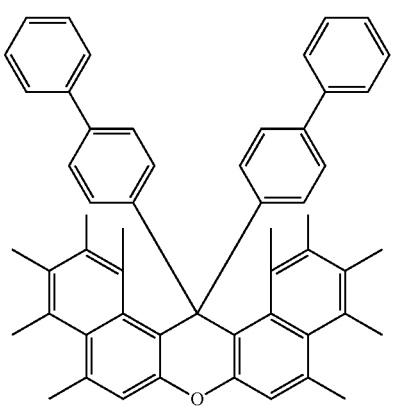
A105
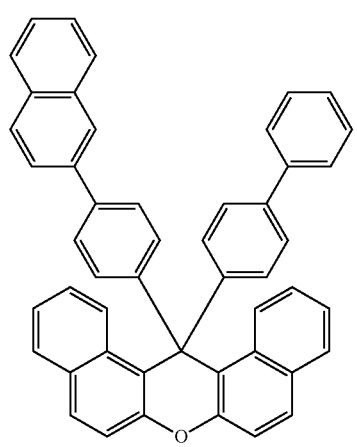

A106
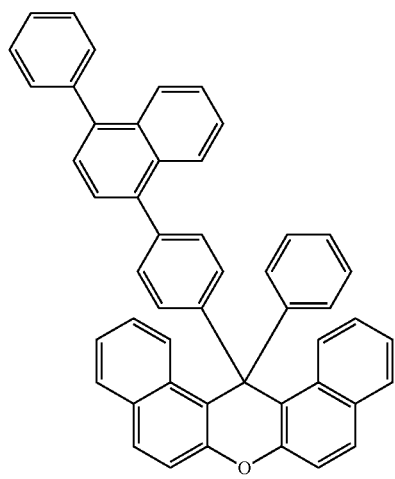
A107
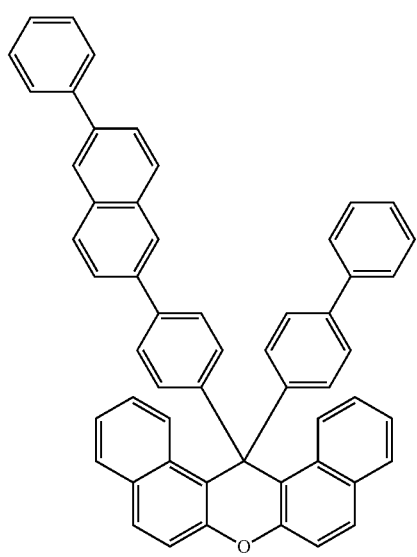
A108
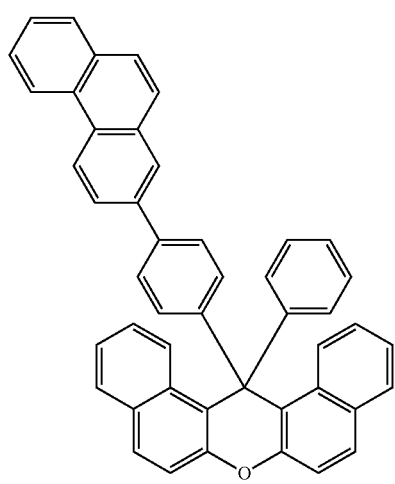
A109
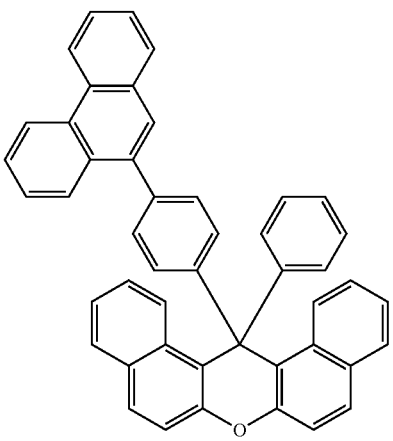
A110
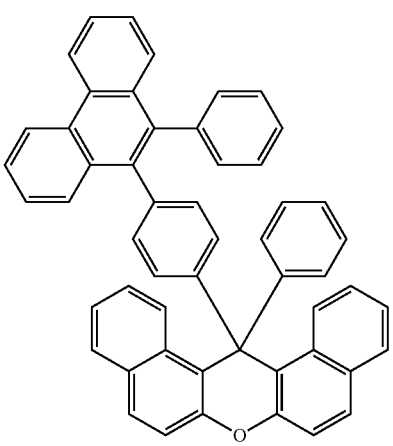
A111
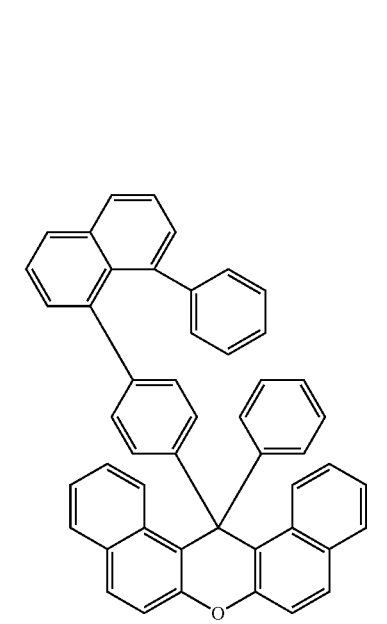

A112
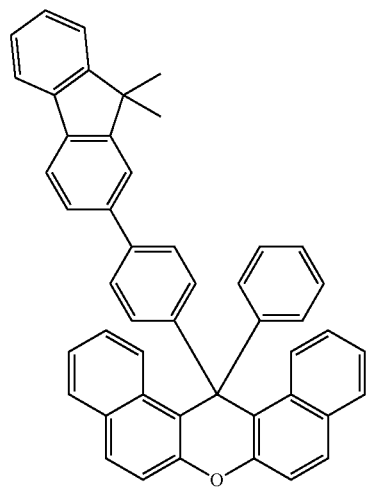
A113
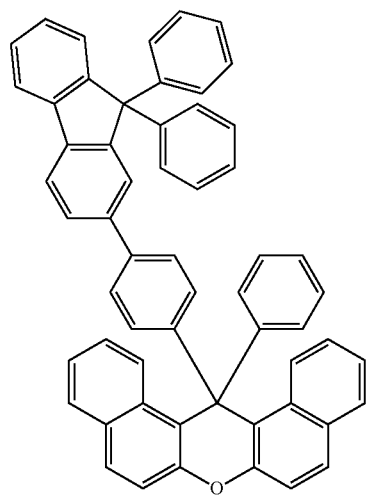
A114
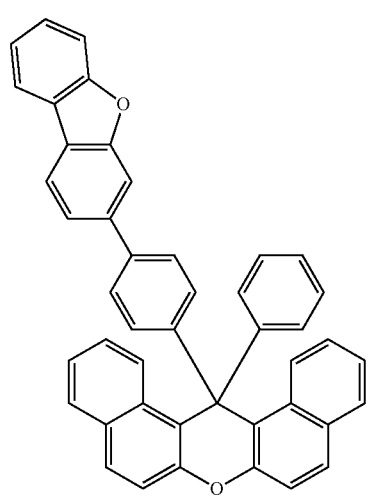
A115
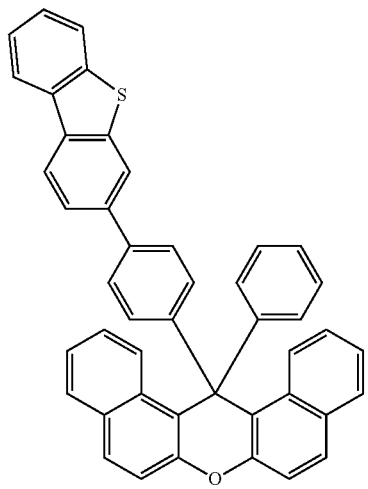
A116
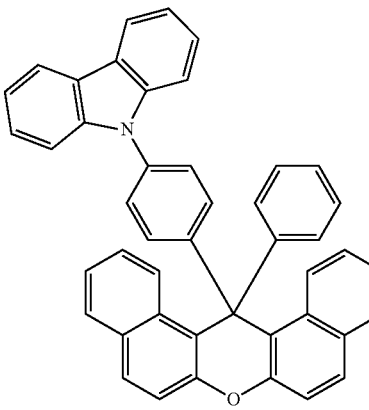
A117
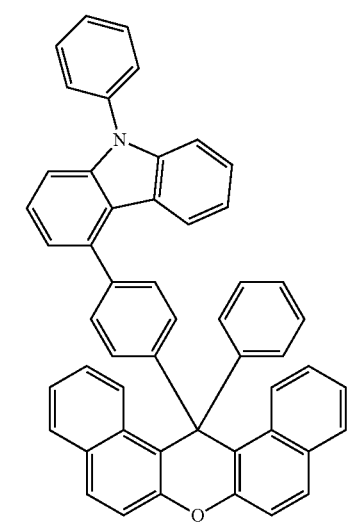

A118
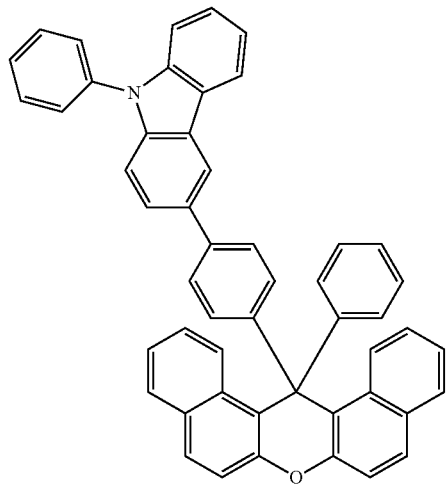
A119
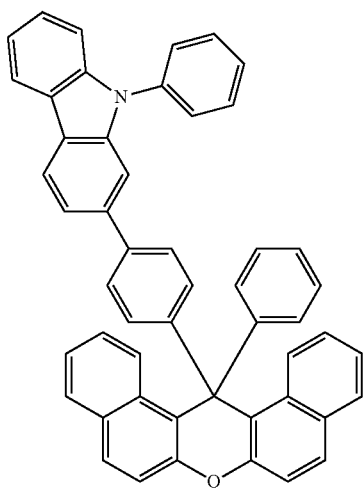
A120
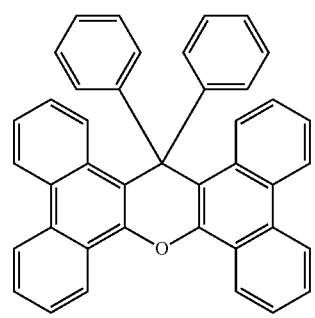
A121
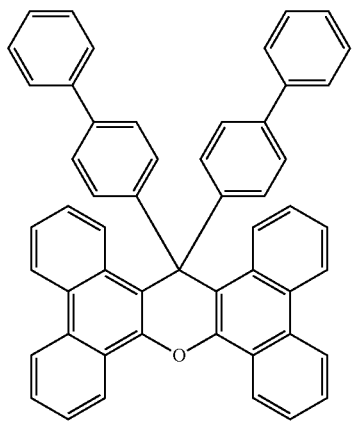
A122
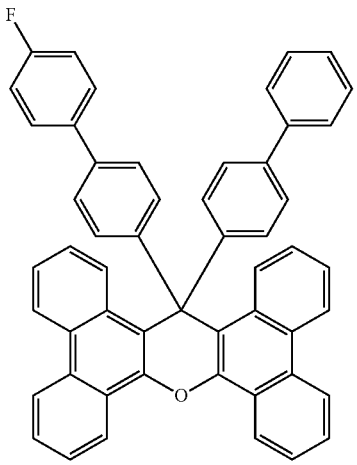
A123
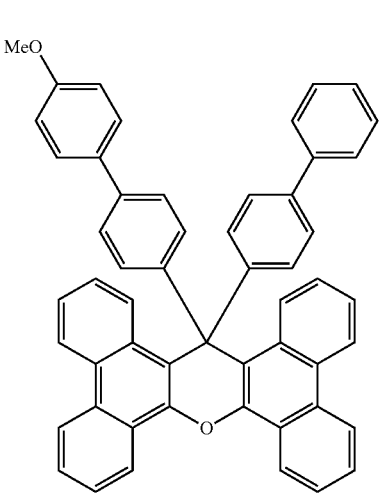

A124
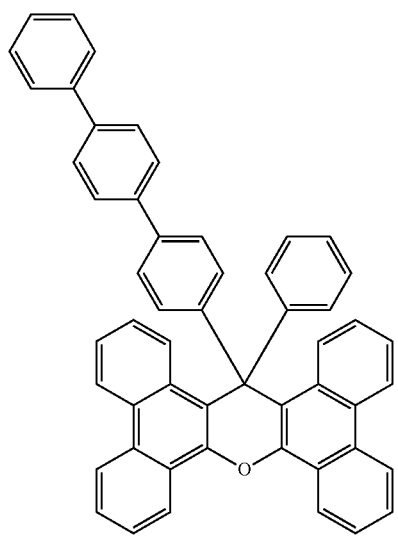
A125
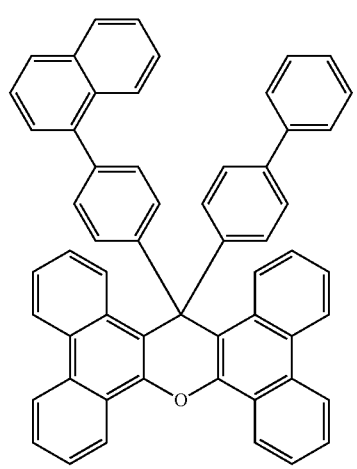
A126
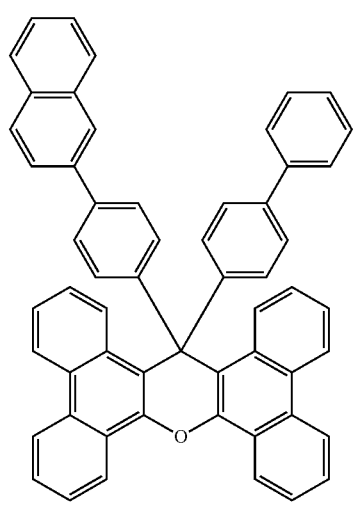
A127
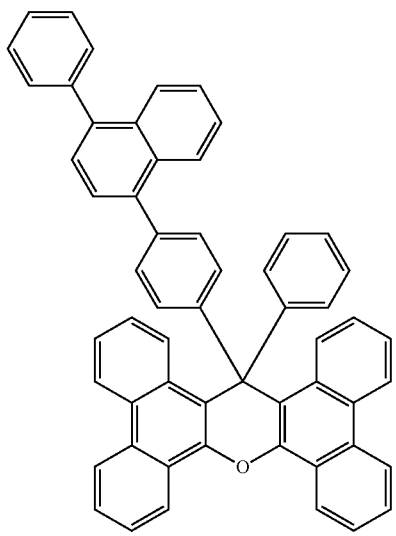
A128
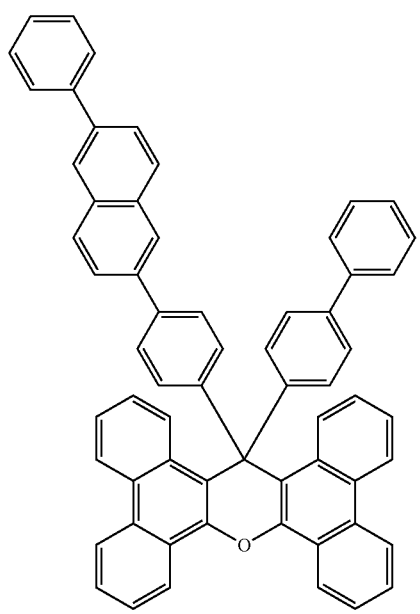
A129
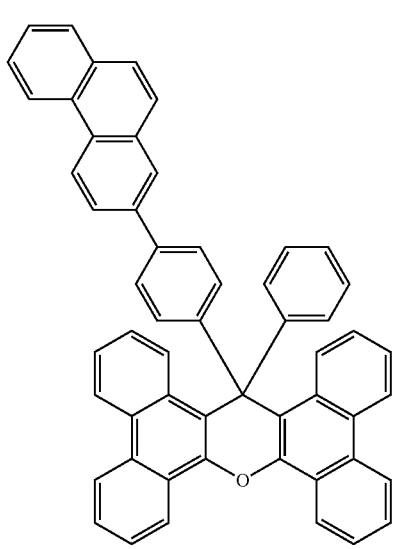

A130
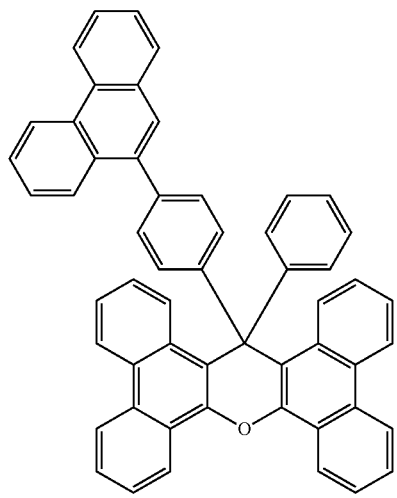
A131
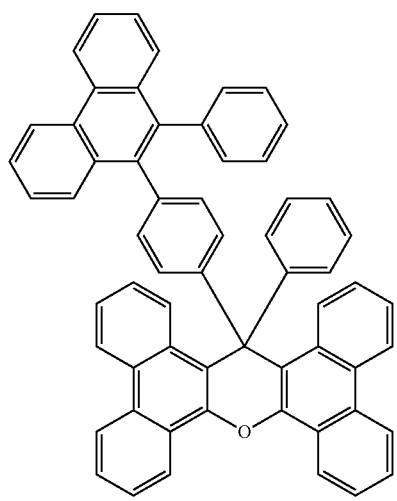
A132
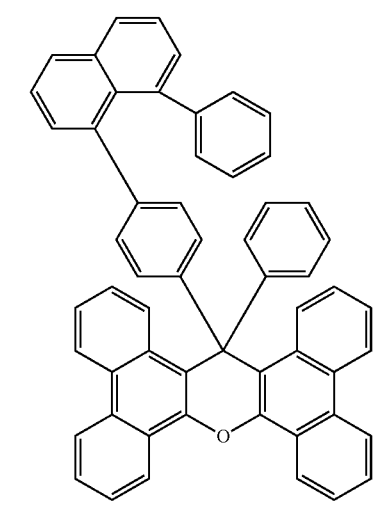
A133
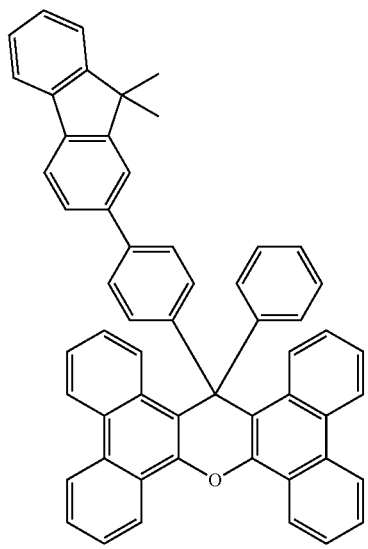
A134
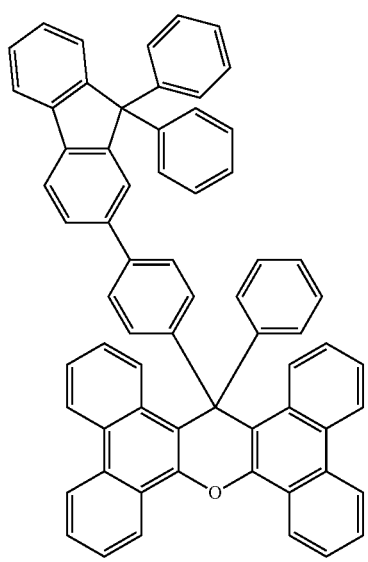
A135
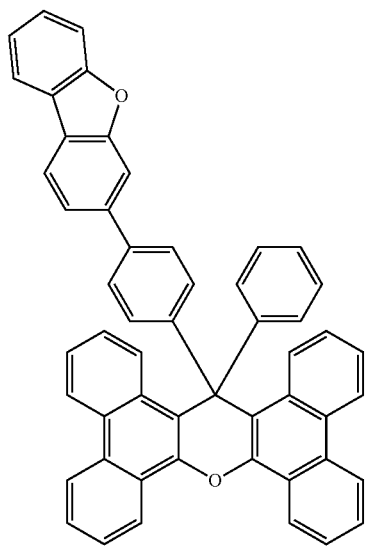

A136
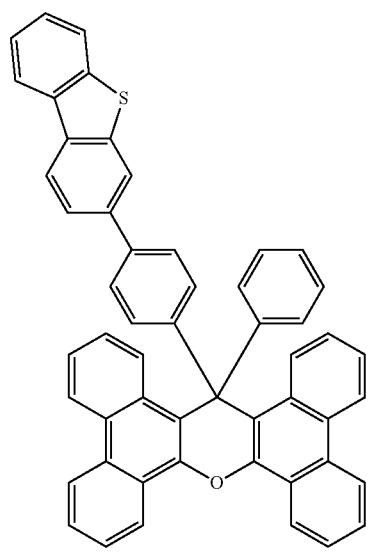
A137
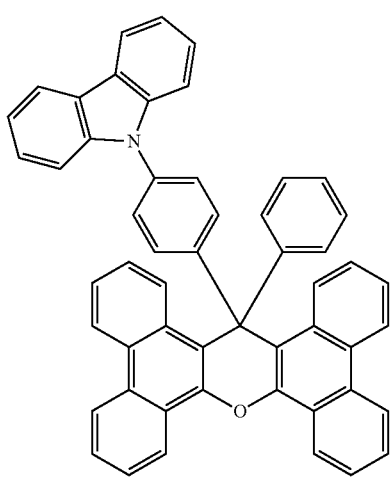
A138
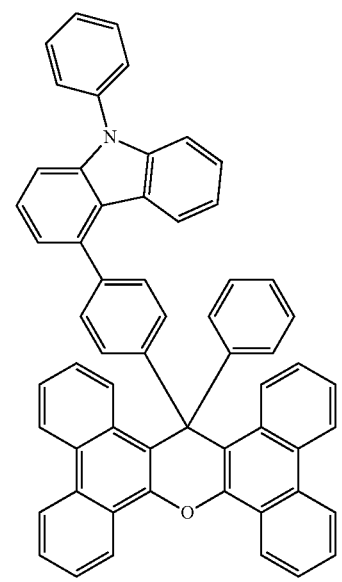
A139
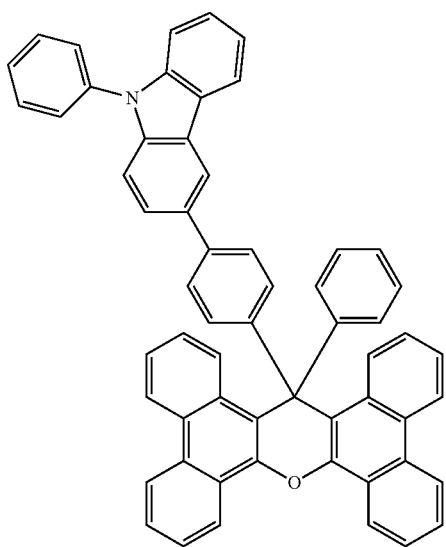
A140
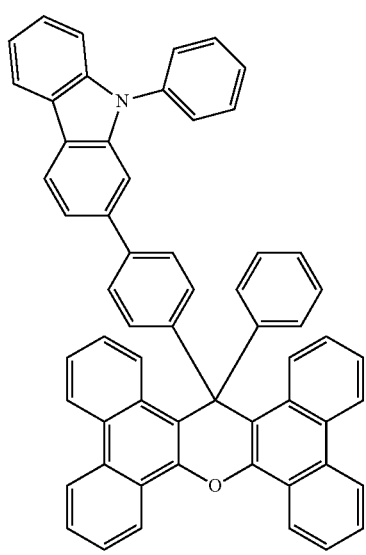
Compound Group 2
A141
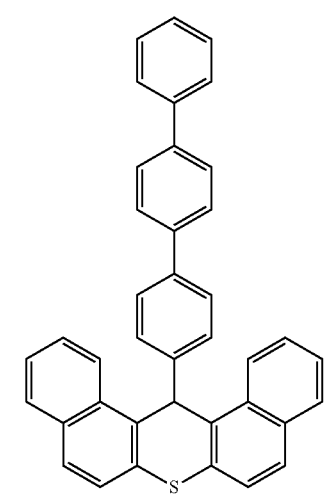

A142
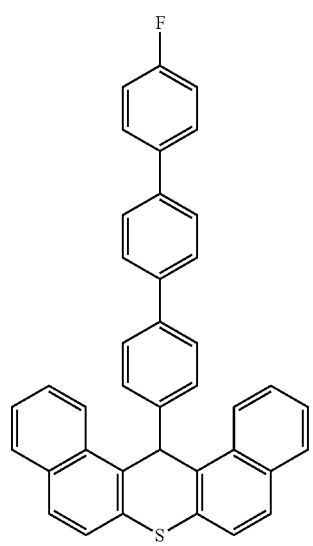
A143
A144
A145
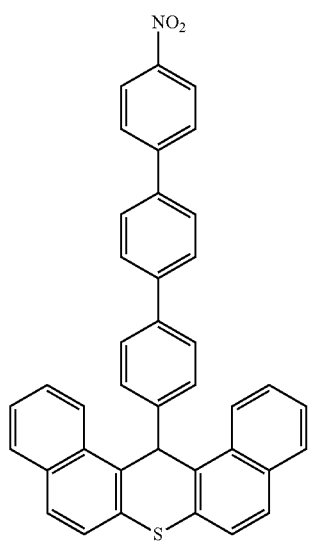
A146
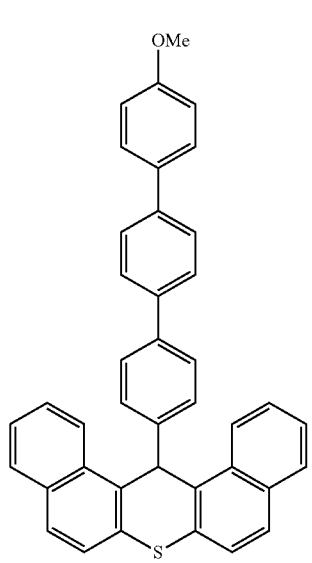
A147
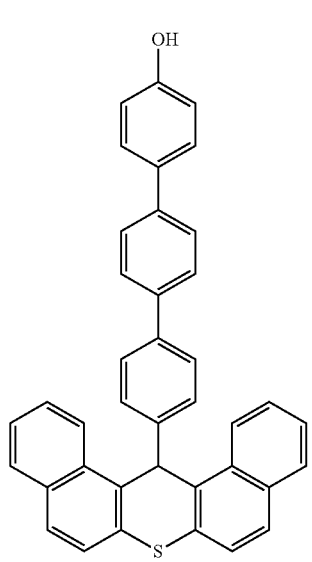

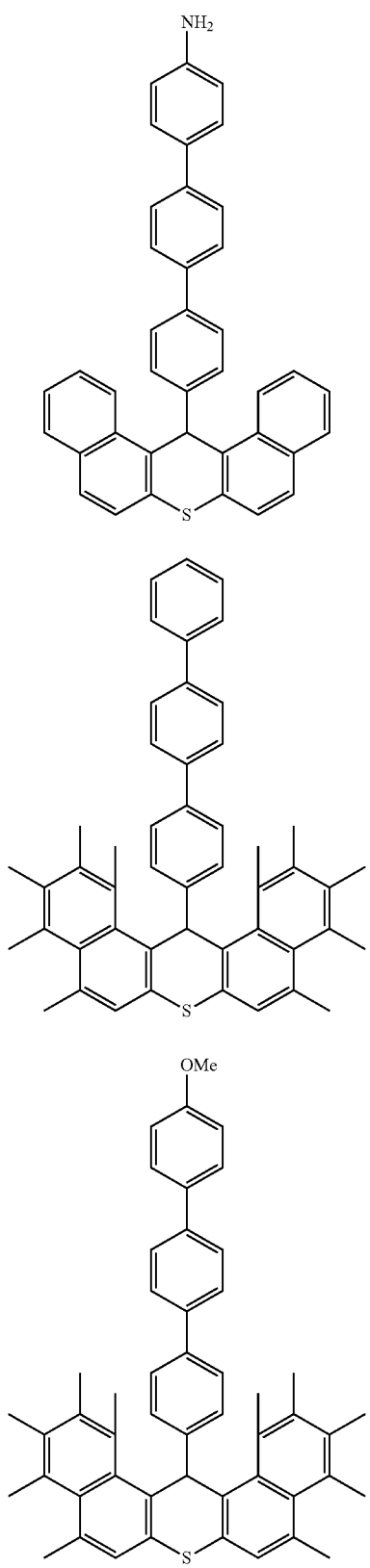
A148
A149
A150
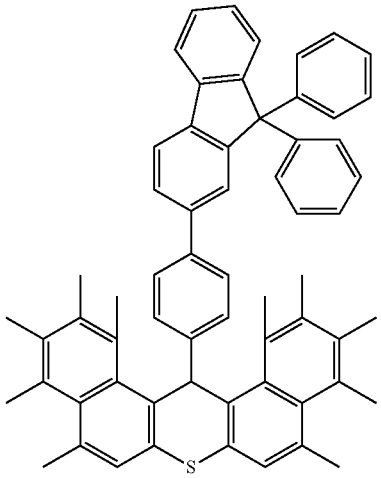
A151
A152
A153

A154 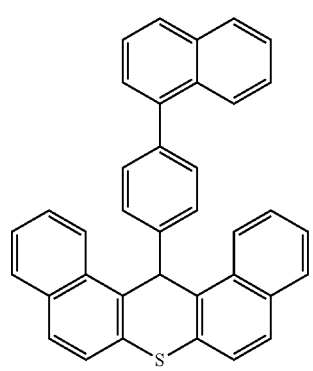
A155 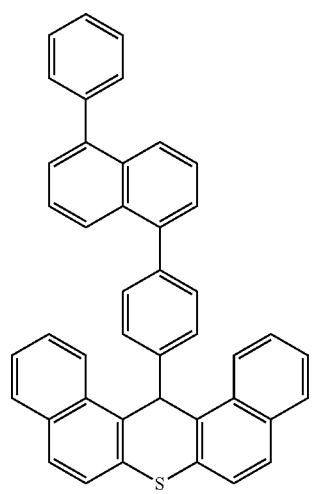
A156 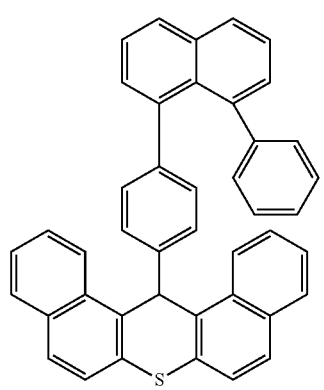
A157 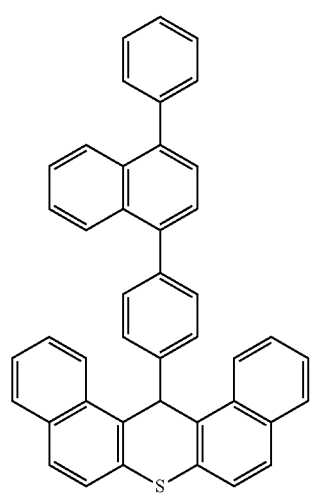
A158 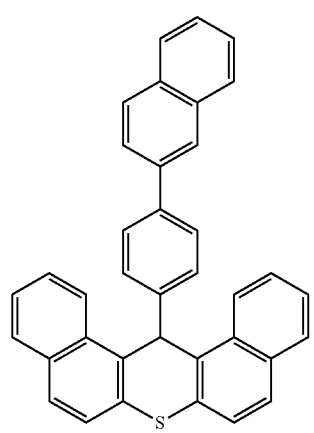
A159 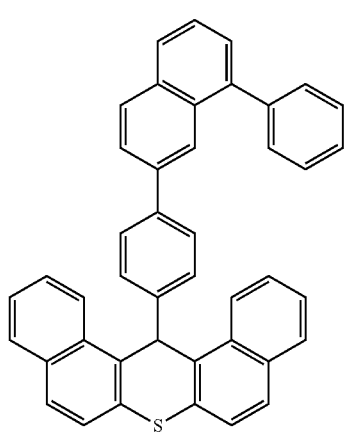

A160
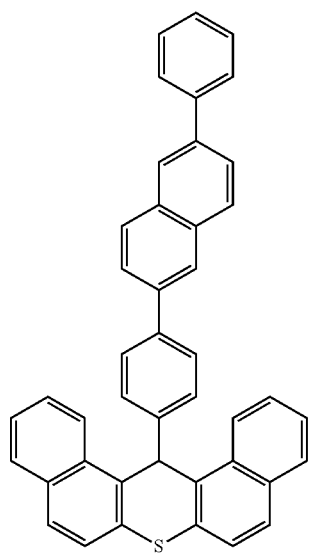
A161
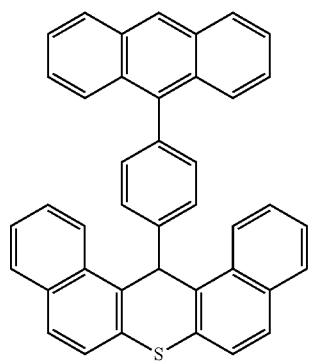
A162
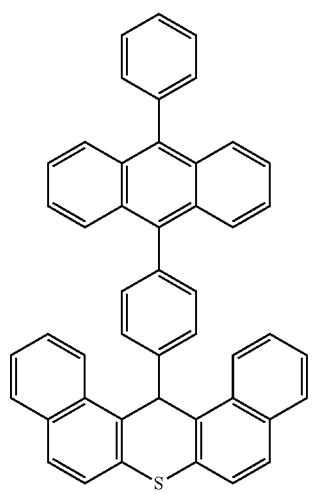
A163
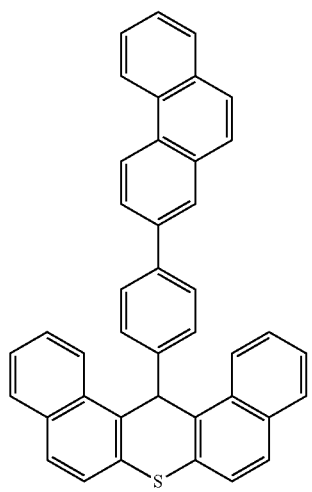
A164
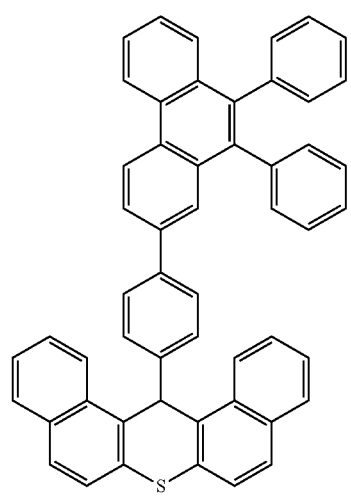
A165
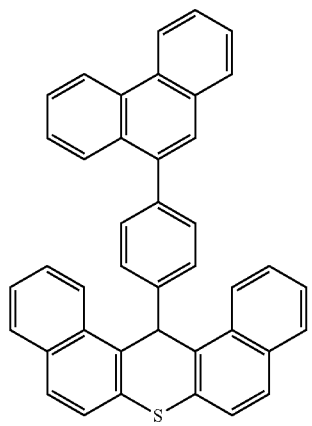

A166
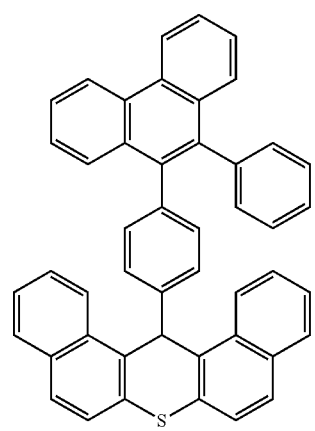
A167
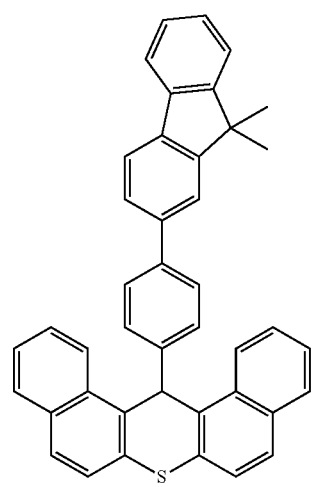
A168
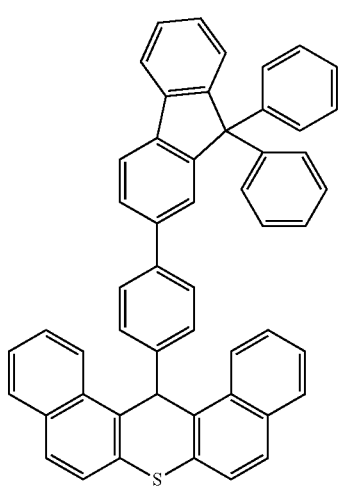
A169
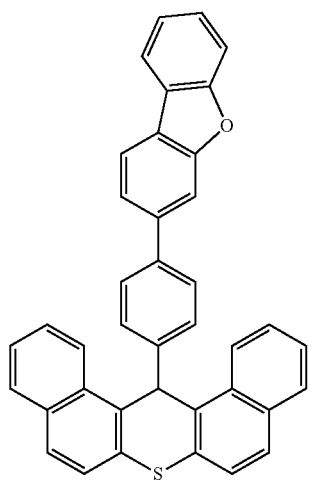
A170
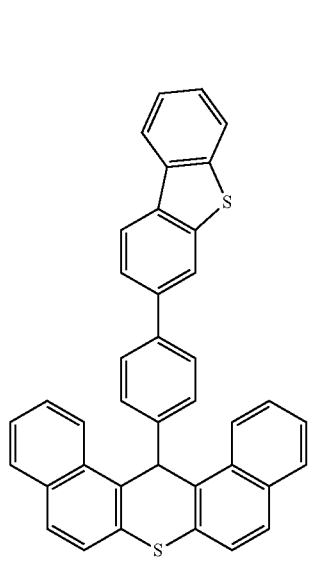
A171
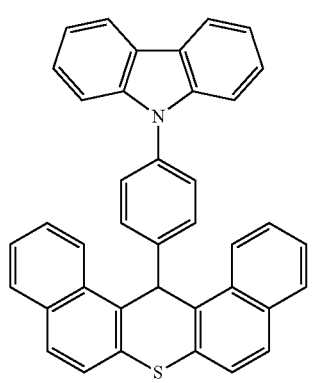

A172
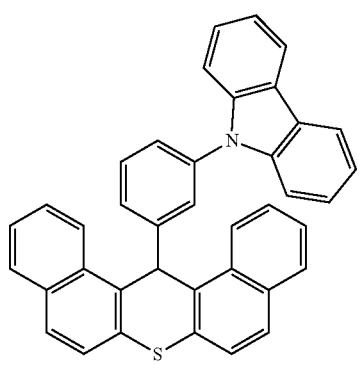
A173
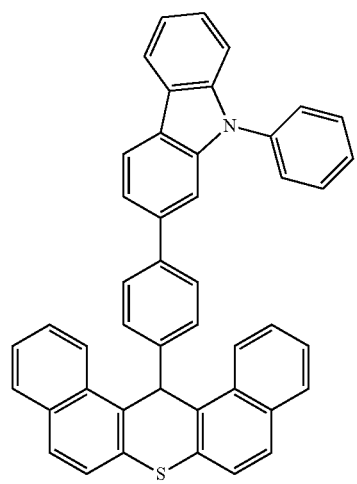
A174
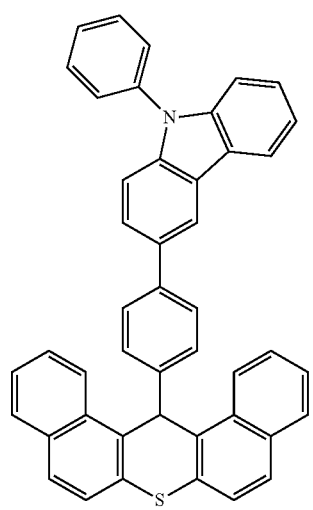
A175
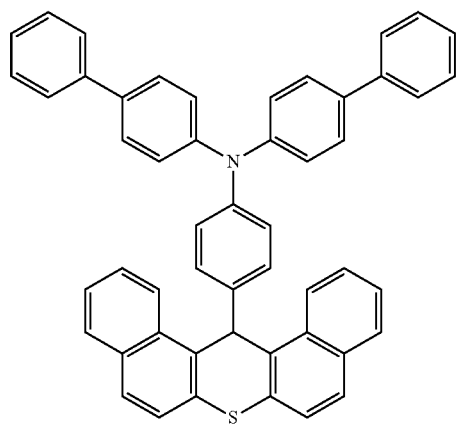
A176
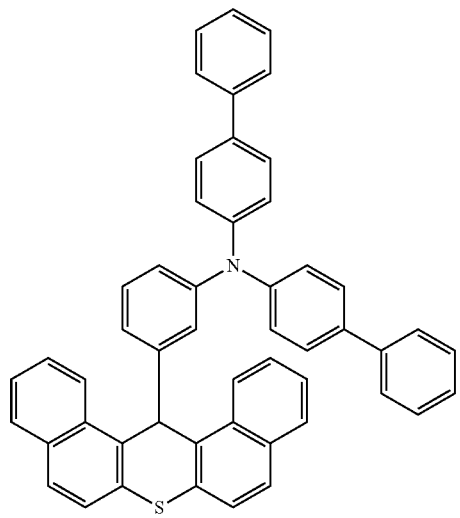
A177
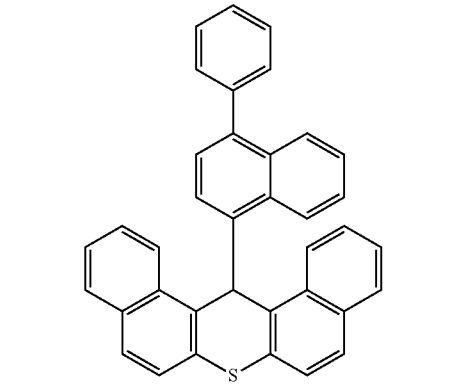

A178 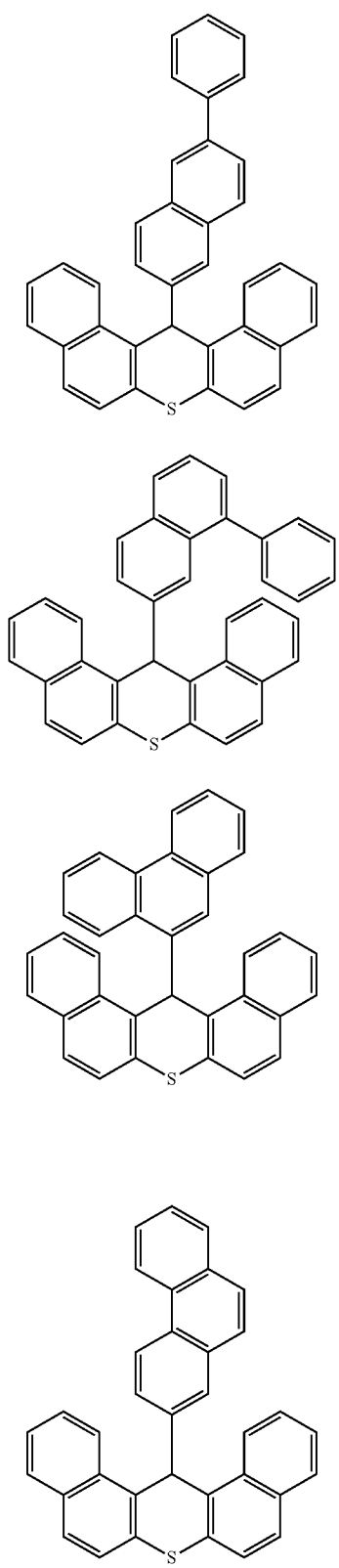
A179
A180
A181
A182 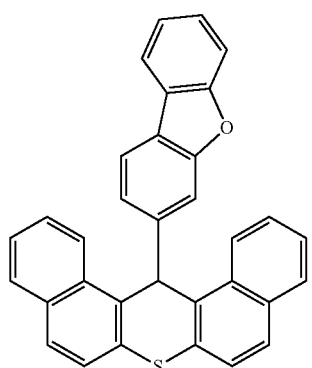
A183 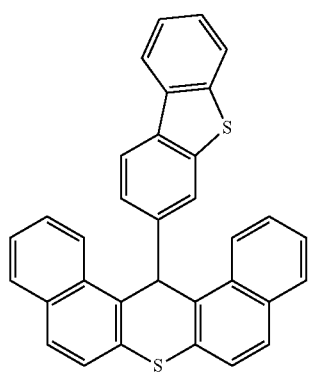
A184 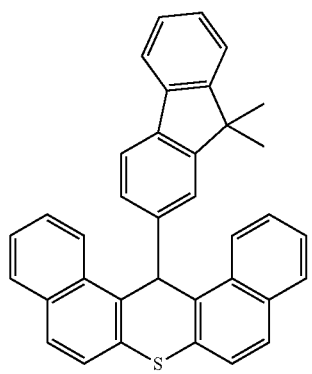
A185 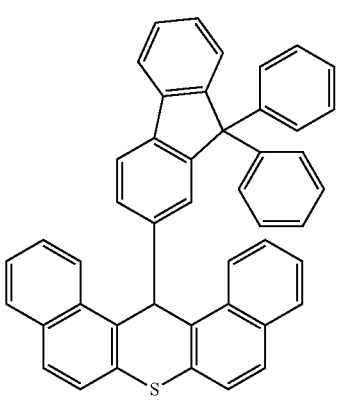

A186 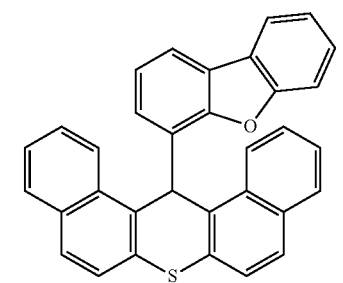
A187 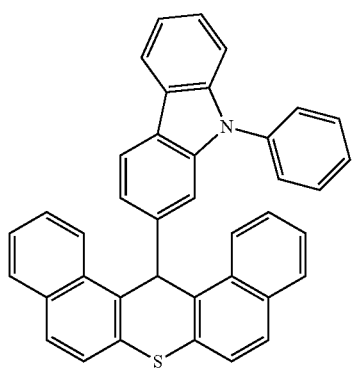
A188 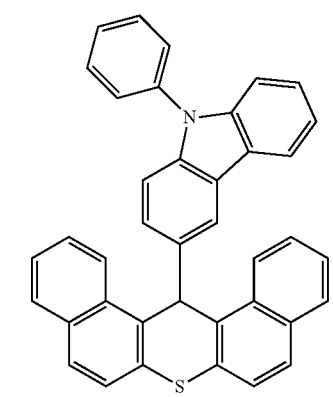
A189 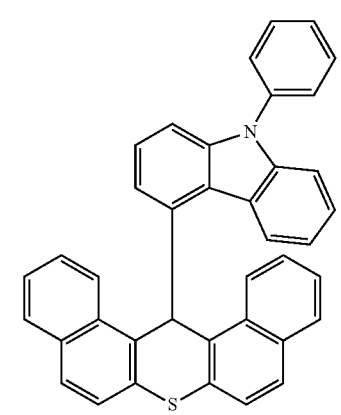
A190 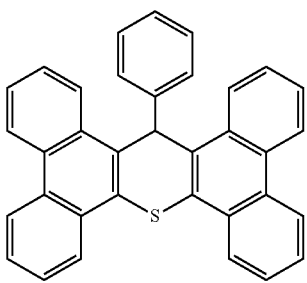
A191 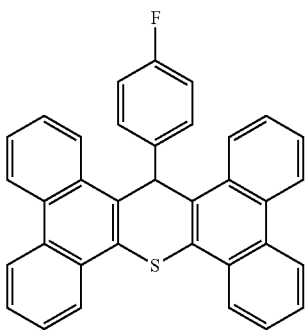
A192 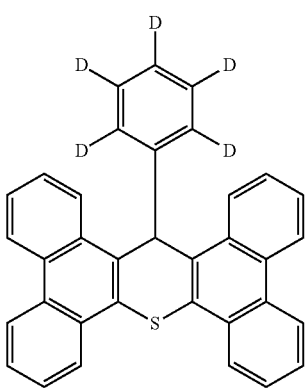
A193 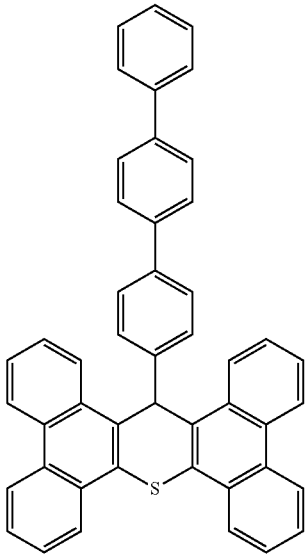

A194 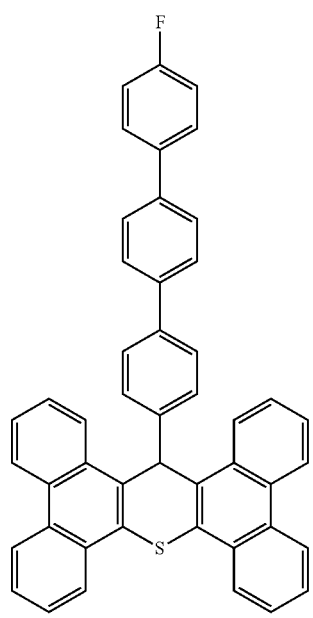
A196 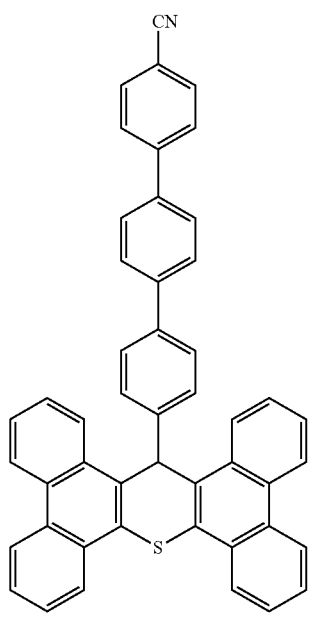
A195 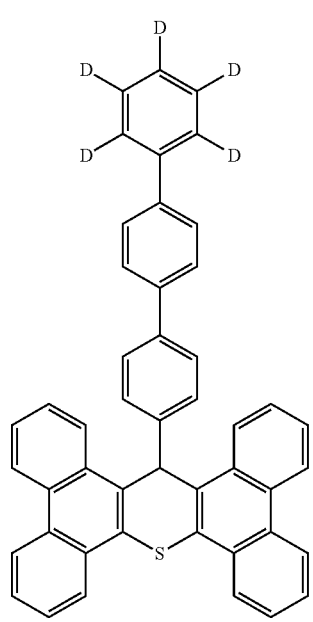
A197 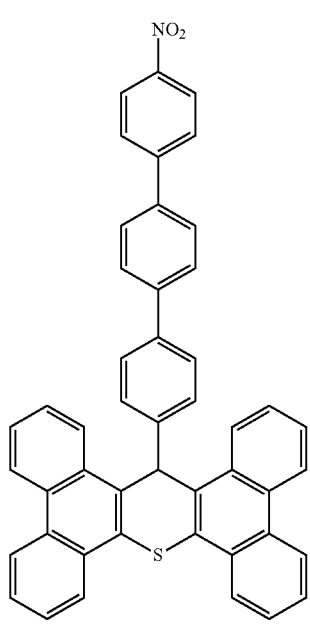

A198
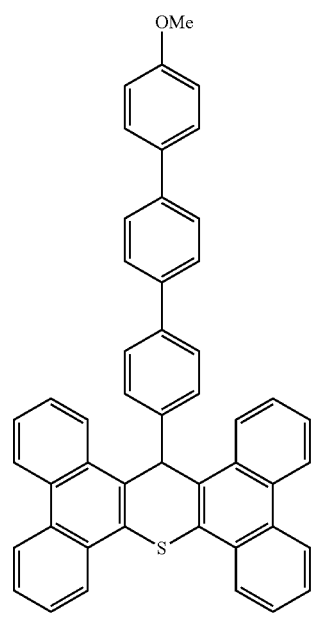
A199
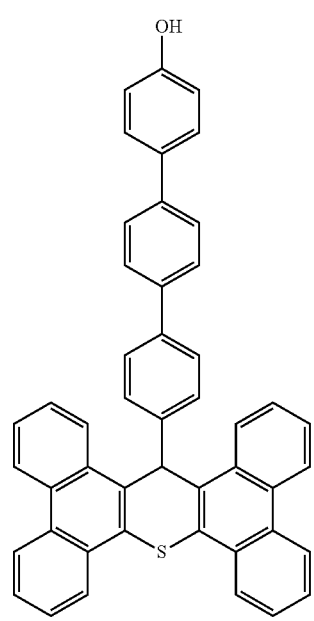
A200
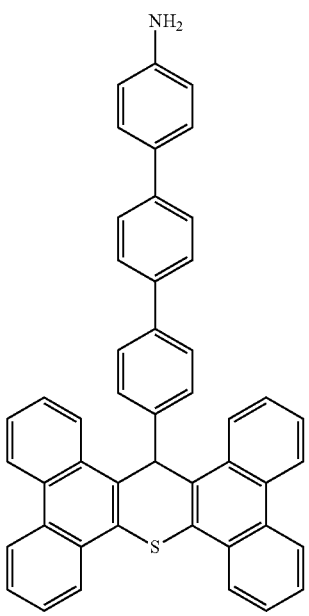
A201
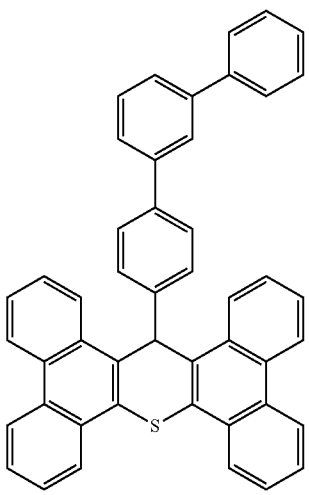
A202
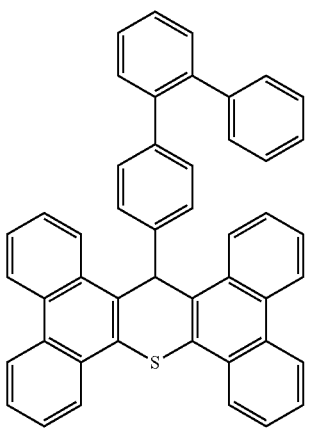

A203
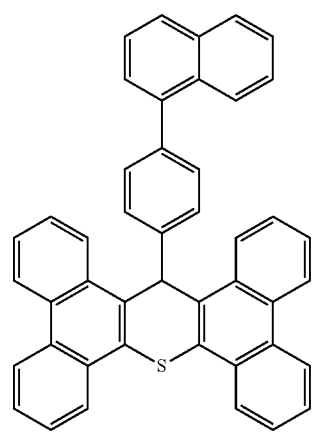
A204
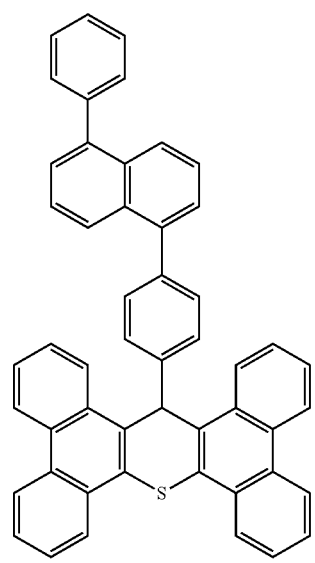
A205
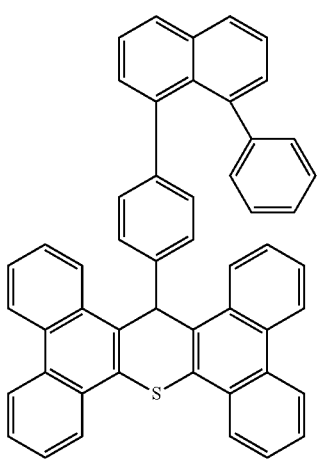
A206
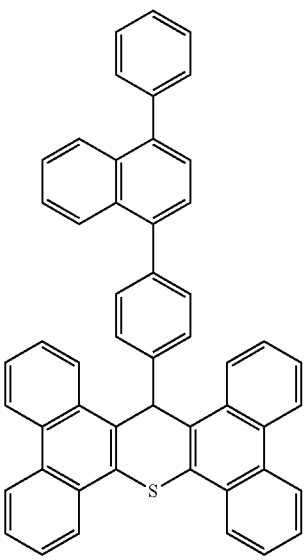
A207
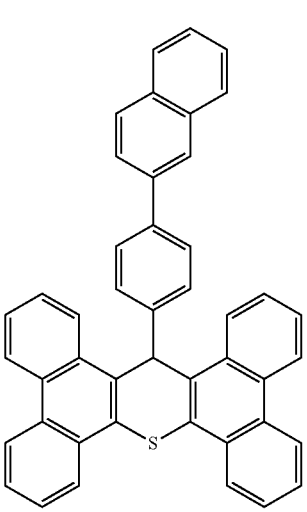
A208
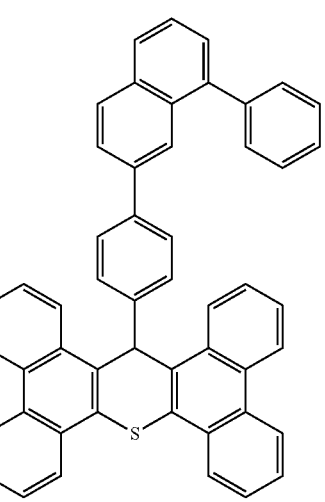

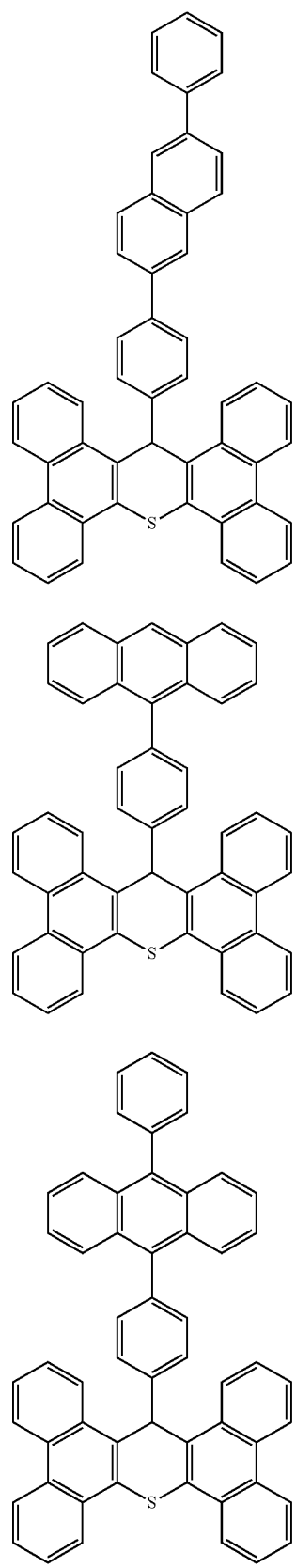
A209
A210
A211
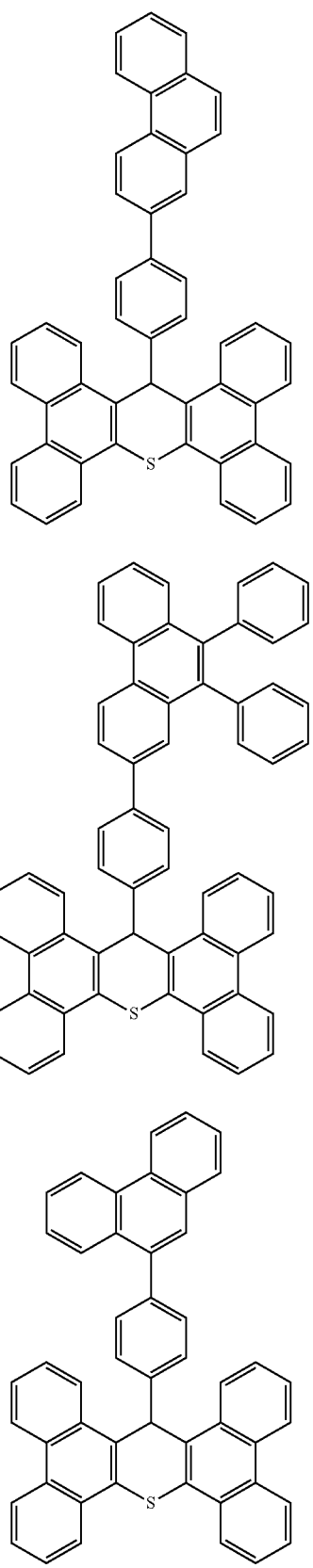
A212
A213
A214

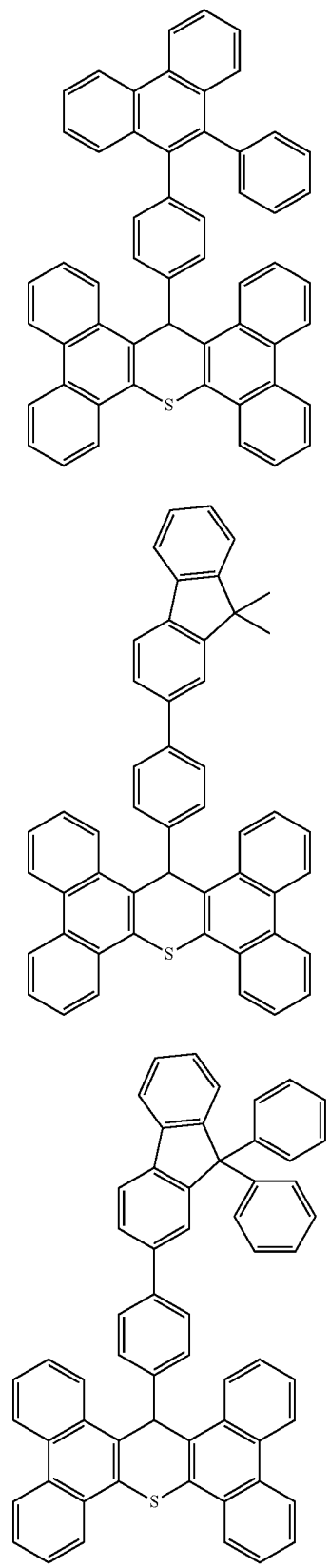
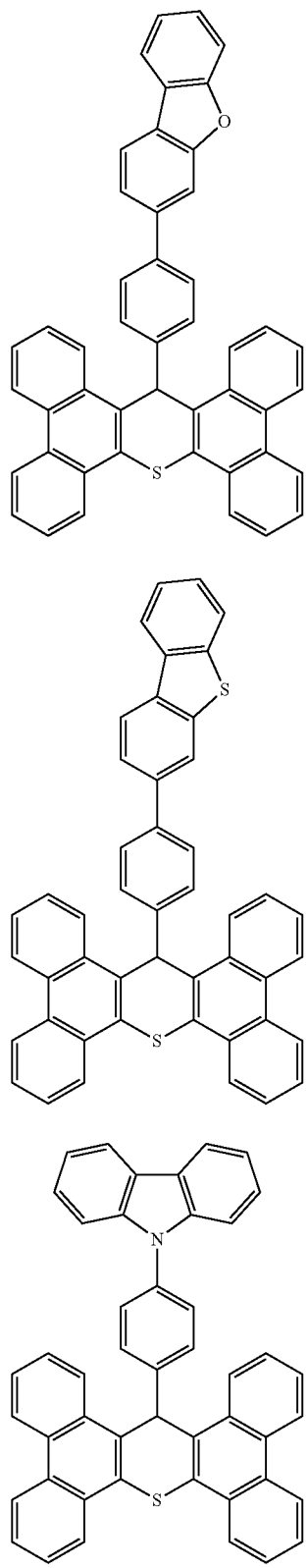

A221 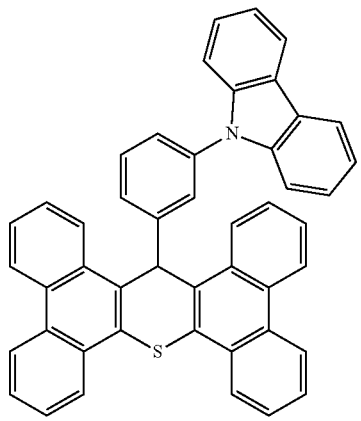
A222 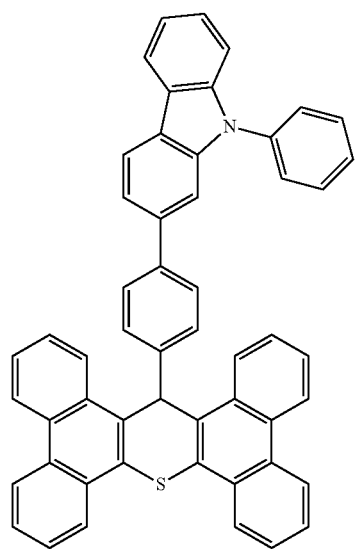
A223 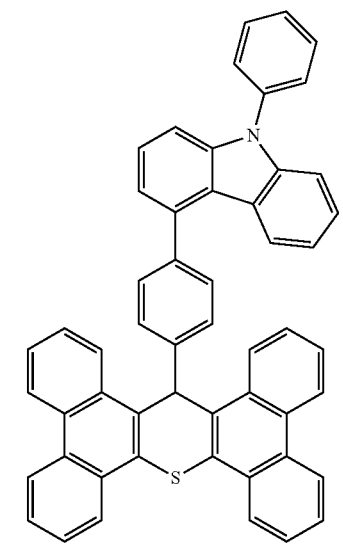
A224 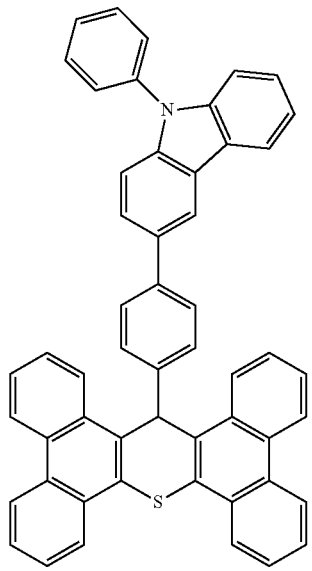
A225 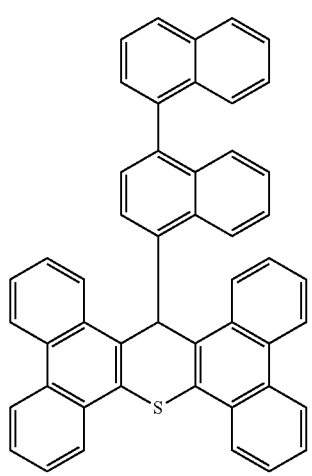
A226 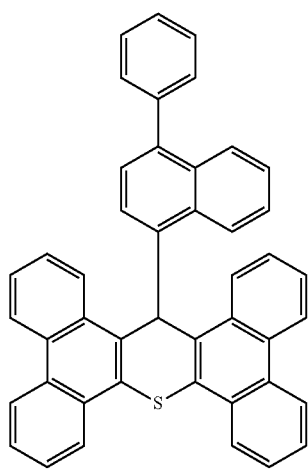

A227
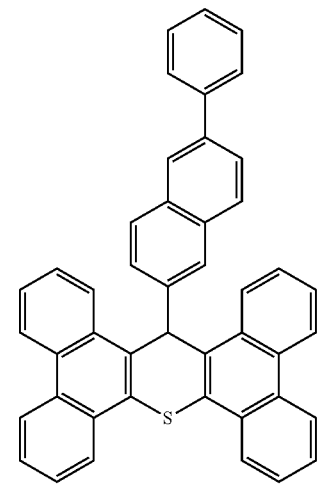
A228
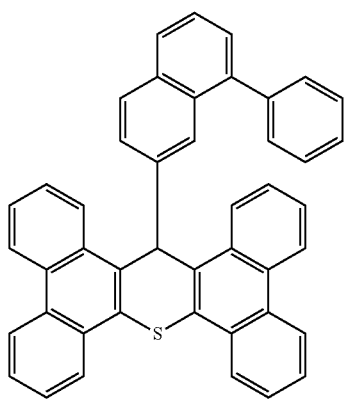
A229
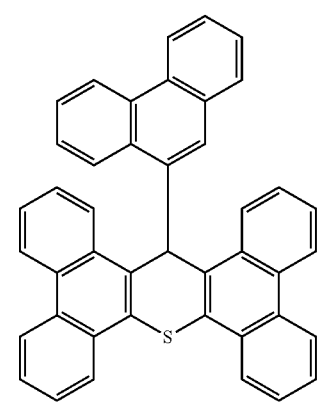
A230
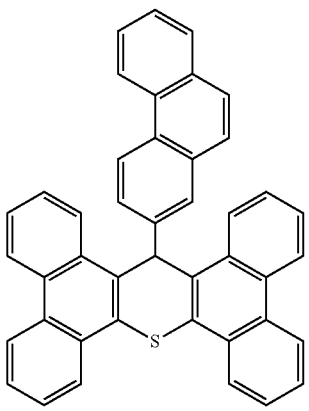
A231
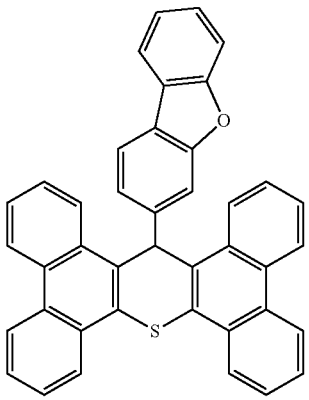
A232
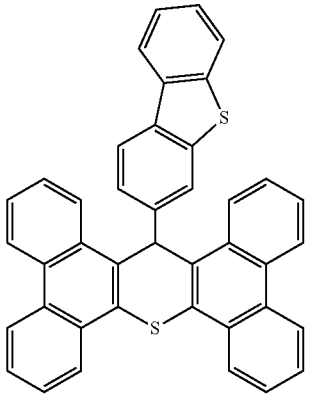
A233
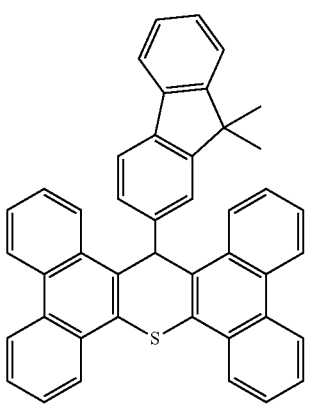

-continued
A234
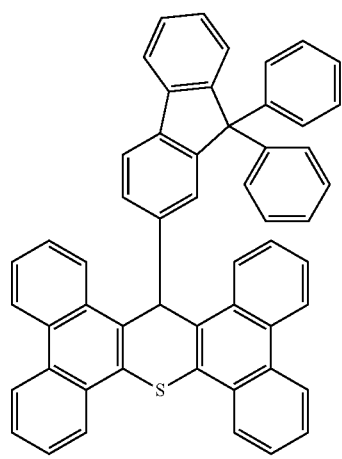
A235
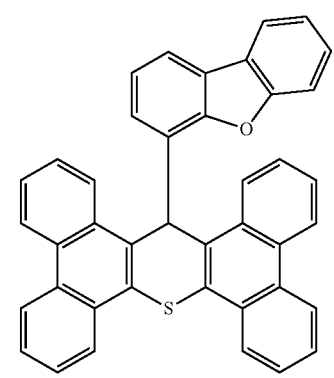
A236
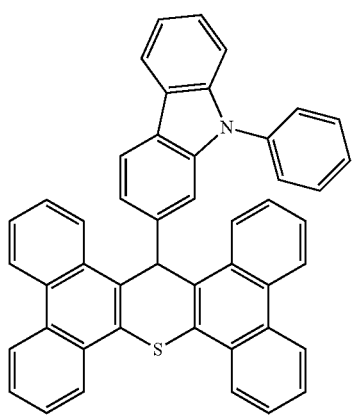
-continued
A237
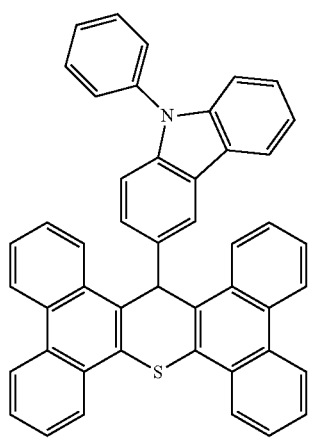
A238
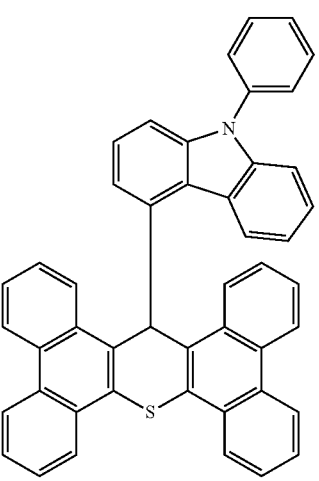
A239
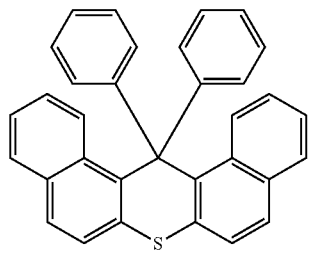
A240
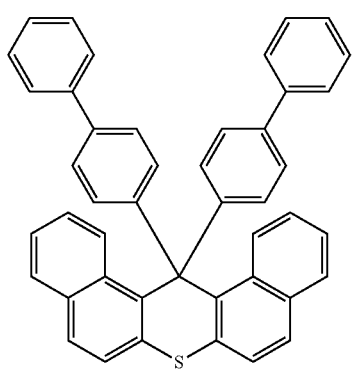

A241 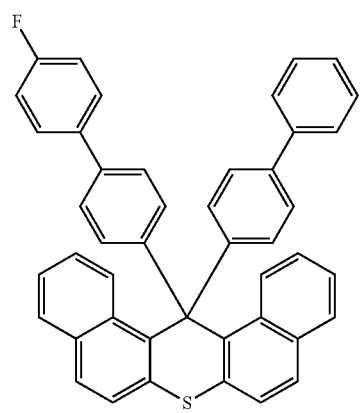
A242 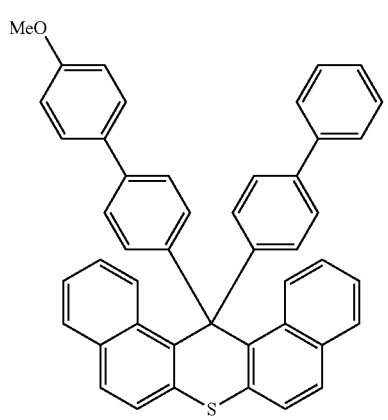
A243 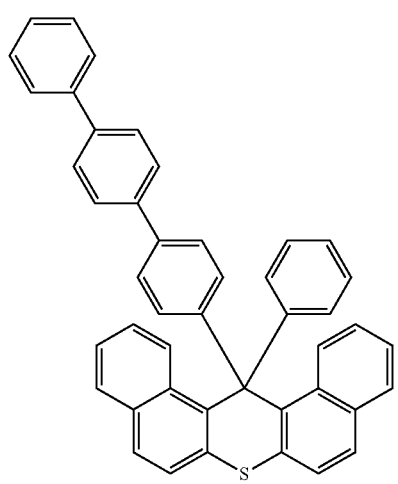
A244 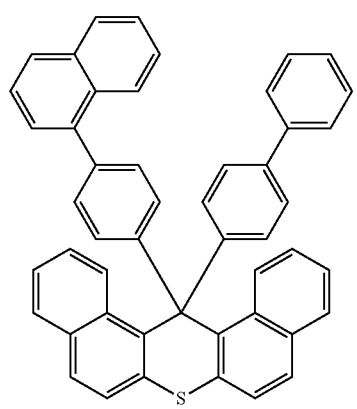
A245 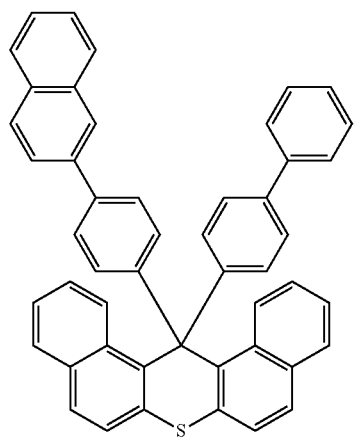
A246 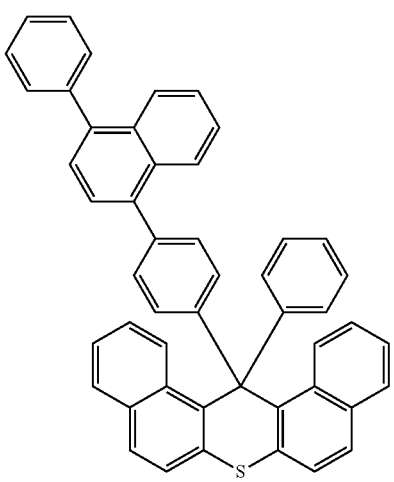

A247
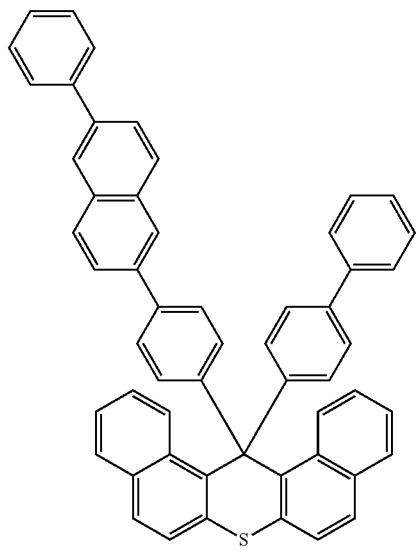
A248
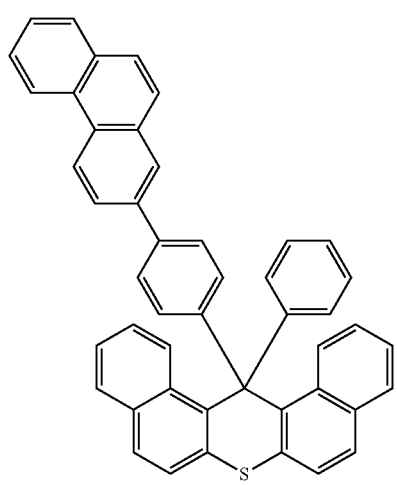
A249
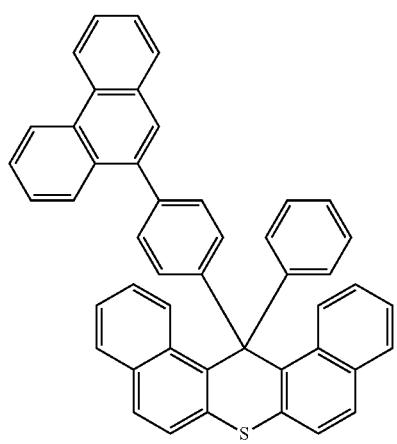
A250
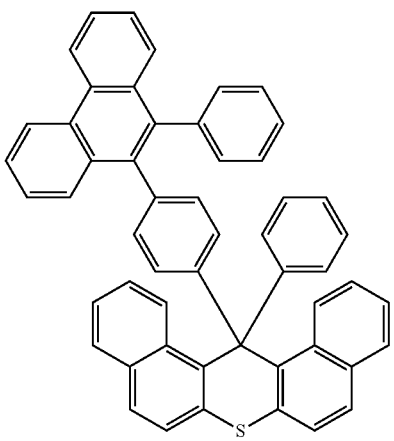
A251
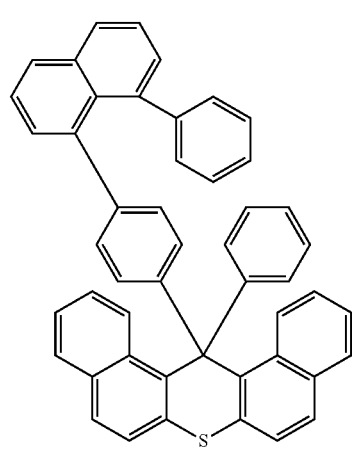
A252
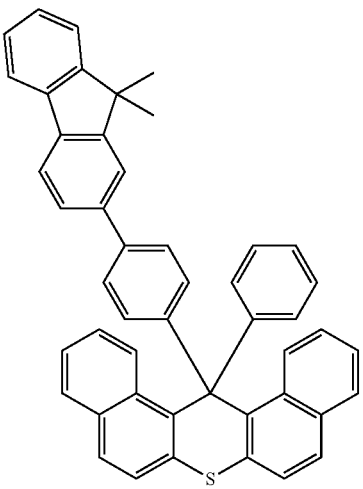

A253
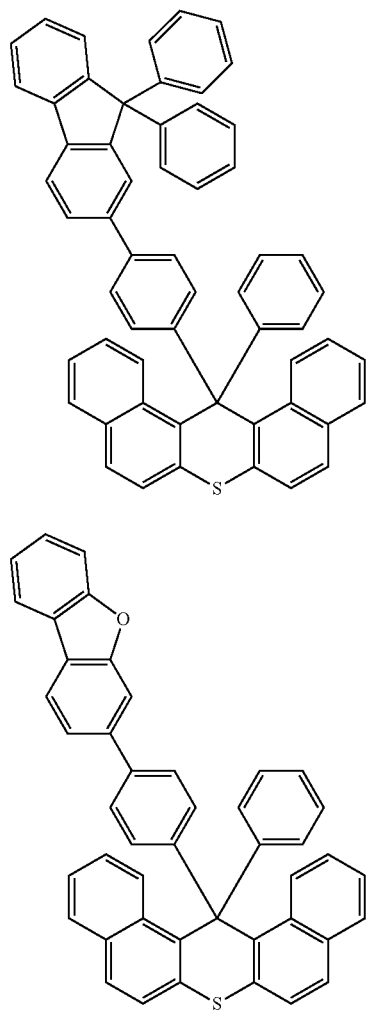
A254
A255
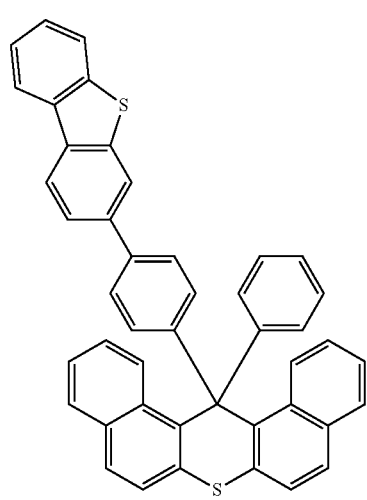
A256
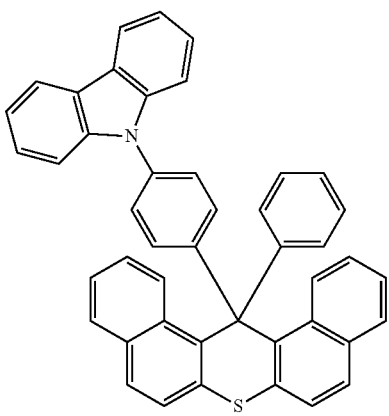
A257
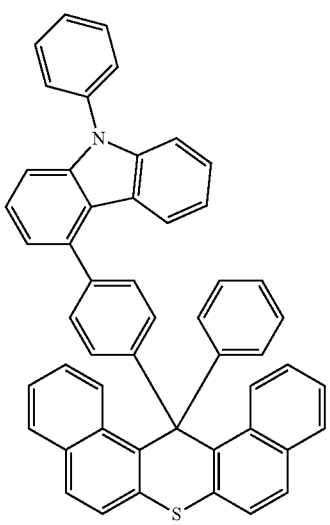
A258
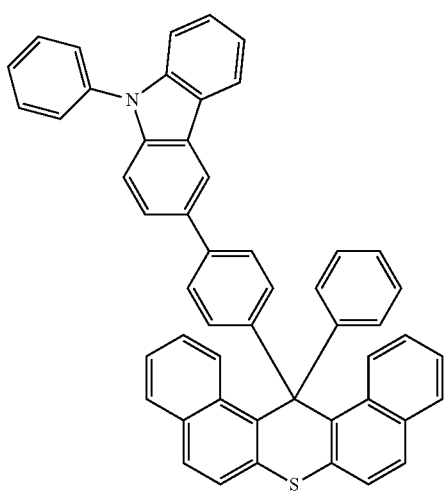

A259
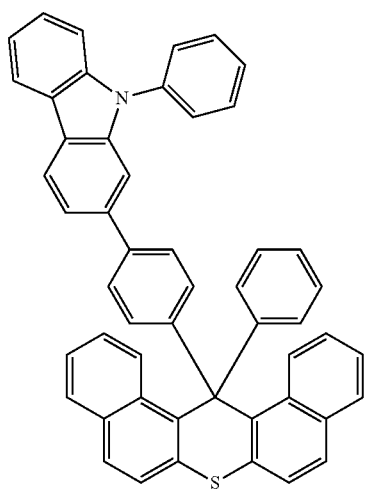
A260
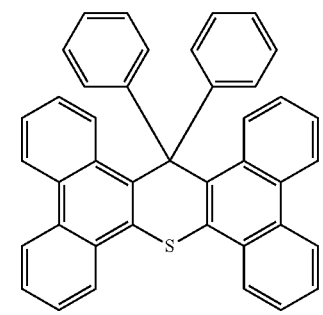
A261
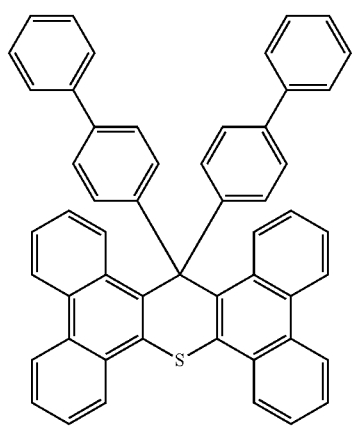
A262
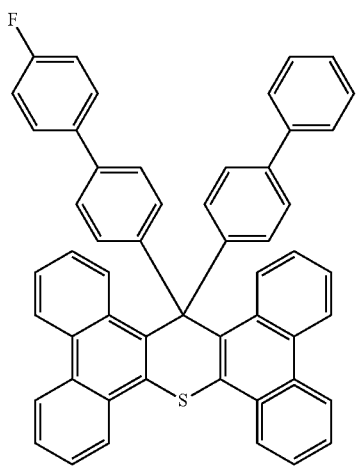
A263
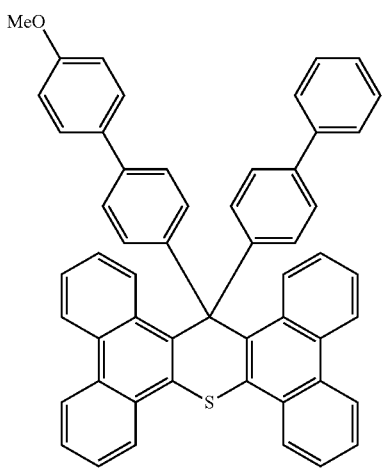
A264

A265
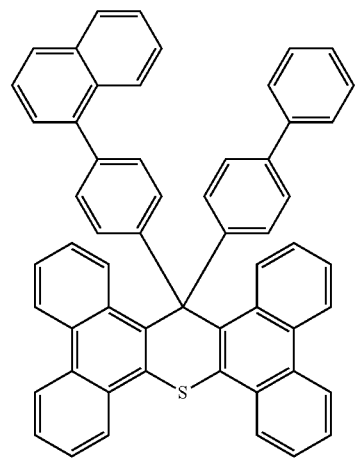
A266
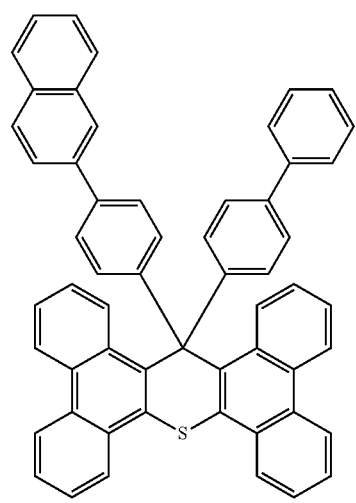
A267
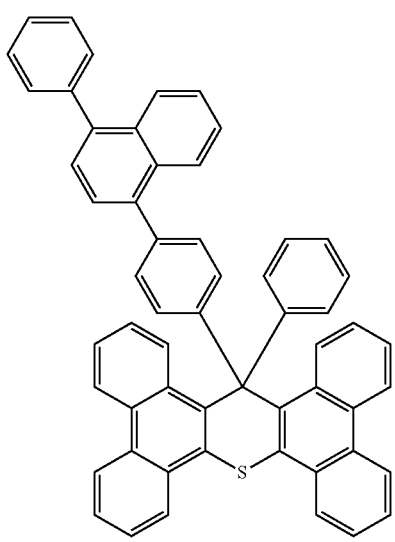
A268
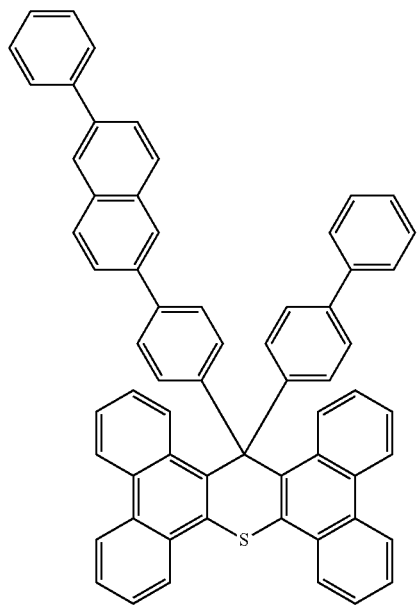
A269
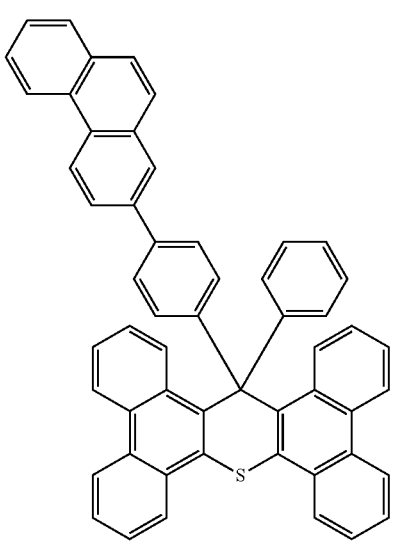
A270
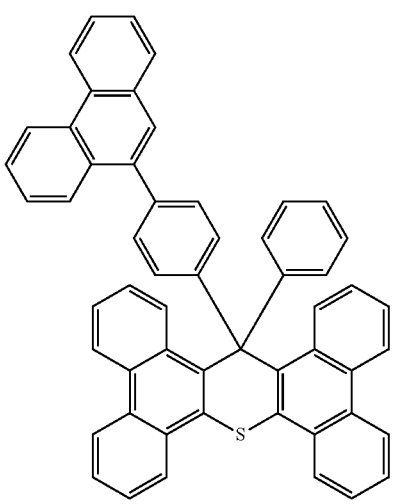

A271
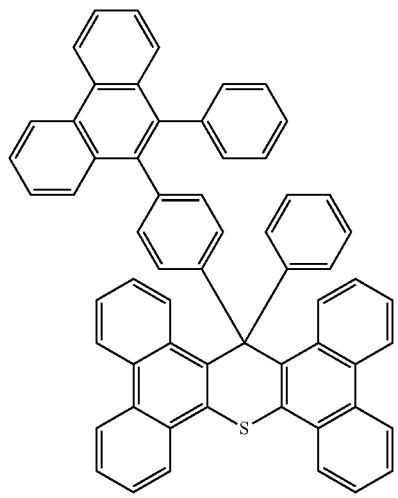
A272
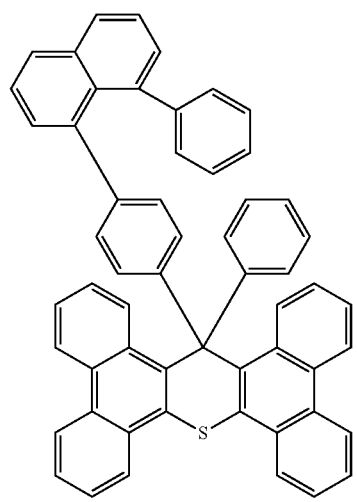
A273
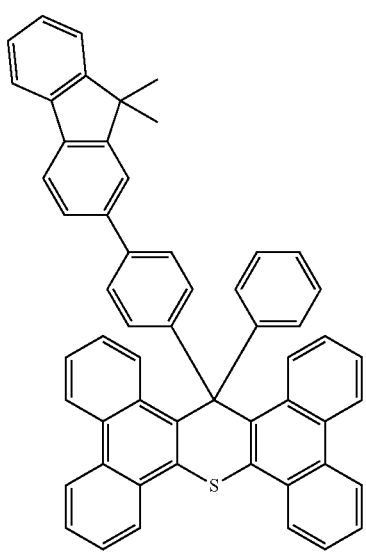
A274
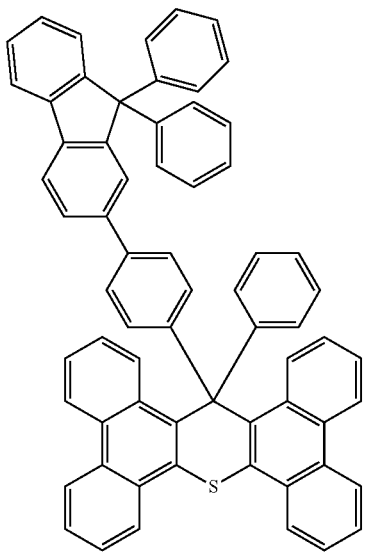
A275
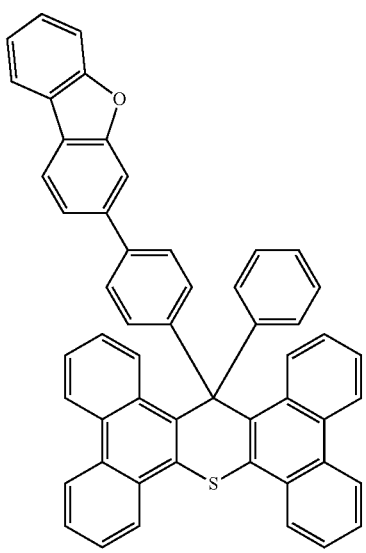
A276
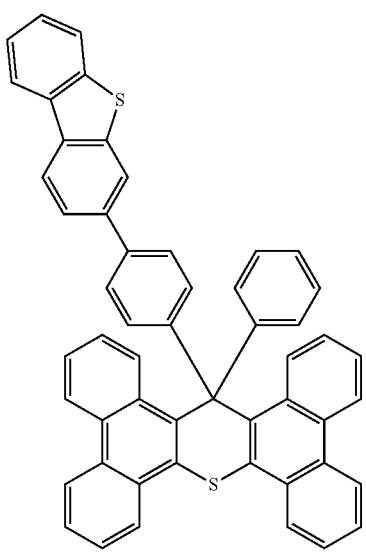

A277
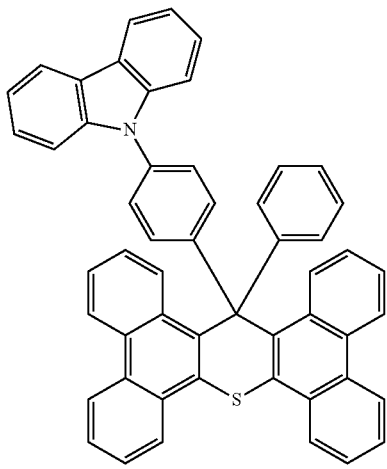
A278
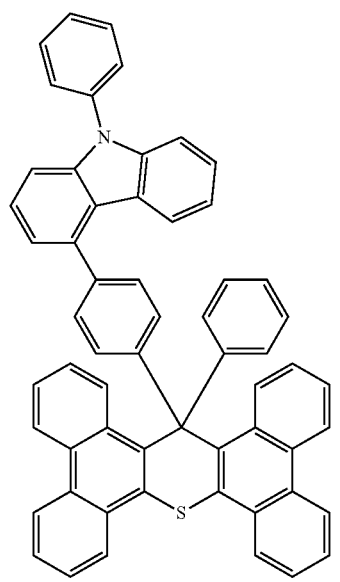
A279
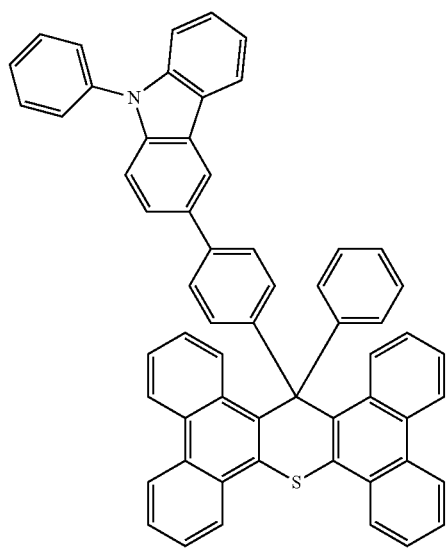
A280
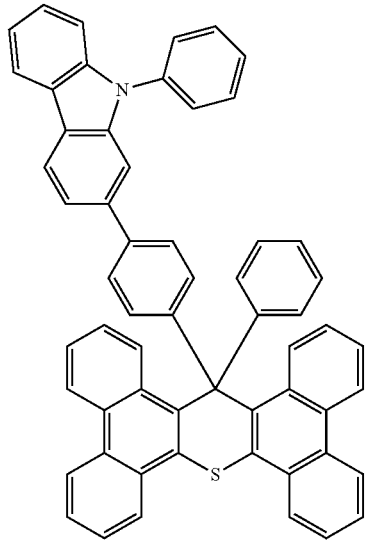
A281
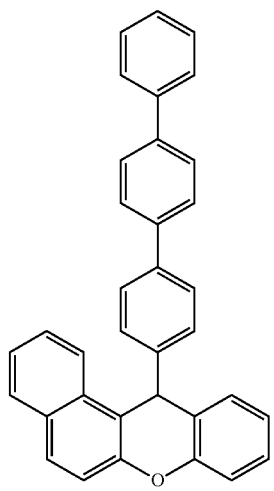
A282
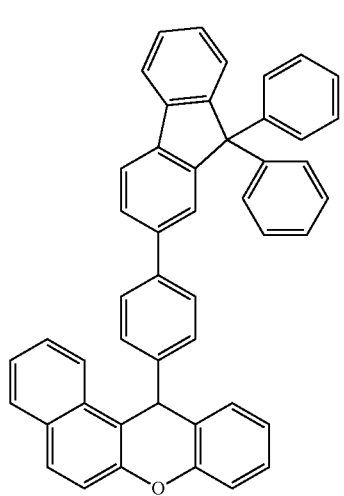

-continued
A283
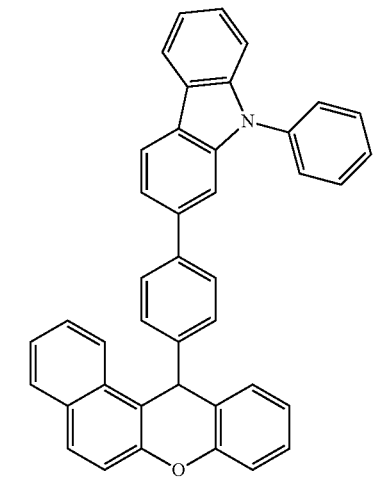
A284
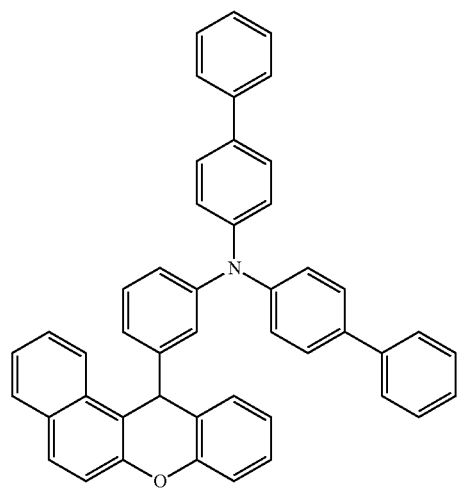
A285
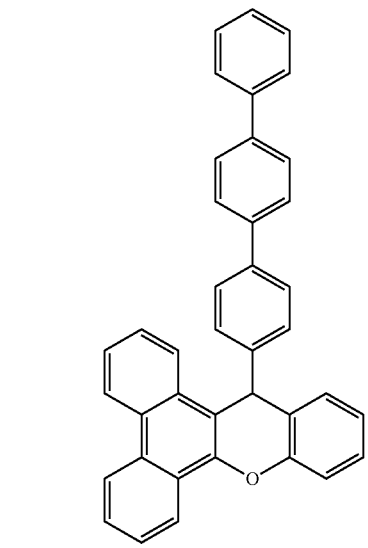
-continued
A286
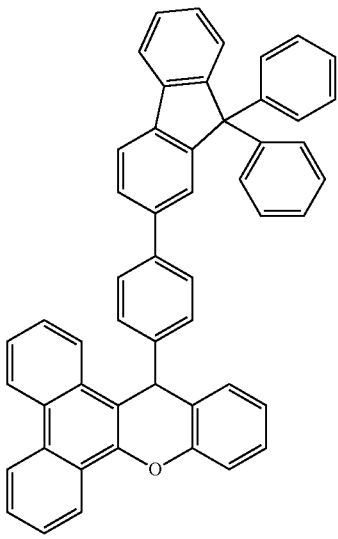
A287
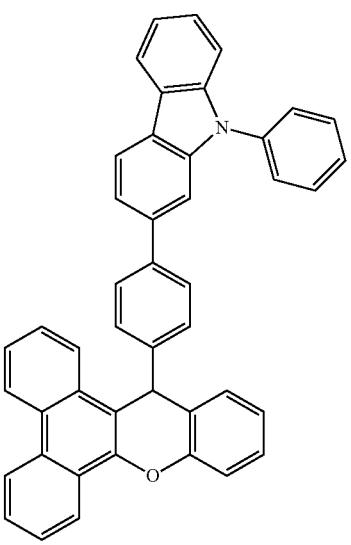
A288
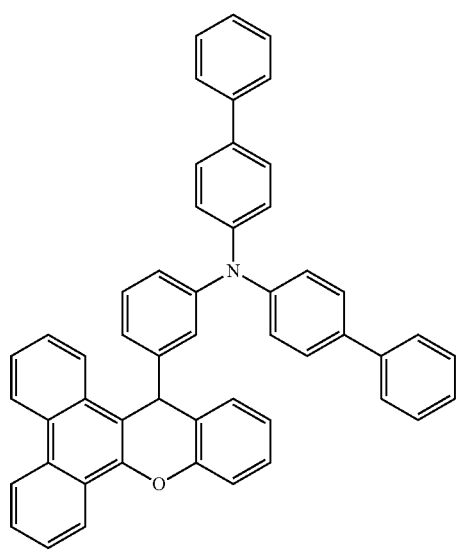

A289
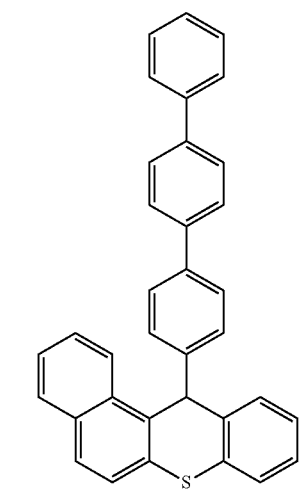
A290
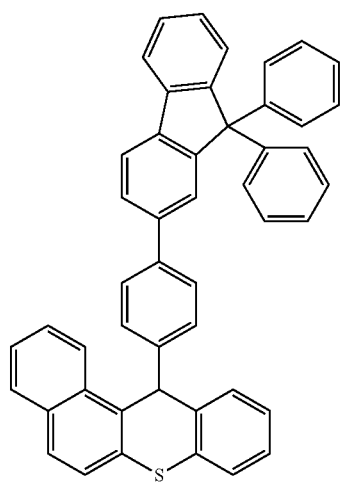
A291
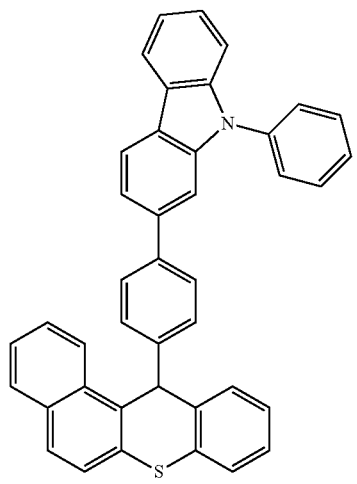
A292
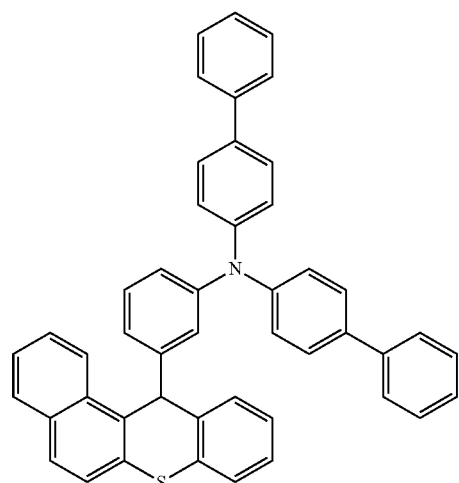
A293
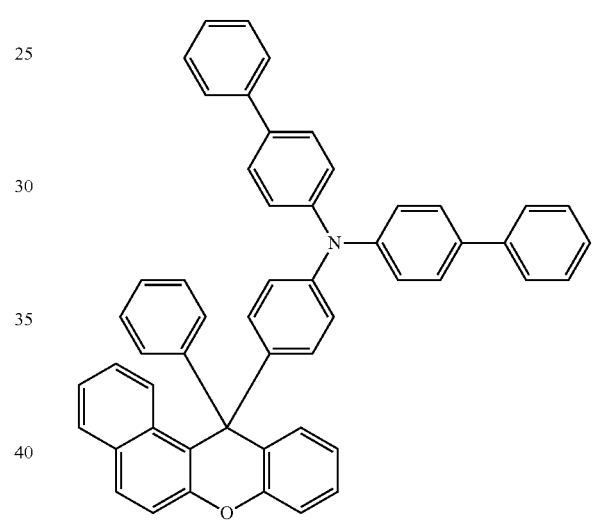
A294
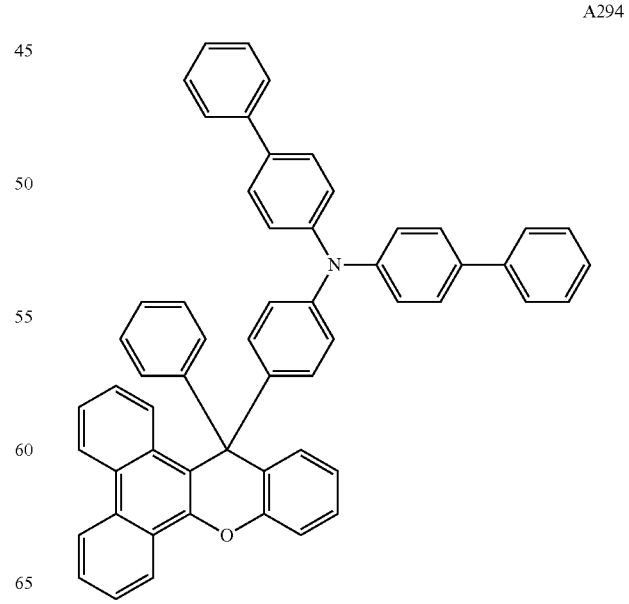

-continued

A295

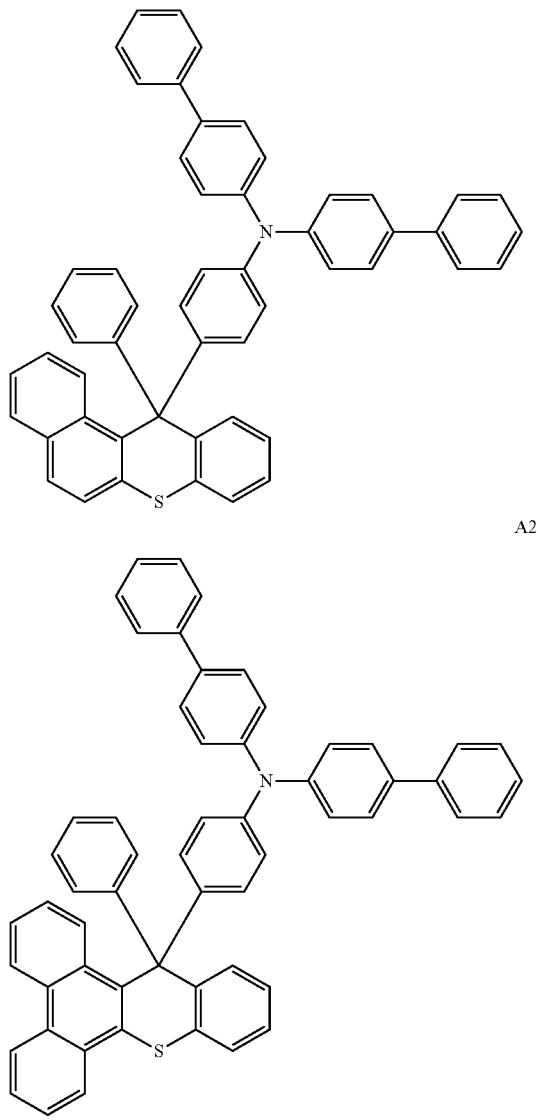

A296

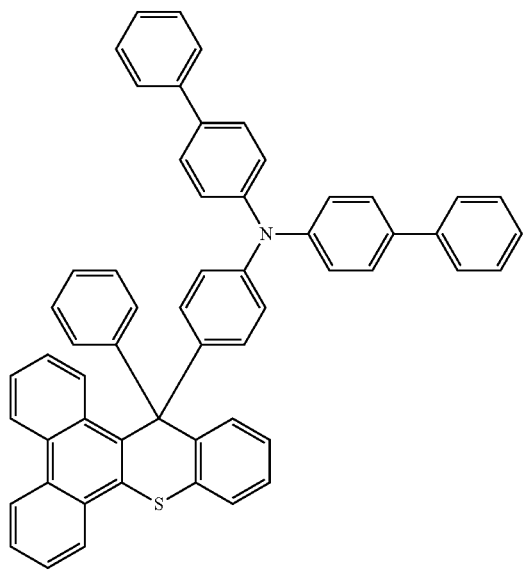

In the polycyclic compounds represented in Compound Group 1, "OMe" may refer to a methoxy group.

The polycyclic compound of an embodiment includes at least one hexagonal hydrocarbon ring which is condensed with a xanthene skeleton or a thioxanthene skeleton, and enhances substituents substituted (e.g., has enhanced substitution) in a carbon atom (e.g., the carbon atom with the substituents $Ar_1$ and $Ar_2$) which is composed of (e.g., includes) a sp3 orbital while forming a xanthene skeleton or a thioxanthene skeleton. If the polycyclic compound is included in an organic electroluminescence device, both long-life characteristics and high emission efficiency may be achieved.

In the organic electroluminescence devices 10 of exemplary embodiments, shown in FIGS. 1 to 3, the hole transport region HTR may include one kind or two or more kinds of the polycyclic compounds represented in Compound Group 1 and Compound Group 2. Also, the hole transport region HTR may further include a suitable (e.g., known) material in addition to the polycyclic compounds in Compound Group 1 and Compound Group 2.

In addition, in the organic electroluminescence device 10 of an embodiment, if the hole transport region HTR is composed of (e.g., includes) a plurality of organic layers, the polycyclic compound of an embodiment may be included in an organic layer adjacent to the emission layer EML in the hole transport region HTR. For example, the polycyclic compound of an embodiment may be included in the hole transport layer HTL of the hole transport region HTR. In addition, if the hole transport layer HTL includes a plurality of organic layers, the polycyclic compound of an embodiment may be included in a layer adjacent to the emission layer EML from among the plurality of organic layers.

For example, if the hole transport region HTR of the organic electroluminescence device 10 of an embodiment includes a hole injection layer HIL and a hole transport layer HTL, the polycyclic compound of an embodiment may be included in the hole transport layer HTL, and if the hole transport region HTR of the organic electroluminescence device of an embodiment includes a hole injection layer HIL, a hole transport layer HTL and an electron blocking layer EBL, the polycyclic compound of an embodiment may be included in the electron blocking layer EBL.

In the organic electroluminescence device 10 of an embodiment, if the hole transport layer HTL includes the polycyclic compound of an embodiment, the hole injection layer HIL may include a suitable (e.g., well-known) hole injection material. For example, the hole injection layer HIL may include triphenylamine-containing polyetherketone (TPAPEK), 4-isopropyl-4'-methyldiphenyliodoniumtetrakis (pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound (such as copper phthalocyanine), 4,4',4"-tris(3-methyl phenyl phenylamino) triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4"-tris{N,N-diphenylamino}triphenylamine (TDATA), 4,4',4"-tris(N,N-2-naphthyl phenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), and/or dipyrazino[2,3-f: 2',3'-h]quinoxaline-2,3,6,7,10,11-hexacarbonitrile (HAT-CN). However, an embodiment of the present disclosure is not limited thereto.

Also, the hole transport layer HTL of the organic electroluminescence device 10 of an embodiment may further include a suitable (e.g., known) hole transport material in addition to the polycyclic compound of an embodiment. For example, the hole transport layer HTL may include 4,4'-cyclohexylidene bis[N,N-bis(4-methylphenyl)benzenamine](TAPC), carbazole derivatives (such as N-phenyl carbazole and polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(1-naphthalenyl)-N,N'-diphenyl-benzidine (NPB), 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), 1,3-bis(N-carbazolyl)benzene (mCP), etc. However, an embodiment of the present disclosure is not limited thereto.

As described above, in the organic electroluminescence device 10 of an embodiment, the hole transport region HTR may further include a hole buffer layer and/or an electron blocking layer EBL in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be utilized as materials included in a hole buffer layer.

In addition, if a hole transport region HTR further includes an electron blocking layer EBL disposed between a hole transport layer HTL and an emission layer EML, the electron blocking layer EBL may play the role of reducing or preventing electron injection from an electron transport region ETR to a hole transport region HTR.

In the organic electroluminescence device 10 of an embodiment, if the hole transport region HTR includes an electron blocking layer EBL, the electron blocking layer EBL may include the polycyclic compound of an embodiment. In addition, the electron blocking layer EBL may further include a suitable material (e.g., common material known in the art) in addition to the polycyclic compound of an embodiment. The electron blocking layer EBL may include, for example, carbazole derivatives (such as N-phenylcarbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(naphthalen-1-yl)-N,N'-diphenyl-benzidine (NPD), 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), mCP, etc.

That is, in the organic electroluminescence device 10 of an embodiment, if the hole transport region HTR is a single layer, the hole transport region HTR may include the polycyclic compound of an embodiment. In this case, the hole transport region HTR may further include a suitable (e.g., known) hole injection material or a suitable (e.g., known) hole transport material.

In addition, in the organic electroluminescence device 10 of an embodiment, if the hole transport region HTR includes a plurality of layers, at least one layer from among the plurality of layers included in the hole transport region HTR may include the polycyclic compound of an embodiment. For example, a layer adjacent to an emission layer EML from among the plurality of layers included in the hole transport region HTR may include the polycyclic compound of an embodiment. Also, a layer not including the polycyclic compound of an embodiment from among the plurality of layers may include a suitable (e.g., known) hole injection material, and/or a suitable (e.g., known) hole transport material. In addition, the layer including the polycyclic compound of an embodiment may further include a suitable (e.g., known) hole injection material, and/or a suitable (e.g., known) hole transport material.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one selected from quinone derivatives, metal oxides, and cyano group-containing compounds, without being limited thereto. For example, non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), and metal oxides (such as tungsten oxide and/or molybdenum oxide), without being limited thereto.

The emission layer EML is provided on the hole transport region HTR. The thickness of the emission layer EML may be, for example, from about 100 Å to about 300 Å. The emission layer EML may have a single layer formed utilizing a single material, a single layer formed utilizing a plurality of different materials, or a multilayer structure having a plurality of layers formed utilizing a plurality of different materials.

The emission layer EML may emit one selected from red, green, blue, white, yellow and cyan light. The emission layer EML may include a fluorescence-emitting material and/or a phosphorescence-emitting material.

In the organic electroluminescence device 10 of an embodiment, the emission layer EML may include anthracene derivatives, pyrene derivatives, fluoranthene derivatives, chrysene derivatives, dihydrobenzanthracene derivatives, and/or triphenylene derivatives. For example, the emission layer EML may include an anthracene derivative and/or a pyrene derivative.

The emission layer EML may include an anthracene derivative represented by the following Formula 3:

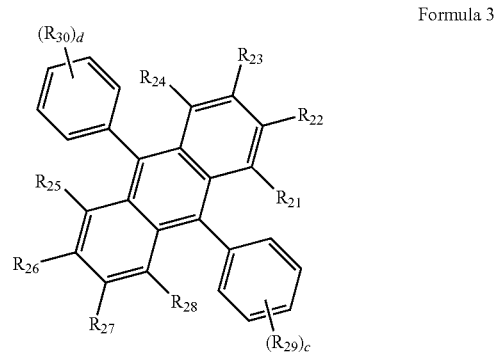

Formula 3

In Formula 3, $R_{21}$ to $R_{30}$ may be each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring. Also, $R_{21}$ to $R_{30}$ may be combined with an adjacent group to form a saturated hydrocarbon ring or an unsaturated hydrocarbon ring.

In Formula 3, c and d may be each independently an integer of 0 to 5.

The anthracene derivative represented by Formula 3 may be represented by any one selected from Formula 3-1 to Formula 3-12 below.

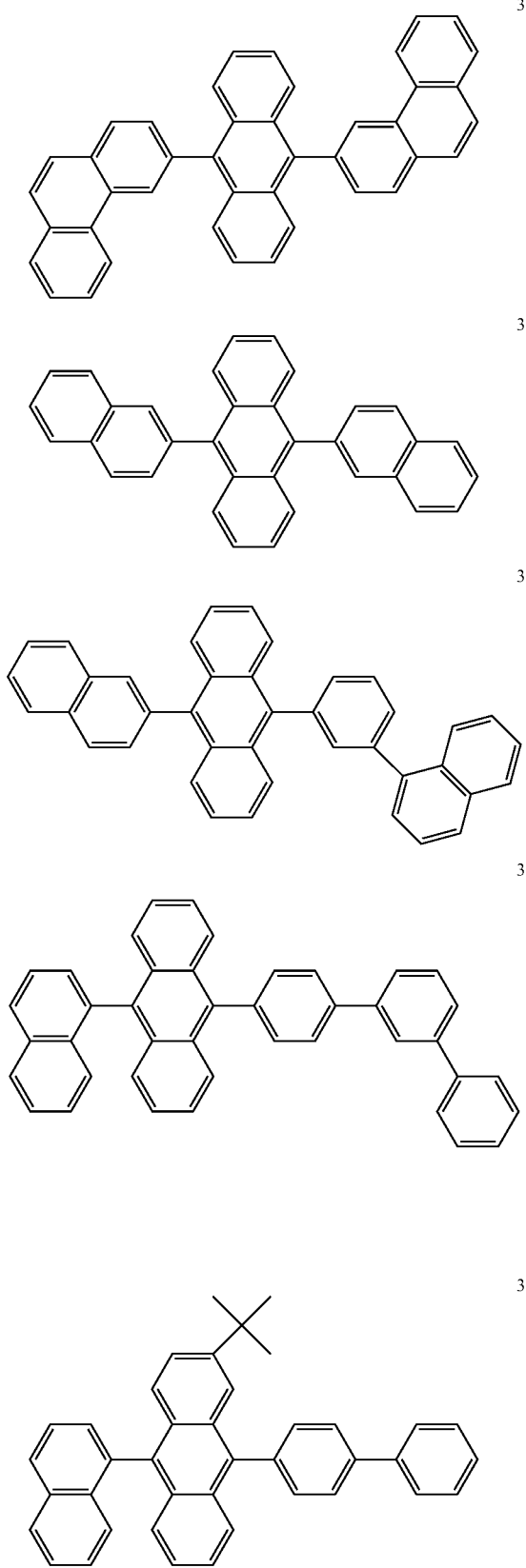
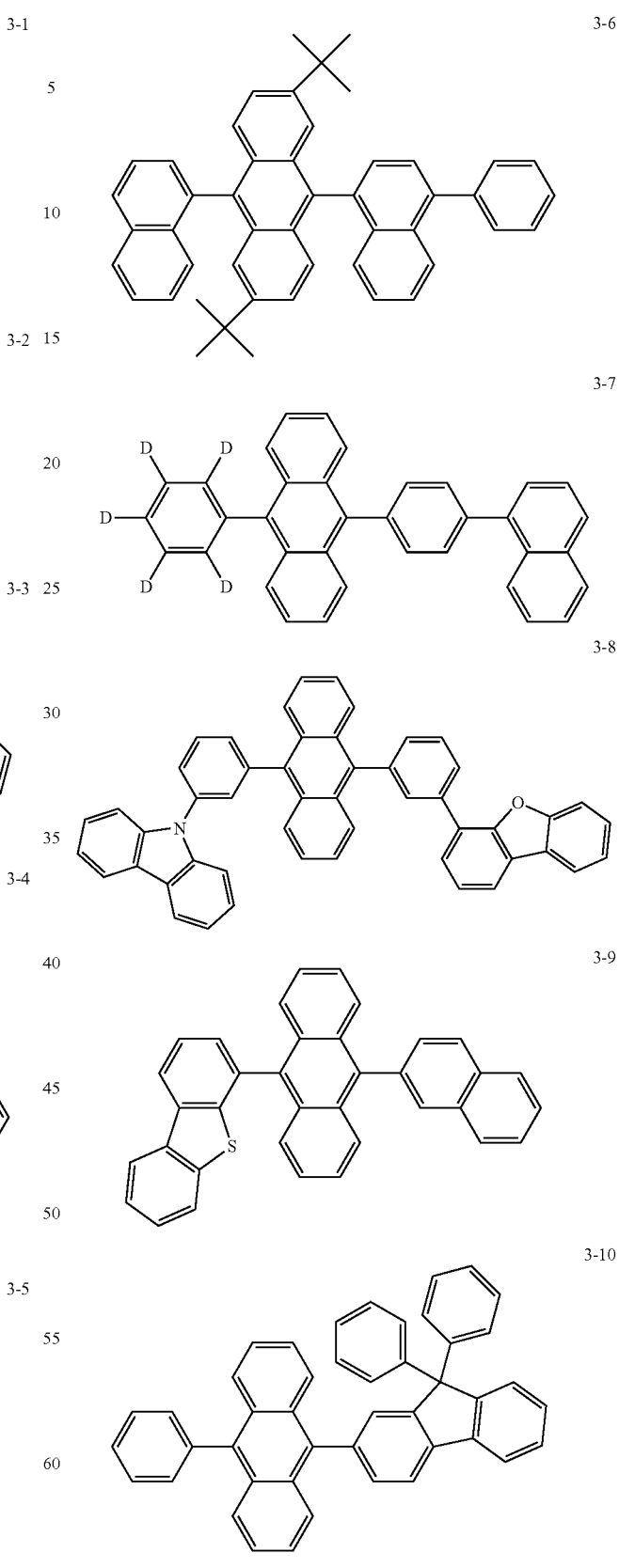

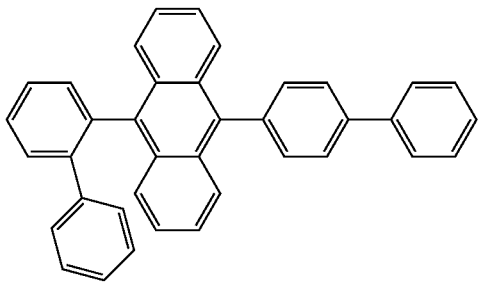

3-11

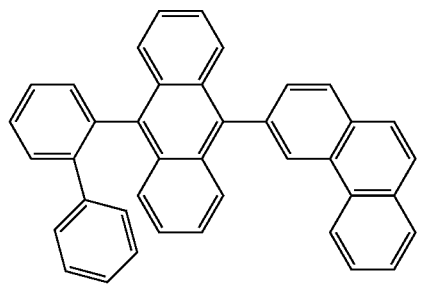

3-12

In the organic electroluminescence devices 10 of exemplary embodiments, as shown in FIG. 1 to FIG. 3, the emission layer EML may include a host and a dopant, and the emission layer EML may include the compound represented by Formula 3 as a host material.

The emission layer EML may further include a suitable material (e.g., commonly known material in the art) as the host material. For example, the emission layer EML may include as a host material, at least one selected from bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA) and 1,3,5-tris(N-phenylbenzimidazole-2-yl)benzene (TPBi). For example, tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc., may be utilized as the host material. However, an embodiment of the present disclosure is not limited thereto.

In an embodiment, the emission layer EML may include as a suitable (e.g., known) dopant material, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), and/or pyrene and the derivatives thereof (for example, 1,1-dipyrene, 1,4-dipyrenylbenzene, and/or 1,4-bis(N,N-diphenylamino)pyrene), etc.

If the emission layer EML emits red light, the emission layer EML may further include a fluorescence material including tris(dibenzoylmethanato)phenanthroline europium (PBD:Eu(DBM)3(Phen)) and/or perylene. If the emission layer EML emits red color, the dopant included in the emission layer EML may be selected from, for example, a metal complex and/or an organometallic complex (such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr) and/or octaethylporphyrin platinum (PtOEP)), rubrene and the derivatives thereof, and 4-dicyanomethylene-2-(p-dimethylaminostyryl)-6-methyl-4H-pyrane (DCM) and the derivatives thereof.

If the emission layer EML emits green light, the emission layer EML may further include a fluorescence material including tris(8-hydroxyquinolino)aluminum (Alq3). If the emission layer EML emits green light, the dopant included in the emission layer EML may be selected from, for example, a metal complex and/or an organometallic complex (such as fac-tris(2-phenylpyridine)iridium (Ir(ppy)3)), and coumarin and the derivatives thereof.

If the emission layer EML emits blue light, the emission layer EML may further include a fluorescence material including, for example, any one selected from the group consisting of spiro-DPVBi, spiro-6P, distyryl-benzene (DSB), distyryl-arylene (DSA), a polyfluorene (PFO)-based polymer and a poly(p-phenylene vinylene) (PPV)-based polymer. If the emission layer EML emits blue light, the dopant included in the emission layer EML may be selected from a metal complex and/or an organometallic complex (such as (4,6-F2ppy)2Irpic), and perylene and the derivatives thereof.

In the organic electroluminescence device 10 of an embodiment, the electron transport region ETR is provided on the emission layer EML. The electron transport region ETR may include a hole blocking layer HBL, an electron transport layer ETL and/or an electron injection layer EIL. However, an embodiment of the present disclosure is not limited thereto.

The electron transport region ETR may have a single layer formed utilizing a single material, a single layer formed utilizing a plurality of different materials, or a multilayer structure having a plurality of layers formed utilizing a plurality of different materials.

For example, the electron transport region ETR may have a single layer structure of an electron injection layer EIL or an electron transport layer ETL, or a single layer structure formed utilizing an electron injection material and/or an electron transport material. Further, the electron transport region ETR may have a single layer structure composed of (e.g., including) a plurality of different materials, or a structure laminated (e.g., stacked) from the emission layer EML of electron transport layer ETL/electron injection layer EIL, or hole blocking layer HBL/electron transport layer ETL/electron injection layer EIL, without being limited thereto. The thickness of the electron transport region ETR may be, for example, from about 100 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include, for example, tris(8-hydroxyquinolinato)aluminum (Alq3), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof, without being limited thereto.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described ranges, satisfactory electron transport properties may be obtained without substantial increase of a driving voltage.

If the electron transport region ETR includes the electron injection layer EIL, the electron transport region ETR may include, for example, LiF, 8-hydroxyquinolinnolata-lithium (LiQ), $Li_2O$, BaO, NaCl, CsF, a metal in lanthanoides (such as Yb), and/or a metal halide (such as RbCl, RbI and/or KI). However, an embodiment of the present disclosure is not limited thereto. The electron injection layer EIL may be also formed utilizing a mixture material of an electron transport material and an insulating organo metal salt. The organo metal salt may be a material having an energy band gap of about 4 eV or more. For example, the organo metal salt may include, one or more of metal acetates, metal benzoates, metal acetoacetates, metal acetylacetonates, and/or metal stearates.

If the electron transport region ETR includes the electron injection layer EIL, the thickness of the electron injection layer EIL may be from about 1 Å to about 100 Å, for example, from about 3 Å to about 90 Å. If the thickness of the electron injection layer EIL satisfies the above described ranges, satisfactory electron injection properties may be obtained without inducing substantial increase of a driving voltage.

The electron transport region ETR may include a hole blocking layer HBL as described above. The hole blocking layer HBL may include, for example, at least one selected from 2,9-dimethyl-4,7-diphenyl-1,10-phenanthroline (BCP), and 4,7-diphenyl-1,10-phenanthroline (Bphen). However, an embodiment of the present disclosure is not limited thereto.

The second electrode EL2 is provided on the electron transport region ETR. The second electrode EL2 has conductivity. The second electrode EL2 may be formed utilizing a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed utilizing the above-described materials, and a transparent conductive layer formed utilizing ITO, IZO, ZnO, ITZO, etc.

In one embodiment, the second electrode EL2 may be connected with an auxiliary electrode. If the second electrode EL2 is connected with the auxiliary electrode, the resistance of the second electrode EL2 may decrease.

In one embodiment, on the second electrode EL2 of the organic electroluminescence device 10, a capping layer may be further disposed. The capping layer may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), N,N'-bis(naphthalene-1-yl), etc.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission device, the first electrode EL1 may be a reflective electrode and the second electrode EL2 may be a transmissive electrode or a transflective electrode. If the organic electroluminescence device 10 is a bottom emission device, the first electrode EL1 may be a transmissive electrode or a transflective electrode and the second electrode EL2 may be a reflective electrode.

The polycyclic compound of an embodiment may be included as a material for the organic electroluminescence device 10 according to an embodiment. In the description, a case where the polycyclic compound of an embodiment is included in the hole transport region HTR is explained in more detail, but an embodiment of the present disclosure is not limited thereto. That is, the organic electroluminescence device 10 according to an embodiment of the present disclosure may include the polycyclic compound in at least one organic layer disposed between the first electrode EL1 and the second electrode EL2, or in a capping layer disposed on the second electrode EL2.

The organic electroluminescence device 10 according to an embodiment of the present disclosure includes the polycyclic compound in at least one organic layer disposed between the first electrode EL1 and the second electrode EL2, and may show excellent emission efficiency and high reliability. For example, the organic electroluminescence device 10 according to an embodiment includes the polycyclic compound in a hole transport region HTR and may show high emission efficiency and improved life characteristics.

In one embodiment, the organic electroluminescence device of an embodiment includes the polycyclic compound of an embodiment in an organic layer adjacent to the emission layer from among the plurality of the organic layers in the hole transport region, and the hole transport region may keep high hole transport capacity while restraining the movement of electrons, thereby showing improved emission efficiency.

For example, the polycyclic compound of an embodiment includes at least one hexagonal hydrocarbon ring which is combined with a xanthene skeleton or a thioxanthene skeleton to form a condensed ring, and has an enhanced structure of substituents which are substituted in a carbon atom which constitutes the xanthene skeleton or the thioxanthene skeleton, and may have increased hole transport properties, improved orientation properties and enhanced (e.g., excellent) reliability. In addition, the organic electroluminescence device of an embodiment includes the polycyclic compound of an embodiment, which has such structural characteristics in a hole transport region, and may show improved device efficiency and life characteristics.

Hereinafter, a polycyclic compound according to an embodiment of the present disclosure and an organic electroluminescence device including the polycyclic compound of an embodiment will be explained in more detail with reference to Examples and Comparative Examples. In addition, the following embodiments are only illustrations to assist the understanding of the present disclosure, and the scope of the present disclosure is not limited thereto.

EXAMPLES

1. Synthesis of Polycyclic Compound

First, the synthetic method of a polycyclic compound according to this embodiment will be particularly explained referring to Compound A1, Compound A52, Compound A69, Compound A9, Compound A11, Compound A104, Compound A101, Compound A46, Compound A45, Compound A48, and Compound A98 in Compound Group 1, and Compound A176 in Compound Group 2. In addition, the synthetic method of a polycyclic compound explained below is an embodiment (e.g., only an example method), and the synthetic method of a polycyclic compound according to an embodiment of the present disclosure is not limited thereto.

Synthesis of Compound A1

Polycyclic Compound A1 according to an embodiment may be synthesized, for example, by the following Reaction 1:

Reaction 1

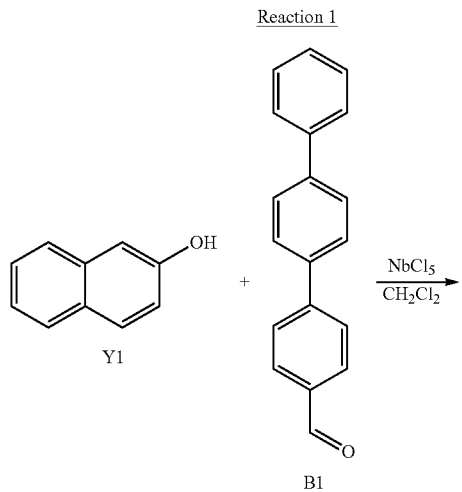

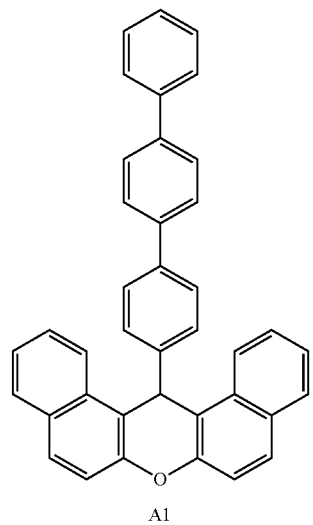

A1

To an alcohol compound, Y1 (5.7 g, 50 mmol), an aldehyde compound, B1 (6.5 g, 25 mmol), and NbCl$_5$ (1.7 g, 25 mol %), a CH$_2$Cl$_2$ solution (200 ml) was added, followed by stirring under a nitrogen atmosphere at room temperature for about 12 hours. H$_2$O (100 ml) was added thereto and then, CH$_2$Cl$_2$ was added and extraction was carried out. Then, an organic layer was washed with NaHCO$_3$, H$_2$O and brine, respectively, and dried with Mg$_2$SO$_4$. The solution thus obtained was concentrated, and recrystallization with ethanol was carried out to obtain Compound A1 (10.1 g, 19.8 mmol, yield 79%, FAB-MS 510.20).

Synthesis of Compound A52

Polycyclic Compound A52 according to an embodiment may be synthesized, for example, by the following Reaction 2:

Reaction 2

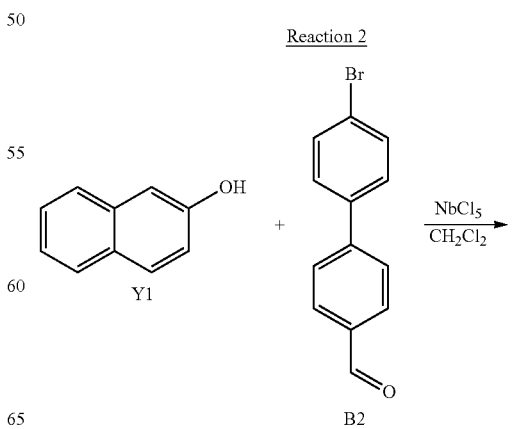

-continued

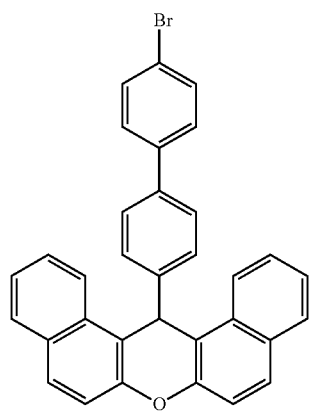
Intermediate C1

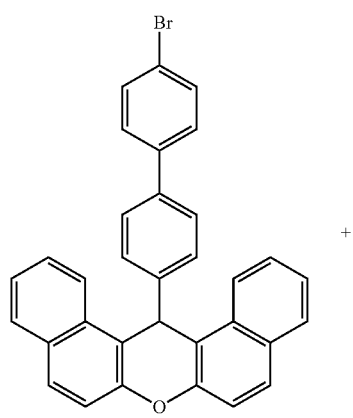
Intermediate C1

+

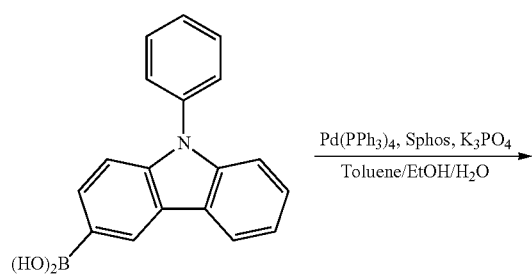
D1

-continued

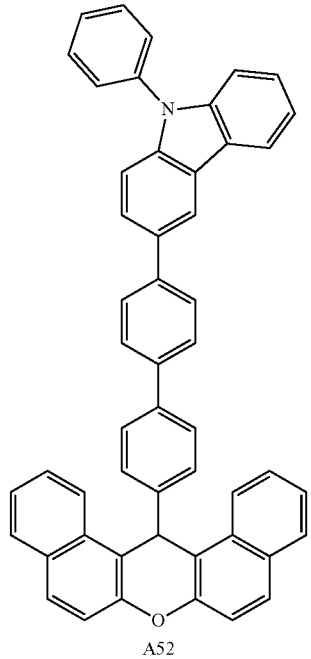
A52

Synthesis of Intermediate Compound C1

To an alcohol compound, Y1 (5.7 g, 50 mmol), an aldehyde compound, B2 (6.5 g, 25 mmol), and $NbCl_5$ (1.7 g, 25 mmol), a $CH_2Cl_2$ solution (200 ml) was added, followed by stirring under a nitrogen atmosphere at room temperature for about 12 hours. $H_2O$ (100 ml) was added thereto and then, $CH_2Cl_2$ was added, and extraction was carried out. Then, an organic layer was washed with $NaHCO_3$, $H_2O$ and brine, respectively, and dried with $Mg_2SO_4$. The solution thus obtained was concentrated, and recrystallization with ethanol was carried out to obtain Intermediate Compound C1 (7.1 g, 13.8 mmol, yield 55%, FAB-MS 512.08).

Synthesis of Compound A52

To Intermediate Compound C1 (10.3 g, 20 mmol) thus obtained, boronic acid, Compound D1 (5.7 g, 20 mmol), and $K_3PO_4$ (8.5 g, 40 mmol), toluene/EtOH/$H_2O$ (4/2/1 volume ratio, 250 ml) was added and deaerated. Under an argon atmosphere, 2-dicyclohexylphosphino-2',6'-dimethoxybiphenyl (1.6 g, 4.0 mmol) and tetrakis(triphenylphosphine)palladium (1.6 g, 1.0 mmol) were added, followed by heating and stirring at about 85° C. for about 6 hours. The reaction solution was cooled in the air to room temperature, extracted with toluene, washed with $H_2O$ and brine, respectively, and dried with $Na_2SO_4$. The solution thus obtained was concentrated and separated by silica gel column chromatography to obtain Compound A52 (9.6 g, 14 mmol, yield 71%, FAB-MS 675.26).

Synthesis of Compound A69

Polycyclic Compound A69 according to an embodiment may be synthesized, for example, by the following Reaction 3:

Reaction 3

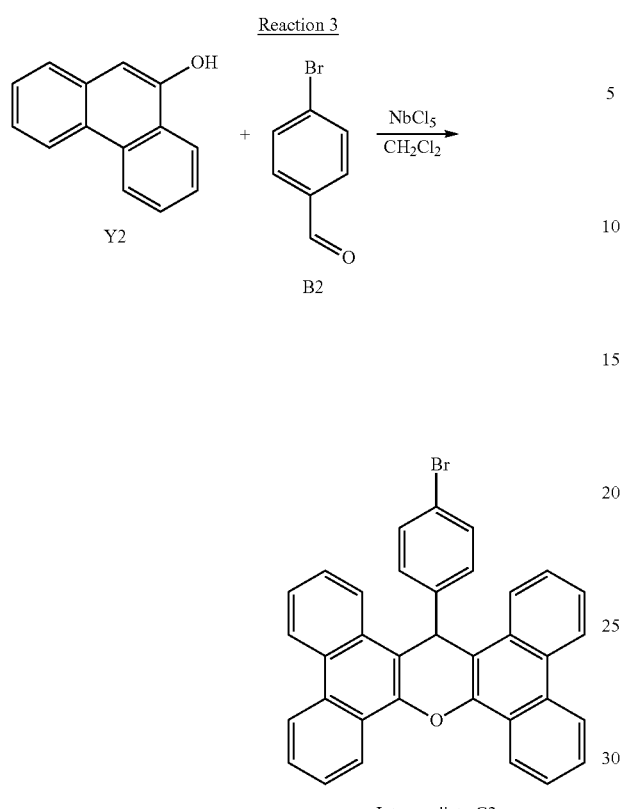

Intermediate C2

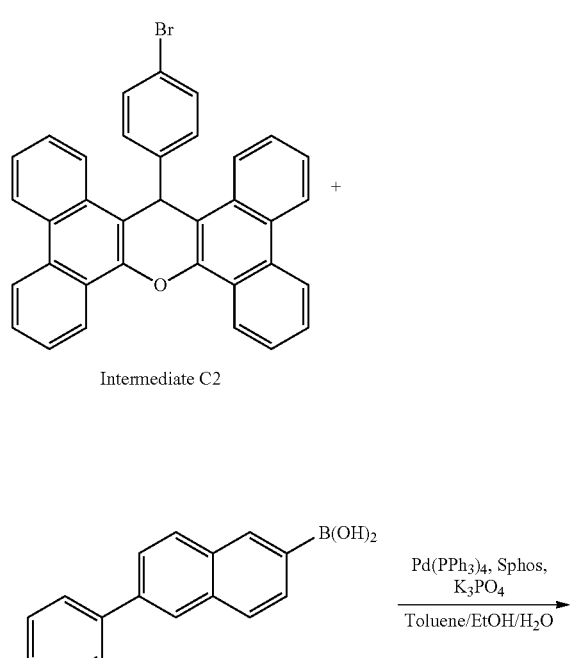

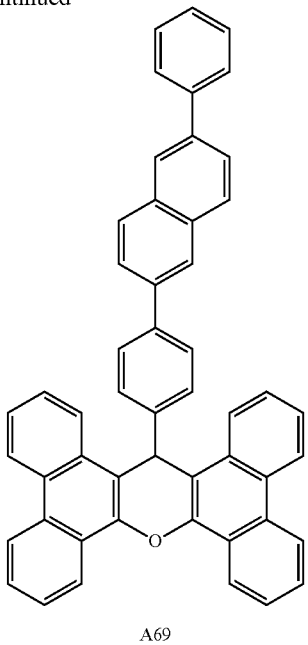

A69

Synthesis of Intermediate Compound C2

To an alcohol compound, Y2 (9.7 g, 50 mmol), an aldehyde compound, B2 (4.6 g, 25 mmol), and NbCl$_5$ (1.7 g, 25 mol %), a CH$_2$Cl$_2$ solution (200 ml) was added, followed by stirring under a nitrogen atmosphere at room temperature for about 12 hours. H$_2$O (100 ml) was added thereto and then, CH$_2$Cl$_2$ was added, and extraction was carried out. Then, an organic layer was washed with NaHCO$_3$, H$_2$O and brine, respectively, and dried with Mg$_2$SO$_4$. The solution thus obtained was concentrated, and recrystallization with ethanol was carried out to obtain Intermediate Compound C2 (17.9 g, 32 mmol, yield 64%, FAB-MS 536.08).

Synthesis of Compound A69

To Intermediate Compound C2 (10.8 g, 20 mmol) thus obtained, boronic acid, Compound D2 (6.3 g, 20 mmol), and K$_3$PO$_4$ (8.5 g, 40 mmol), toluene/EtOH/H$_2$O (4/2/1 volume ratio, 250 ml) was added and deaerated. Under an argon atmosphere, 2-dicyclohexylphosphino-2',6'-dimethoxybiphenyl (1.6 g, 4.0 mmol) and tetrakis(triphenylphosphine)palladium (1.6 g, 1.0 mmol) were added, followed by heating and stirring at about 85° C. for about 6 hours. The reaction solution was cooled in the air to room temperature, extracted with toluene, washed with H$_2$O and brine, respectively, and dried with Na$_2$SO$_4$. The solution thus obtained was concentrated and separated by silica gel column chromatography to obtain Compound A69 (9.9 g, 15 mmol, yield 77%, FAB-MS 660.25).

Synthesis of Compound A9

Polycyclic Compound A9 according to an embodiment may be synthesized, for example, by the following Reaction 4:

Reaction 4

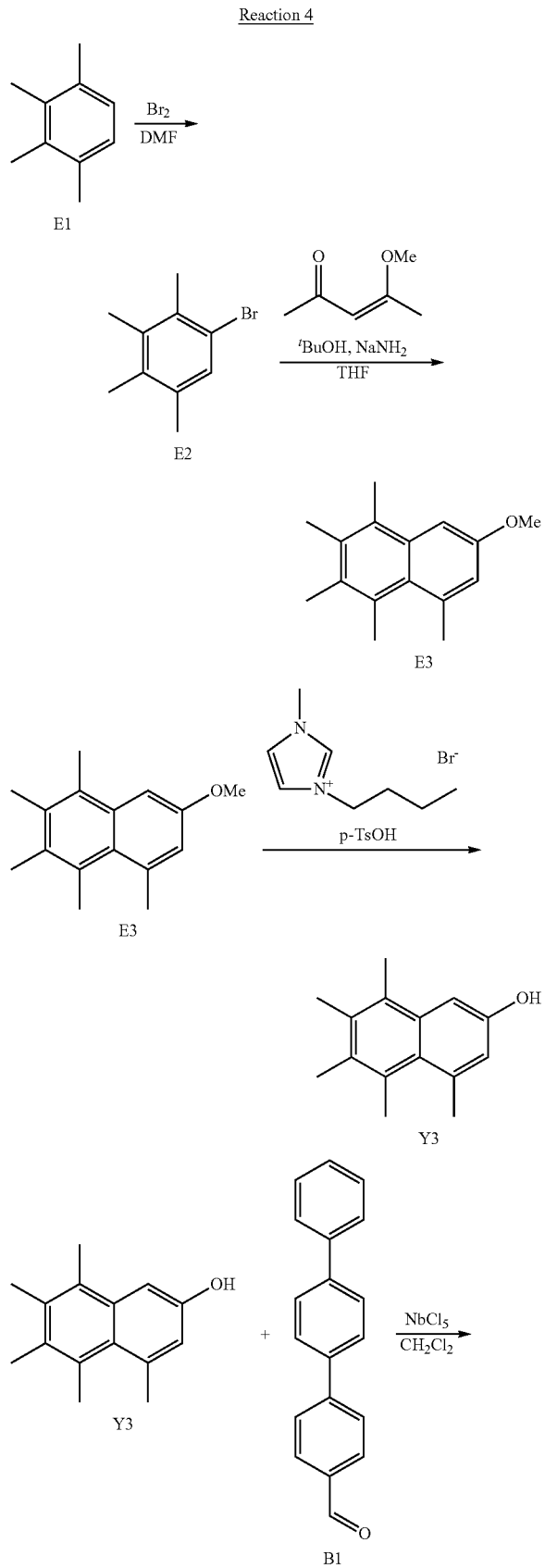

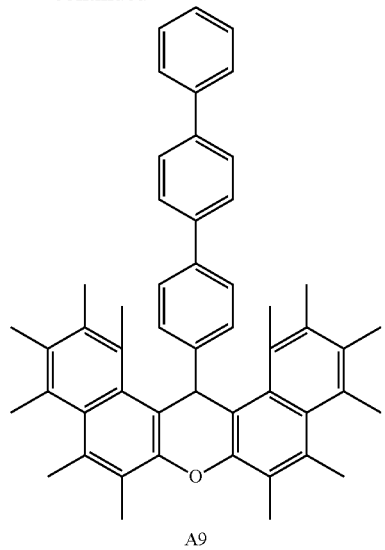

A9

Synthesis of Intermediate Compound E2

To a benzene compound, E1 (20 g, 150 mmol), DMF (100 ml) was added and cooled in an ice bath to about 0° C. Then, a DMF solution into which bromine (24 g, 150 mmol) had been added, was added dropwise, followed by stirring at room temperature for about 10 hours. To the reaction solution, an aqueous sodium sulfate solution and hexane were added, and an organic layer was extracted with hexane. An organic layer was washed with $NaHCO_3$, $H_2O$ and brine, respectively, and dried with $Mg_2SO_4$. The organic layer was concentrated and distilled under a reduced pressure to obtain Intermediate Compound E2 (15 g, 67.5 mmol, FAB-MS 212.02, yield 45%).

Synthesis of Intermediate Compound E3

To THF (35 ml), tert-BuOH (7.5 g, 100 mmol) was added and a THF solution (80 ml) of $NaNH_2$ (14 g, 400 mmol) was added thereto dropwise, followed by stirring at about 45° C. for about 2 hours. A THF solution (80 ml) of Intermediate Compound E2 (21 g, 100 mmol) was added to the reaction solution dropwise, followed by stirring at about 60° C. for about 6 hours. After cooling by standing at room temperature, the reaction solution was added to $H_2O$, neutralized with a 3 M HCl aqueous solution, and extracted with AcOEt. An organic layer was washed with $NaHCO_3$, $H_2O$ and brine, respectively, and dried with $Mg_2SO_4$. The solution thus obtained was concentrated and separated by silica gel column chromatography to obtain Intermediate Compound E3 (3.9 g, 17 mmol, FAB-MS 228.15, yield 17%).

Synthesis of Intermediate Compound Y3

To the Intermediate Compound E3 (4.6 g, 20 mmol) thus obtained, 1-butyl-3-methylimidazoliumbromide (13 g, 60 mmol), p-TsOH (10 g, 60 mmol), and 1-butyl-3-methylimidazoliumtetrafluoroborate (20 ml) were added, followed by stirring at about 115° C. for about 8 hours. A THF solution (80 ml) of Intermediate Compound E3 (21 g, 100 mmol) was added to the reaction solution dropwise, followed by stirring at about 60° C. for about 6 hours. The reaction solution was cooled to room temperature, extracted with ether, washed with H₂O and brine, respectively, and dried with Mg₂SO₄. The solution thus obtained was concentrated and separated by silica gel column chromatography to obtain Intermediate Compound Y3 (4.3 g, 20 mmol, FAB-MS 214.14, quant.).

Synthesis of Compound A9

To Intermediate Compound, Y3 (10.7 g, 50 mmol), an aldehyde compound, B1 (6.5 g, 25 mmol), and NbCl₅ (1.7 g, 25 mol %), a CH₂Cl₂ solution (200 ml) was added, followed by stirring under a nitrogen atmosphere at room temperature for about 12 hours. H₂O (100 ml) was added thereto and then, CH₂Cl₂ was added and extraction was carried out. Then, an organic layer was washed with NaHCO₃, H₂O and brine, respectively, and dried with Mg₂SO₄. The solution thus obtained was concentrated, and recrystallization with ethanol was carried out to obtain Compound A9 (8.5 g, 12.5 mmol, FAB-MS 678.40, yield 50%).

Synthesis of Compound A11

Polycyclic Compound A11 according to an embodiment may be synthesized, for example, by the following Reaction 5:

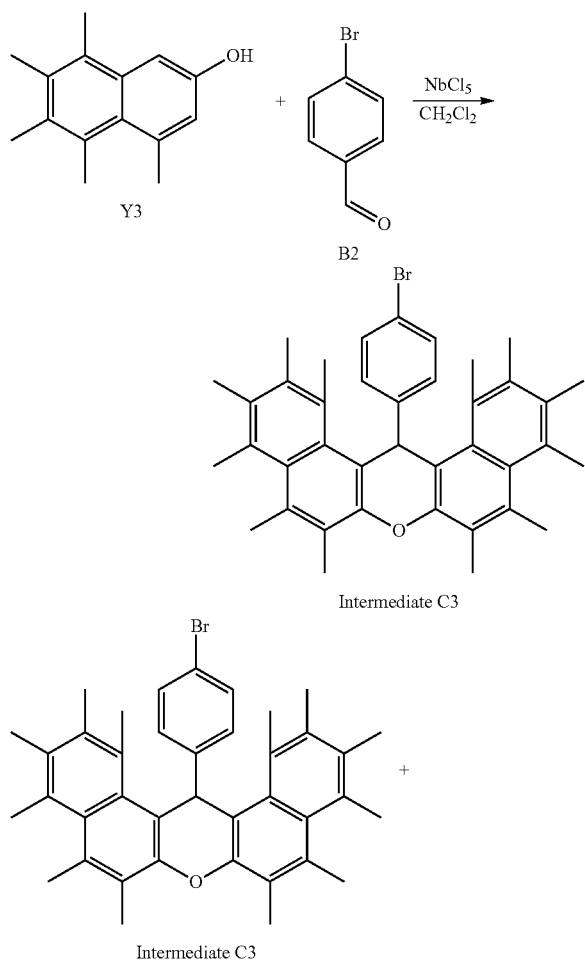

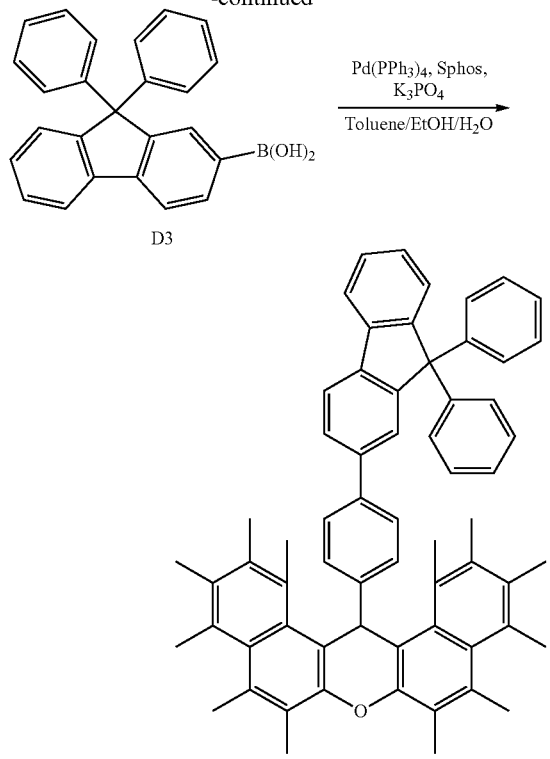

Synthesis of Intermediate Compound C3

To an alcohol compound, Y3 (10.7 g, 50 mmol), an aldehyde compound, B2 (4.6 g, 25 mmol), and NbCl₅ (1.7 g, 25 mol %), a CH₂Cl₂ solution (200 ml) was added, followed by stirring under a nitrogen atmosphere at room temperature for about 12 hours. H₂O (100 ml) was added thereto and then, CH₂Cl₂ was added and extraction was carried out. Then, an organic layer was washed with NaHCO₃, H₂O and brine, respectively, and dried with Mg₂SO₄. The solution thus obtained was concentrated, and recrystallization with ethanol was carried out to obtain Intermediate Compound C3 (9.1 g, 15 mmol, FAB-MS 604.23, yield 60%).

Synthesis of Compound A11

To Intermediate Compound C3 (12.1 g, 20 mmol) thus obtained, boronic acid, Compound D3 (7.3 g, 20 mmol), and K₃PO₄ (8.5 g, 40 mmol), toluene/EtOH/H₂O (4/2/1 volume ratio, 250 ml) was added and deaerated. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added, followed by heating and stirring at about 85° C. for about 6 hours. The reaction solution was cooled in the air to room temperature, extracted with toluene, washed with H₂O and brine, respectively, and dried with Na₂SO₄. The solution thus obtained was concentrated and separated by silica gel column chromatography to obtain Compound A11 (8.9 g, 13 mmol, FAB-MS 842.50, yield 65%).

Synthesis of Compound A104

Polycyclic Compound A104 according to an embodiment may be synthesized, for example, by the following Reaction 6:

Reaction 6

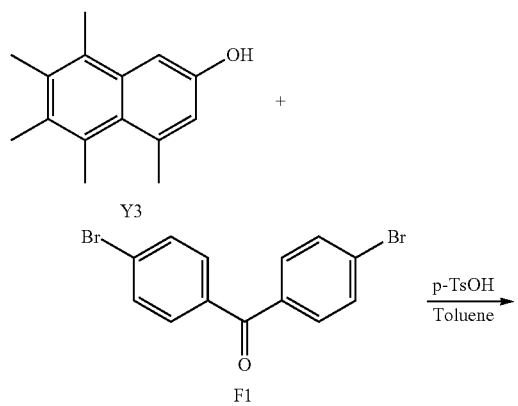

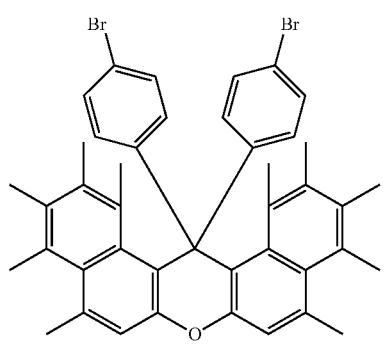

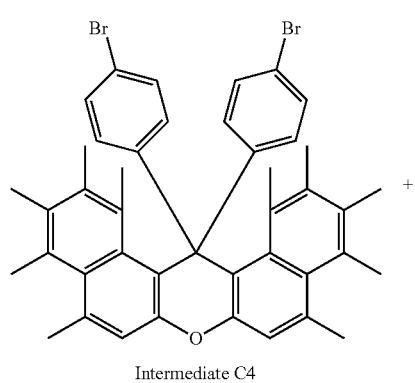

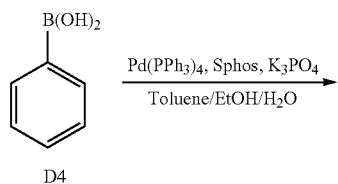

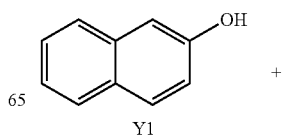

Synthesis of Intermediate Compound C4

To an alcohol compound, Y3 (10.7 g, 50 mmol), a ketone compound, F1 (8.5 g, 25 mmol), and p-TsOH (1.7 g, 10 mol %), a toluene solution (200 ml) was added, followed by stirring under a nitrogen atmosphere at room temperature for about 12 hours. $H_2O$ (100 ml) was added thereto and then, toluene was added and extraction was carried out. Then, an organic layer was washed with $NaHCO_3$, $H_2O$ and brine, respectively, and dried with $Mg_2SO_4$. The solution thus obtained was concentrated and separated by silica gel column chromatography to obtain Intermediate Compound C4 (5.3 g, 7.3 mmol, MS 730.14, yield 29%).

Synthesis of Compound A104

To Intermediate Compound C4 (14.6 g, 20 mmol) thus obtained, boronic acid, Compound D4 (2.5 g, 20 mmol), and $K_3PO_4$ (8.5 g, 40 mmol), toluene/EtOH/$H_2O$ (4/2/1 volume ratio, 250 ml) was added and deaerated. Under an argon atmosphere, 2-dicyclohexylphosphino-2',6'-dimethoxybiphenyl (1.6 g, 4.0 mmol) and tetrakis(triphenylphosphine)palladium (1.6 g, 1.0 mmol) were added, followed by heating and stirring at about 85° C. for about 6 hours. The reaction solution was cooled in the air to room temperature, extracted with toluene, washed with $H_2O$ and brine, respectively, and dried with $Na_2SO_4$. The solution thus obtained was concentrated and separated by silica gel column chromatography to obtain Compound A104 (12.9 g, 18 mmol, FAB-MS 726.40, yield 89%).

Synthesis of Compound A101

Polycyclic Compound A101 according to an embodiment may be synthesized, for example, by the following Reaction 7:

Reaction 7

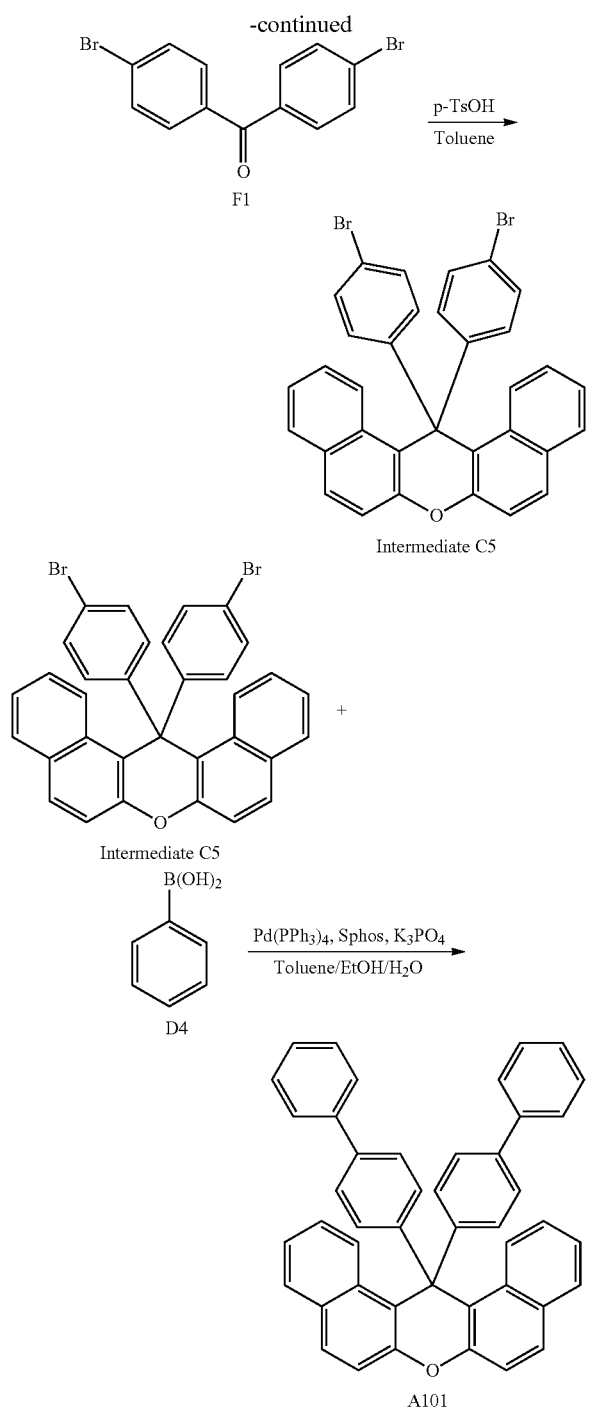

Intermediate C5

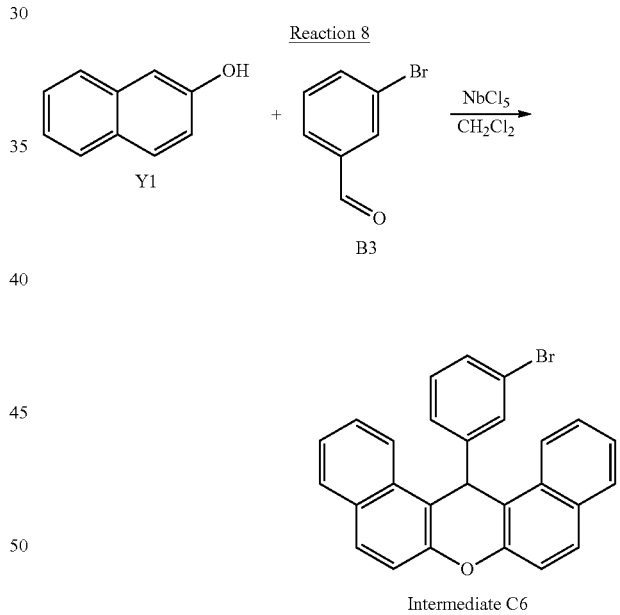

umn chromatography to obtain Intermediate Compound C5 (5.2 g, 8.7 mmol, FAB-MS 589.99, yield 35%).

Synthesis of Compound A101

To Intermediate Compound C5 (11.8 g, 20 mmol) thus obtained, boronic acid, Compound D4 (2.5 g, 20 mmol), and $K_3PO_4$ (8.5 g, 40 mmol), toluene/EtOH/$H_2O$ (4/2/1 volume ratio, 250 ml) was added and deaerated. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added, followed by heating and stirring at about 85° C. for about 6 hours. The reaction solution was cooled in the air to room temperature, extracted with toluene, washed with $H_2O$ and brine, respectively, and dried with $Na_2SO_4$. The solution thus obtained was concentrated and separated by silica gel column chromatography to obtain Compound A101 (9.4 g, 16 mmol, FAB-MS 586.23, yield 80%).

Synthesis of Compound A46

Polycyclic Compound A46 according to an embodiment may be synthesized, for example, by the following Reaction 8:

Synthesis of Intermediate Compound C5

To an alcohol compound, Y1 (5.7 g, 50 mmol), a ketone compound, F1 (8.5 g, 25 mmol), and p-TsOH (1.7 g, 10 mol %), a toluene solution (200 ml) was added, followed by stirring under a nitrogen atmosphere at room temperature for about 12 hours. $H_2O$ (100 ml) was added thereto and then, toluene was added, and extraction was carried out. Then, an organic layer was washed with $NaHCO_3$, $H_2O$ and brine, respectively, and dried with $Mg_2SO_4$. The solution thus obtained was concentrated and separated by silica gel col-

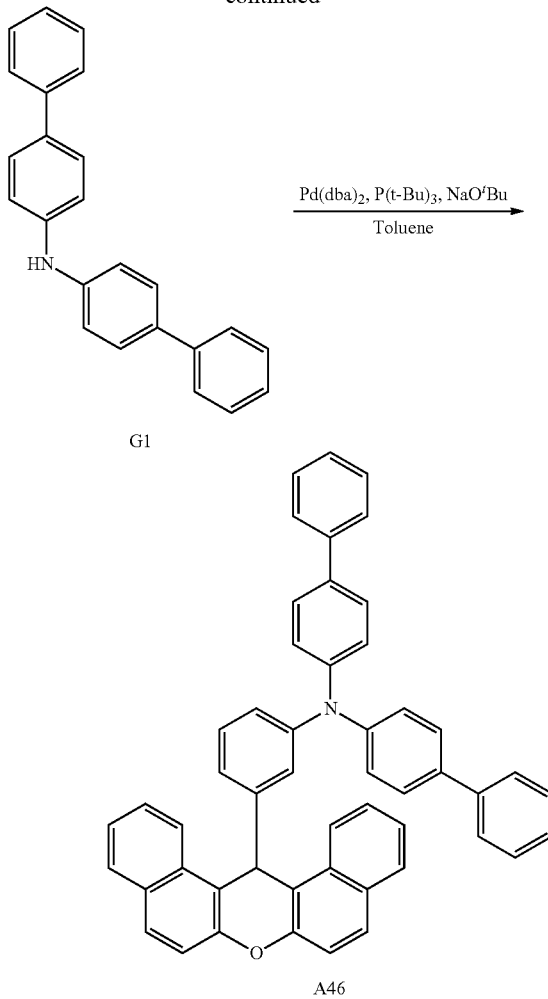

G1

A46

Synthesis of Intermediate Compound C6

To an alcohol compound, Y1 (5.7 g, 50 mmol), an aldehyde compound, B3 (4.6 g, 25 mmol), and NbCl$_5$ (1.7 g, 25 mol %), a CH$_2$Cl$_2$ solution (200 ml) was added, followed by stirring under a nitrogen atmosphere at room temperature for about 12 hours. H$_2$O (100 ml) was added thereto and then, CH$_2$Cl$_2$ was added, and extraction was carried out. Then, an organic layer was washed with NaHCO$_3$, H$_2$O and brine, respectively, and dried with Mg$_2$SO$_4$. The solution thus obtained was concentrated and recrystallized with ethanol to obtain Intermediate Compound C6 (6.5 g, 15 mmol, FAB-MS 436.05, yield 60%).

Synthesis of Compound A46

To Intermediate Compound C6 (8.7 g, 20 mmol), which was a xanthene compound, an amine compound, Compound G1 (6.4 g, 20 mmol), and NaOtBu (2.0 g, 20 mmol), toluene (300 ml) was added and deaerated. Under an argon atmosphere, tri-tert-butylphosphine (2.7 ml, 1.5 M in toluene) and bis(dibenzylideneacetone) palladium (0.6 g, 1.0 mmol) were added, followed by heating and stirring at about 85° C. for about 6 hours. The reaction solution was cooled in the air to room temperature, extracted with toluene, washed with H$_2$O and brine, respectively, and dried with Na$_2$SO$_4$. The solution thus obtained was concentrated and separated by silica gel column chromatography to obtain Compound A46 (8.8 g, 13 mmol, FAB-MS 677.27, yield 65%).

Synthesis of Compound A288

Polycyclic Compound A288 according to an embodiment may be synthesized, for example, by the following Reaction 9:

Reaction 9

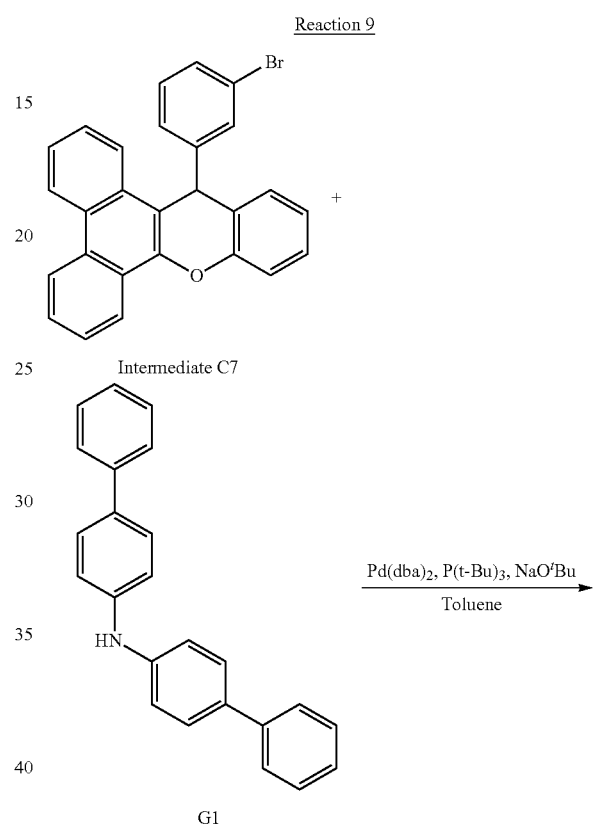

Intermediate C7

G1

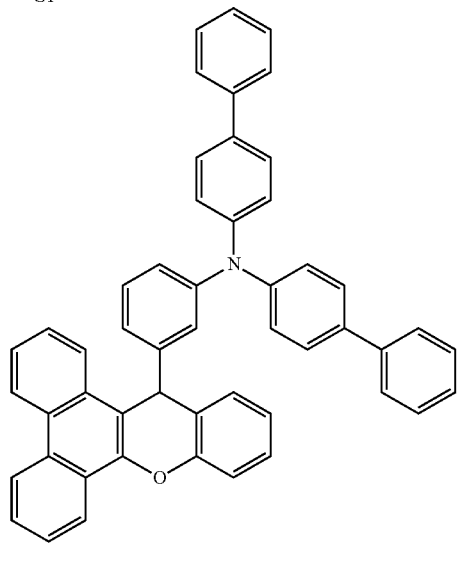

A288

To Intermediate Compound C7 (8.7 g, 20 mmol), which was a xanthene compound, an amine compound, Compound G1 (6.4 g, 20 mmol), and NaOtBu (2.0 g, 20 mmol), toluene (300 ml) was added and deaerated. Under an argon atmosphere, tri-tert-butylphosphine (2.7 ml, 1.5 M in toluene) and bis(dibenzylideneacetone) palladium (0.6 g, 1.0 mmol) were added, followed by heating and stirring at about 85° C. for about 6 hours. The reaction solution was cooled in the air to room temperature, extracted with toluene, washed with H$_2$O and brine, respectively, and dried with Na$_2$SO$_4$. The solution thus obtained was concentrated and separated by silica gel column chromatography to obtain Compound A288 (9.5 g, 14 mmol, FAB-MS 677.27, yield 72%).

Synthesis of Compound A48

Polycyclic Compound A48 according to an embodiment may be synthesized, for example, by the following Reaction 10:

Reaction 10

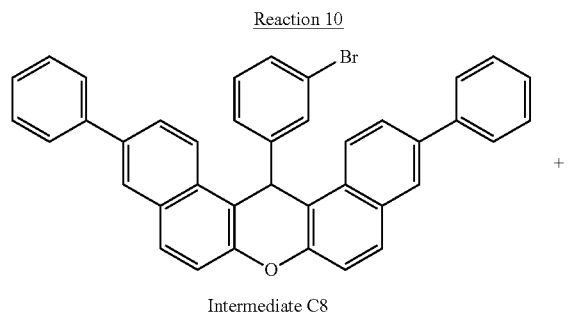

Intermediate C8

+

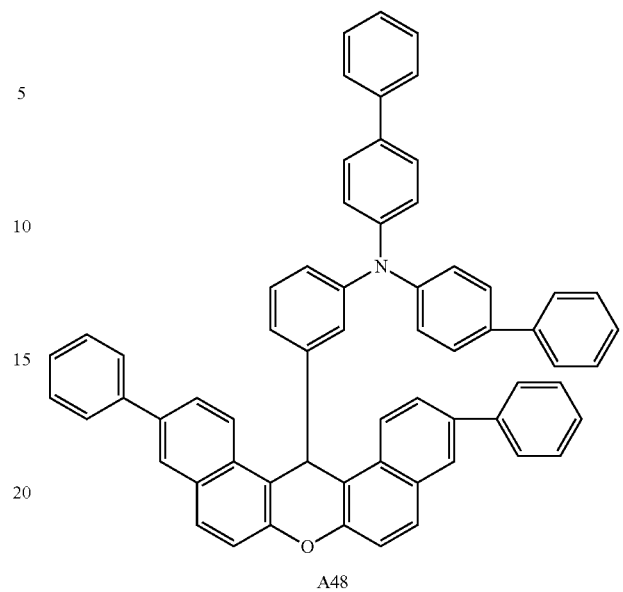

A48

To Intermediate Compound C8 (11.8 g, 20 mmol), which was a xanthene compound, an amine compound, Compound G1 (6.4 g, 20 mmol), and NaOtBu (2.0 g, 20 mmol), toluene (300 ml) was added and deaerated. Under an argon atmosphere, tri-tert-butylphosphine (2.7 ml, 1.5 M in toluene) and bis(dibenzylideneacetone) palladium (0.6 g, 1.0 mmol) were added, followed by heating and stirring at about 85° C. for about 6 hours. The reaction solution was cooled in the air to room temperature, extracted with toluene, washed with H$_2$O and brine, respectively, and dried with Na$_2$SO$_4$. The solution thus obtained was concentrated and separated by silica gel column chromatography to obtain Compound A48 (9.2 g, 10 mmol, FAB-MS 753.30, yield 61%).

Synthesis of Compound A98

Polycyclic Compound A98 according to an embodiment may be synthesized, for example, by the following Reaction 11:

Reaction 11

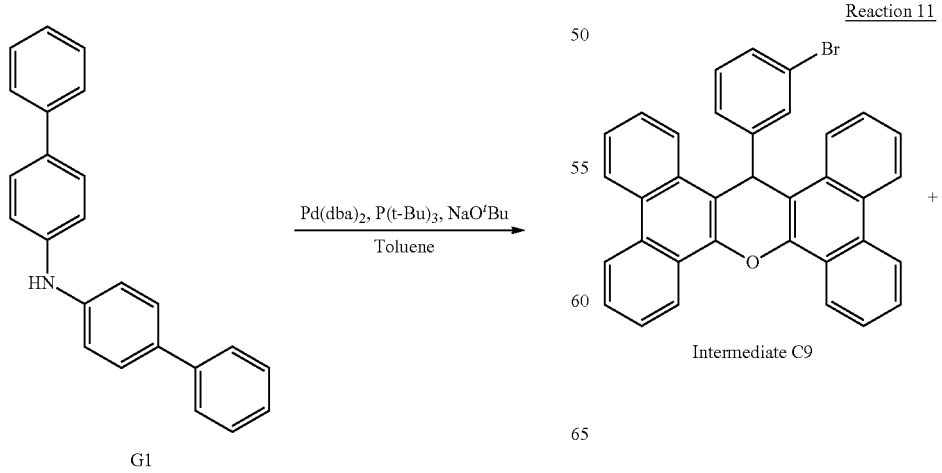

G1

Pd(dba)$_2$, P(t-Bu)$_3$, NaO$^t$Bu
Toluene

Intermediate C9

+

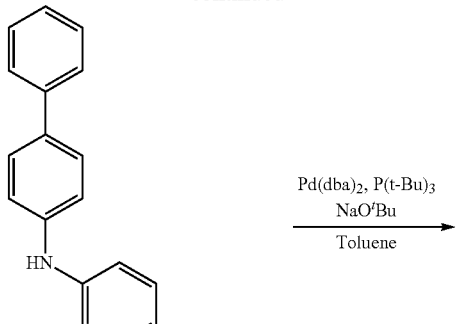

G1

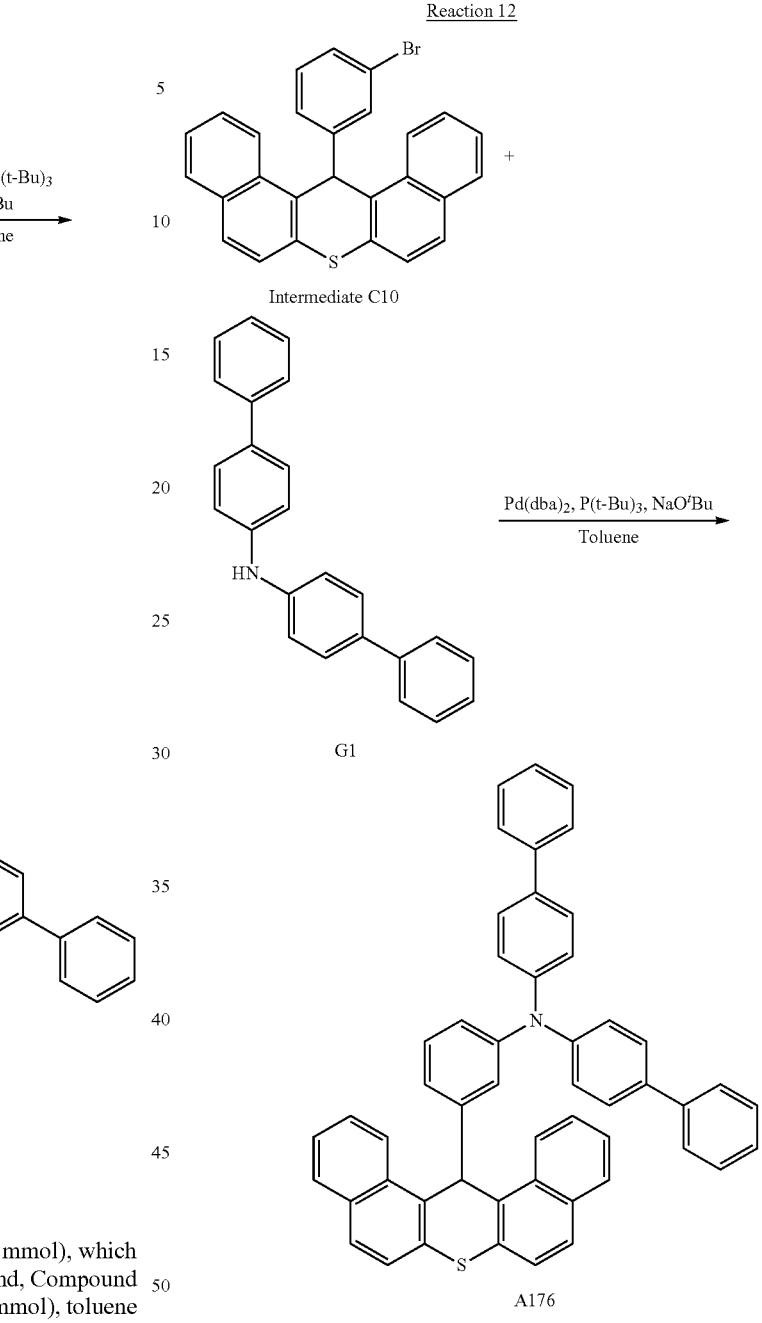

A98

To Intermediate Compound C9 (10.7 g, 20 mmol), which was a xanthene compound, an amine compound, Compound G1 (6.4 g, 20 mmol), and NaOtBu (2.0 g, 20 mmol), toluene (300 ml) was added and deaerated. Under an argon atmosphere, tri-tert-butylphosphine (2.7 ml, 1.5 M in toluene) and bis(dibenzylideneacetone) palladium (0.6 g, 1.0 mmol) were added, followed by heating and stirring at about 85° C. for about 6 hours. The reaction solution was cooled in the air to room temperature, extracted with toluene, washed with H₂O and brine, respectively, and dried with Na₂SO₄. The solution thus obtained was concentrated and separated by silica gel column chromatography to obtain Compound A98 (7.8 g, 10 mmol, FAB-MS 777.30, yield 50%).

Synthesis of Compound A176

Polycyclic Compound A176 according to an embodiment may be synthesized, for example, by the following Reaction 12:

To Intermediate Compound C10 (9.1 g, 20 mmol), which was a thioxanthene compound, an amine compound, Compound G1 (6.4 g, 20 mmol), and NaOtBu (2.0 g, 20 mmol), toluene (300 ml) was added and deaerated. Under an argon atmosphere, tri-tert-butylphosphine (2.7 ml, 1.5 M in toluene) and bis(dibenzylideneacetone) palladium (0.6 g, 1.0 mmol) were added, followed by heating and stirring at about 85° C. for about 6 hours. The reaction solution was cooled in the air to room temperature, extracted with toluene, washed with H₂O and brine, respectively, and dried with Na₂SO₄. The solution thus obtained was concentrated and separated by silica gel column chromatography to obtain Compound A176 (5.5 g, 8 mmol, FAB-MS 693.25, yield 42%).

2. Manufacture and Evaluation of Organic Electroluminescence Device Including a Polycyclic Compound Manufacture of Organic Electroluminescence Devices Organic electroluminescence devices of exemplary embodiments including the polycyclic compounds of exemplary embodiments in a hole transport layer were manufactured by a method described below. Organic electroluminescence devices of Examples 1 to 9 were manufactured utilizing the polycyclic compounds of Compound A9, Compound A11, Compound A52, Compound A104, Compound A46, Compound A48, Compound A98, Compound A288, and Compound A176, respectively, as materials for a hole transport layer. In Comparative Examples 1 to 6, organic electroluminescence devices were manufactured utilizing Comparative Compounds R1 to R6, respectively, as materials of a hole transport layer Compounds utilized in the hole transport layer in Examples 1 to 9 and Comparative Examples 1 to 6 are shown below.

TABLE 1

Compound A9

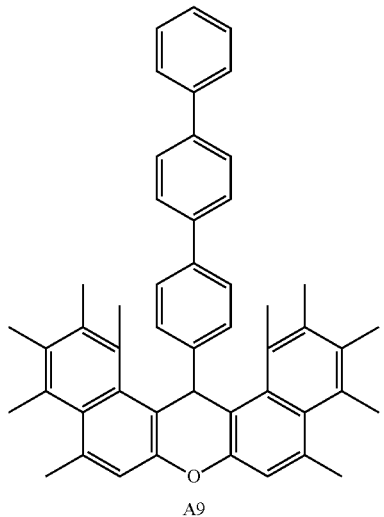

A9

Compound A11

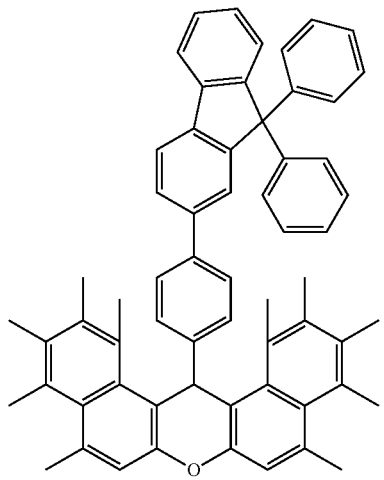

A11

TABLE 1-continued
Compound A52
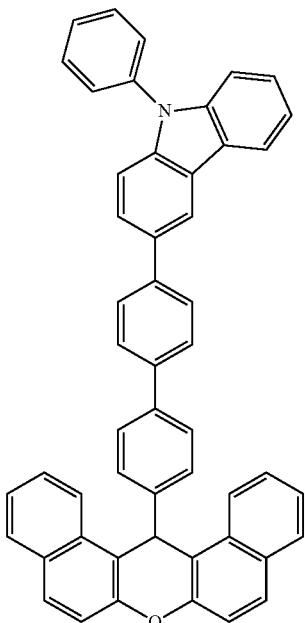
A52
Compound A104
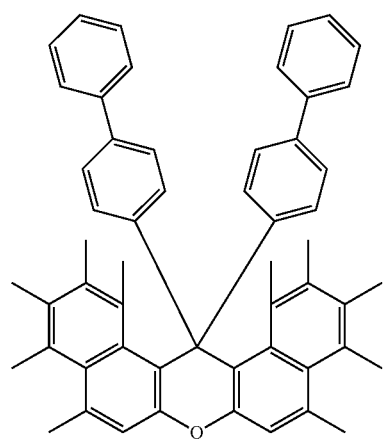
A104
Compound A46
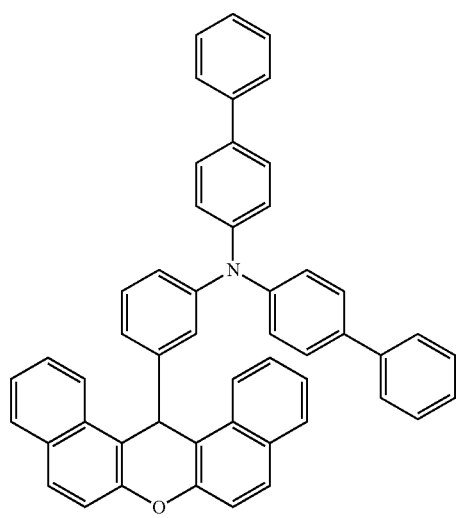
A46

TABLE 1-continued
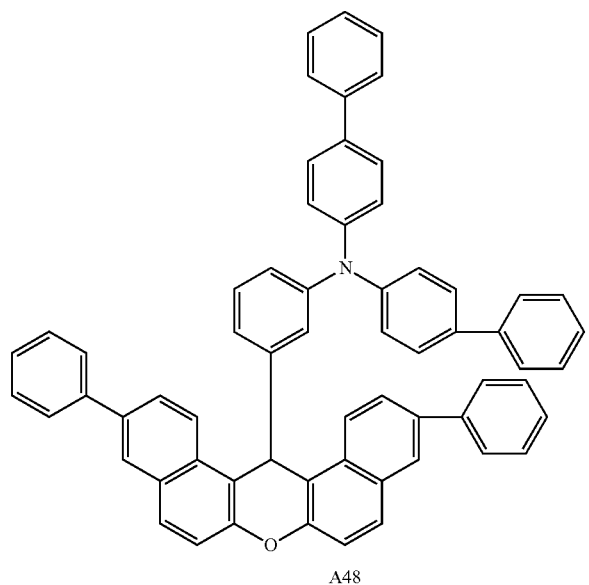
A48
Compound A48
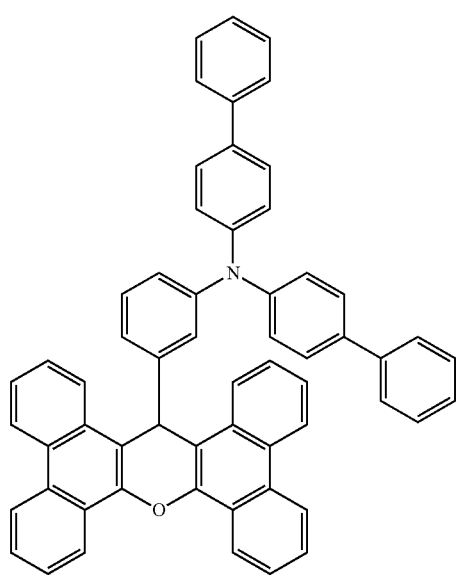
A98
Compound A98

TABLE 1-continued
Compound A288
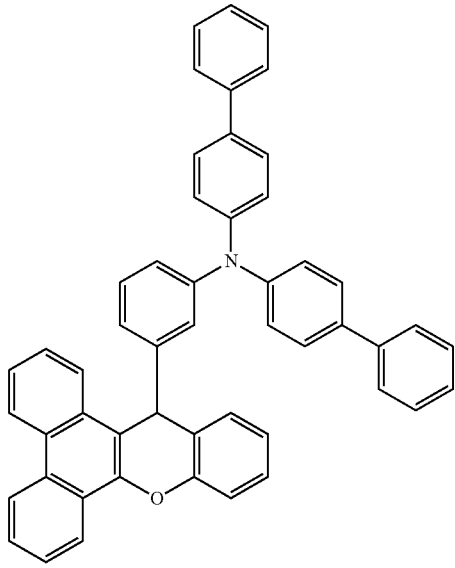
A288
Compound A176
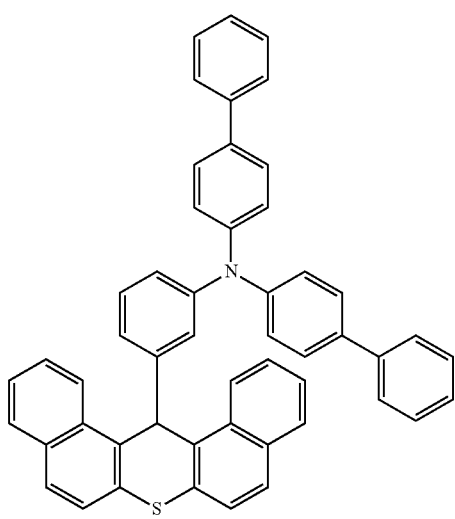
A176
Comparative Compound R1
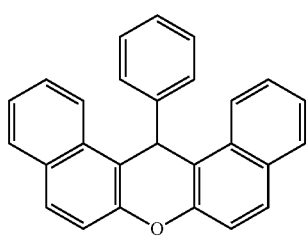
R1

TABLE 1-continued
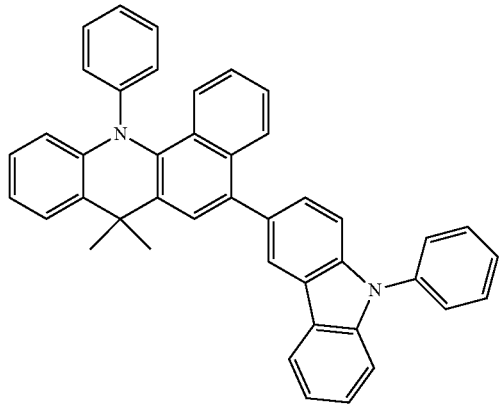
R2
Comparative Compound R2
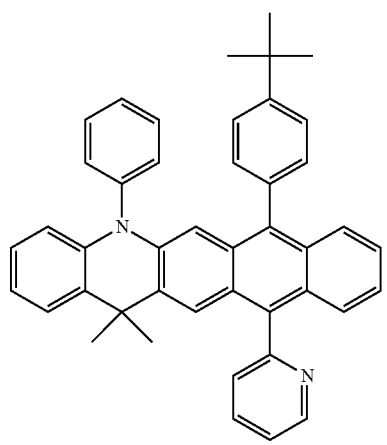
R3
Comparative Compound R3
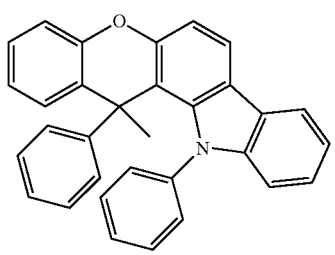
R4
Comparative Compound R4
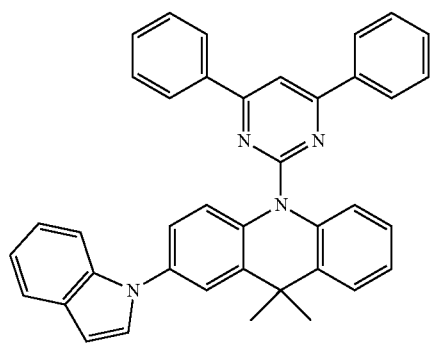
R5
Comparative Compound R5

TABLE 1-continued

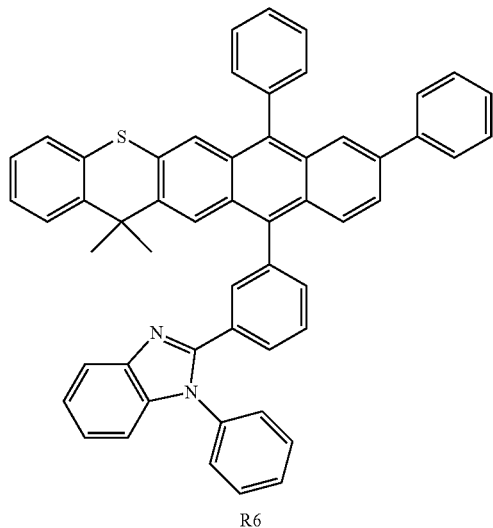

Comparatve Compound R6

R6

On a glass substrate, ITO was patterned to a thickness of about 1,500 Å and washed with ultra-pure water, and a UV ozone treatment was conducted for about 10 minutes. 2-TNATA was deposited to a thickness of about 600 Å to form a hole injection layer. Then, one selected from the Example Compounds and the Comparative Compounds was deposited to a thickness of about 300 Å to form a hole transport layer.

An emission layer was formed on the hole transport layer utilizing ADN doped with 3% TBP to a thickness of about 250 Å. Then, an electron transport layer was formed by depositing Alq3 to a thickness of about 250 Å and an electron injection layer was formed by depositing LiF to a thickness of about 10 Å.

Then, a second electrode was formed by depositing Al to a thickness of about 1,000 Å.

In an embodiment, a hole injection layer, a hole transport layer, an emission layer, an electron transport layer, an electron injection layer and a second electrode were formed by utilizing a vacuum deposition apparatus.

Evaluation of Properties of Organic Electroluminescence Device

The evaluation results of the organic electroluminescence devices according to Example 1 to Example 9, and Comparative Example 1 to Comparative Example 6 are shown in Table 2. In Table 2, the device efficiency, device life and driving voltage of the organic electroluminescence devices thus manufactured are compared and shown. The evaluation results on the device efficiency and the device life for Example 1 to Example 9 and Comparative Example 1 to Comparative Example 6 are shown as relative values. In the following embodiments, the device efficiency and the device life of the Examples and the Comparative Examples are shown as relative values with respect to 100% of the device efficiency and life of Example 3.

In the evaluation results of the properties of the Examples and the Comparative Examples in Table 2, the device efficiency represents efficiency values at a current density of 10 mA/cm², and the device life represents half-life at 1.0 mA/cm².

The current density and device efficiency of the organic electroluminescence devices of the Examples and the Comparative Examples were measured utilizing 2400 series Source Meter of Keithley Instrument Co., a luminous brightness measurement apparatus, CS-200 of Konica Minolta Co., and PC Program LabVIEW 2.0 for measurement of National Instrument Co., in Japan, in a dark room.

TABLE 2

| Device manufacturing example | Hole transport layer material | Device efficiency | Device life | Driving voltage (V) |
|---|---|---|---|---|
| Example 1 | Example Compound A9 | 105% | 102% | 4.3 |
| Example 2 | Example Compound A11 | 104% | 104% | 4.3 |
| Example 3 | Example Compound A52 | 100% | 100% | 4.5 |
| Example 4 | Example Compound A104 | 106% | 106% | 4.3 |
| Example 5 | Example Compound A46 | 108% | 110% | 4.2 |
| Example 6 | Example Compound A48 | 108% | 106% | 4.2 |
| Example 7 | Example Compound A98 | 109% | 108% | 4.2 |
| Example 8 | Example Compound A288 | 108% | 107% | 4.2 |
| Example 9 | Example Compound A176 | 110% | 107% | 4.2 |
| Comparative Example 1 | Comparative Compound R1 | 45% | 51% | 5.2 |
| Comparative Example 2 | Comparative Compound R2 | 86% | 55% | 4.9 |
| Comparative Example 3 | Comparative Compound R3 | 82% | 61% | 4.9 |
| Comparative Example 4 | Comparative Compound R4 | 76% | 46% | 5.1 |
| Comparative Example 5 | Comparative Compound R5 | 71% | 41% | 5.1 |
| Comparative Example 6 | Comparative Compound R6 | 78% | 56% | 4.9 |

Referring to the results of Table 2, it was found that the organic electroluminescence devices of the Examples, which utilized the polycyclic compound of an embodiment as a hole transport layer material, showed good (e.g., excellent) device efficiency, good device life characteristics and low driving voltage That is, it was found that the organic electroluminescence devices of Examples 1 to 9 showed higher emission efficiency and longer life characteristics when compared with Comparative Examples 1 to 6. When comparing Example 1 to Example 9 with Comparative Example 1, Example 1 to Example 9 showed significantly (e.g., markedly) decreased driving voltage. When comparing with Comparative Compound R1, the Example Compounds utilized in Example 1 to Example 8 had increased carbon number of an aryl group which was bonded to carbon which was composed of a sp3 orbital and included in a xanthene skeleton, and formed electronically enlarged molecular orbital, and thus, charge transport properties were improved. For example, compared with Comparative Compound R1, the Example Compounds utilized in Example 1 to Example 8 had greater total number of carbon atoms in groups corresponding to $Ar_1$ and $Ar_2$ of Formula 1. Thus, the driving voltages in the devices of exemplary embodiments (e.g., Examples 1 to 8) were decreased. In addition, such structural characteristics of the Example Compounds affected the device efficiency, and Example 1 to Example 8 showed improved device efficiency when compared with Comparative Example 1. Also, regarding the device life, due to the increase of the carbon number of an aryl group which was bonded to carbon composed of a sp3 orbital, the molecular weight of a compound was increased, and the glass transition temperature of the Example Compounds was increased and amorphous properties in a layer which was composed of the Example Compounds were increased. Accordingly, Example 1 to Example 8 were found to show improved properties when compared with Comparative Example 1.

The device efficiency and device life of Example 1 to Example 8 were improved when compared with Comparative Example 2 to Comparative Example 6. These results are considered due to structural difference of a nitrogen-containing material such as Comparative Compound R2 to Comparative Compound R6 and a non-nitrogen-containing material such as the xanthene skeleton of the Example Compounds utilized in Example 1 to Example 8. Example 1 to Example 8 showed excellent device properties due to excellent hole transport capacity by the compound structure when compared with Comparative Example 2 to Comparative Example 6.

Further, the significant (e.g., remarkable) decrease of the device efficiency in Comparative Example 3 to Comparative Example 6 was considered due to energy transfer in an excited state.

In addition, regarding Example 1 and Example 2, if the carbon number of an aryl group (e.g., the total carbon number of the aryl group) which was substituted in carbon composed of a sp3 orbital was increased, the device efficiency was kept to an equivalent level and the device life was even further improved. In addition, the Example Compound (e.g., Compound A11) in which sterically large substituent was substituted as utilized in Example 2 showed increased amorphous properties, and might promote the increase of device efficiency and device life. In addition, as the Example Compound (e.g., Compound A52) utilized in Example 3, if an aryl group substituted with a heterocycle was included, high device efficiency and long-life characteristics to degrees equivalent to Example 1 and Example 2 were shown.

Also, the Example Compound utilized in Example 4, in which two aryl groups were substituted in carbon composed of a sp3 orbital, was different from the Example Compound utilized in Example 1, in which one aryl group was substituted. When comparing Example 4 with Example 1, a case where two aryl groups were substituted showed improved device life in general, when compared with a case where one aryl group was substituted.

In addition, if an aryl group was introduced in a xanthene skeleton as in Example 6, the properties of an electronic molecular orbital composed of a sp3 orbital included in the xanthene skeleton and resultant charge transfer properties might be improved. From the comparison of Example 5 and Example 6, it was found that high device efficiency and long-life characteristics, which were of equivalent degrees were shown.

Also, if a xanthene skeleton contains a condensed carbon rings with three hexagonal hydrocarbon rings (e.g., phenanthrene moiety) as in Example 7 and Example 8, high device efficiency and long-life characteristics were shown by the electronic enlargement in a xanthene skeleton as in Example 5 and Example 6, in which contains a condensed carbon rings with two hexagonal hydrocarbon rings (e.g., naphthalene moiety). In addition, from the comparison of Example 7 to Example 8, high device efficiency and long-life characteristics were shown due to a xanthene skeleton even in an asymmetric case.

In addition, as in Example 9, if a thioxanthene skeleton was introduced instead of the xanthene skeleton, the properties of an electronic molecular orbital composed of a sp3 orbital included in a thioxanthene skeleton and resulted charge transfer properties were improved when compared with Example 7. Accordingly, high device efficiency and long-life characteristics which were of equivalent degrees to Example 7 were shown.

That is, referring to the results of the Examples and Comparative Examples in Table 2, the polycyclic compounds utilized in the Examples had a xanthene skeleton or a thioxanthene skeleton. By enhancing the combination of substituents substituted in a carbon atom composed of a sp3 orbital in the xanthene skeleton or the thioxanthene skeleton, improved hole transport capacity was attained. In addition, the devices of embodiments manufactured by including the polycyclic compounds of embodiments may show improved device efficiency, long-life characteristics, and low driving voltage properties.

The polycyclic compound of an embodiment may be included in a hole transport region and may promote the high efficiency, long-life, and low driving voltage properties of the organic electroluminescence device of an embodiment. For example, if the polycyclic compound of an embodiment is included in a hole transport region which is adjacent to an emission layer, orientation properties in the hole transport region and charge transfer properties (such as hole injection and hole transportation) may be even further improved, thereby significantly (e.g., markedly) improving the device efficiency and device life of an organic electroluminescence device.

The polycyclic compound according to an embodiment may improve the emission efficiency and device life of an organic electroluminescence device.

The organic electroluminescence device according to an embodiment includes the polycyclic compound of an embodiment in a hole transport region and may attain high efficiency and long-life characteristics.

Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present invention have been described, it is understood that the present invention should not be limited to these exemplary embodiments but various changes and modifications can be made by one ordinary skilled in the art within the spirit and scope of the present disclosure as hereinafter claimed, and equivalents thereof.

What is claimed is:
1. An organic electroluminescence device, comprising:
a first electrode;
a second electrode on the first electrode; and
a plurality of organic layers between the first electrode and the second electrode, wherein at least one organic layer of the plurality of organic layers comprises a polycyclic compound represented by any one selected from the following Formula 1-2 to Formula 1-5:

Formula 1-2
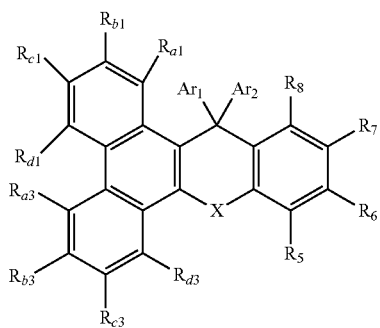

Formula 1-3
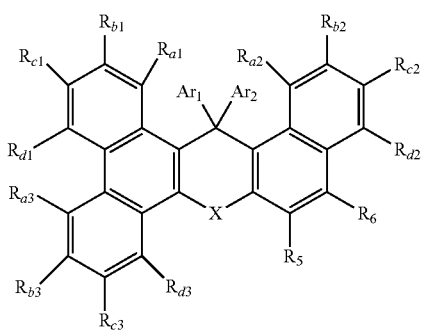

-continued

Formula 1-4
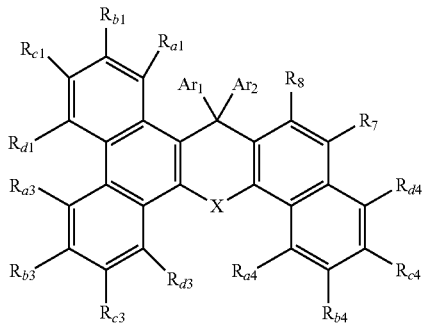

Formula 1-5
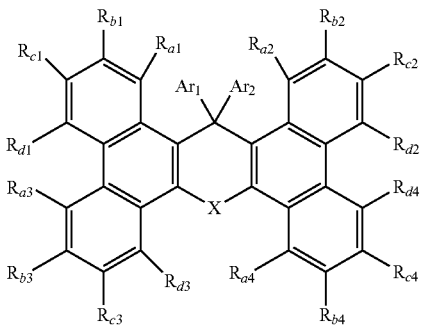

wherein in Formula 1-2 to Formula 1-5,
X is O or S,
$Ar_1$ and $Ar_2$ are each independently a hydrogen atom, a deuterium atom, a halogen atom, a cyano group, a substituted or unsubstituted silyl group, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms, or a substituted or unsubstituted heteroaryl group of 2 to 50 carbon atoms, wherein $Ar_1$ and $Ar_2$ are not joined to form a ring,
when one of $Ar_1$ and $Ar_2$ is a hydrogen atom, the other one is not selected from a group consisting of a hydrogen atom, a deuterium atom, an unsubstituted phenyl group, an unsubstituted biphenyl group, a phenyl group substituted with a t-butyl group, an aryl group of 6 to 50 carbon atoms substituted with an amino group, and a heteroaryl group of 2 to 50 carbon atoms substituted with an amino group, and
when one of $Ar_1$ and $Ar_2$ is an unsubstituted phenyl group, the other one is selected from the group consisting of a substituted phenyl group, a substituted or unsubstituted biphenyl group, a substituted or unsubstituted naphthalene group, and a substituted or unsubstituted phenanthrene group, provided that the substituents of $Ar_1$ and $Ar_2$ do not form a fused ring,
$R_5$ to $R_8$ are each independently a hydrogen atom, and $R_{a1}$ to $R_{d1}$, $R_{a2}$ to $R_{d2}$, $R_{a3}$ to $R_{d3}$, and $R_{a4}$ to $R_{d4}$ are each independently a hydrogen atom.
2. The organic electroluminescence device of claim 1, wherein the plurality of organic layers comprises:
an emission layer; and
a hole transport region between the first electrode and the emission layer, wherein the hole transport region comprises the polycyclic compound.

3. The organic electroluminescence device of claim 1, wherein the plurality of organic layers comprises:
an emission layer;
a hole injection layer between the first electrode and the emission layer; and
a hole transport layer between the hole injection layer and the emission layer, wherein the hole transport layer comprises the polycyclic compound.

4. The organic electroluminescence device of claim 1, wherein $Ar_1$ and $Ar_2$ are each independently a hydrogen atom, a substituted or unsubstituted phenyl group, a substituted or unsubstituted biphenyl group, a substituted or unsubstituted naphthalene group, a substituted or unsubstituted phenanthrene group, a substituted or unsubstituted dibenzofuran group, a substituted or unsubstituted dibenzothiophene group, or a substituted or unsubstituted fluorene group.

5. The organic electroluminescence device of claim 2, wherein the emission layer comprises an anthracene derivative represented by the following Formula 3:

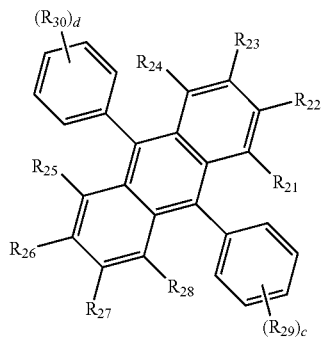

Formula 3 wherein in Formula 3,
$R_{21}$ to $R_{30}$ are each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms, or a substituted or unsubstituted heteroaryl group of 2 to 30 carbon atoms, or combined with an adjacent group to form a ring, and
c and d are each independently an integer of 0 to 5.

6. The organic electroluminescence device of claim 1, wherein the polycyclic compound comprises at least one selected from compounds represented in the following Compound Group 1 and Compound Group 2:

Compound Group 1

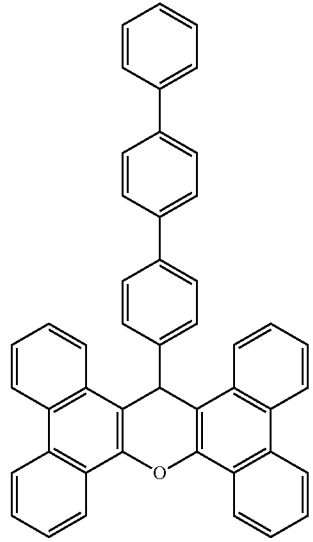

A53

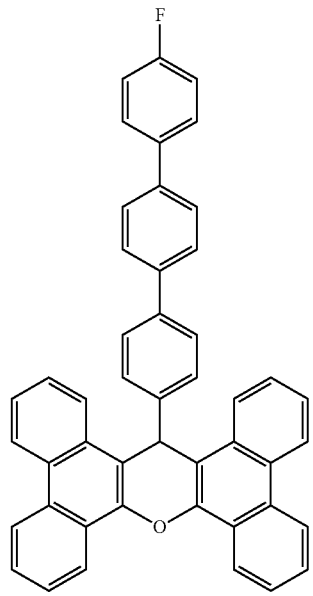

A54

-continued
A55
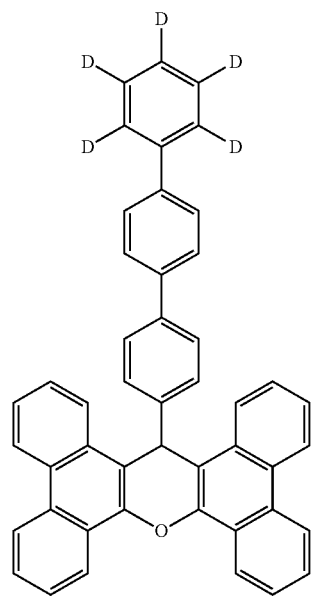
A57
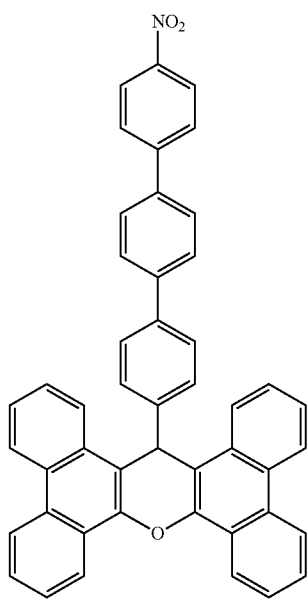
A56
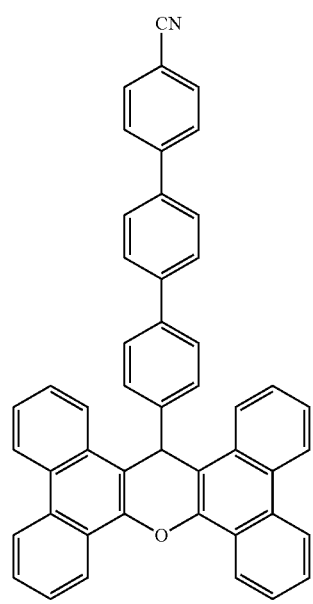
A58
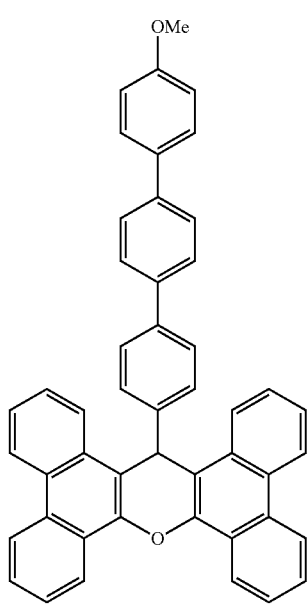

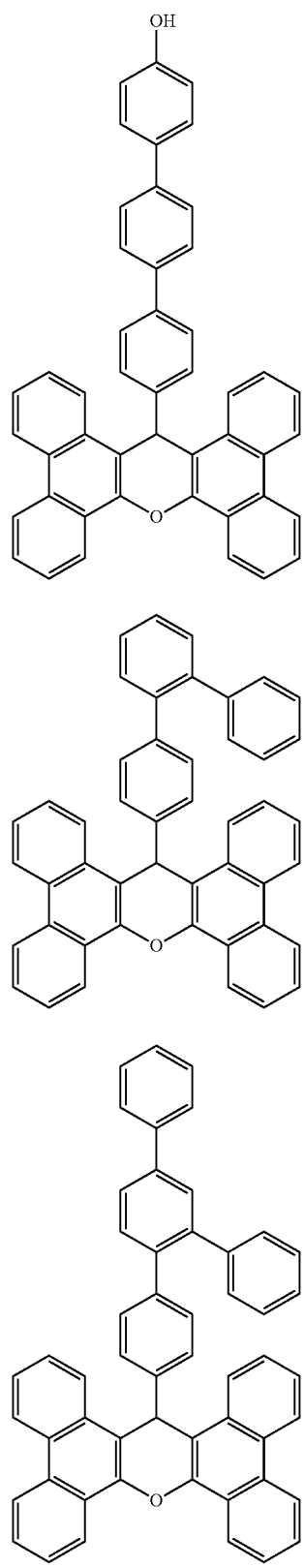
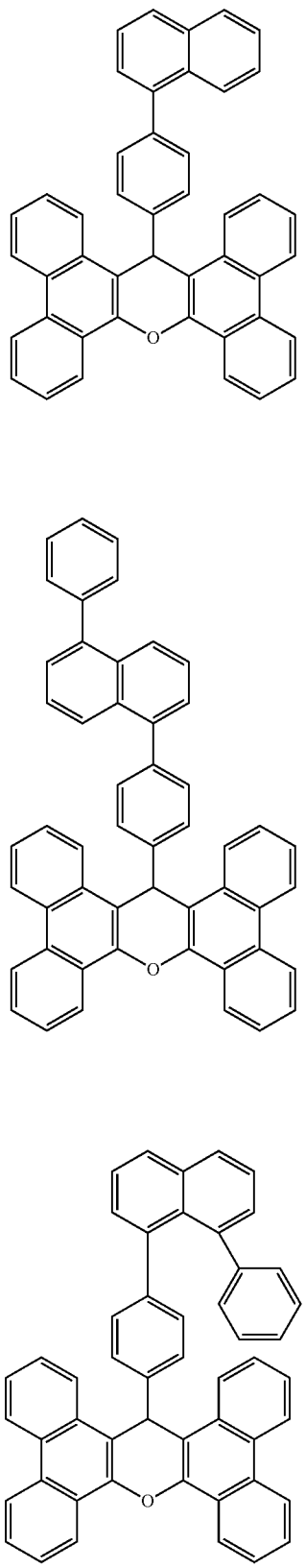

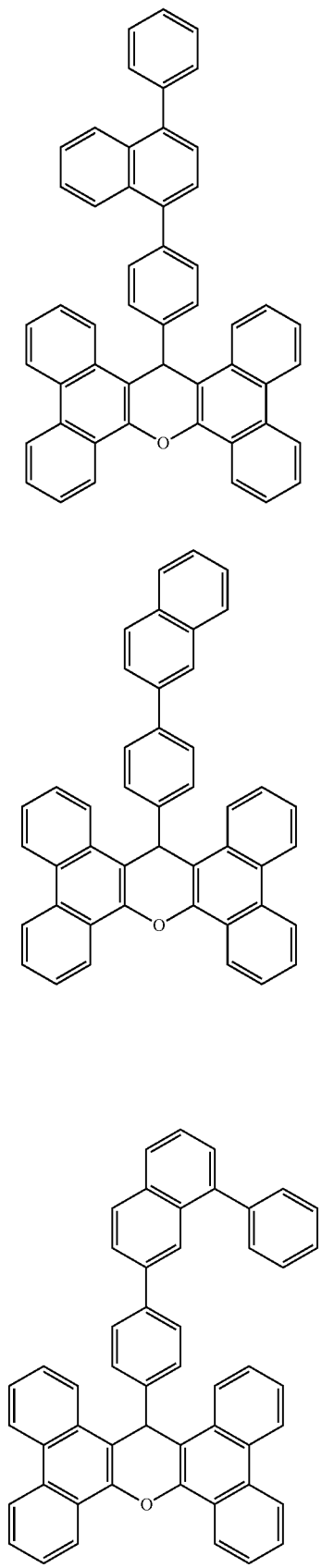
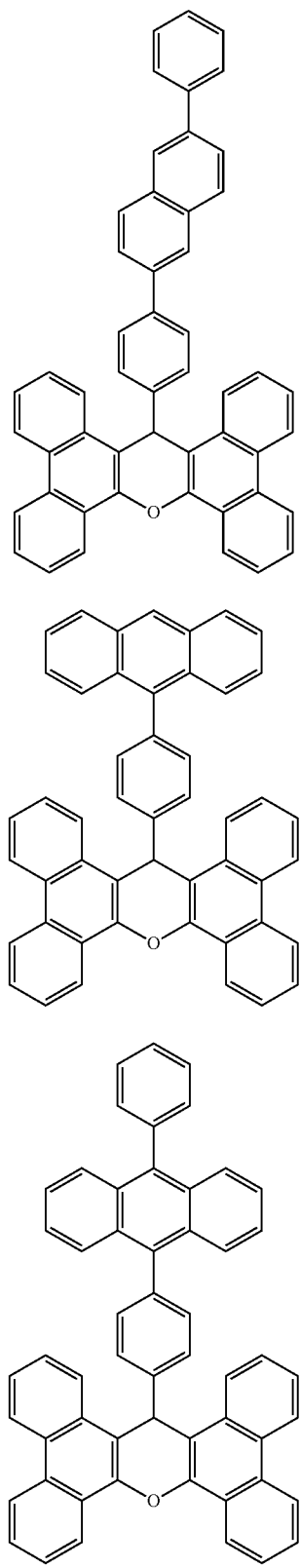

-continued
A72
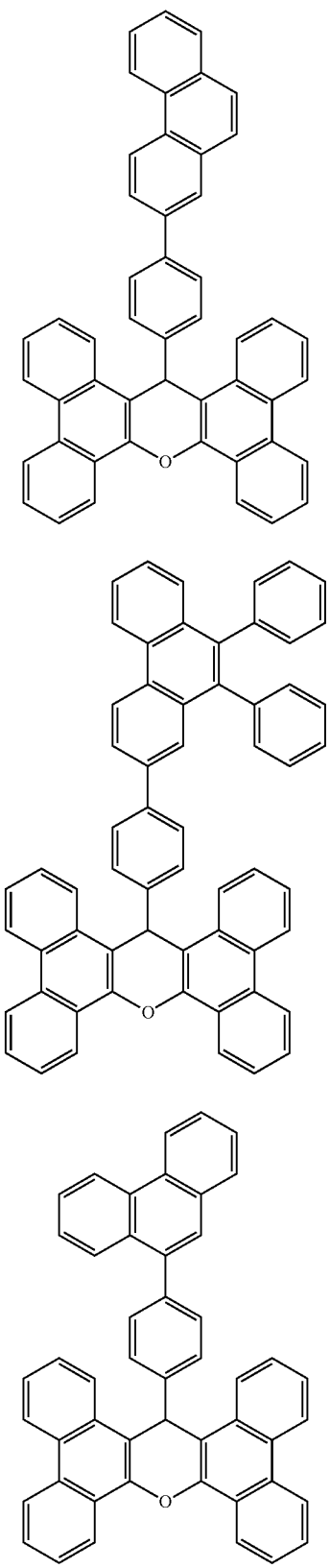
A73
A74
A75
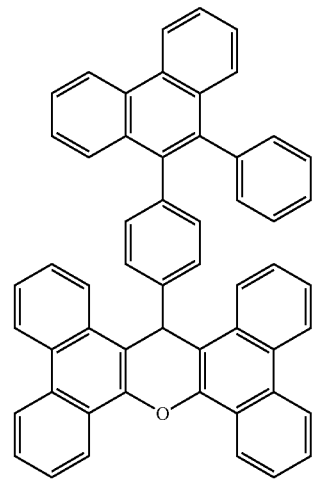
A76
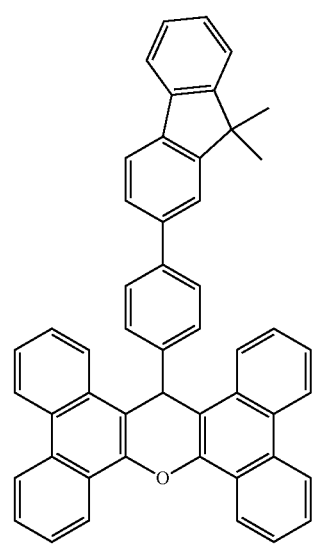
A77
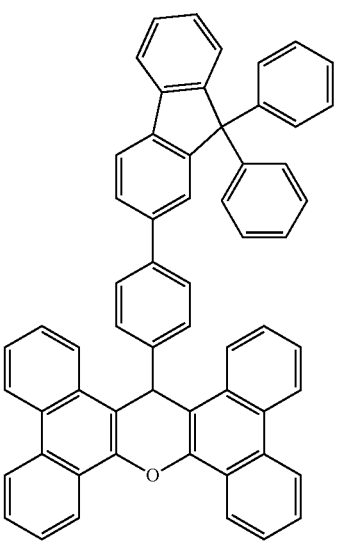

A78
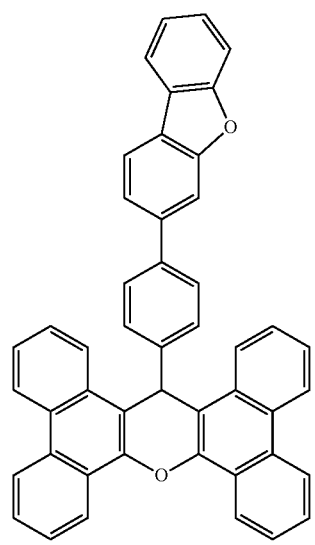
A79
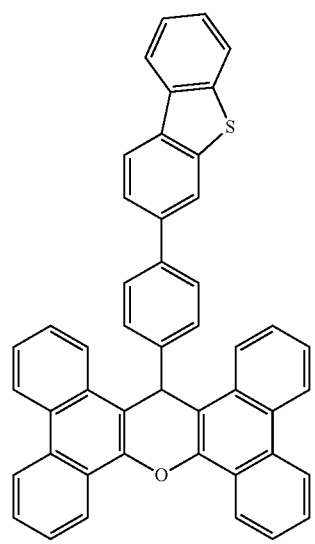
A80
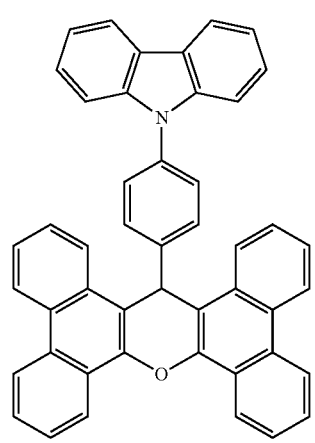
A81
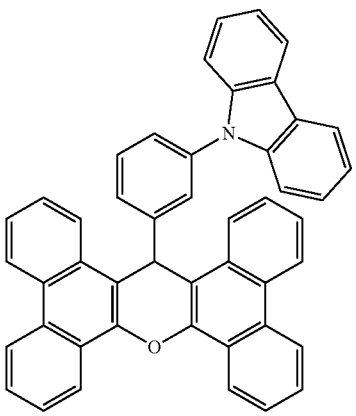
A82
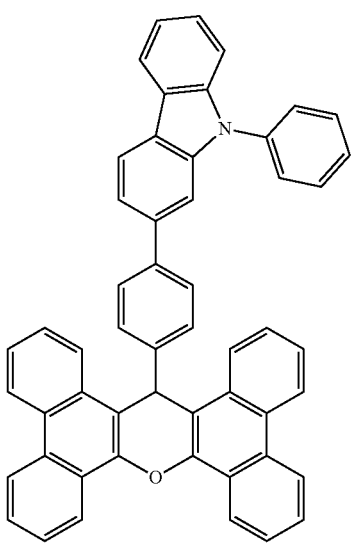
A83
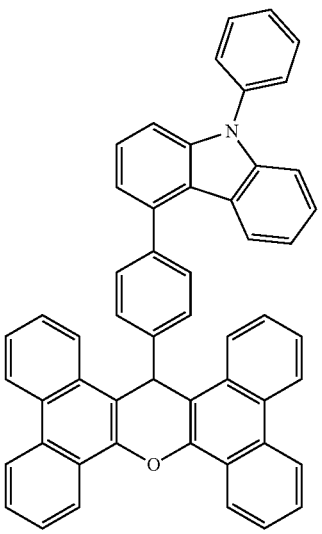

-continued
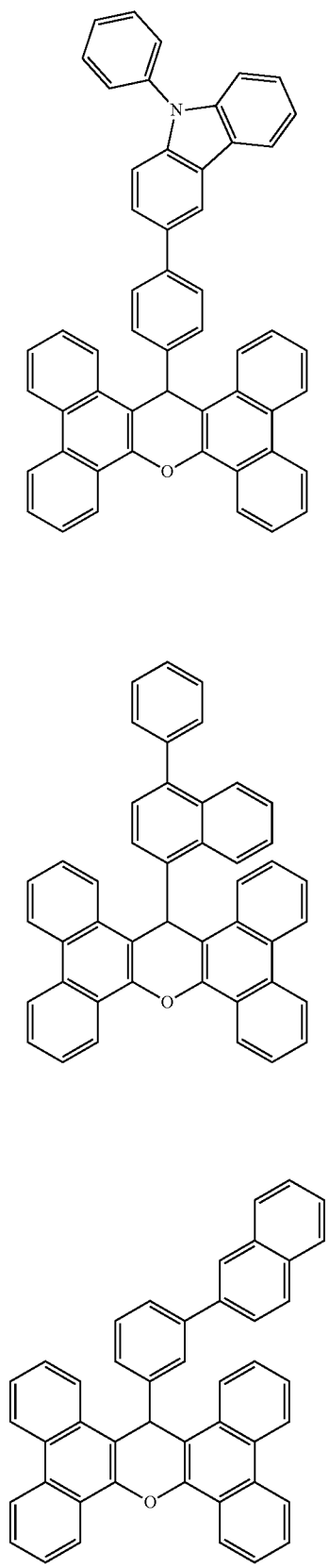
A84
A85
A86
-continued
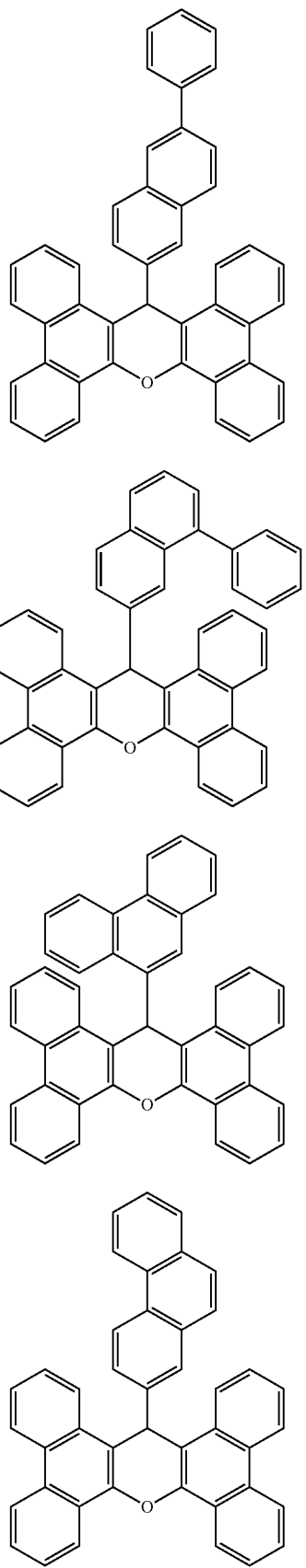
A87
A88
A89
A90

A91
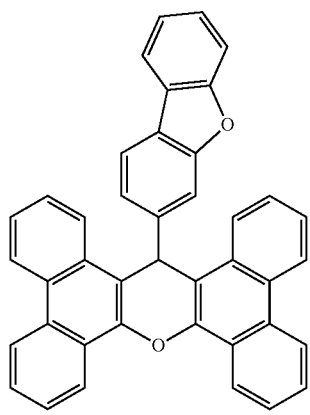
A92
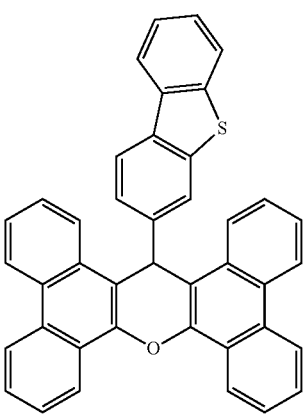
A93
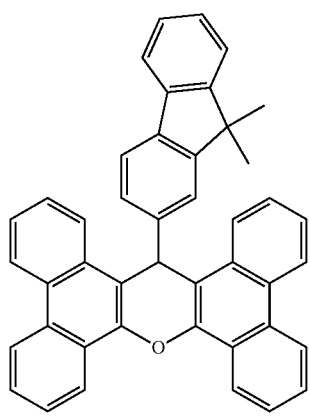
A94
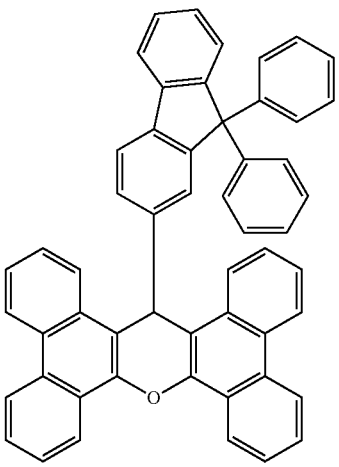
A95
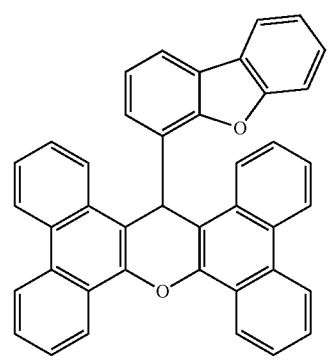
A96
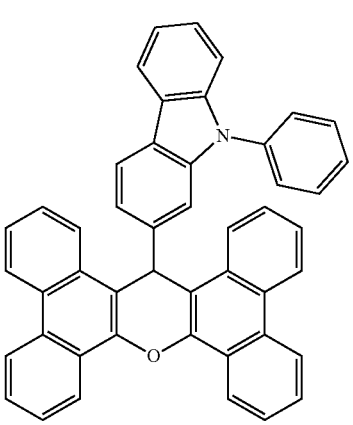

-continued
A97
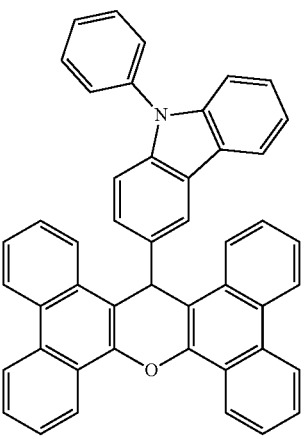
A121
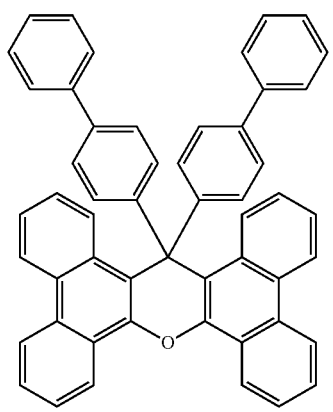
A122
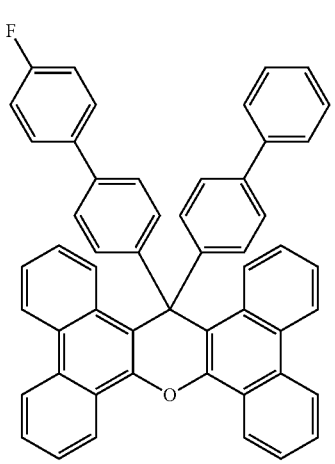
-continued
A123
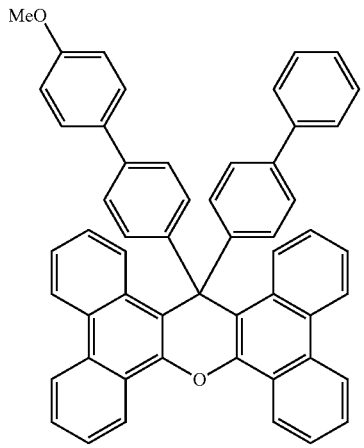
A124
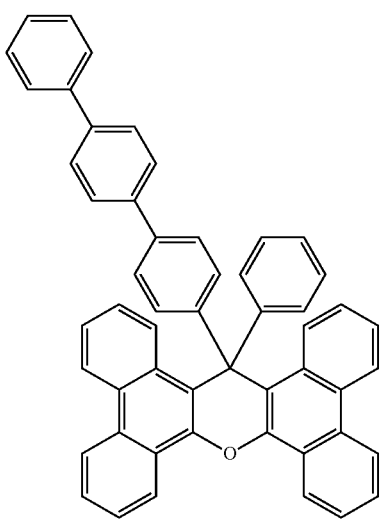
A125
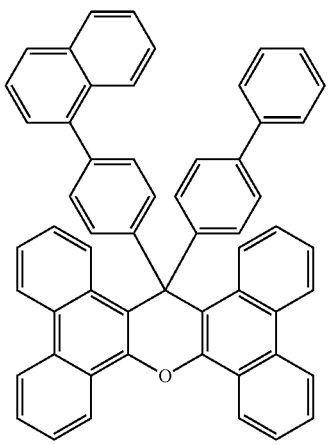

A126
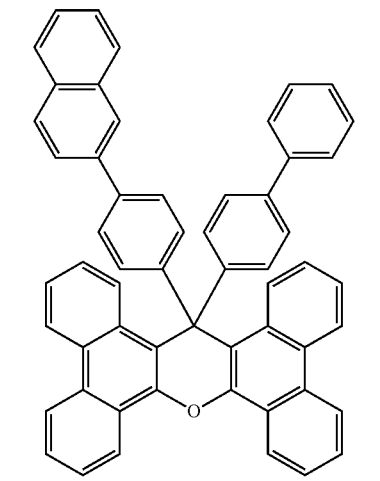
A127
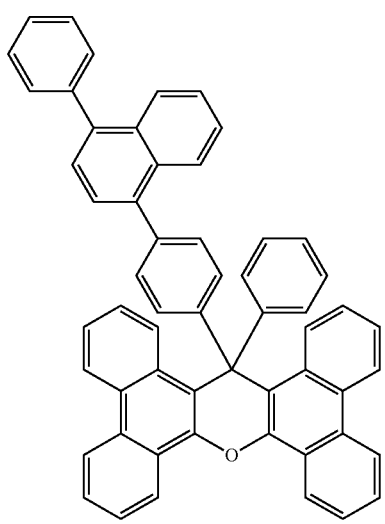
A128
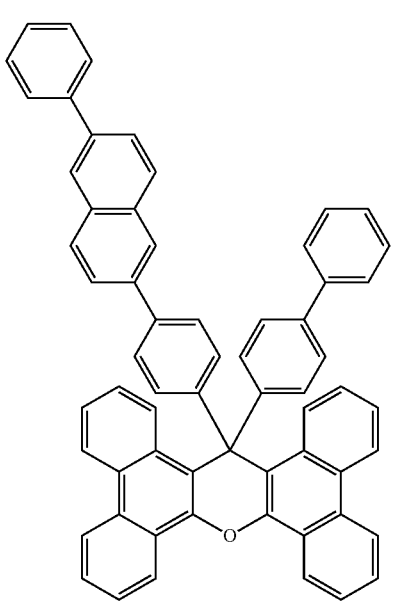
A129
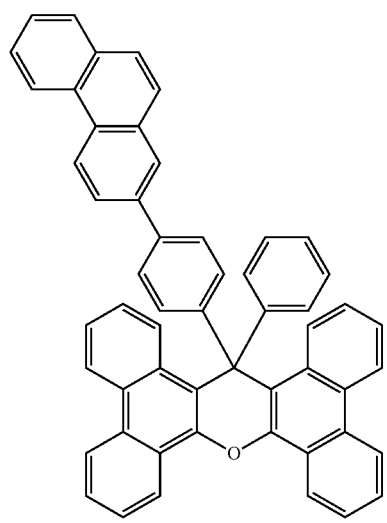
A130
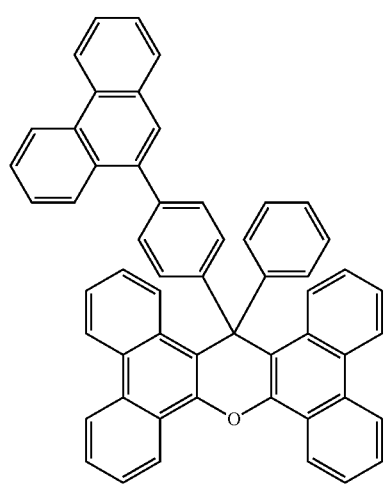
A131
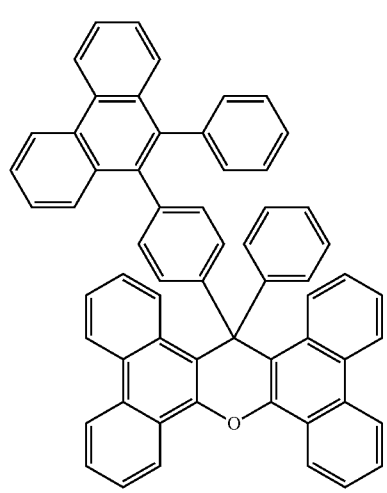

-continued
A132
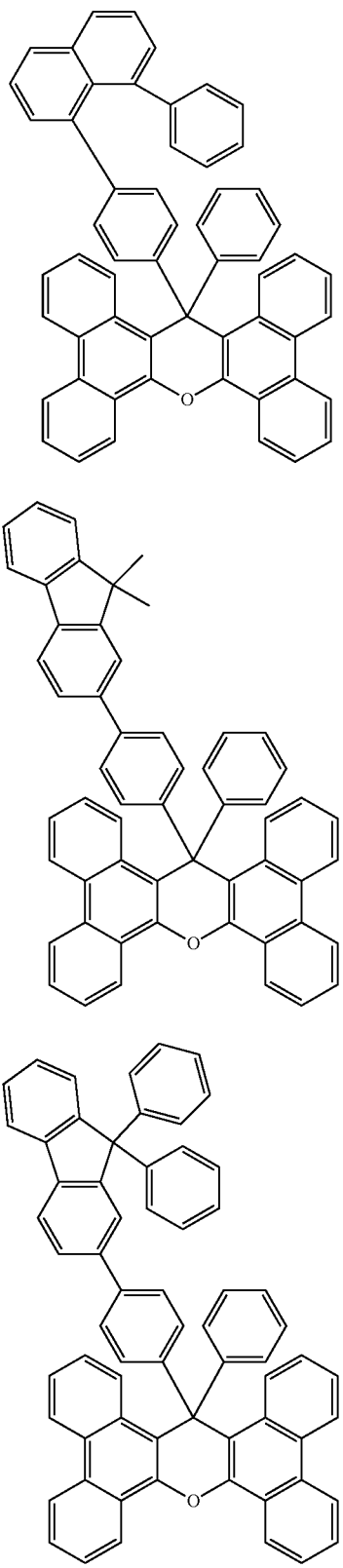
A133
A134
A135
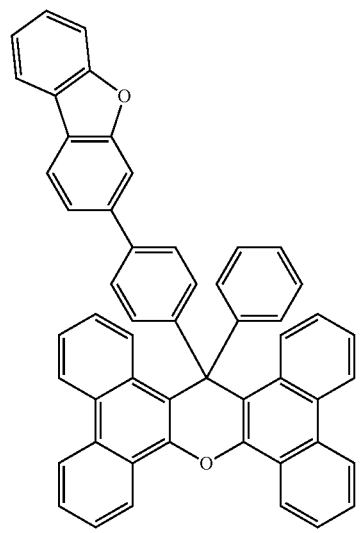
A136
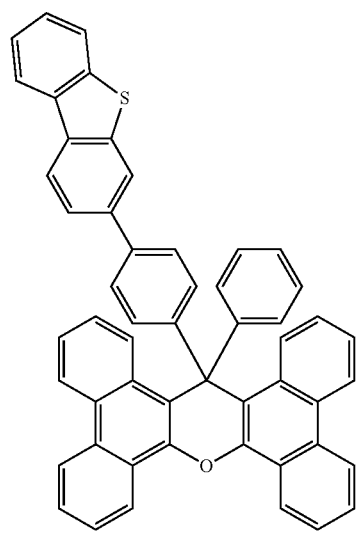
A137
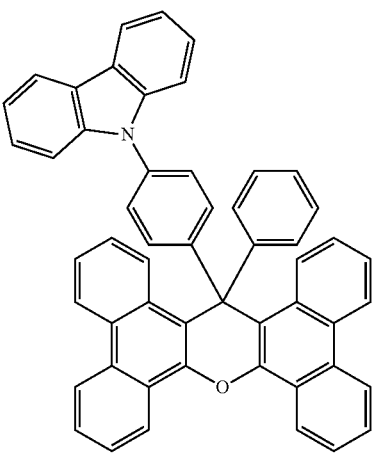

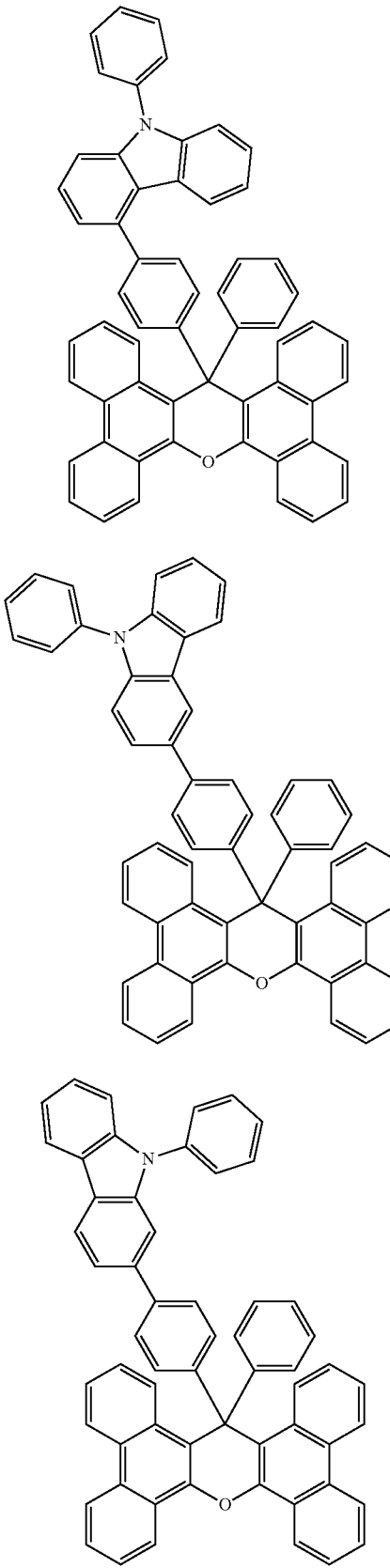

A195
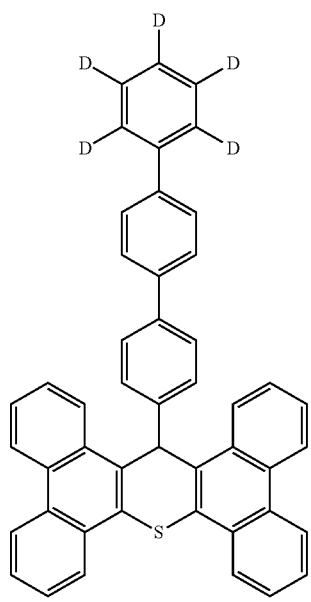
A196
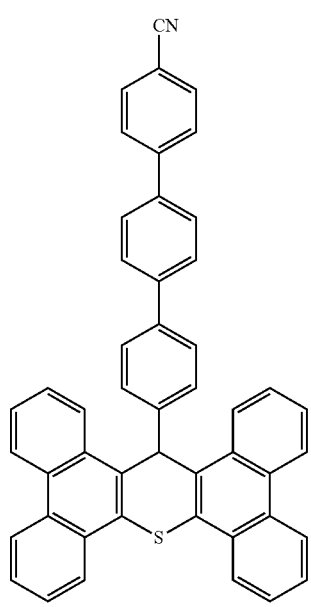
A197
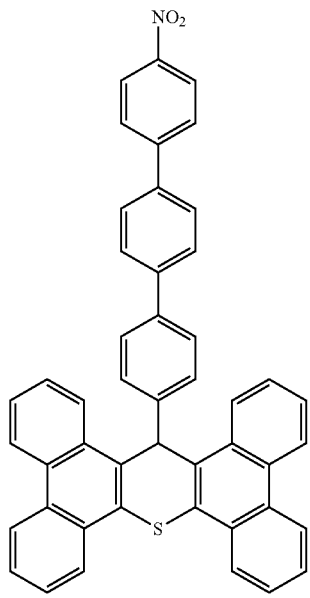
A198
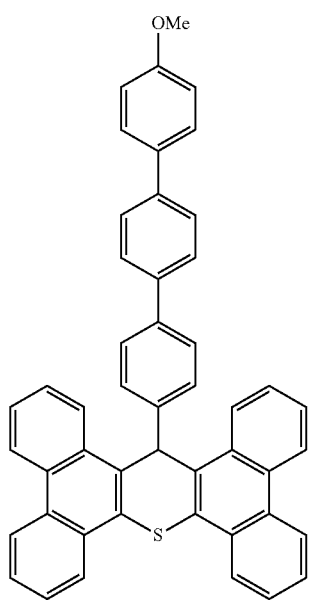

-continued
A199
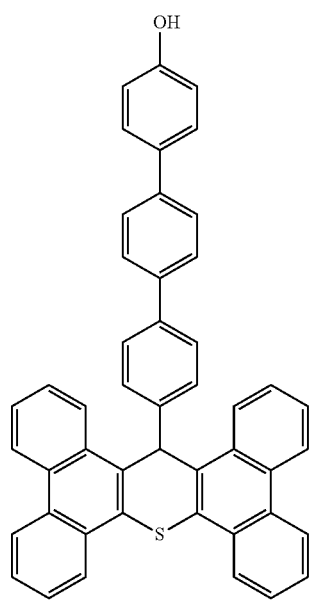
A201
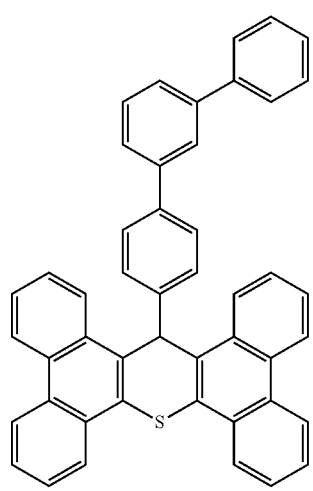
A202
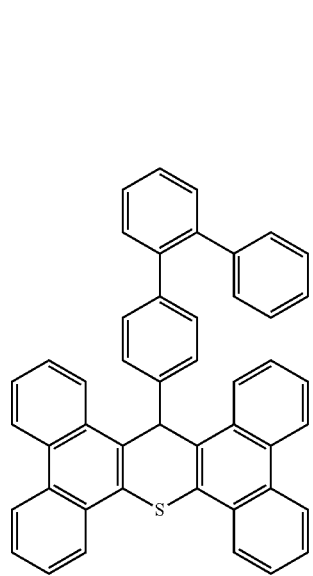
-continued
A203
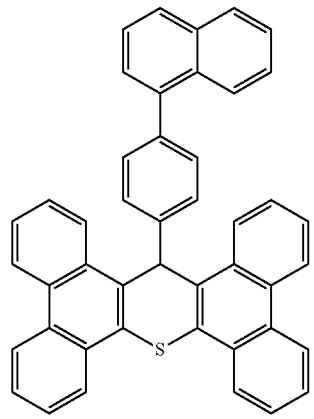
A204
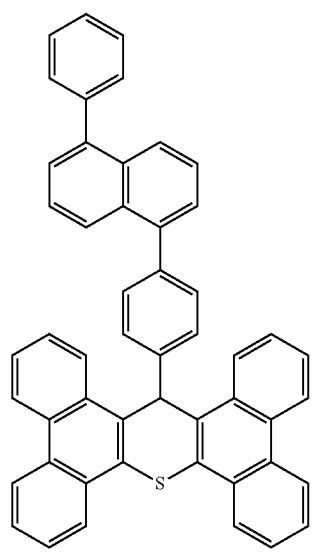
A205
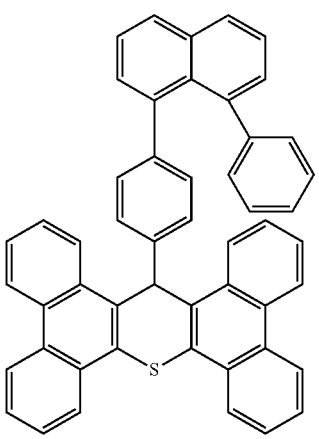

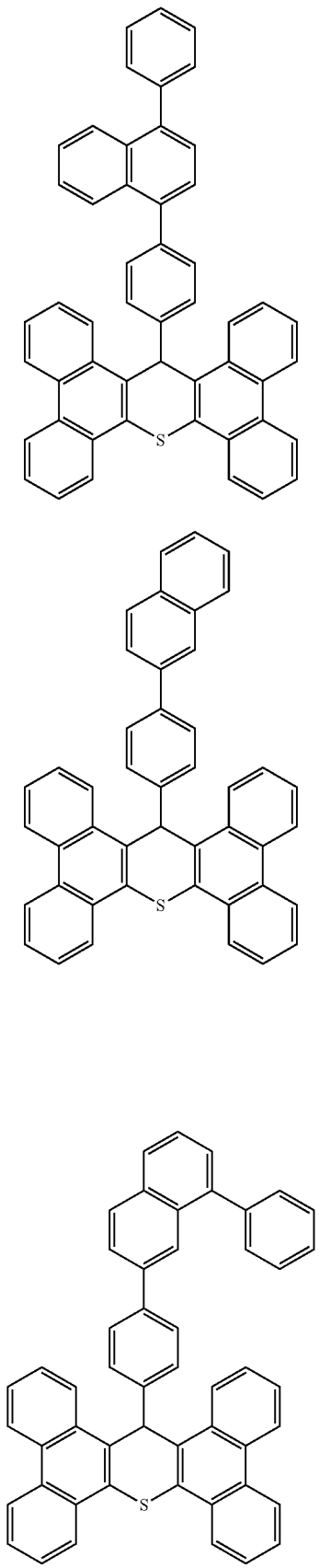
A206
A207
A208
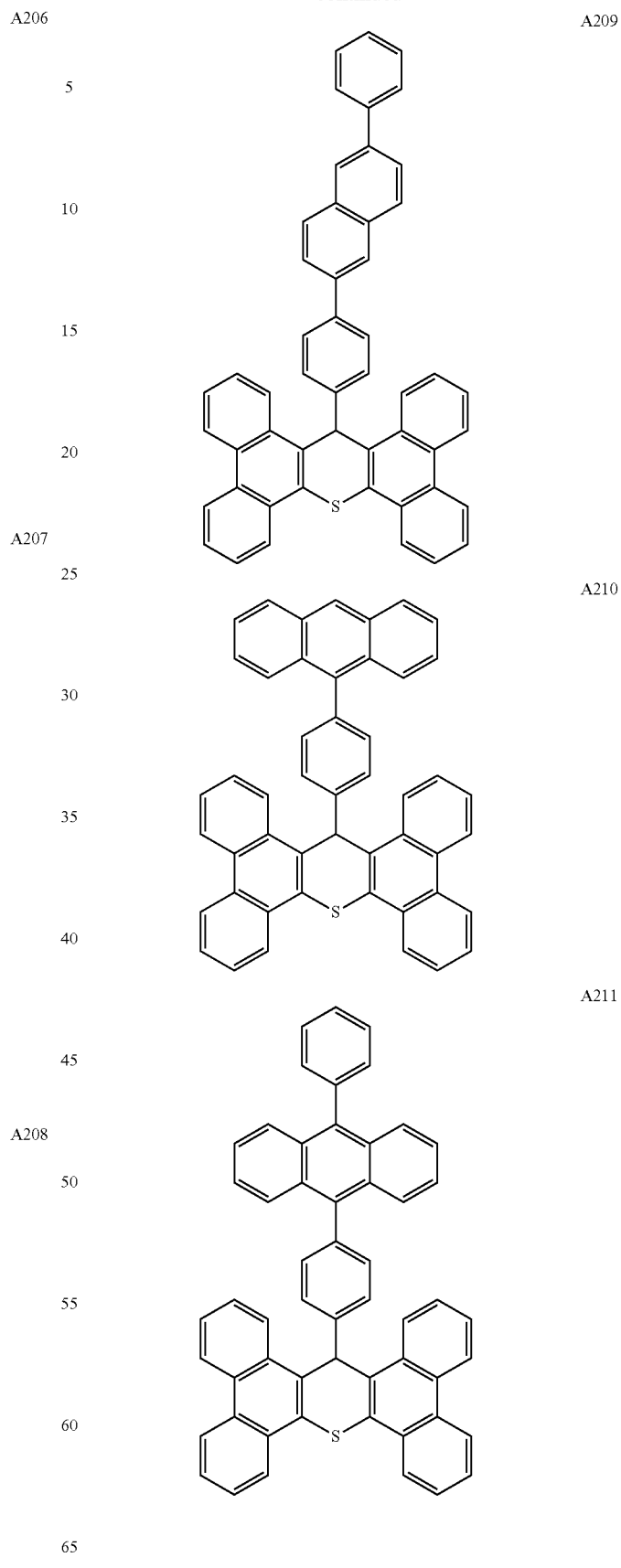
A209
A210
A211

A212
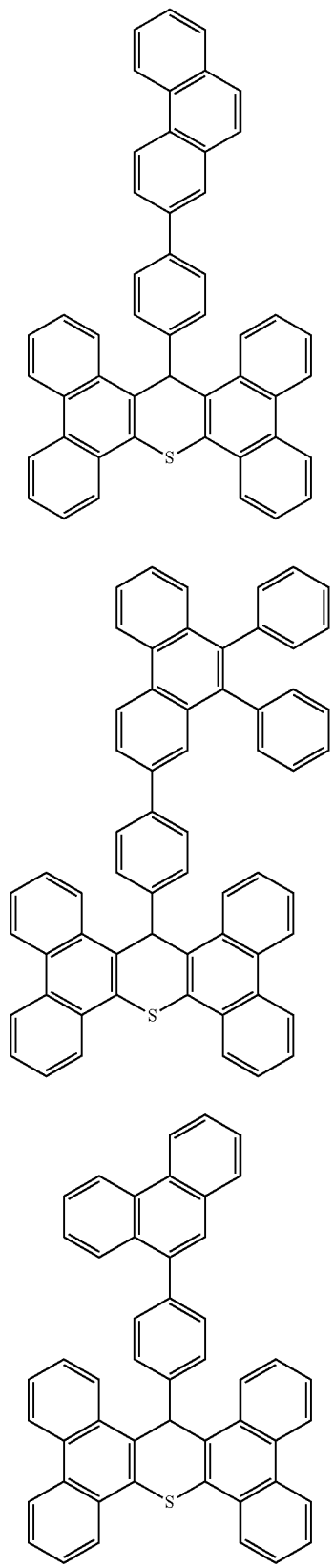
A213
A214
A215
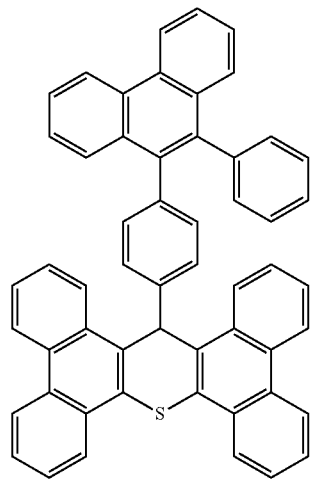
A216
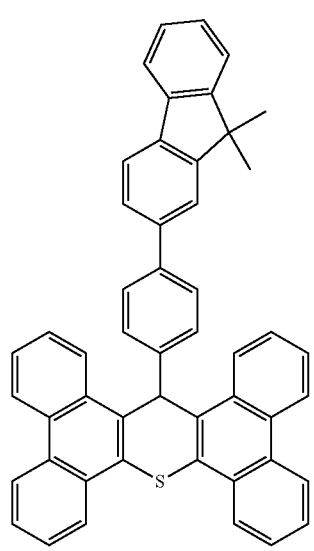
A217
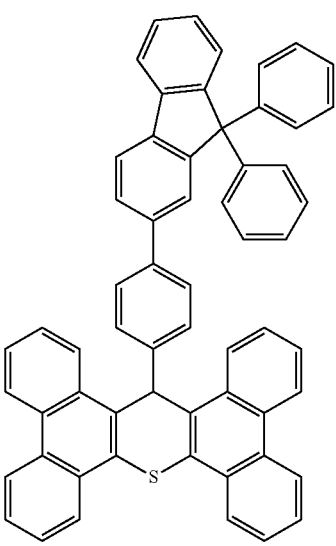

-continued
A218
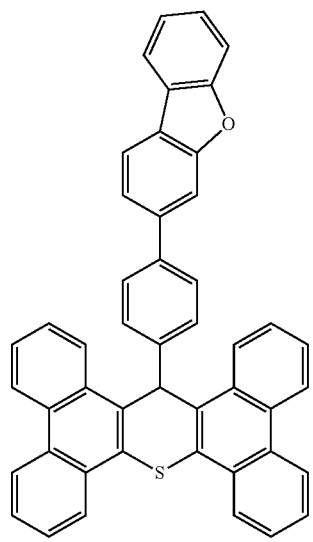
A219
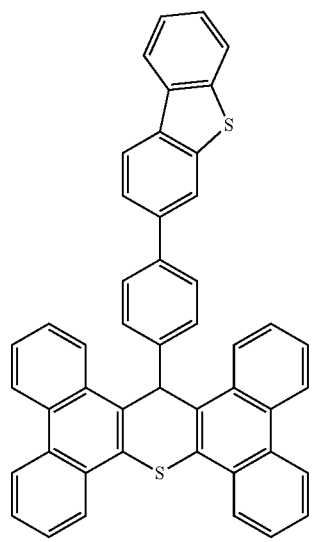
A220
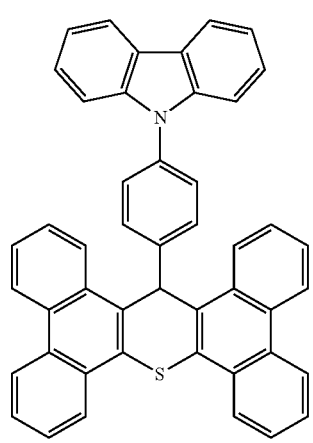
-continued
A221
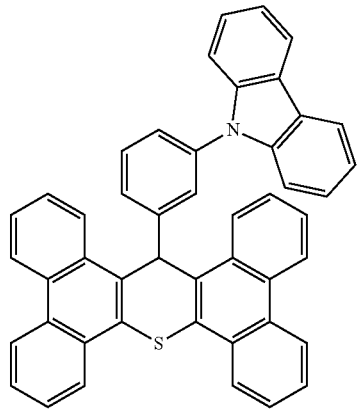
A222
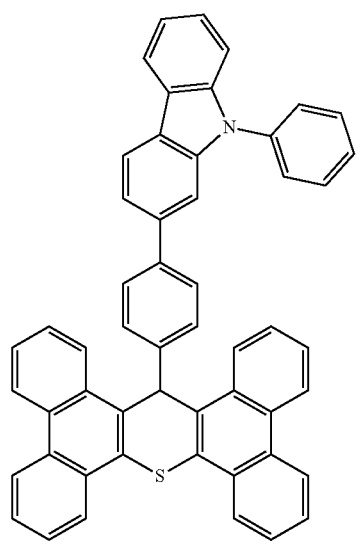
A223
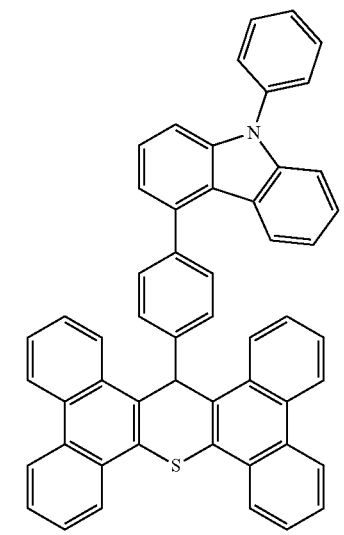

193
-continued
A224
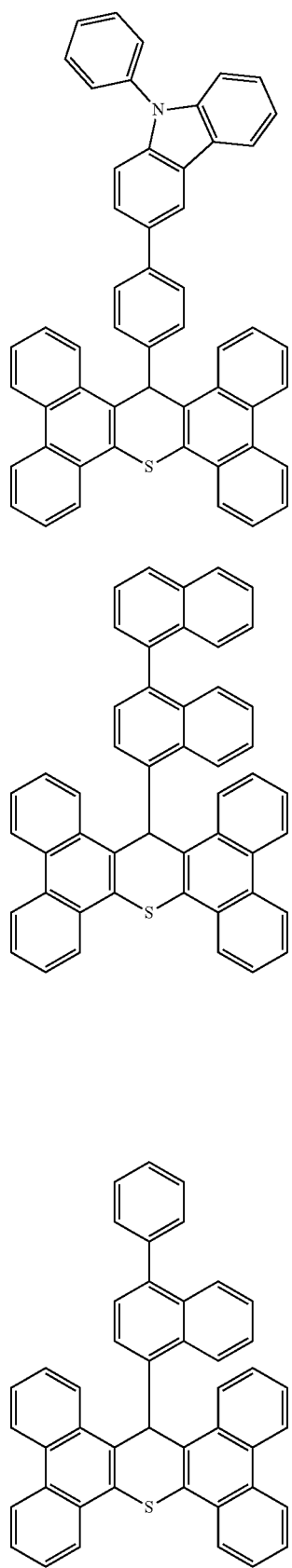
A225
A226
194
-continued
A227
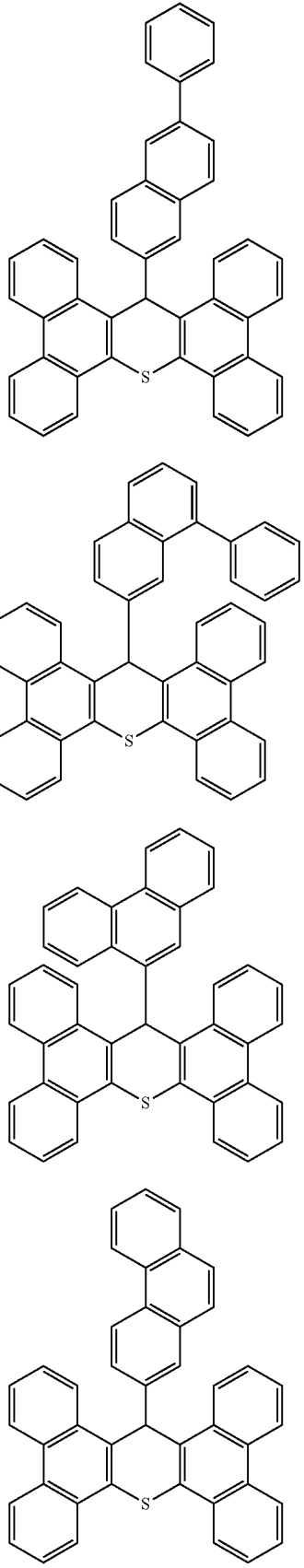
A228
A229
A230

-continued
A231 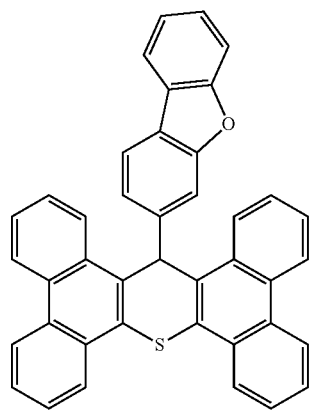
A232 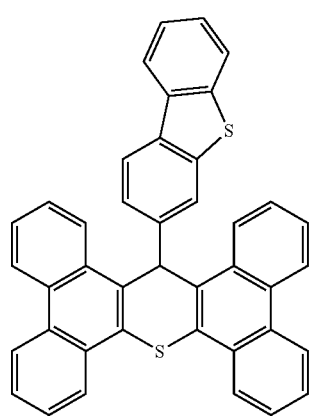
A233 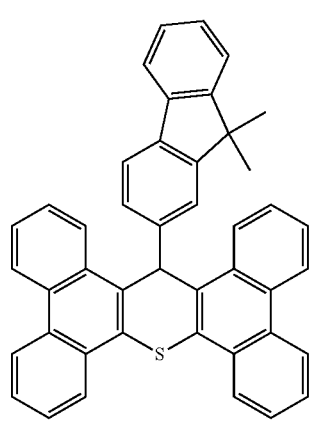
-continued
A234 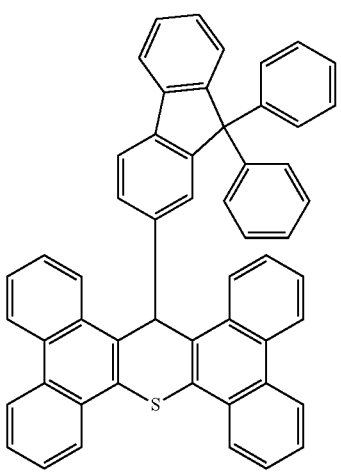
A235 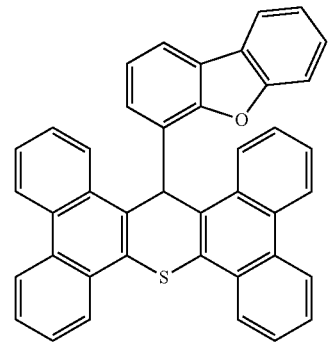
A236 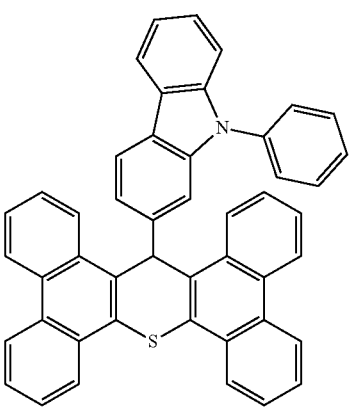
A237 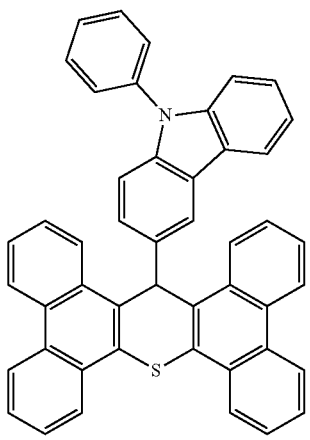

-continued
A238
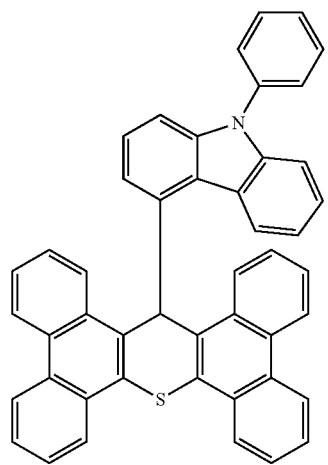
A261
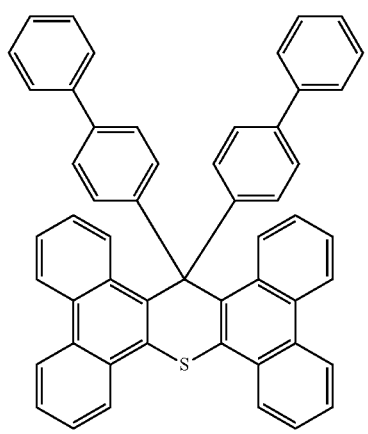
A262
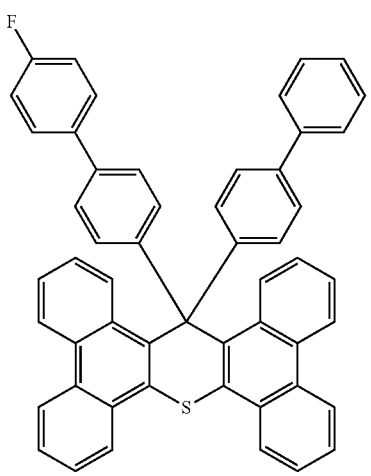
-continued
A263
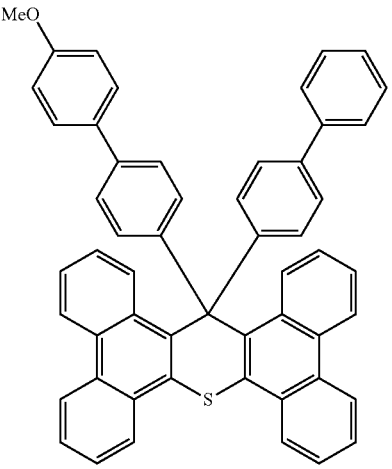
A264
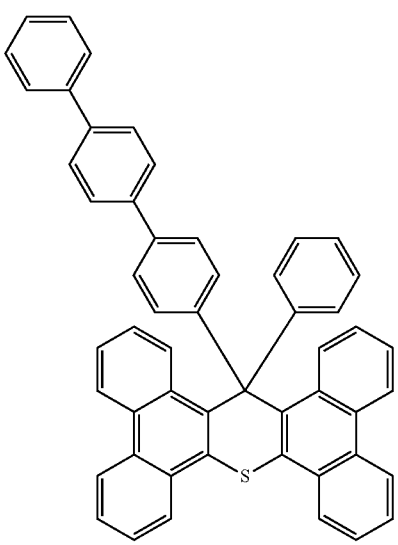
A265
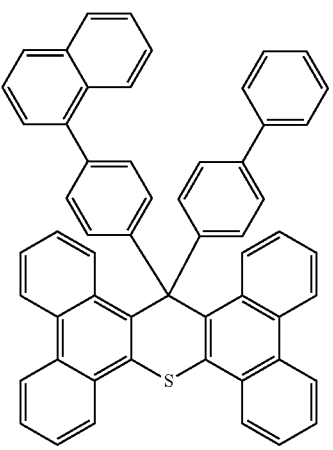

A266 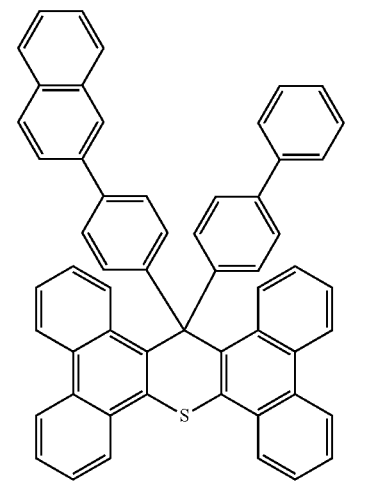
A267 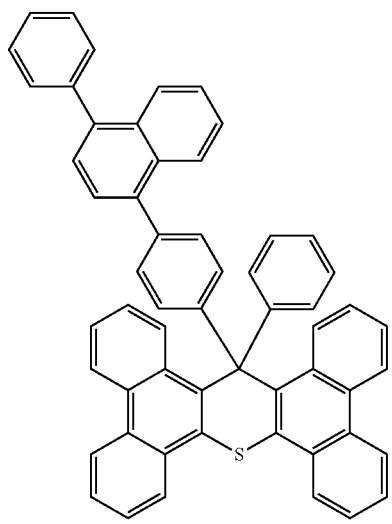
A268 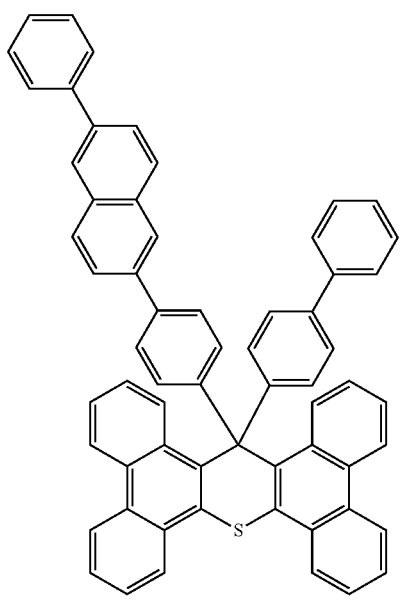
A269 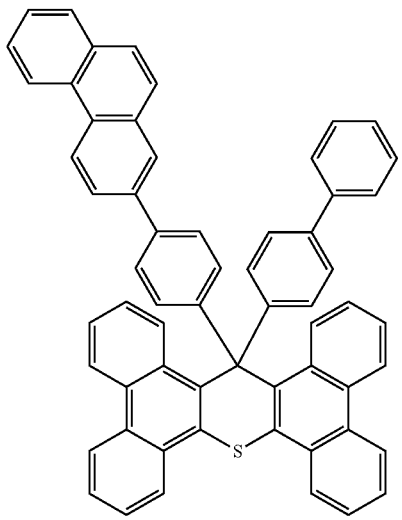
A270 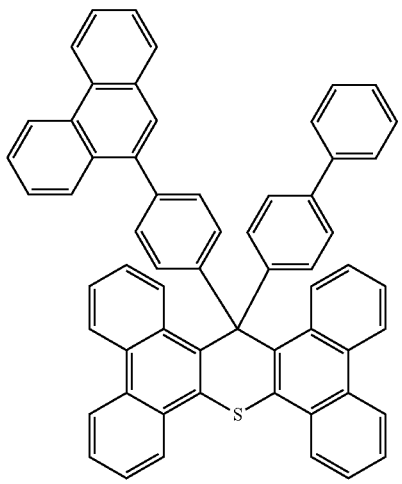
A271 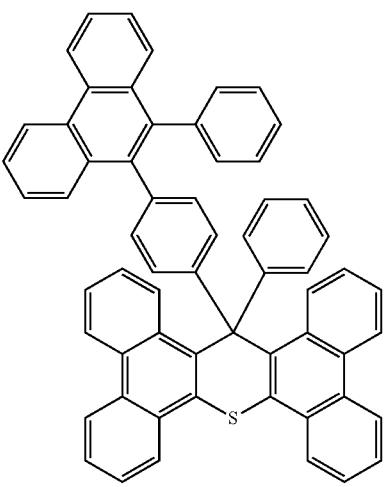

-continued
A272
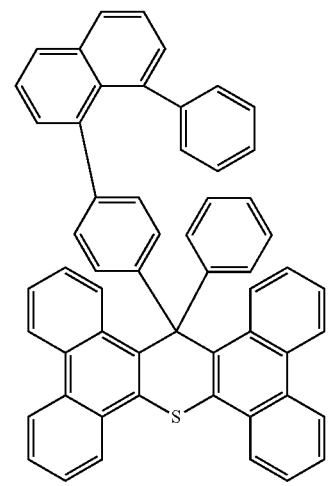
A273
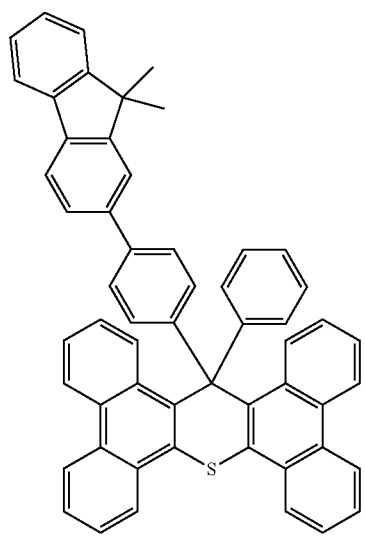
A274
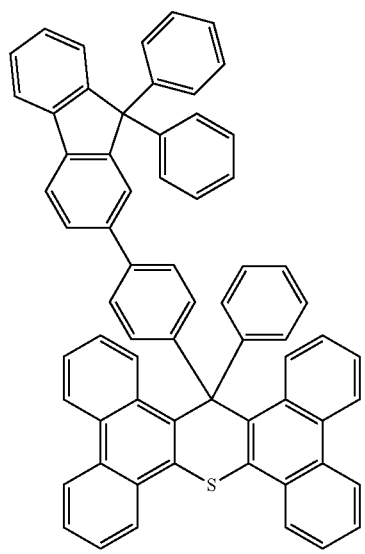
-continued
A275
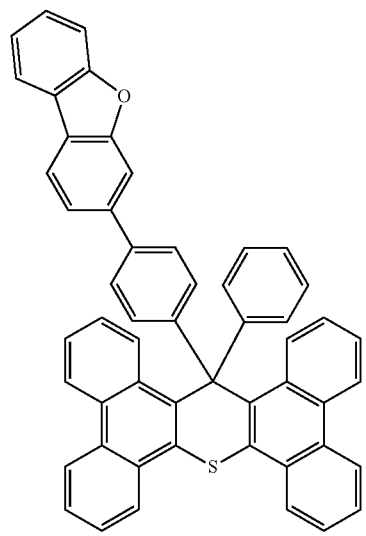
A276
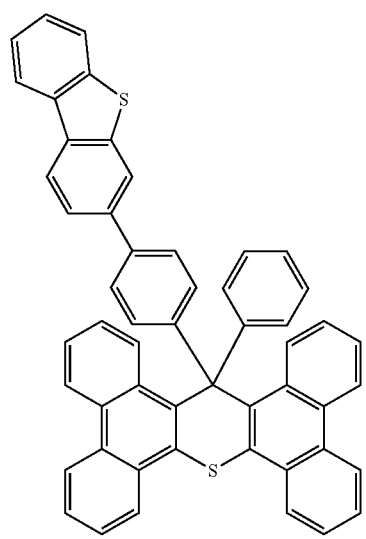
A277
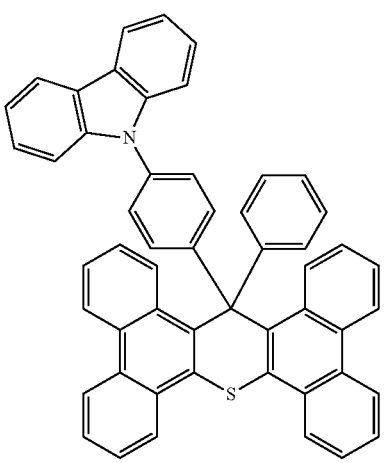

A278
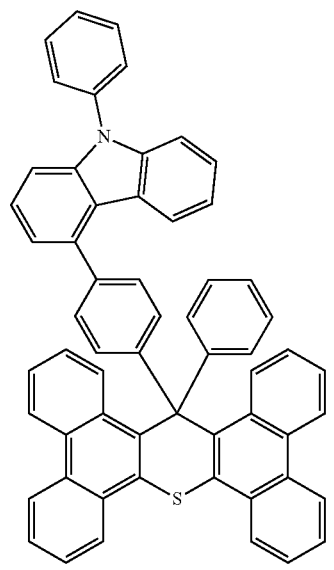
A279
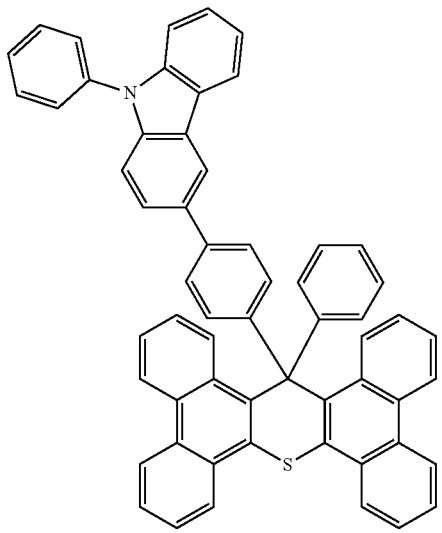
A280
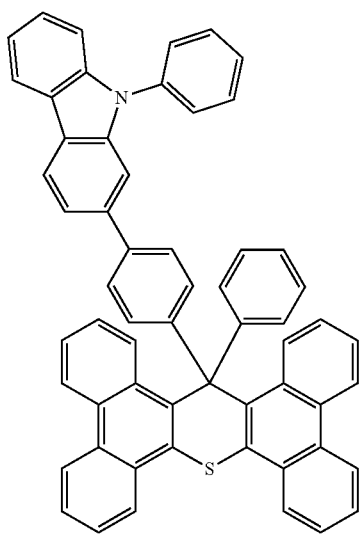
A285
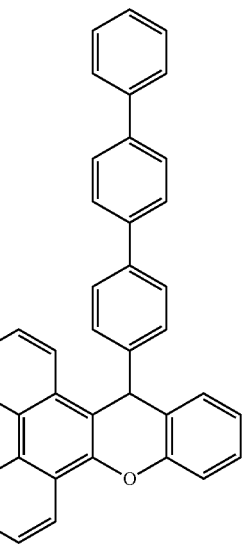
A286
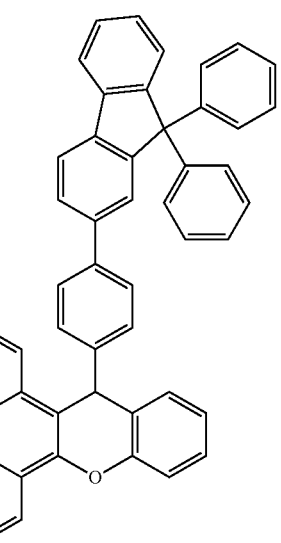
A287
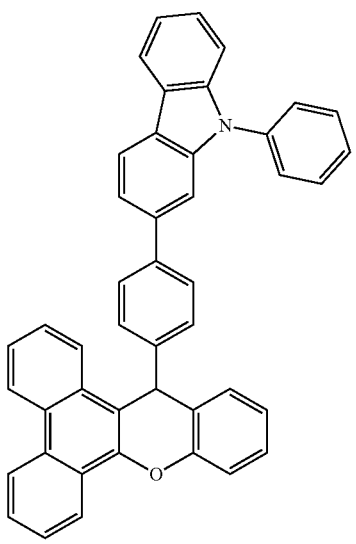

-continued

A294

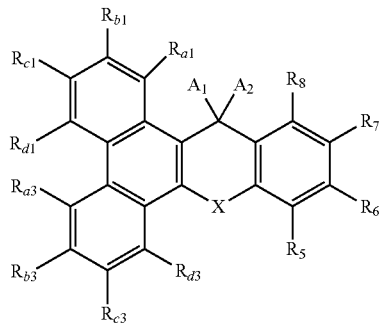

A296

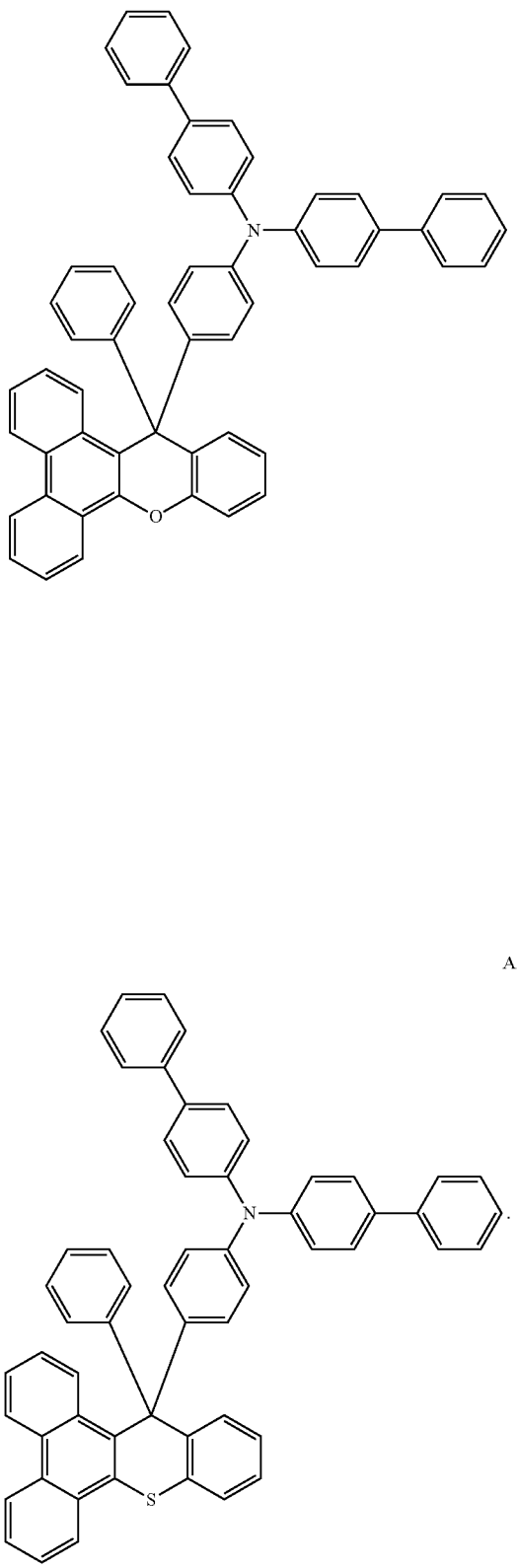

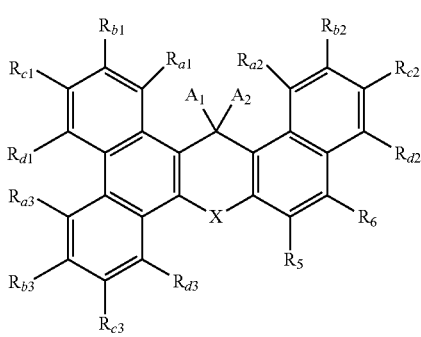

7. A polycyclic compound represented by any one selected from the following Formula 1-2 to Formula 1-5:

wherein in Formula 1-2 to Formula 1-5,

X is O or S, $Ar_1$ and $Ar_2$ are each independently a hydrogen atom, a deuterium atom, a halogen atom, a cyano group, a substituted or unsubstituted silyl group, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms, or a substituted or unsubstituted heteroaryl group of 2 to 50 carbon atoms, wherein Ar$_1$ and Ar$_2$ are not joined to form a ring, when X is S and one of Ar$_1$ and Ar$_2$ is a hydrogen atom, the other one is not a hydrogen atom, a deuterium atom, an unsubstituted phenyl group, an unsubstituted biphenyl group, a phenyl group substituted with a t-butyl group, a phenyl group substituted with bromine, an aryl group of 6 to 50 carbon atoms substituted with an amino group, and a heteroaryl group of 2 to 50 carbon atoms substituted with an amino group, when X is O and one of Ar$_1$ and Ar$_2$ is a hydrogen atom, the other one is not a hydrogen atom, a deuterium atom, an unsubstituted phenyl group, an unsubstituted biphenyl group, an unsubstituted pyridinyl group, an unsubstituted fluorenyl group, an unsubstituted naphthyl group, an unsubstituted phenanthrenyl group, an aryl group of 6 to 50 carbon atoms substituted with an amino group, a heteroaryl group of 2 to 50 carbon atoms substituted with an amino group, and a phenyl group substituted with bromine, chlorine, fluorine, an alkyl group, an alkenyl group, an alkoxy group, a hydroxyl group, a cyano group, or a nitro group, and when one of Ar$_1$ and Ar$_2$ is an unsubstituted phenyl group, the other one is selected from the group consisting of a substituted phenyl group, a substituted or unsubstituted biphenyl group, a substituted or unsubstituted naphthalene group, and a substituted or unsubstituted phenanthrene group, provided that the substituents of Ar$_1$ and Ar$_2$ do not form a fused ring, R$_5$ to R$_8$ are each independently a hydrogen atom, and R$_{a1}$ to R$_{d1}$, R$_{a2}$ to R$_{d2}$, R$_{a3}$ to R$_{d3}$, and R$_{a4}$ to R$_{d4}$ are each independently a hydrogen atom.

8. The polycyclic compound of claim 7, wherein Ar$_1$ and Ar$_2$ are each independently a hydrogen atom, a substituted or unsubstituted phenyl group, a substituted or unsubstituted biphenyl group, a substituted or unsubstituted naphthalene group, a substituted or unsubstituted phenanthrene group, a substituted or unsubstituted dibenzofuran group, a substituted or unsubstituted dibenzothiophene group, or a substituted or unsubstituted fluorene group.

9. A polycyclic compound comprises at least one selected from compounds represented in the following Compound Group 1 and Compound Group 2:

Compound Group 1

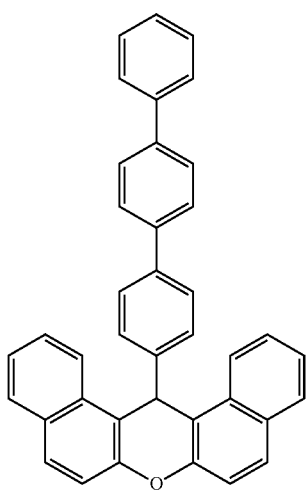

A1

-continued

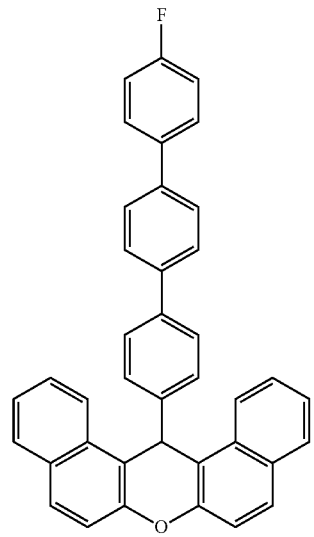

A2

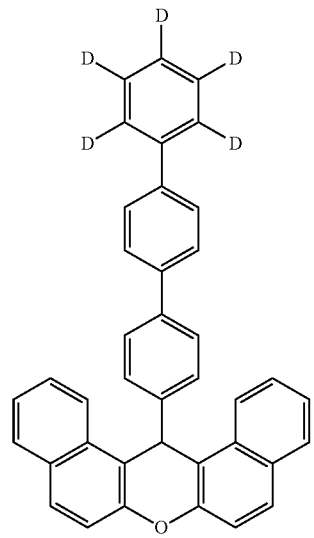

A3

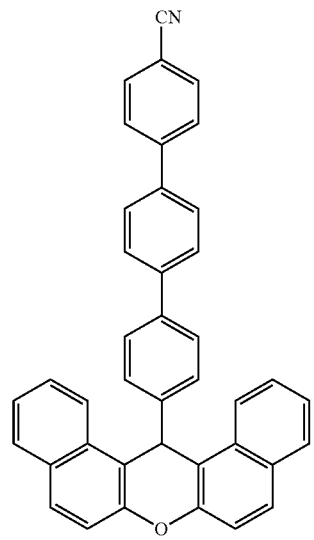

A4

-continued
A5 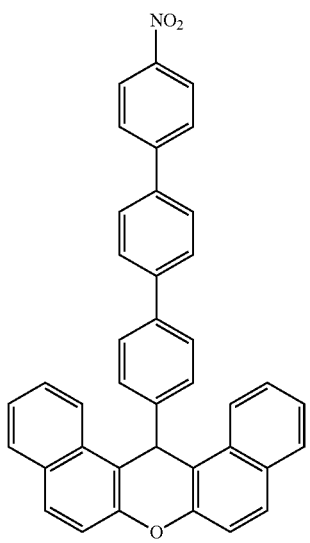
A6 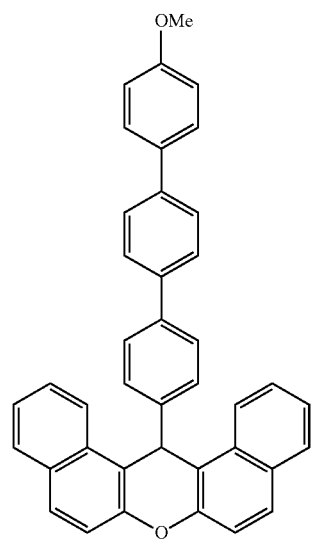
A7 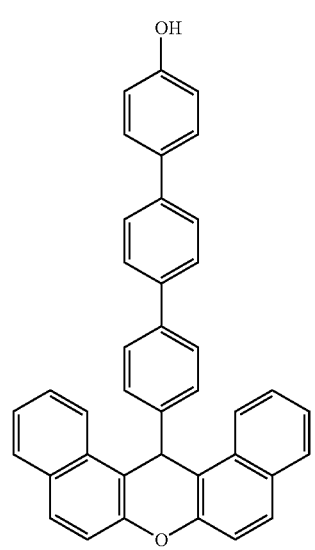
-continued
A13 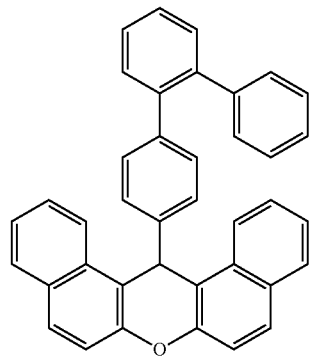
A14 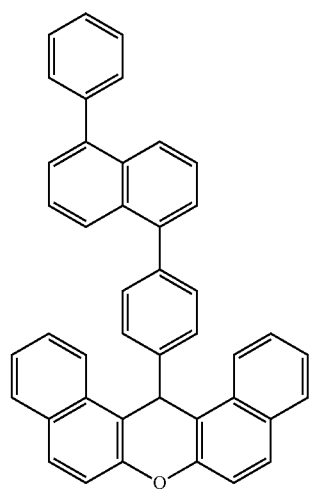
A15
A16 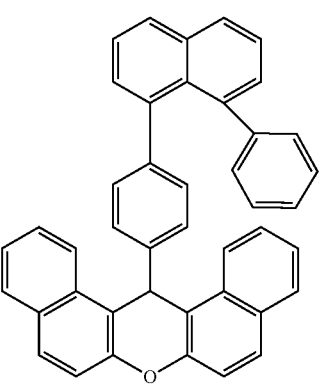

A17
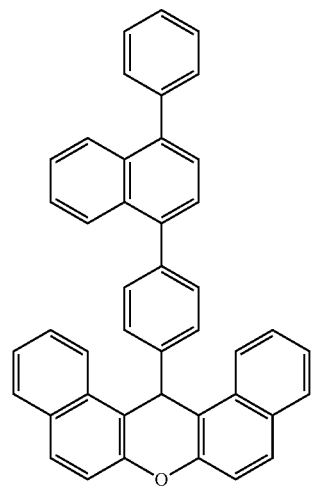
A18
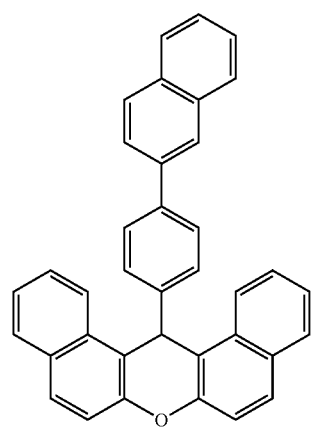
A19
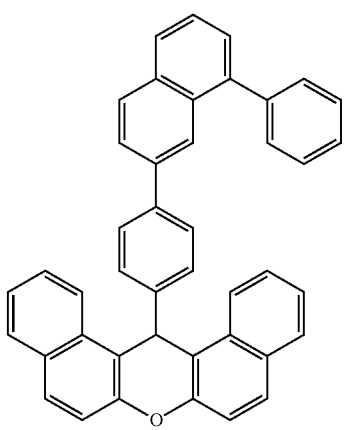
A20
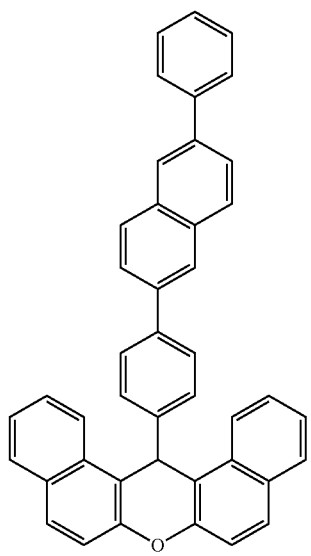
A21
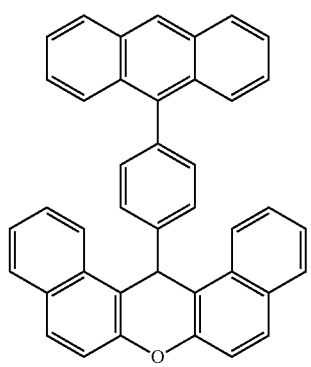
A22
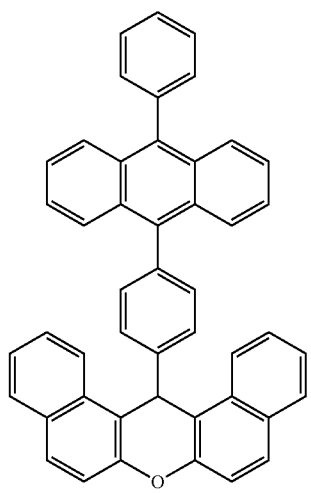

A23 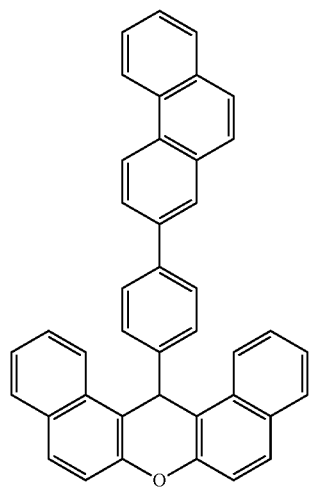
A24 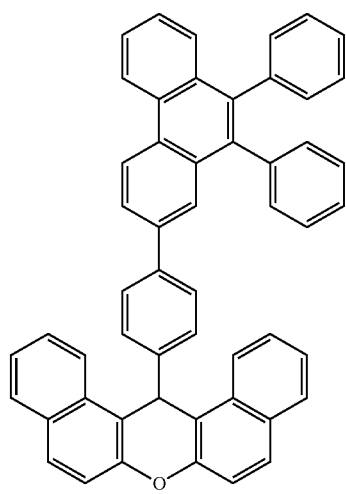
A25 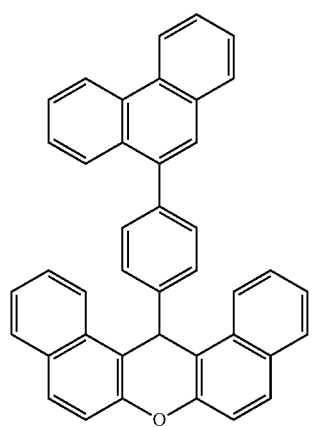
A26 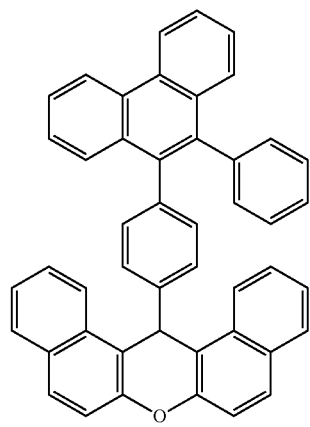
A27 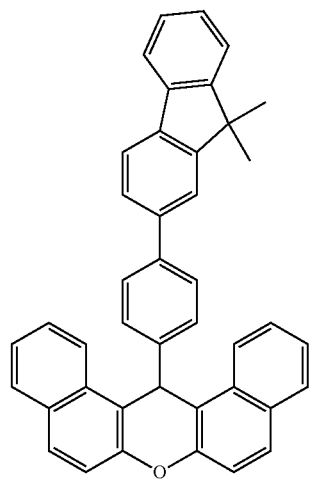
A28 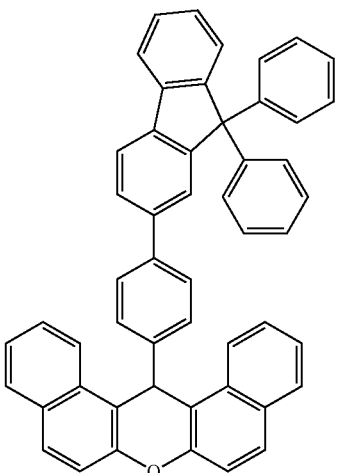

-continued
A29
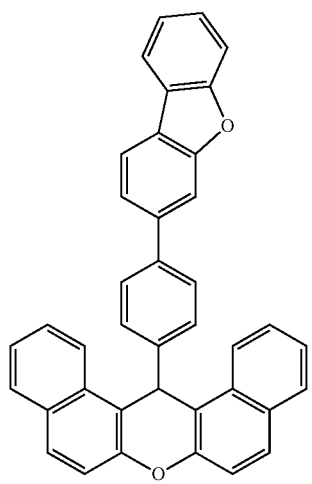
A30
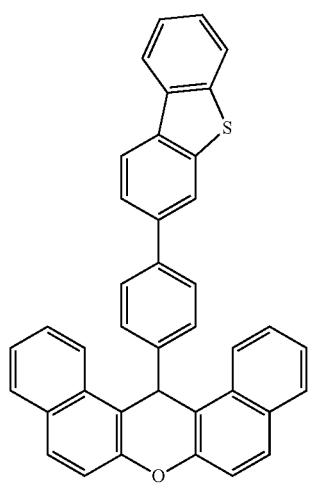
A31
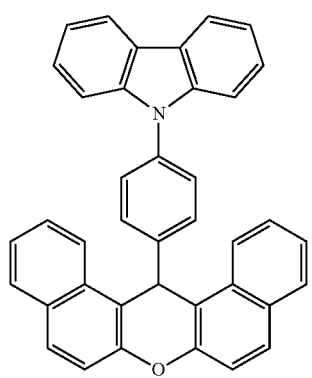
-continued
A32
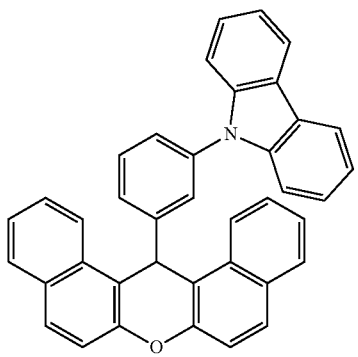
A33
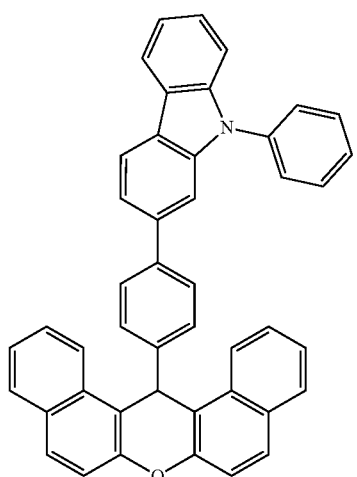
A34
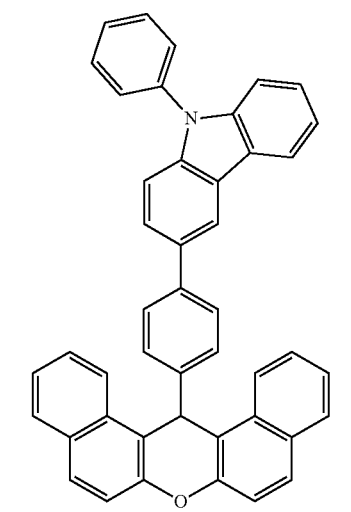

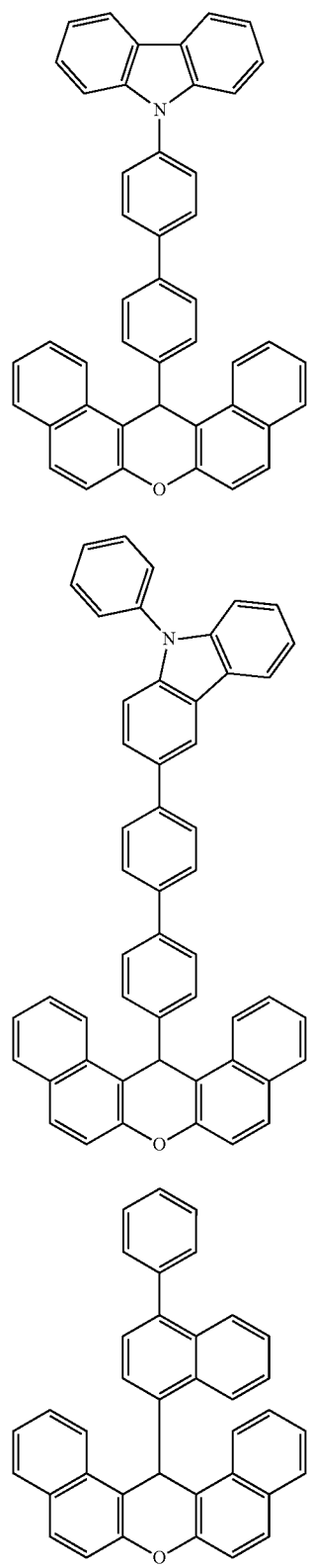
A35
A36
A37
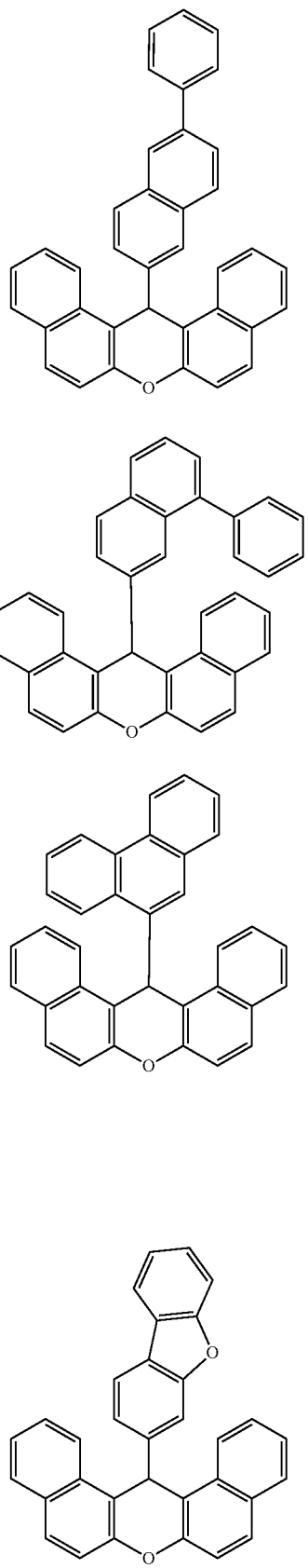
A38
A39
A40
A42

A43 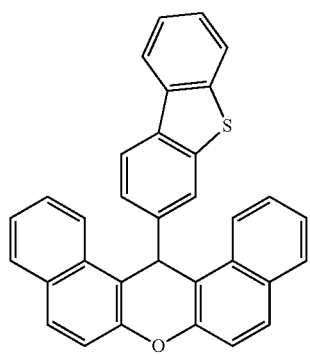
A44 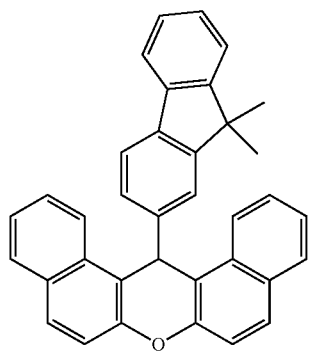
A53 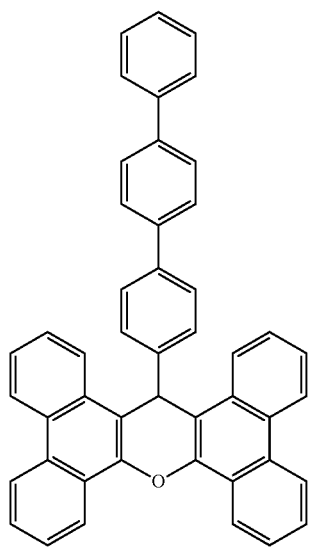
A54 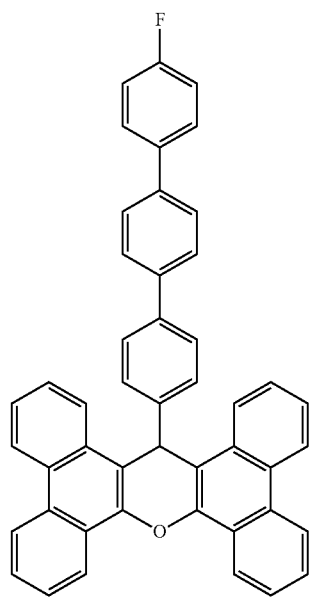
A55 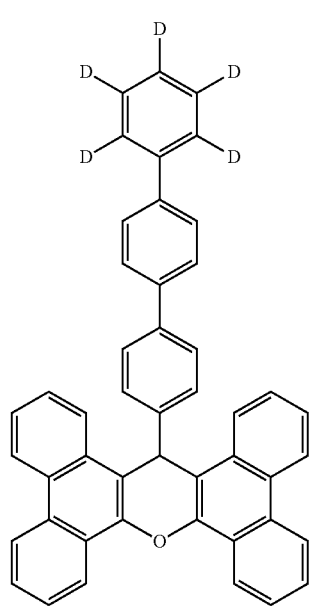

A56
A57
A58
A59
A61
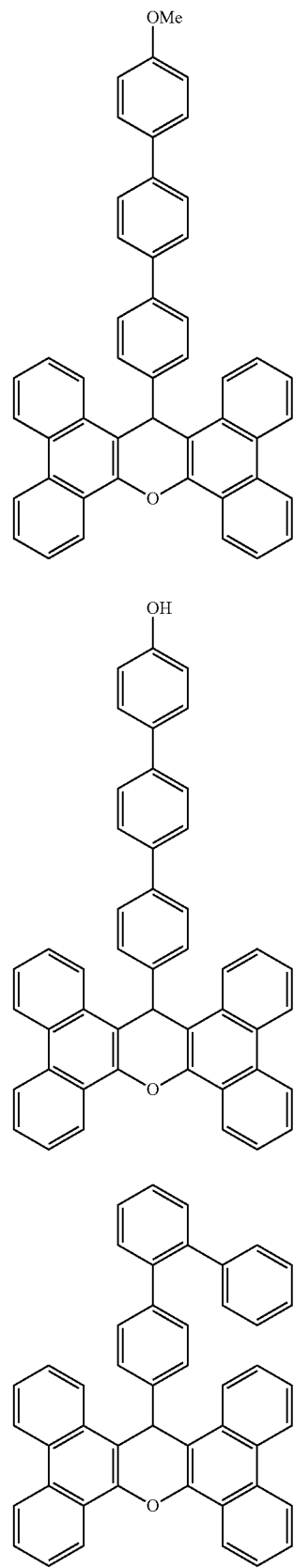

A62
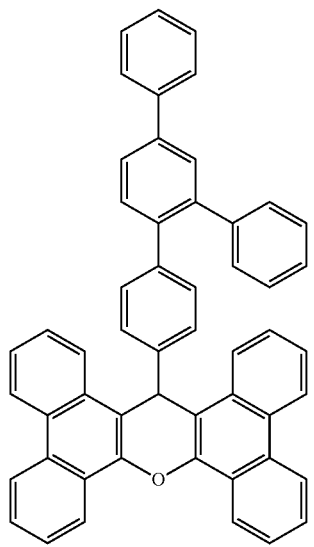
A63
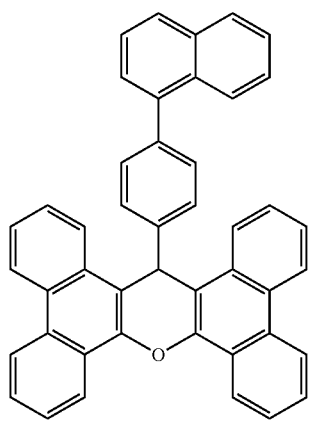
A64
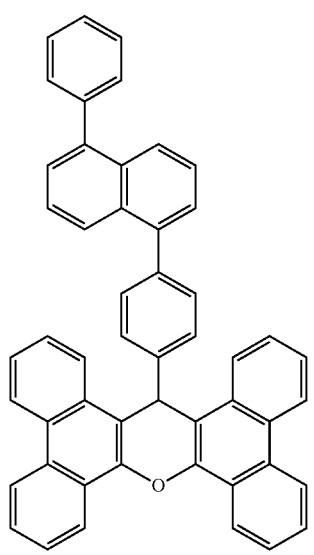
A65
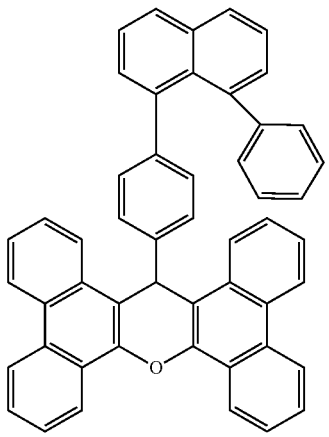
A66
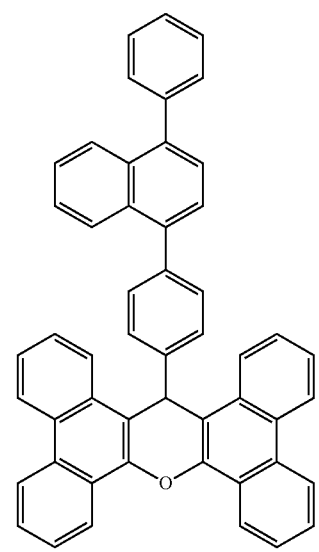
A68
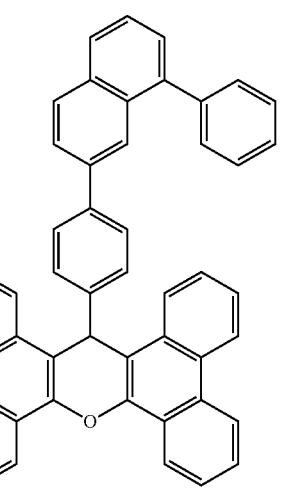

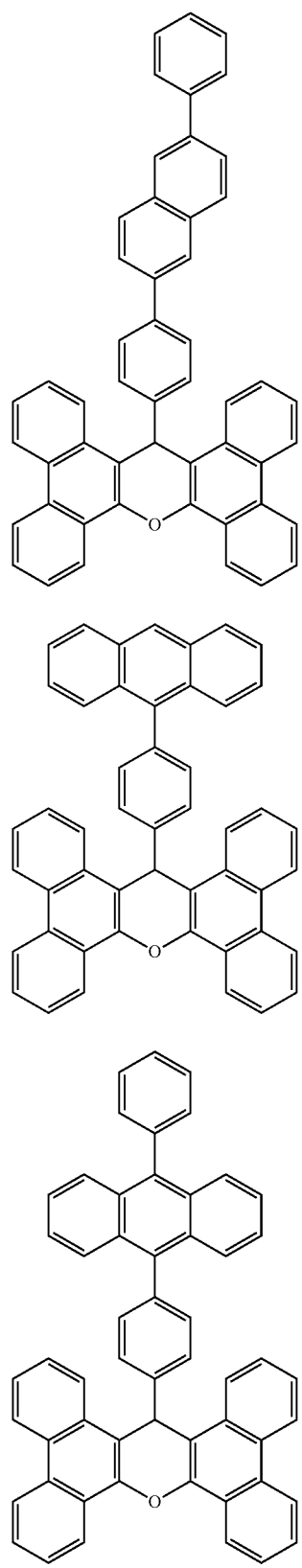
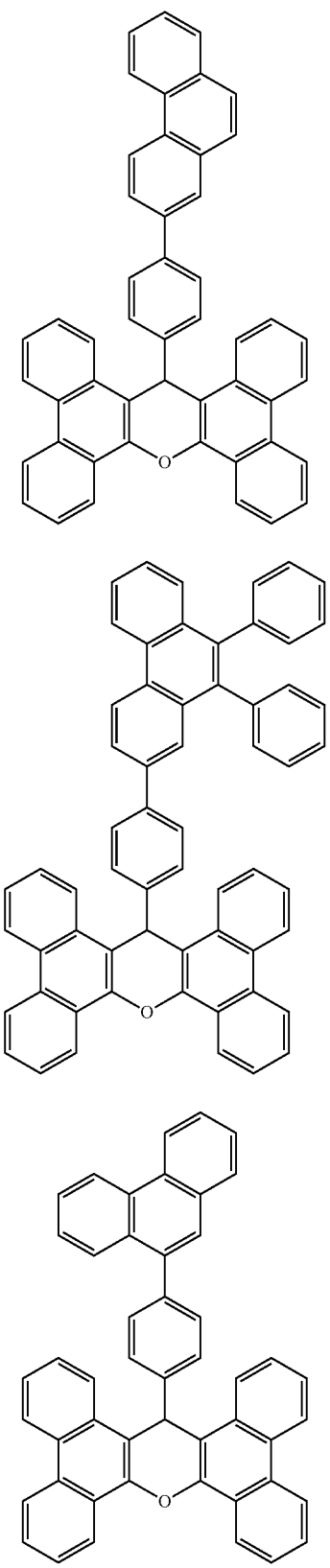

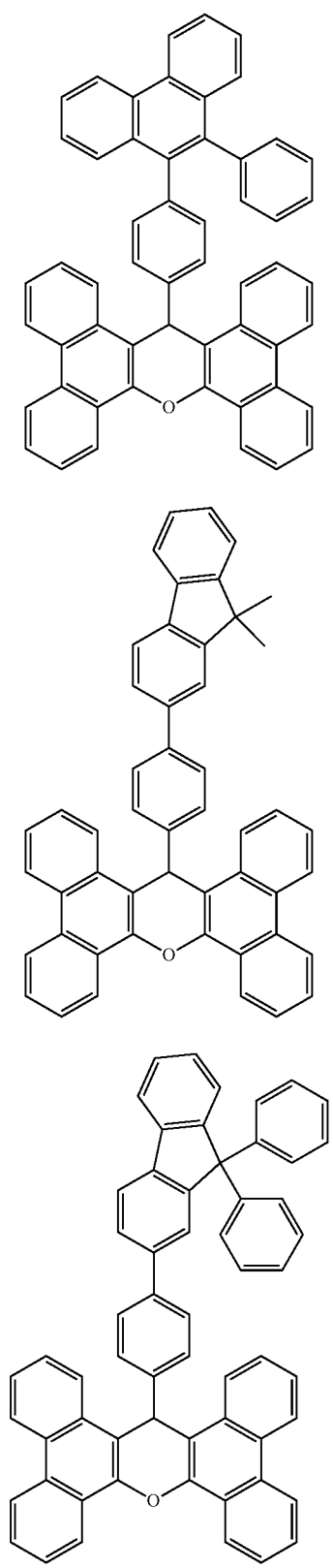
A75
A76
A77
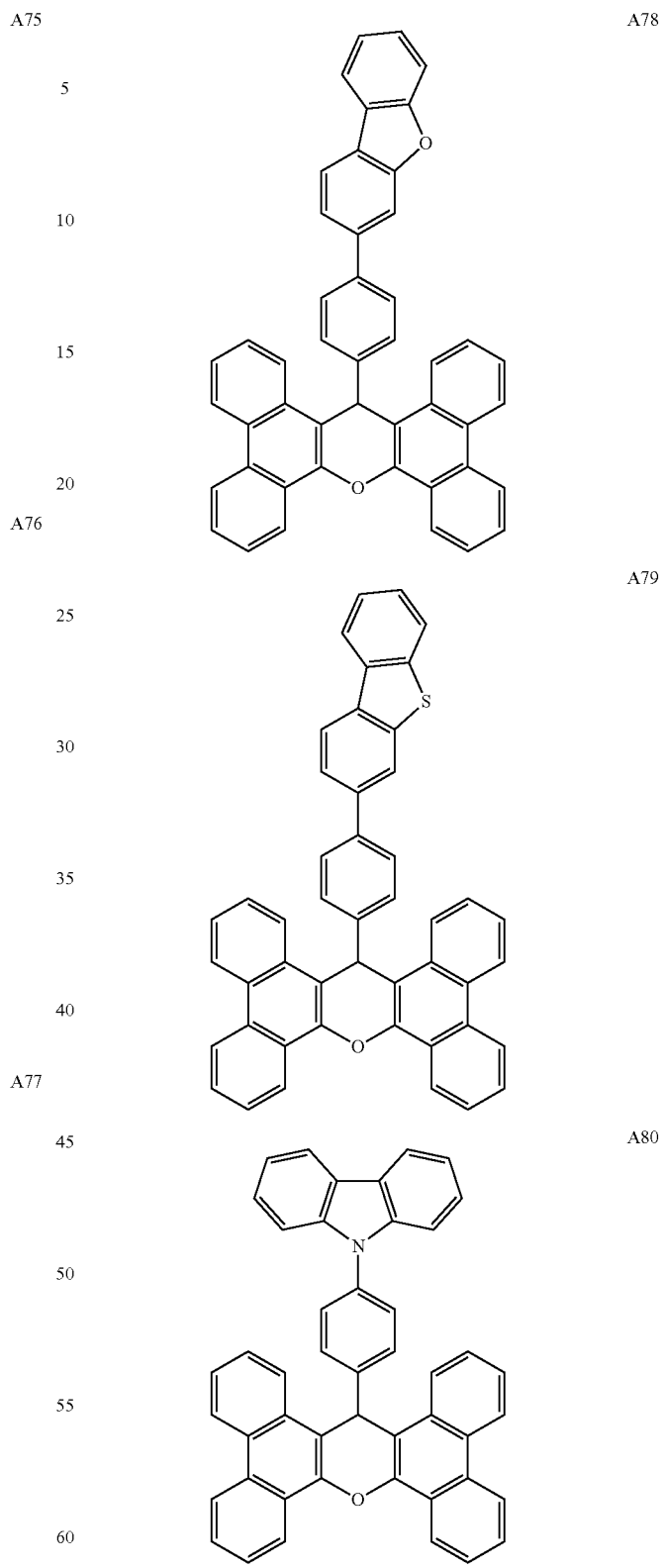
A78
A79
A80

A81
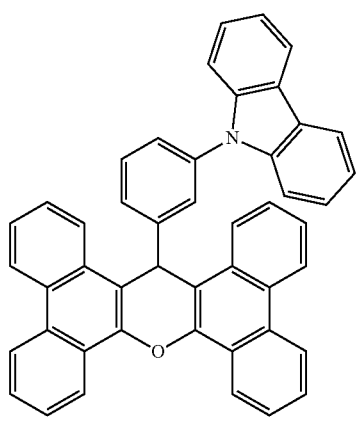
A82
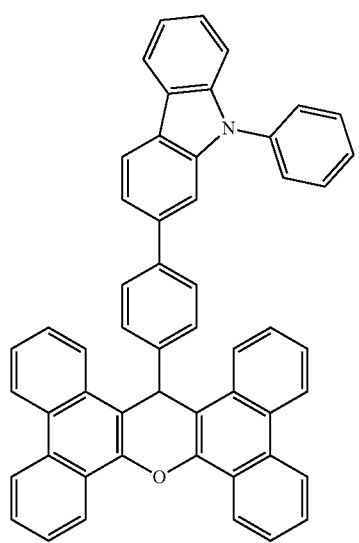
A83
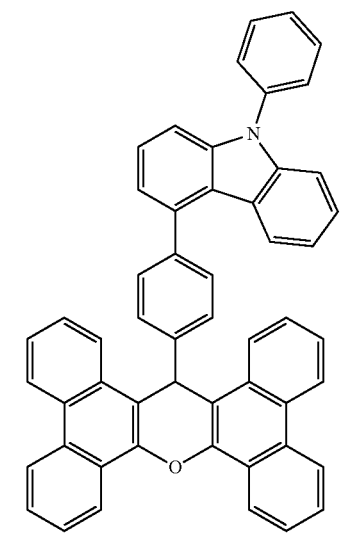
A84
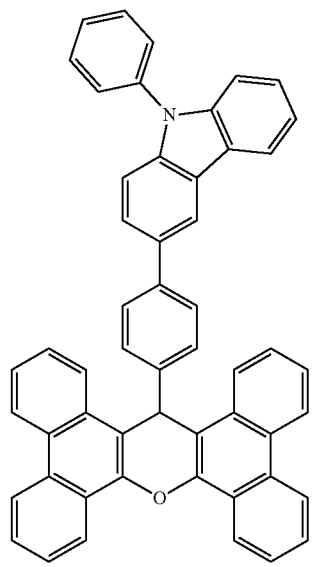
A85
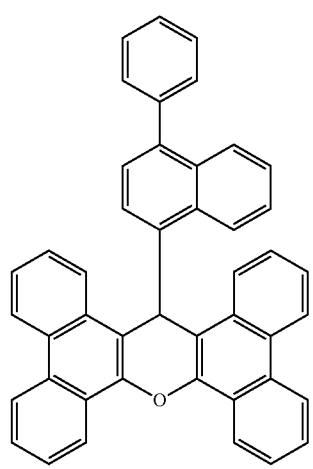
A86
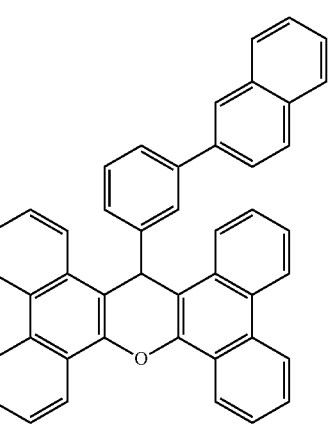

A87 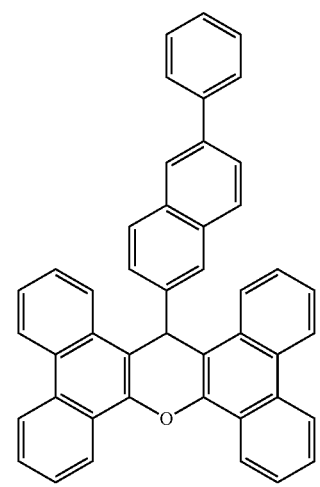
A88 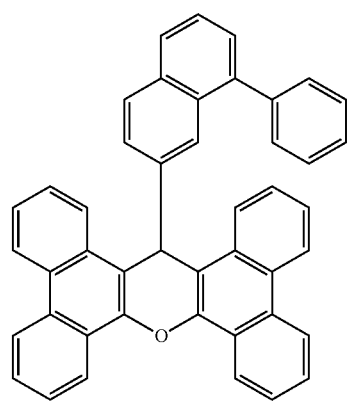
A89 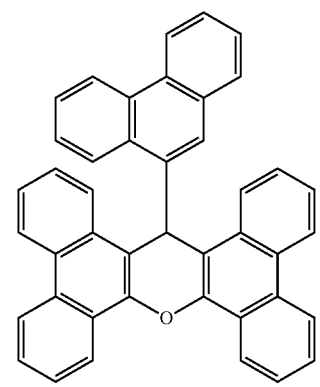
A90 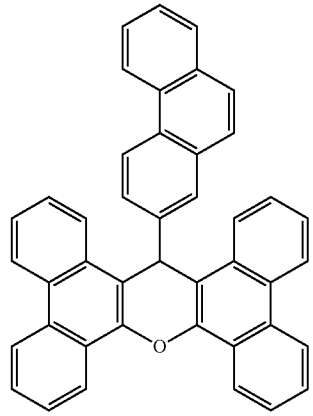
A91 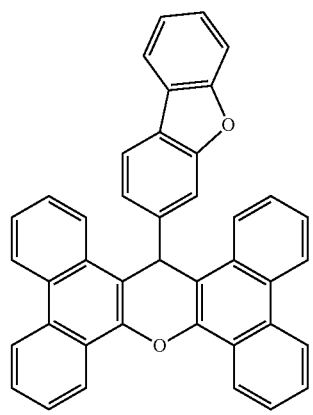
A92 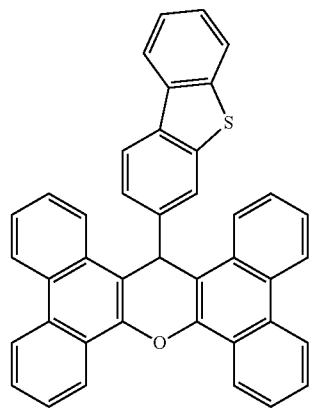
A93 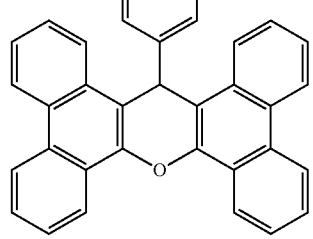

-continued
A94
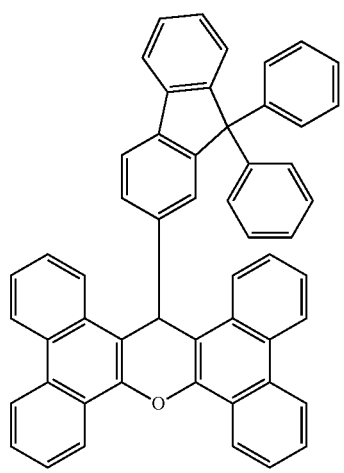
A95
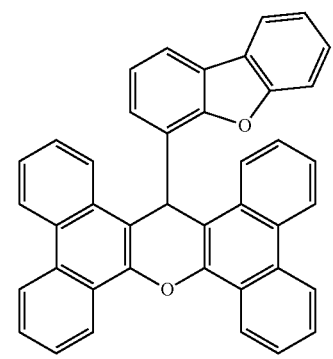
A96
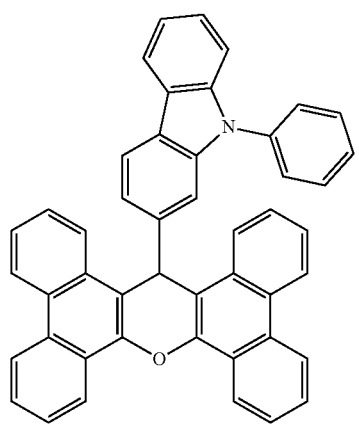
-continued
A97
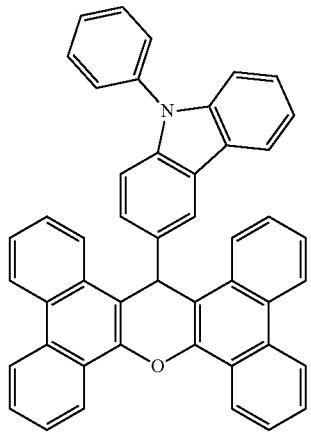
A99
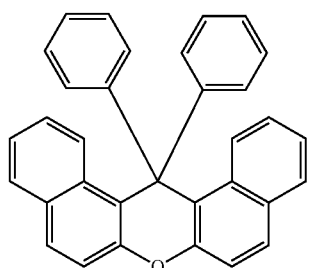
A100
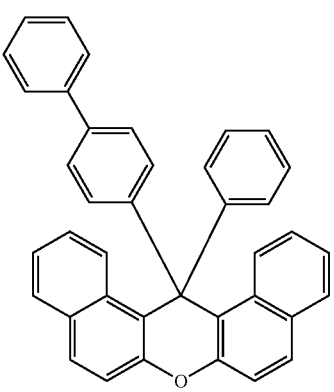
A101
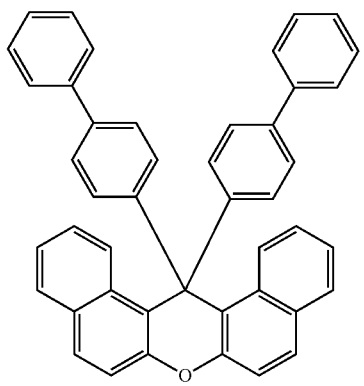

A105
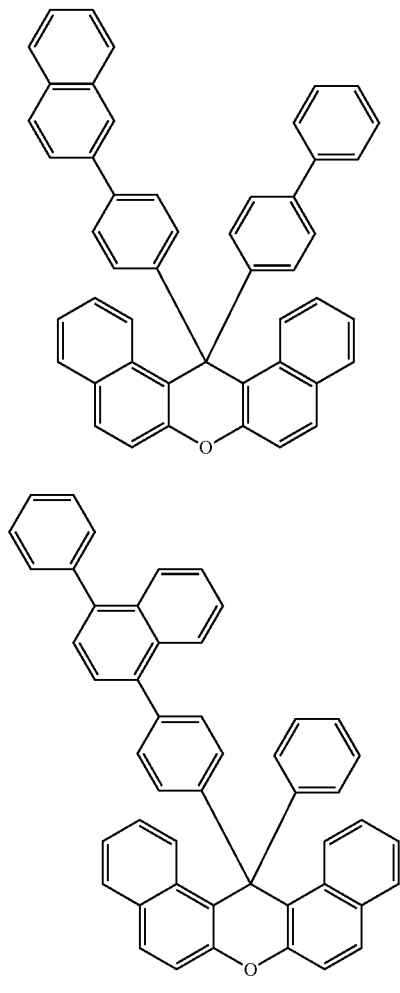
A106
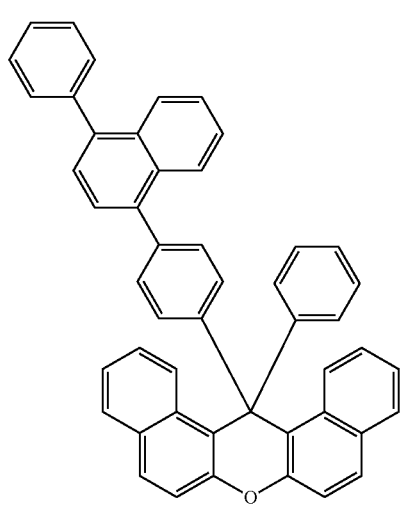
A107
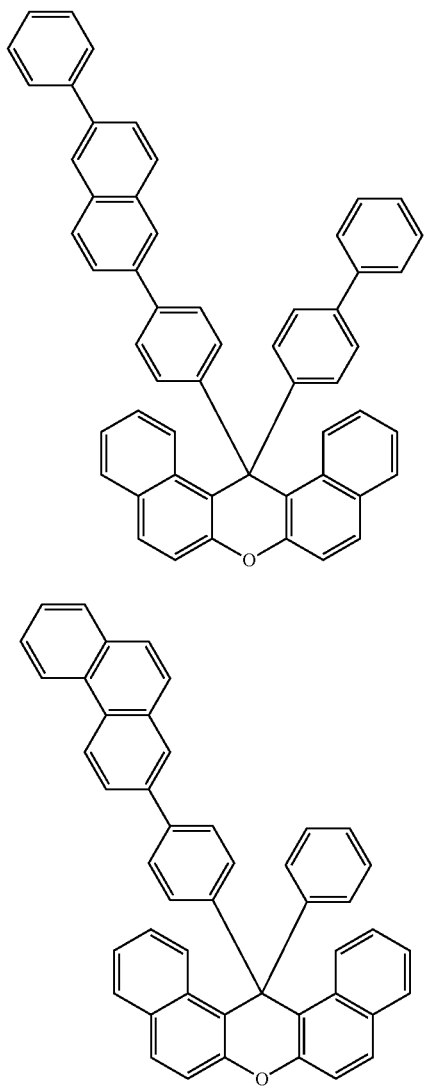
A108
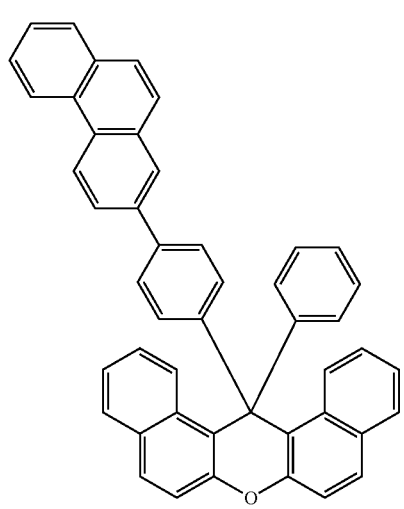
A109
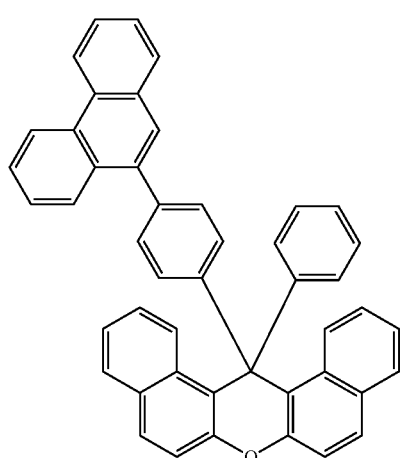

-continued
A110
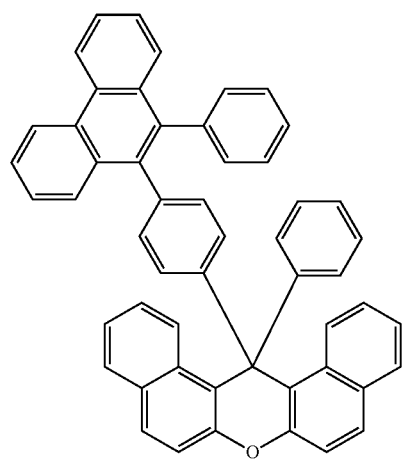
A111
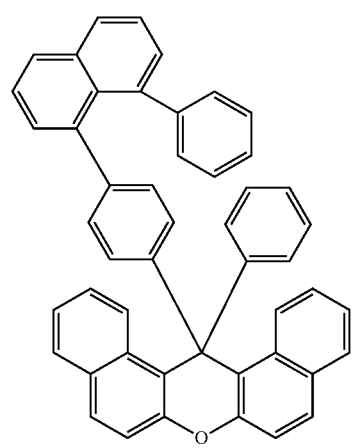
A115
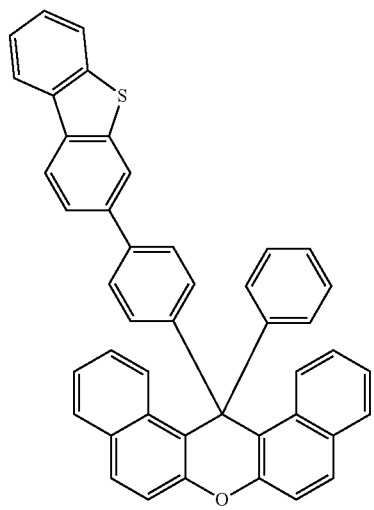
-continued
A120
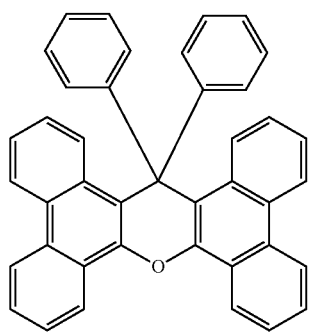
A121
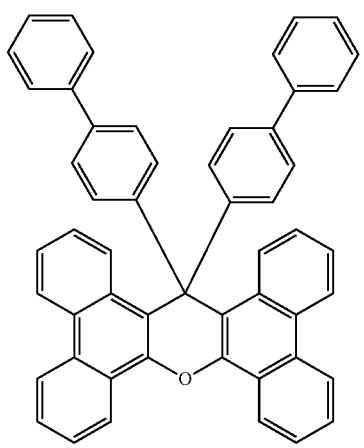
A122
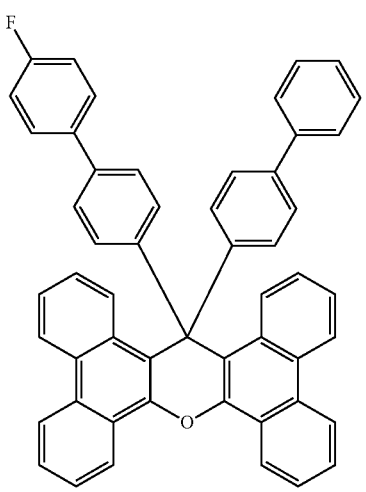

A123
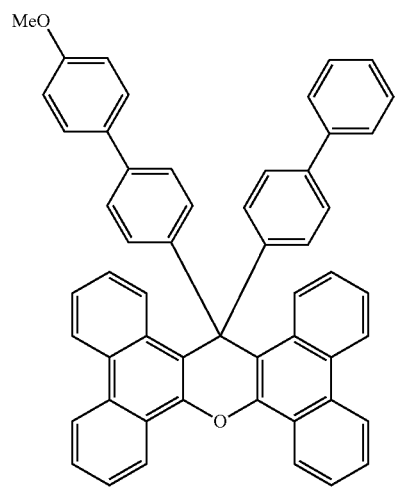
A124
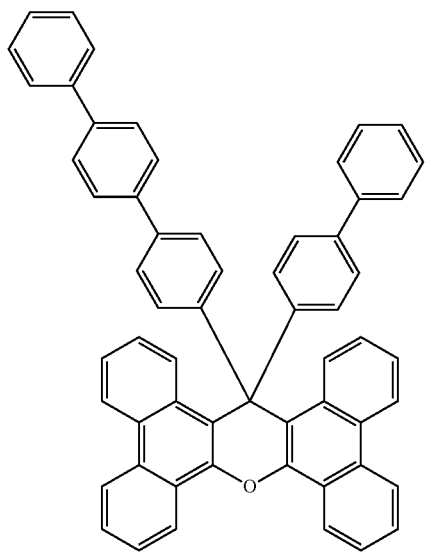
A125
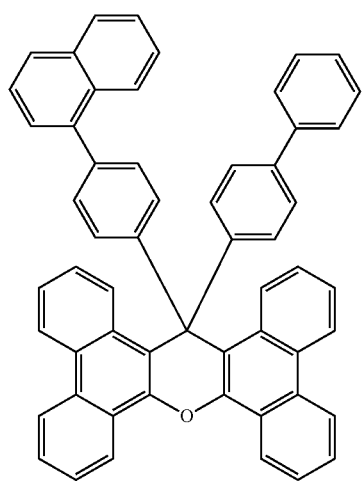
A126
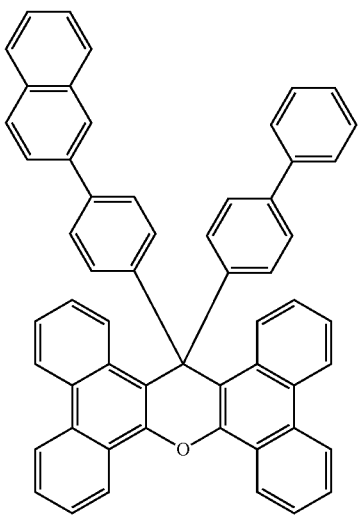
A127
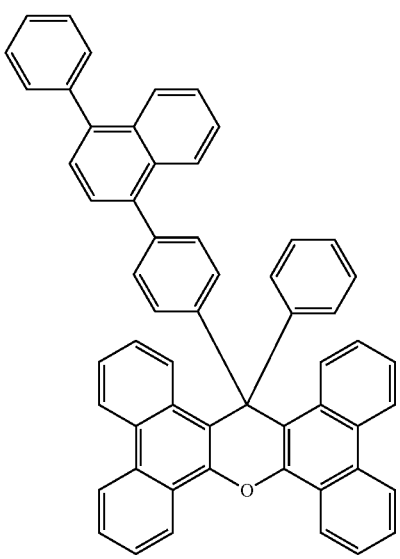

A128
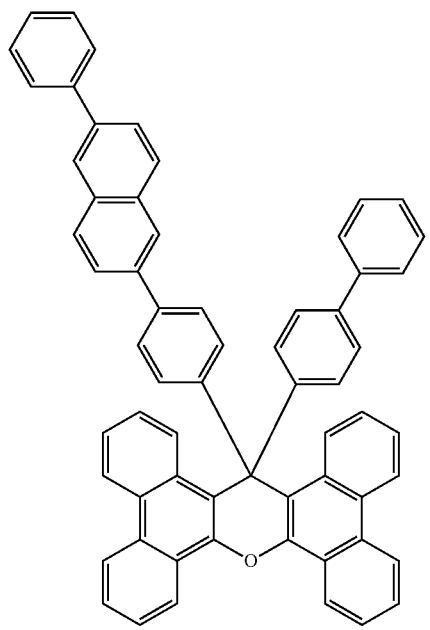
A129
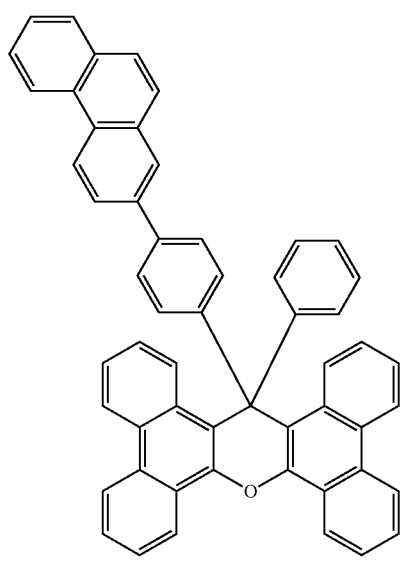
A130
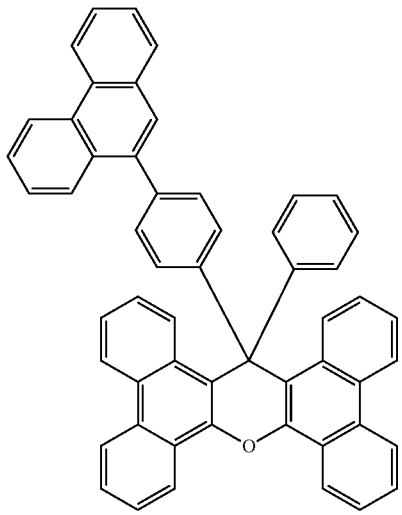
A131
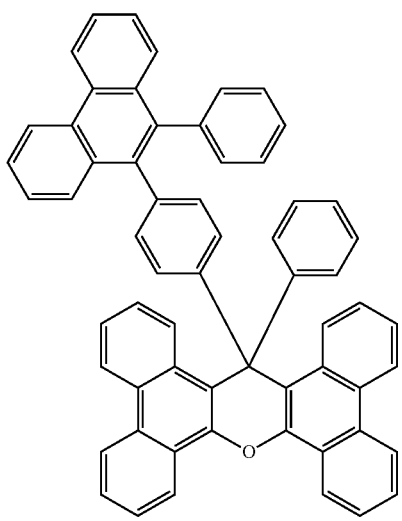
A132
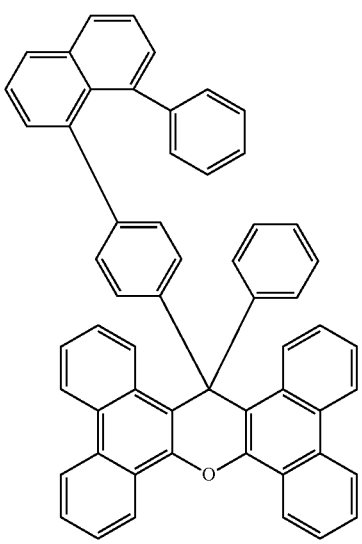

A133
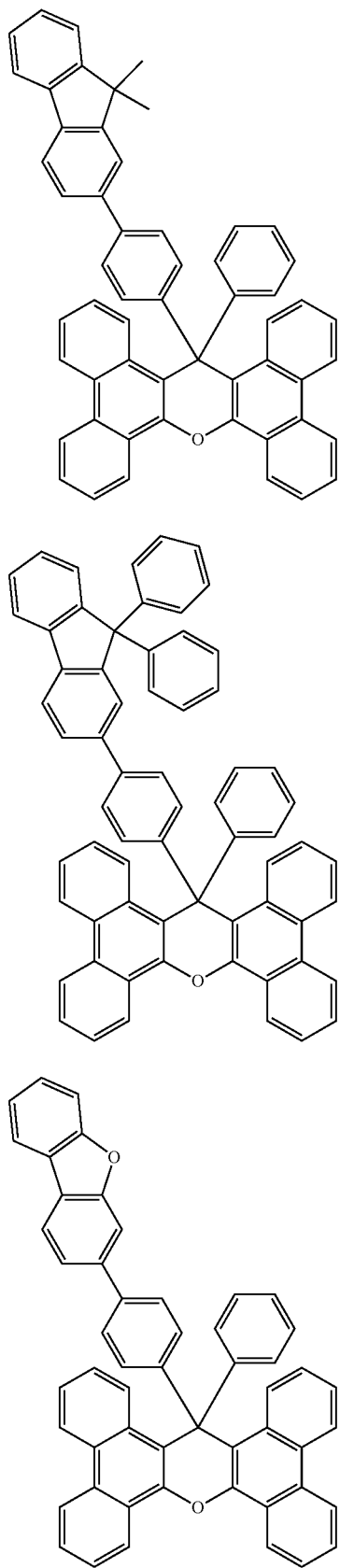
A134
A135
A136
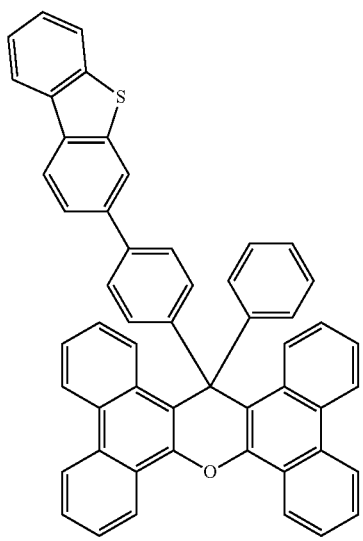
A137
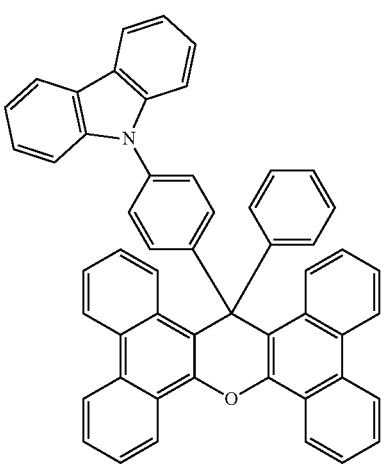
A138
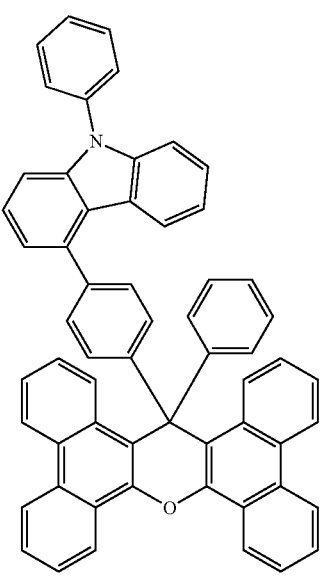

A139
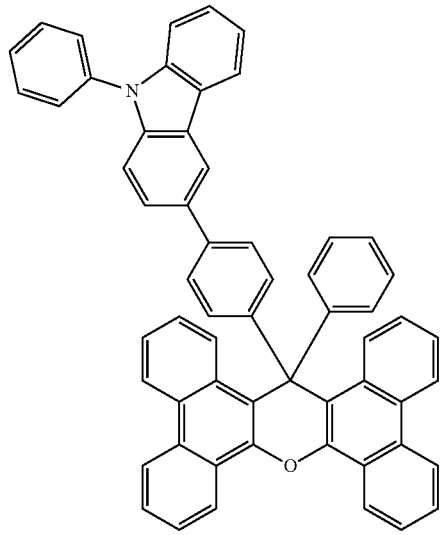
A140
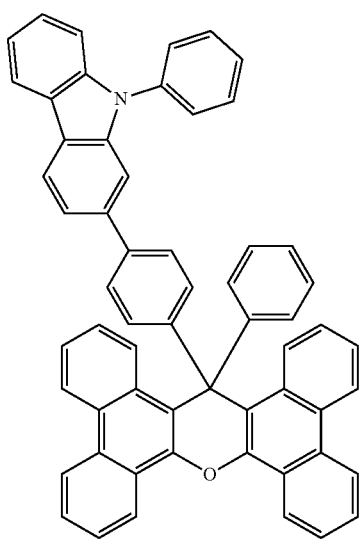
Compound Group 2
A141
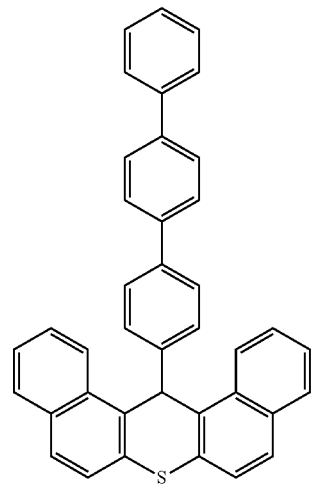
A142
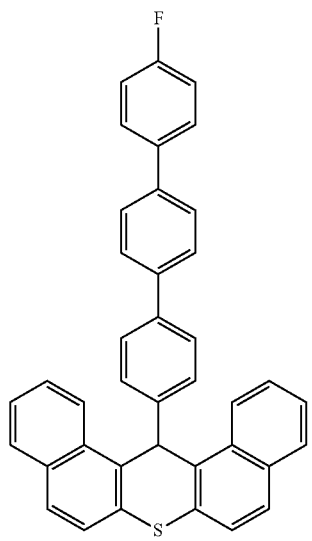
A143
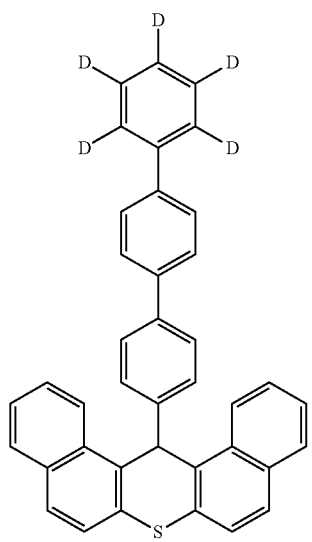
A144
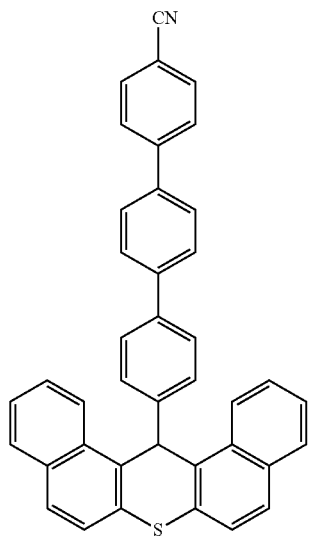

A145
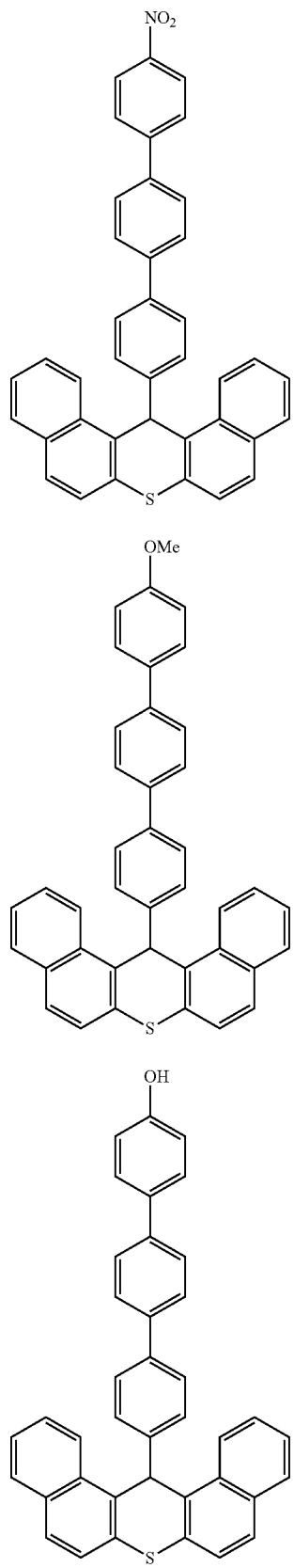
A146
A147
A153
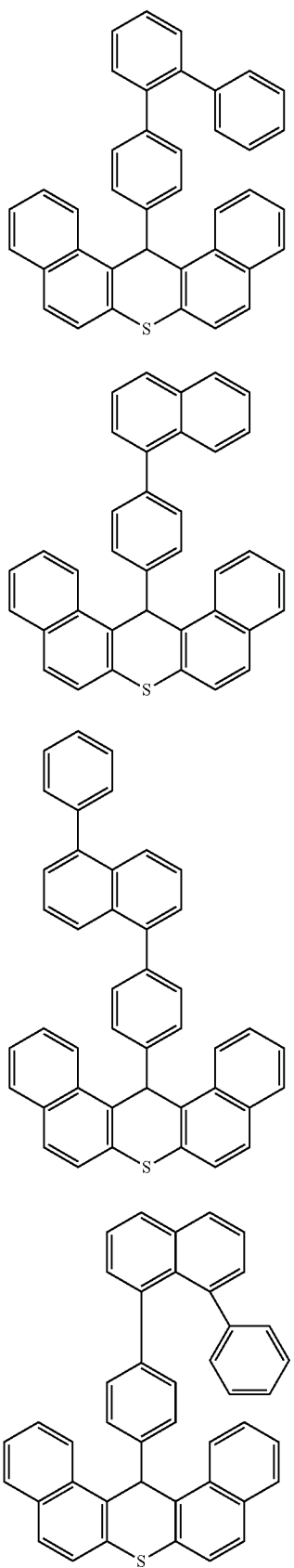
A154
A155
A156

-continued
A157
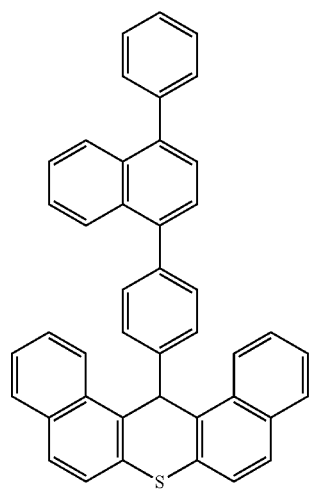
A158
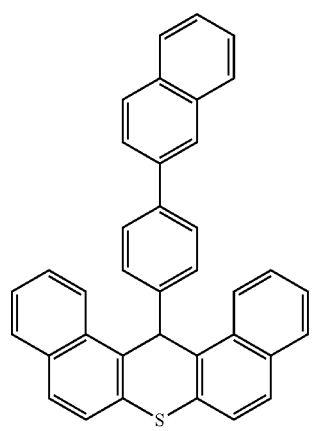
A159
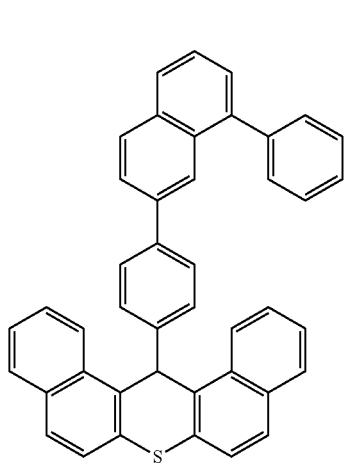
-continued
A160
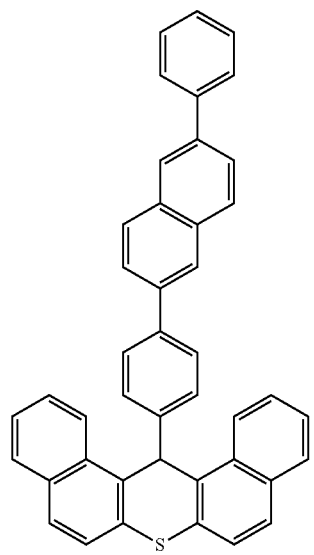
A161
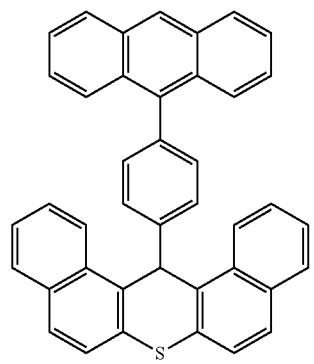
A162
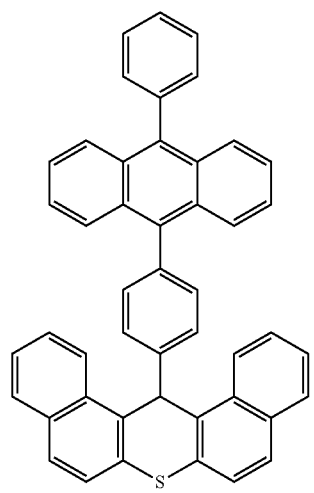

A163
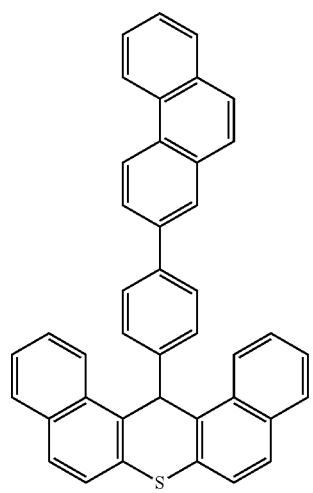
A164
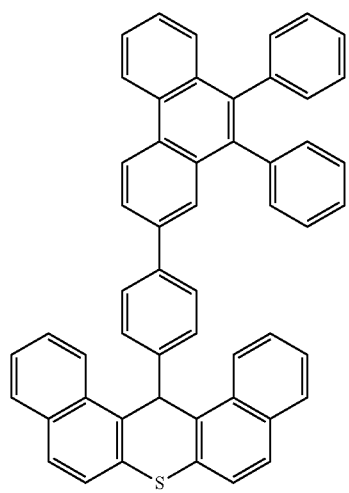
A165
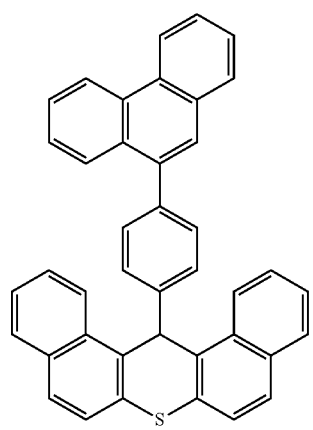
A166
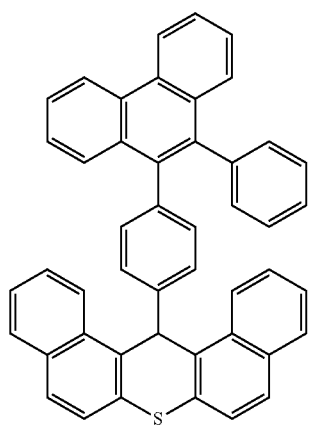
A167
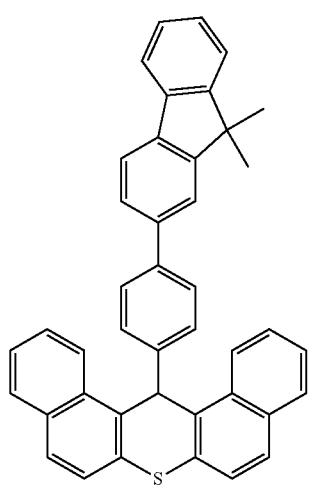
A168
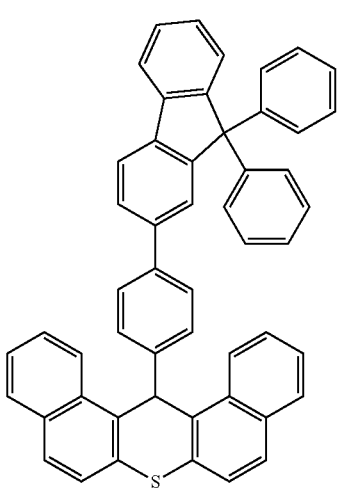

-continued
A169
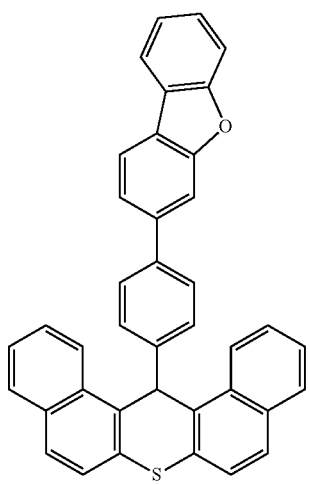
A170
A171
A172
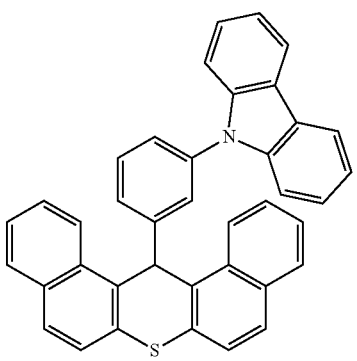
A173
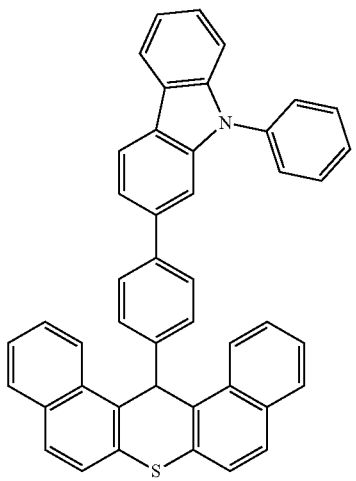
A174
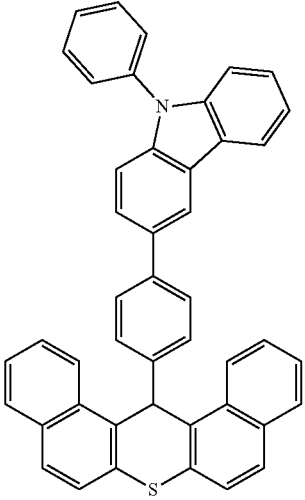

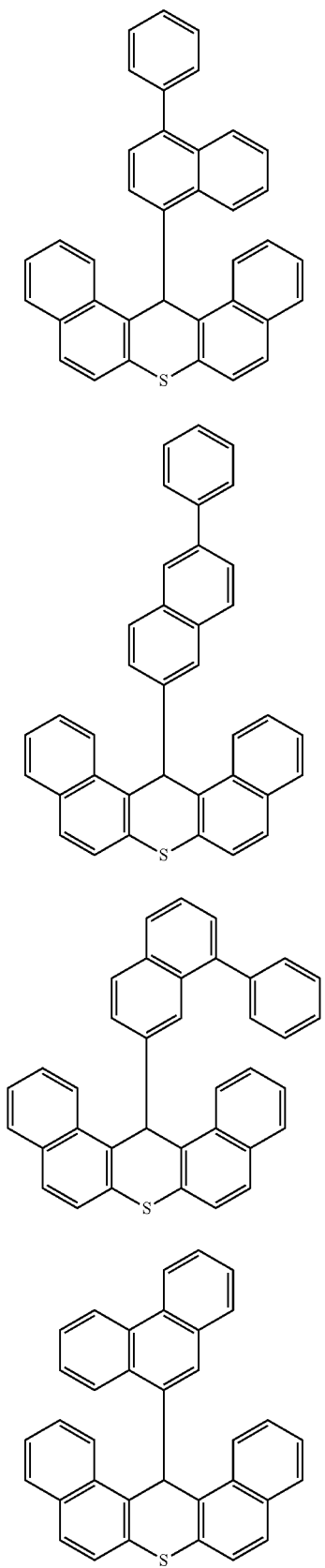
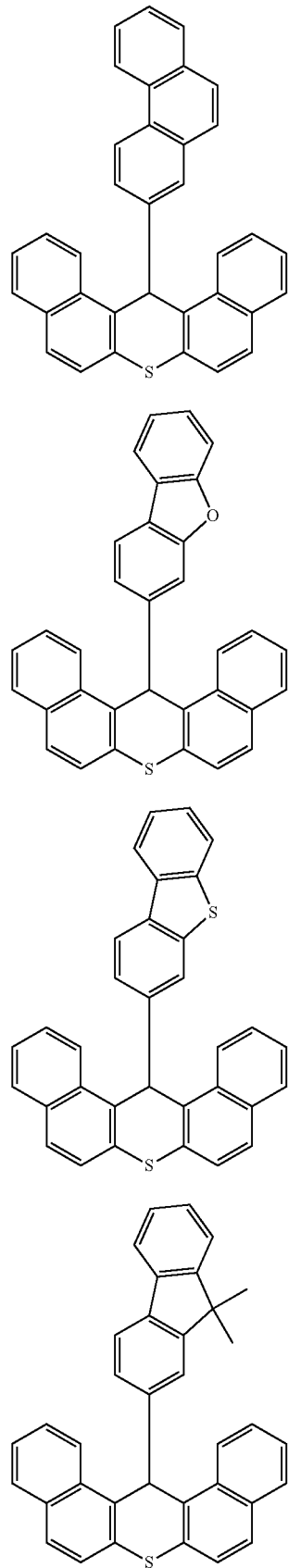

A185 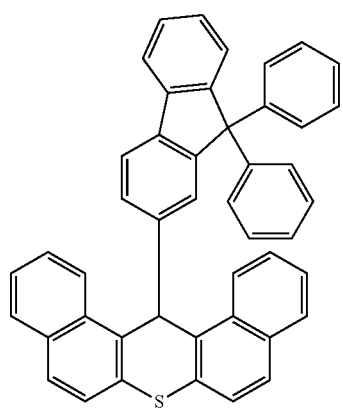
A186 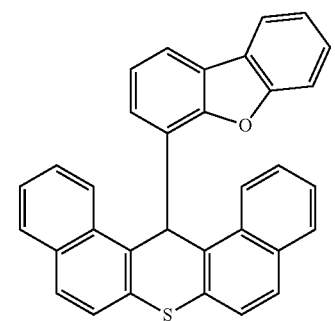
A187 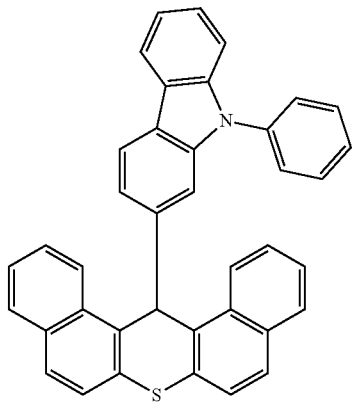
A188 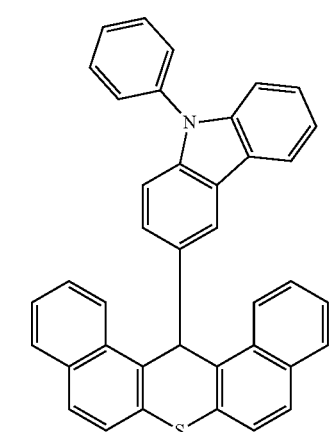
A189 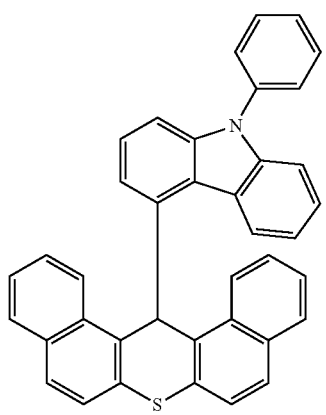
A190 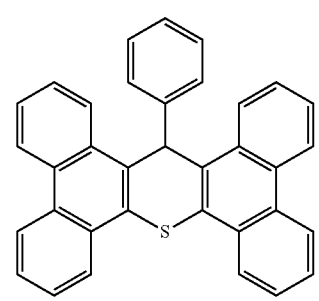
A191 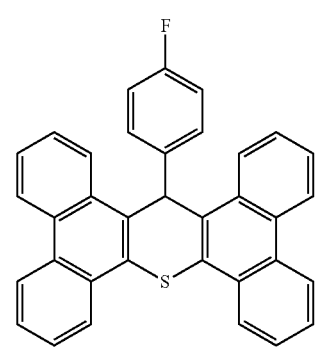
A192 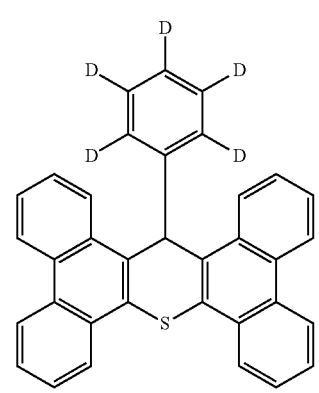

A193
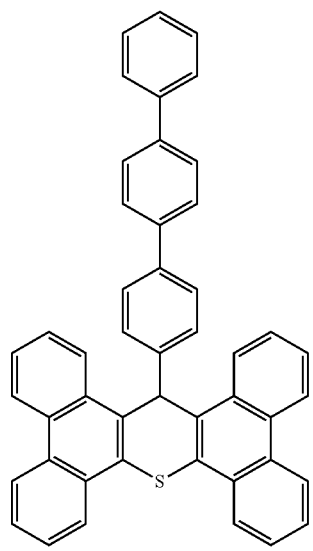
A195
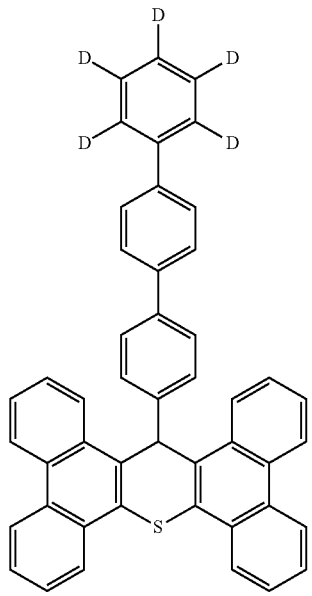
A194
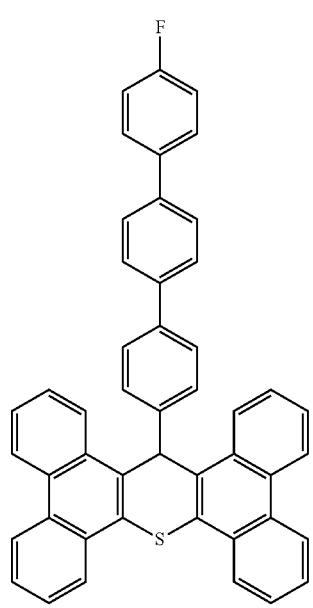
A196
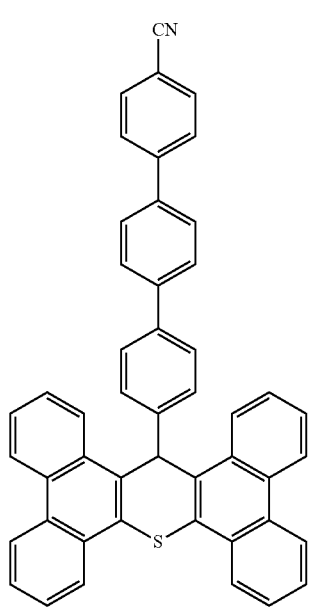

A197
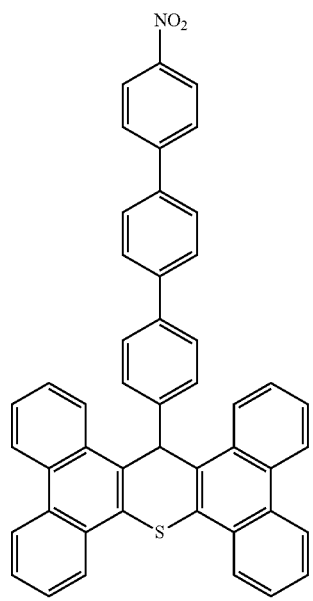
A198
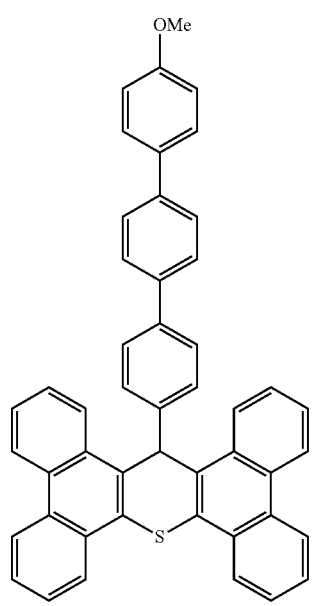
A199
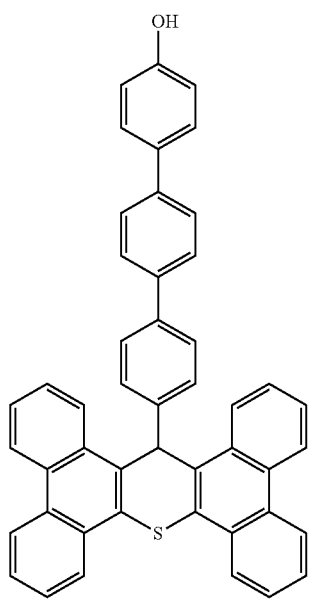
A201
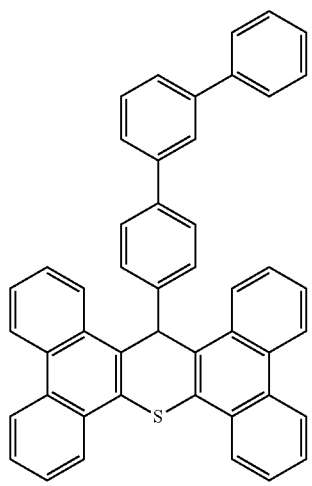
A202
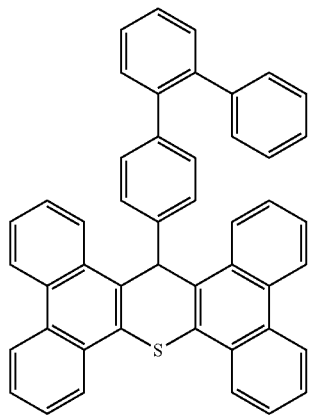

A203
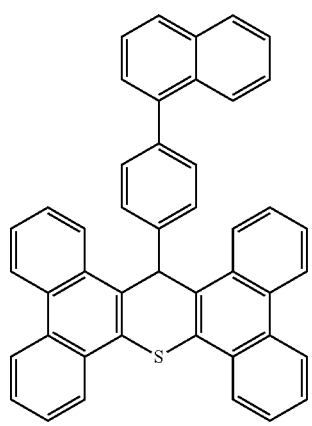
A204
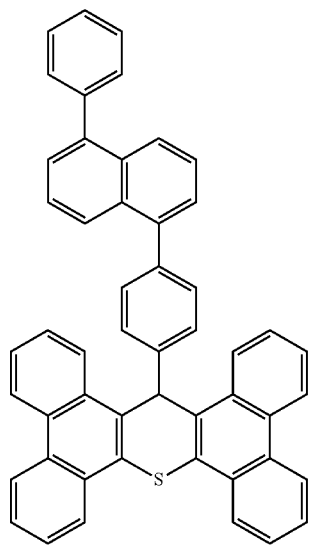
A205
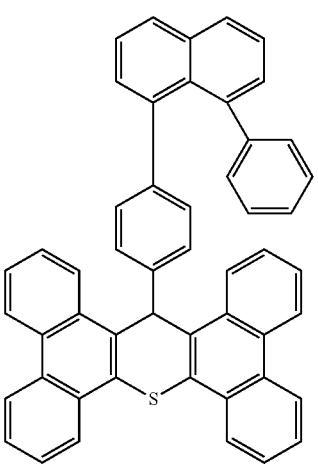
A206
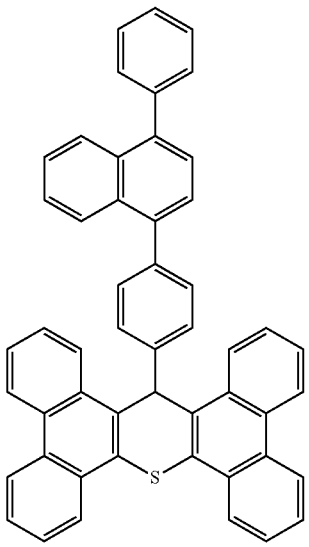
A207
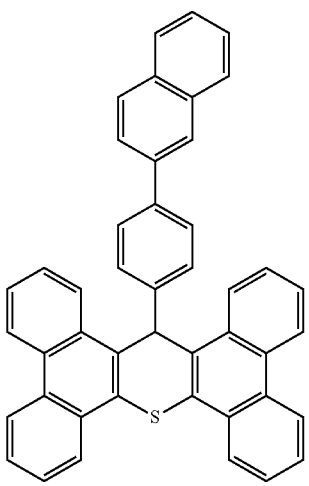
A208
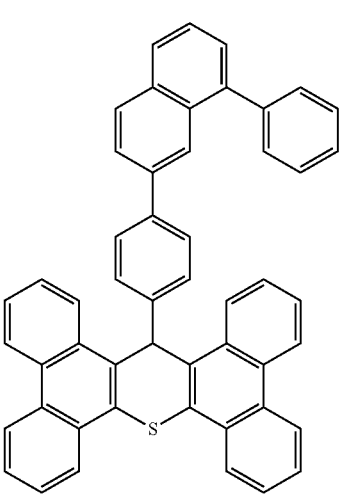

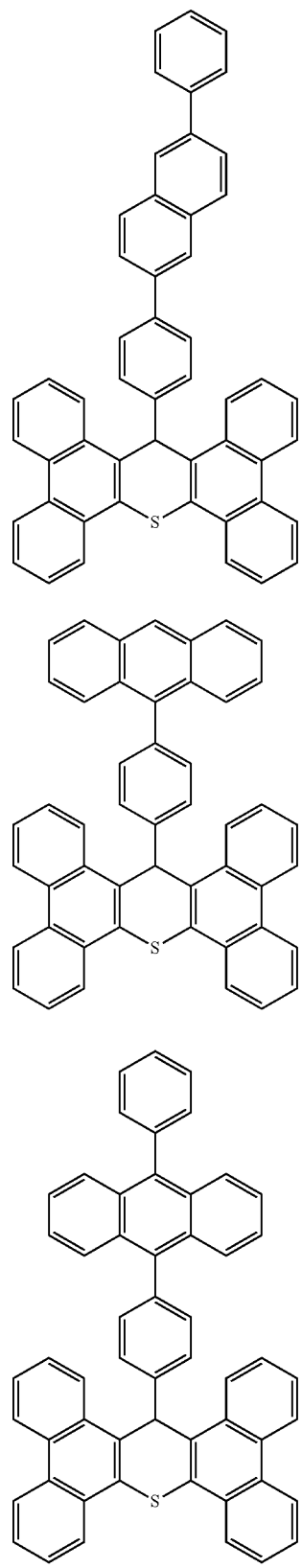
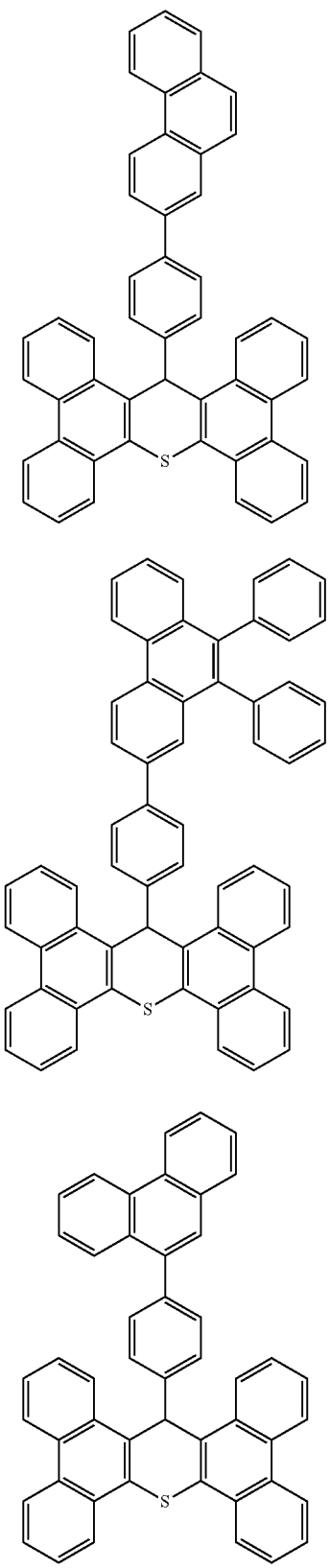

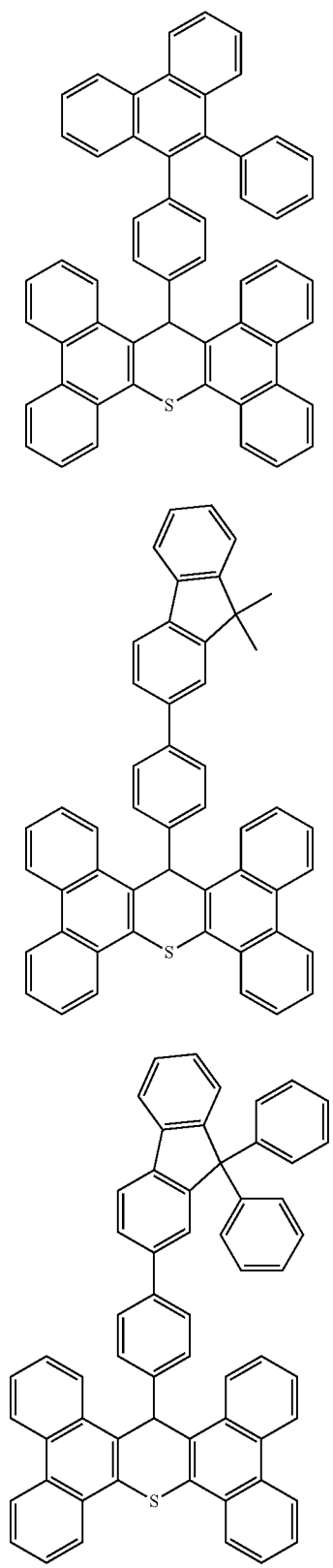
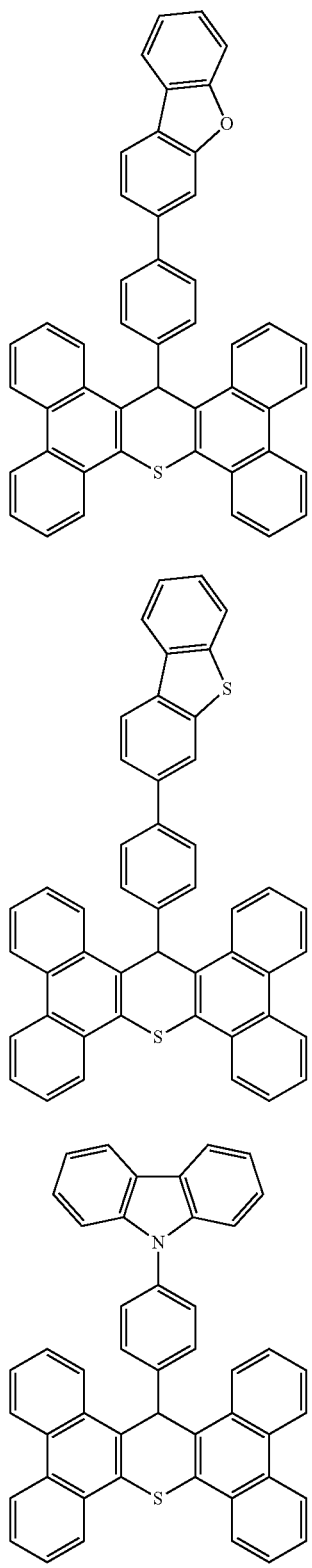

269
-continued
A221
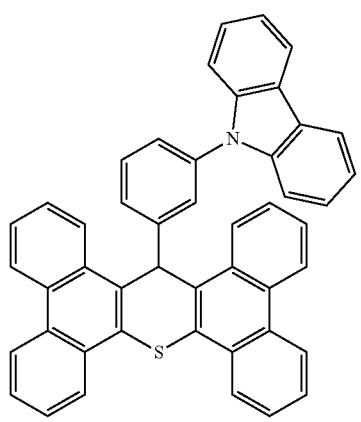
A222
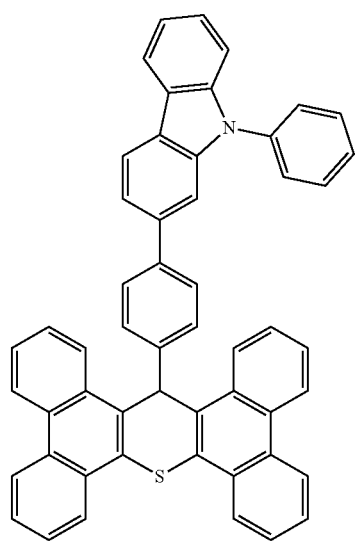
A223
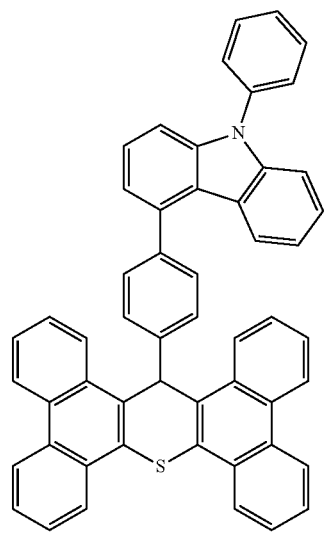
270
-continued
A224
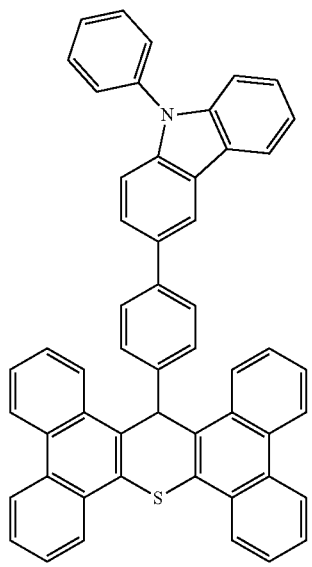
A225
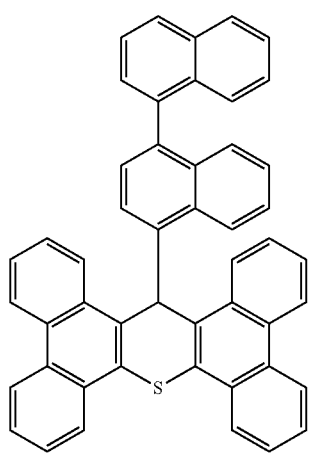
A226
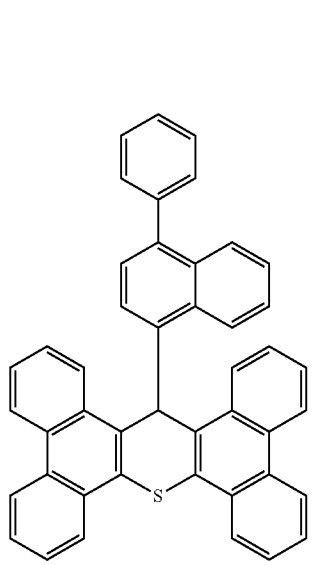

271
-continued
A227
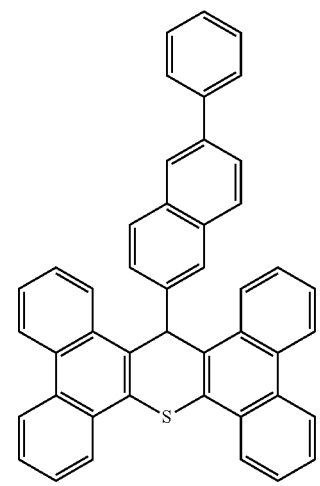
A228
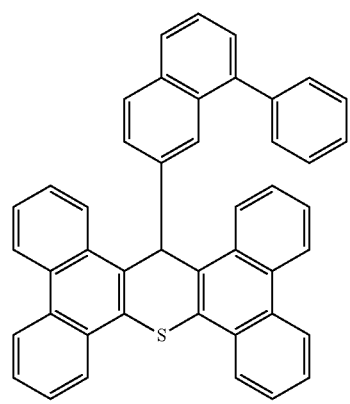
A229
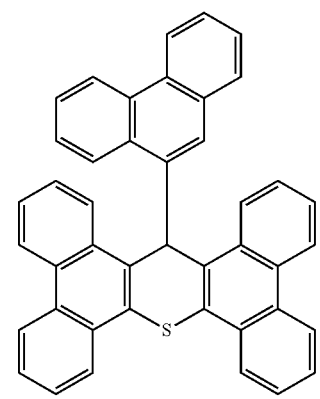
272
-continued
A230
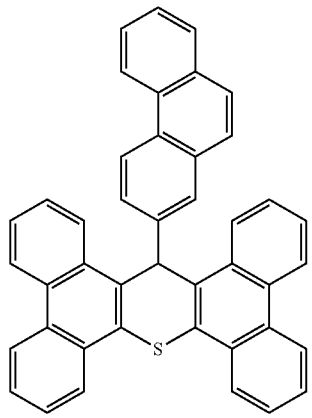
A231
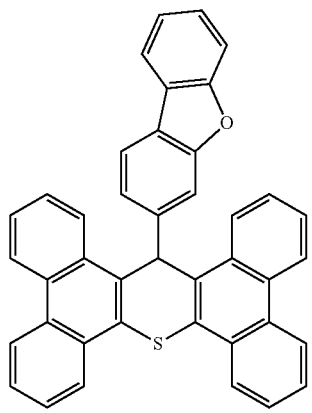
A232
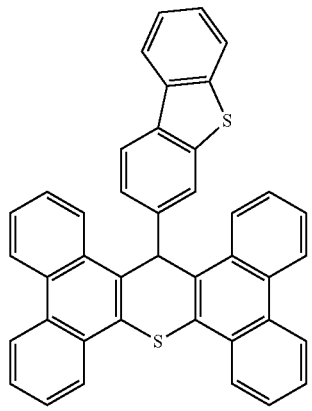
A233
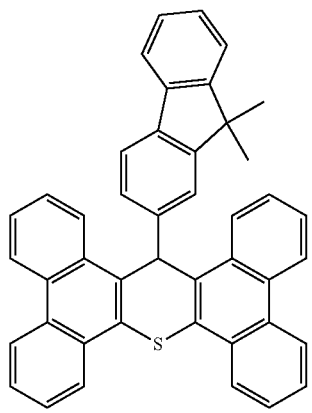

A234
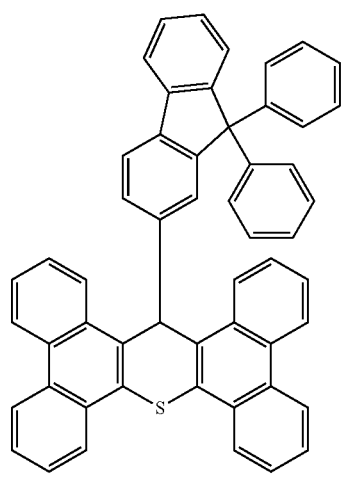
A235
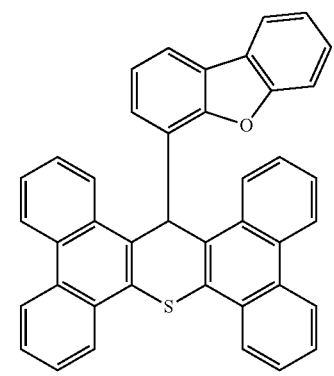
A236
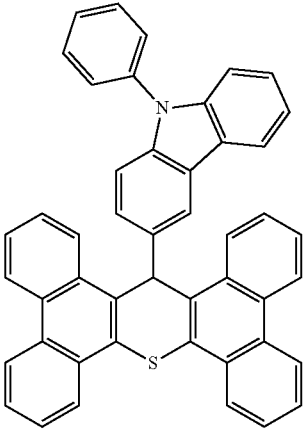
A237
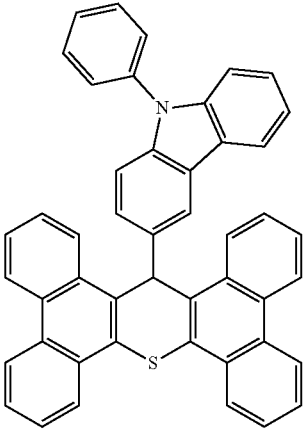
A238
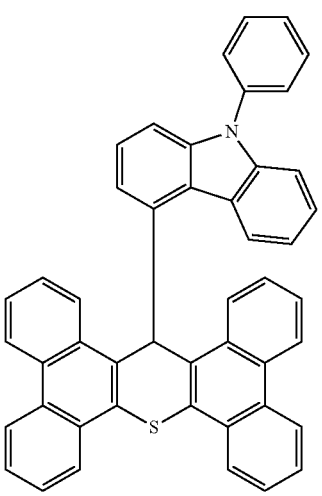
A239
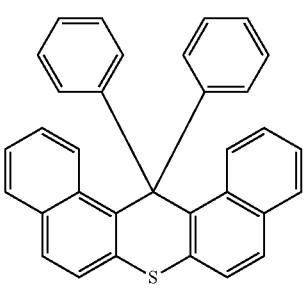
A240
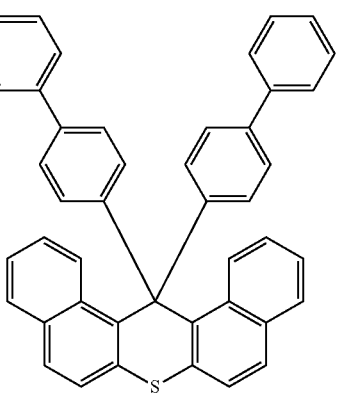

A241 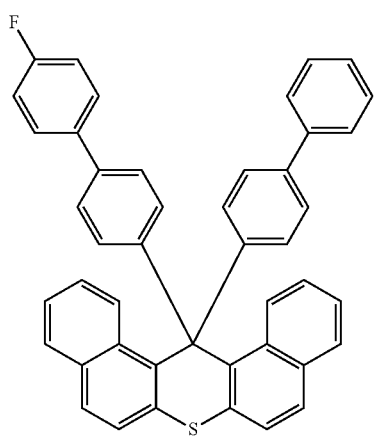
A244 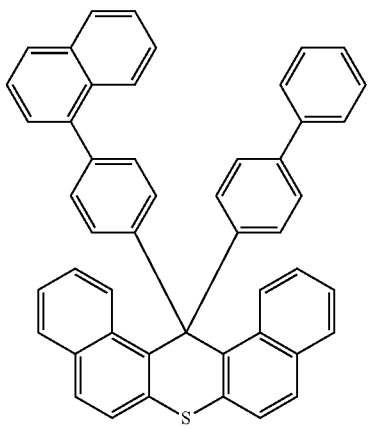
A242 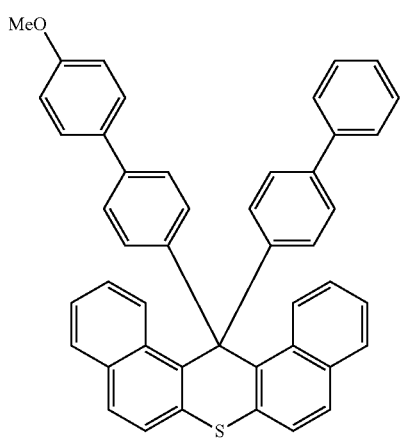
A245 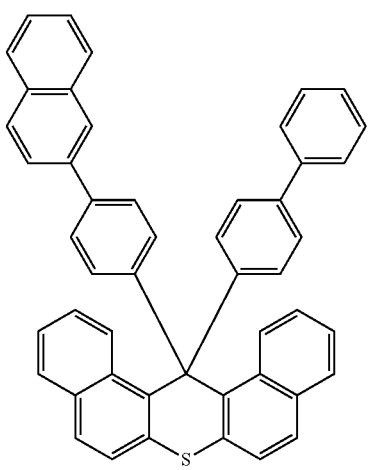
A243 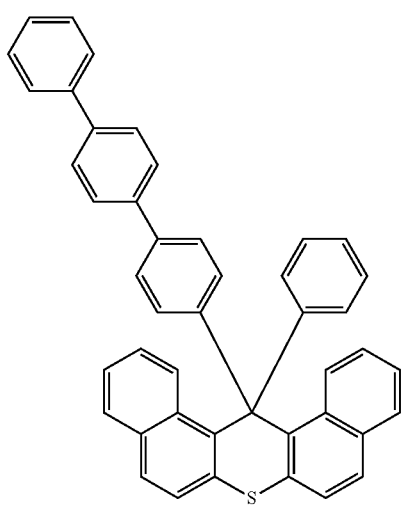
A246 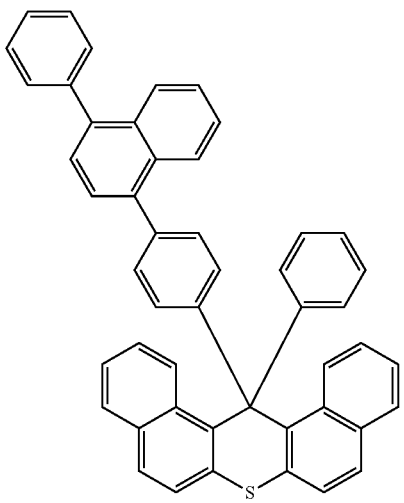

277
-continued
A247
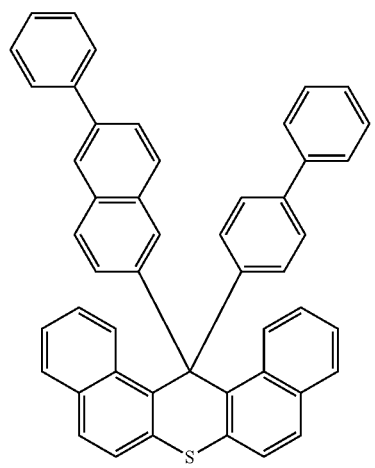
A248
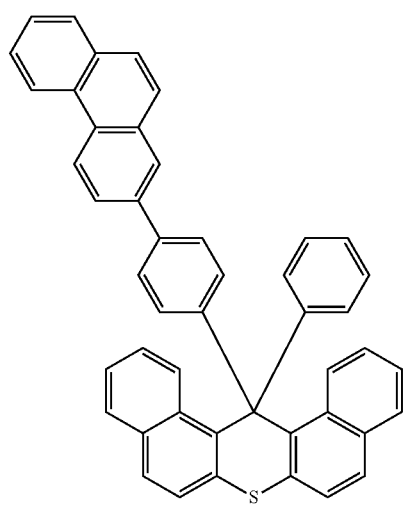
A249
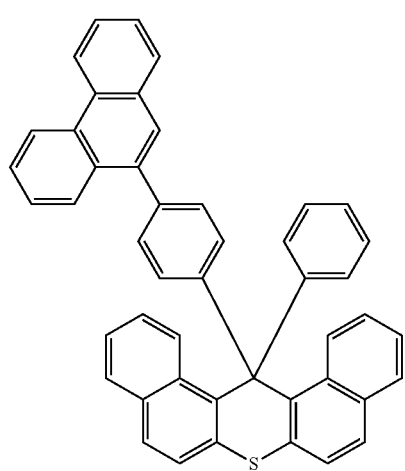
278
-continued
A250
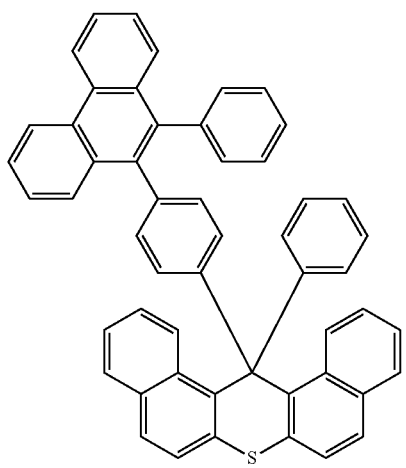
A251
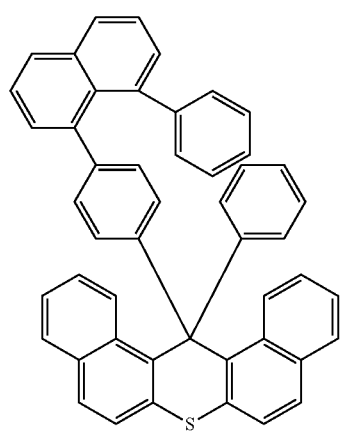
A255
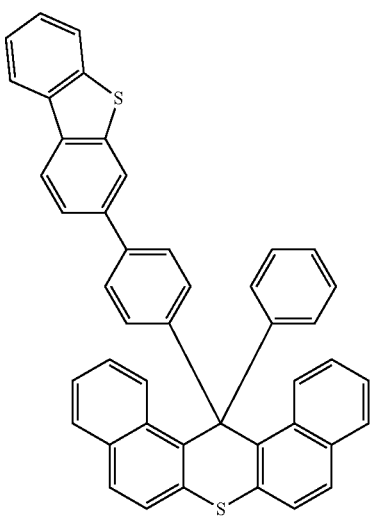

A260
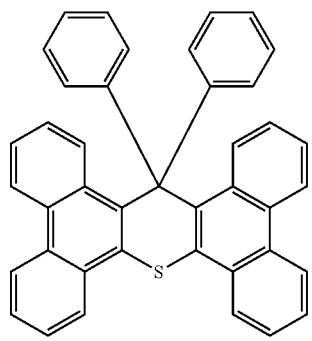
A261
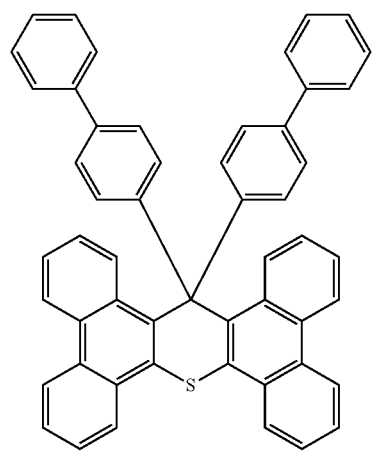
A262
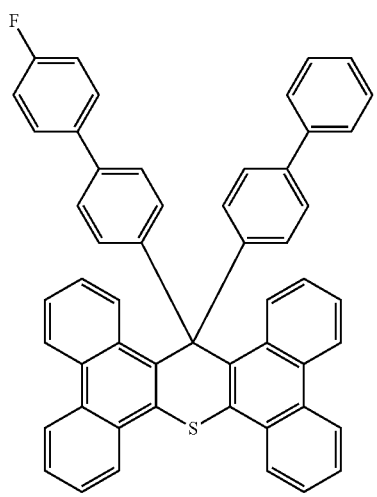
A263
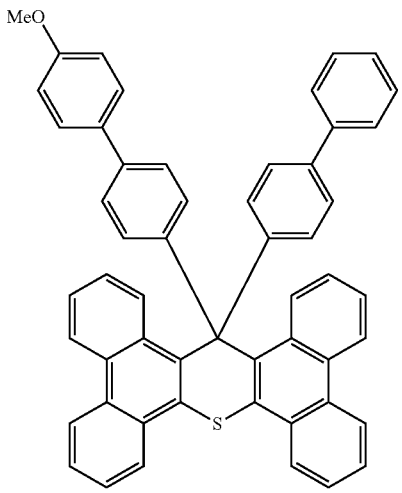
A264
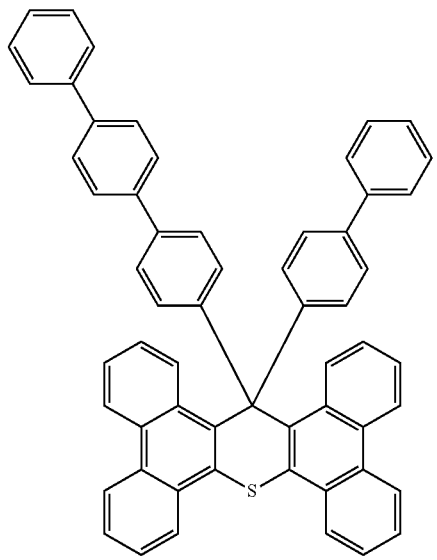
A265
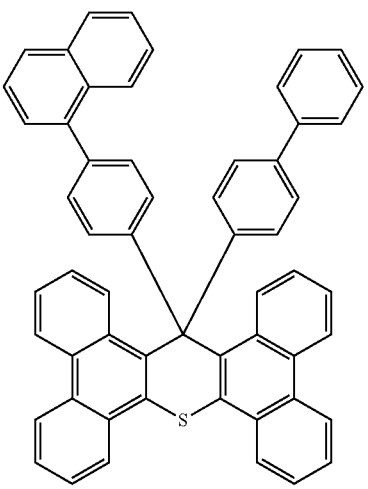

281
-continued
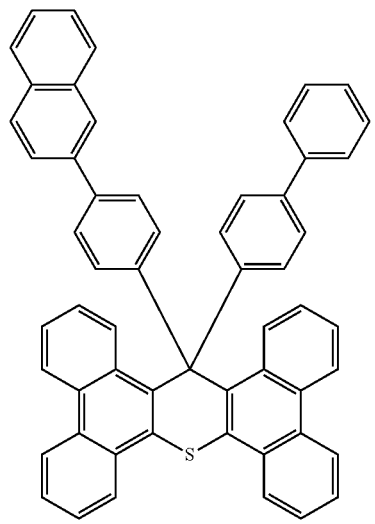
A266
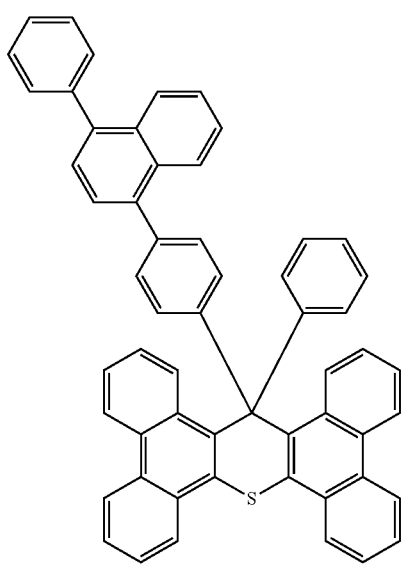
A267
282
-continued
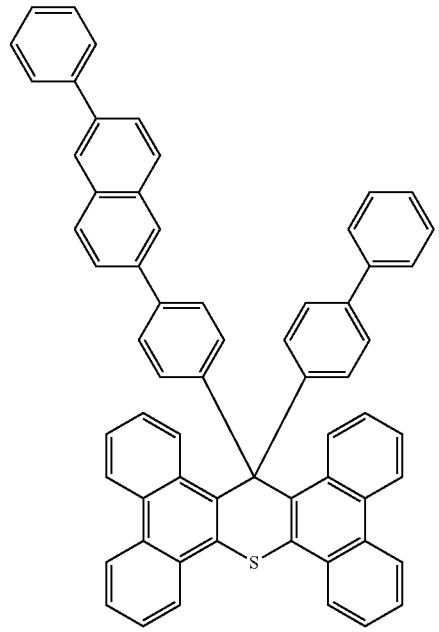
A268
A269

A270
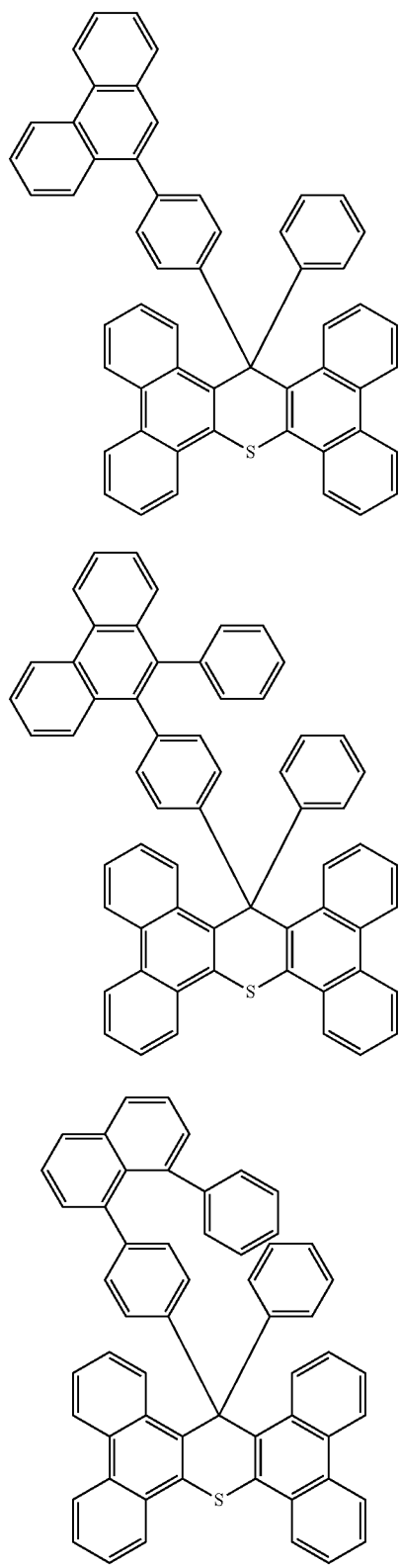
A271
A272
A273
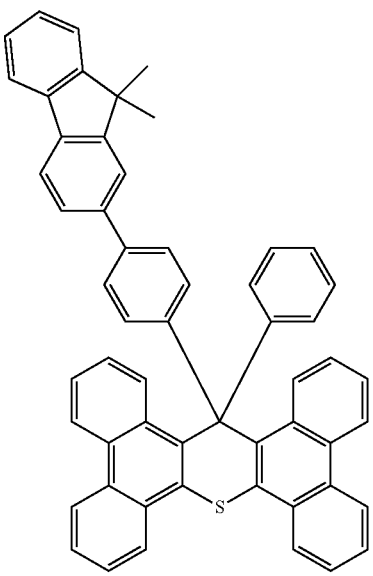
A274
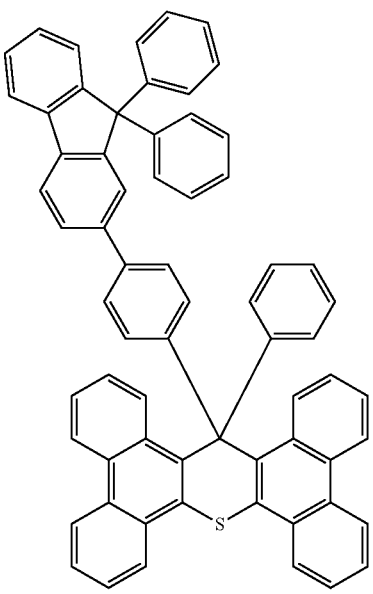

-continued
A275
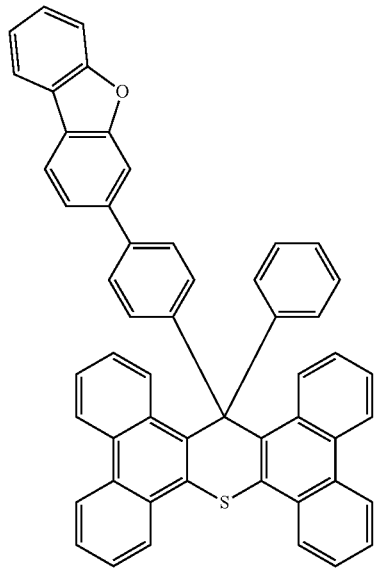
A276
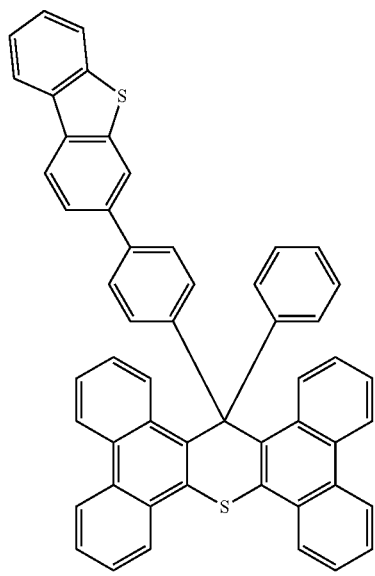
A277
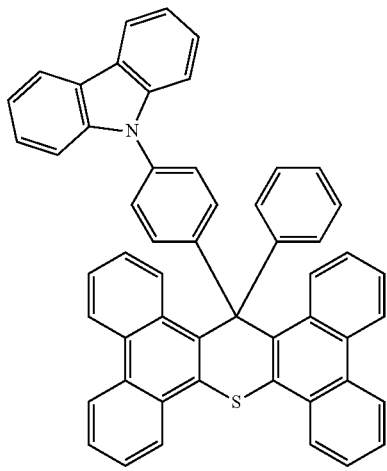
A278
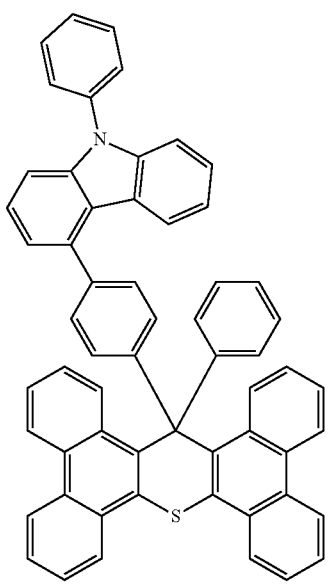
A279
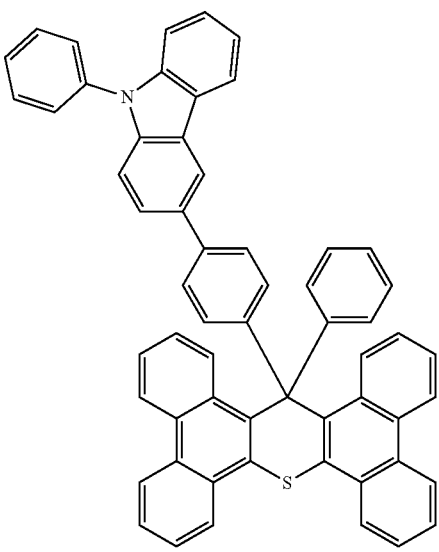

-continued
A280
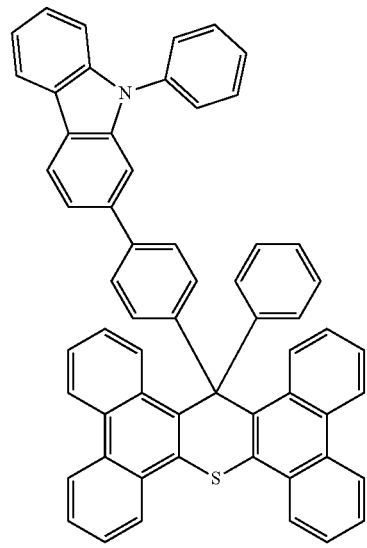
A281
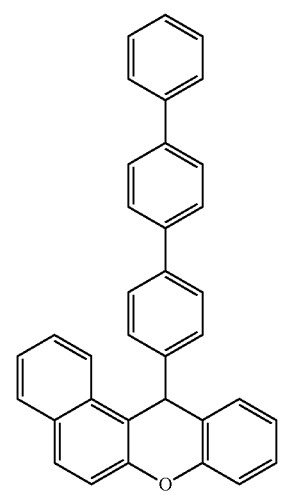
A282
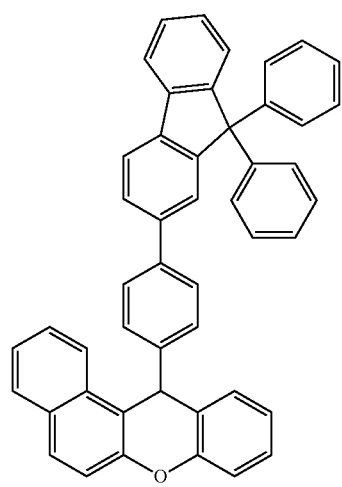
-continued
A283
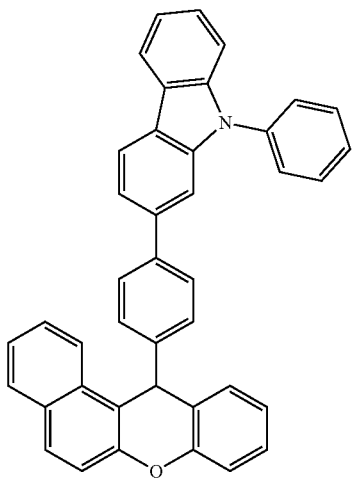
A285
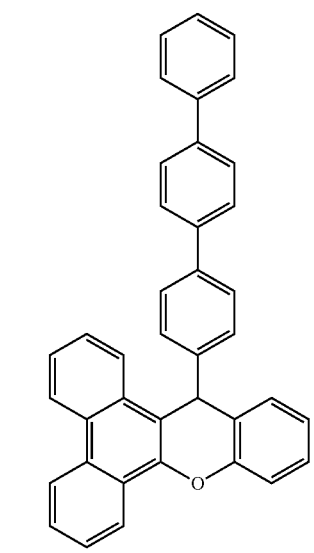
A286
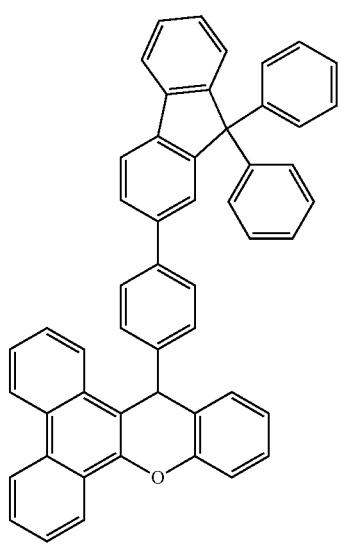

-continued
A287
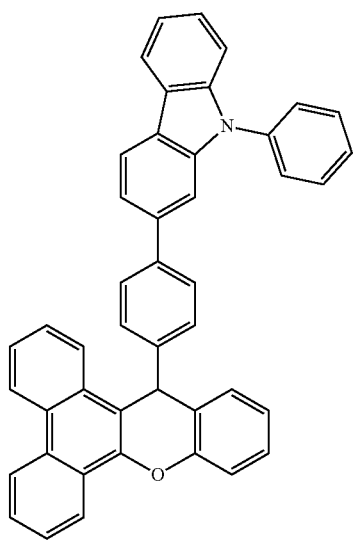
A289
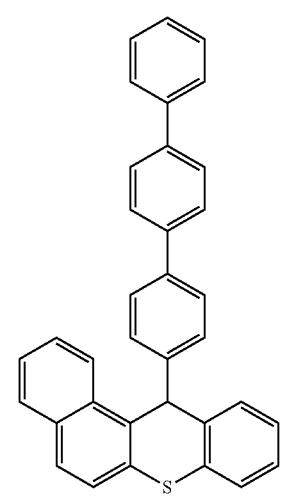
A290
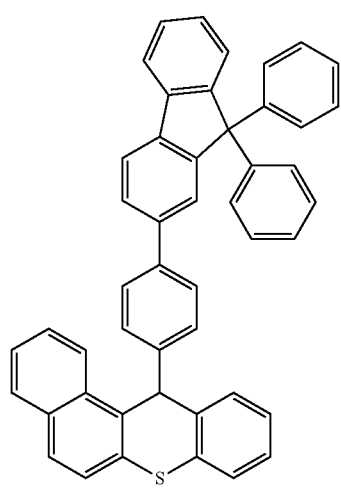
-continued
A291
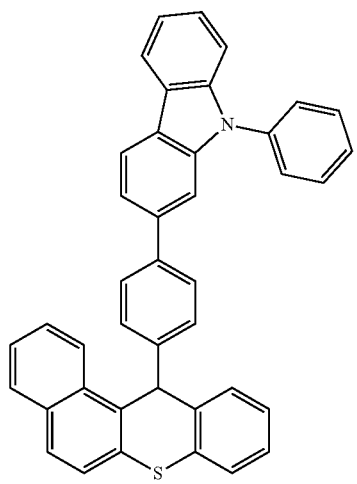
A293
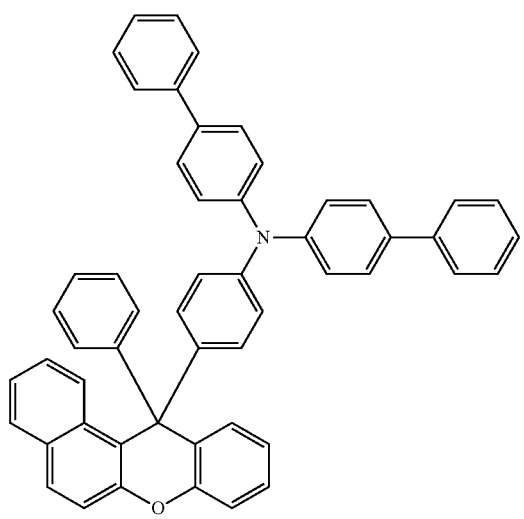
A294
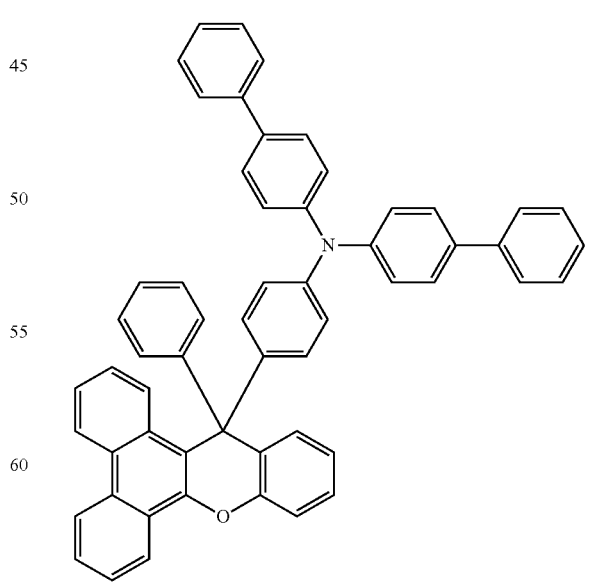

291
-continued
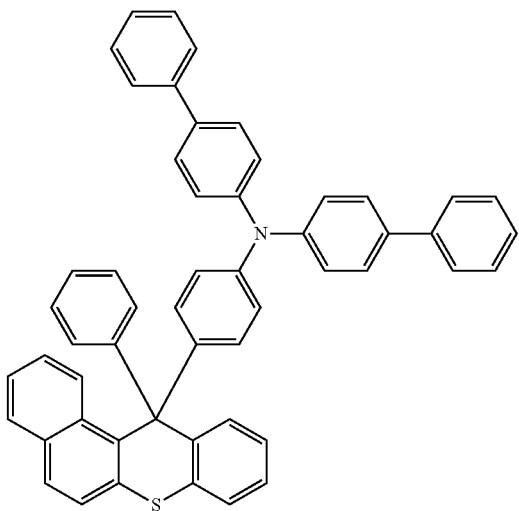
A295
292
-continued
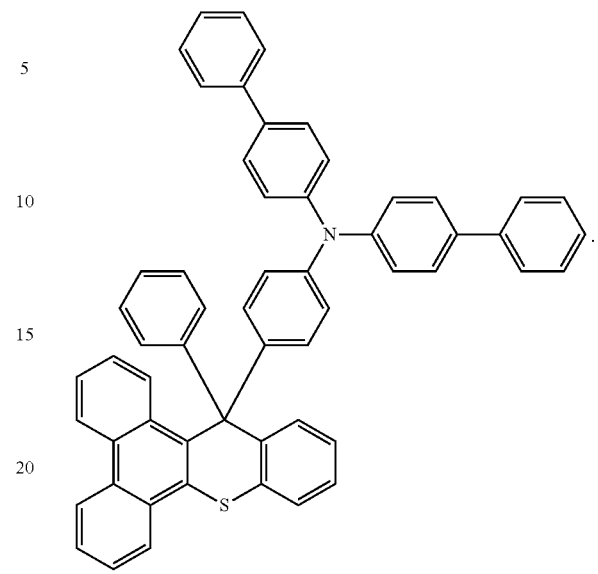
A296
* * * * *